United States Patent
Eldridge et al.

(10) Patent No.: US 8,485,418 B2
(45) Date of Patent: Jul. 16, 2013

(54) METHOD OF WIREBONDING THAT UTILIZES A GAS FLOW WITHIN A CAPILLARY FROM WHICH A WIRE IS PLAYED OUT

(75) Inventors: Benjamin N. Eldridge, Danville, CA (US); Gary W. Grube, Pleasanton, CA (US); Igor Y. Khandros, Orinda, CA (US); Gaetan L. Mathieu, Varennes, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/942,709

(22) Filed: Nov. 9, 2010

(65) Prior Publication Data

US 2011/0057018 A1 Mar. 10, 2011

Related U.S. Application Data

(60) Division of application No. 12/500,495, filed on Jul. 9, 2009, now abandoned, which is a division of application No. 11/758,479, filed on Jun. 5, 2007, now abandoned, which is a division of application No. 10/035,633, filed on Dec. 28, 2001, now Pat. No. 7,225,538, which is a continuation of application No. 09/476,960, filed on Dec. 21, 2000, now Pat. No. 6,835,898, which is a division of application No. 08/452,255, filed on May 26, 1995, now Pat. No. 6,336,269.

(51) Int. Cl.
*B23K 31/02* (2006.01)

(52) U.S. Cl.
USPC .............. 228/179.1; 228/180.22; 228/180.5

(58) Field of Classification Search
None
See application file for complete search history.

(56) References Cited

U.S. PATENT DOCUMENTS

| 3,271,851 | A | 9/1966 | Hays |
| 3,389,457 | A | 6/1968 | Goldman et al. |
| 3,490,141 | A | 1/1970 | Lesk |
| 3,519,890 | A | 7/1970 | Ashby |
| 3,591,839 | A | 7/1971 | Evans |
| 3,623,127 | A | 11/1971 | Glenn |
| 3,662,454 | A | 5/1972 | Miller |
| 3,668,756 | A | 6/1972 | Wiene |

(Continued)

FOREIGN PATENT DOCUMENTS

| DE | 2354256 | 10/1973 |
| DE | 2540321 | 9/1975 |

(Continued)

OTHER PUBLICATIONS

U.S. Appl. No. 09/245,499, filed Feb. 5, 1999, Khandros.

(Continued)

*Primary Examiner* — Kiley Stoner
(74) *Attorney, Agent, or Firm* — Kirton McConkie

(57) ABSTRACT

Contact structures exhibiting resilience or compliance for a variety of electronic components are formed. A variety of materials for the wire stem (which serves as a falsework) and for the overcoat (which serves as a superstructure over the falsework) are disclosed. Various techniques are described for mounting the contact structures to a variety of electronic components (e.g., semiconductor wafers and dies, semiconductor packages, interposers, interconnect substrates, etc.), and various process sequences are described. The resilient contact structures described herein are ideal for making a "temporary" (probe) connections to an electronic component such as a semiconductor die, for burn-in and functional testing.

42 Claims, 60 Drawing Sheets

U.S. PATENT DOCUMENTS

| | | |
|---|---|---|
| 3,702,439 A | 11/1972 | McGahey et al. |
| 3,753,665 A | 8/1973 | McCary et al. |
| 3,795,037 A | 3/1974 | Luttmer |
| 3,806,801 A | 4/1974 | Bove |
| 3,842,189 A | 10/1974 | Southgate |
| 3,844,909 A | 10/1974 | McCary et al. |
| 3,866,119 A | 2/1975 | Ardezzone et al. |
| 3,952,410 A | 4/1976 | Garretson et al. |
| 3,959,874 A | 6/1976 | Coucoulas |
| 3,963,986 A | 6/1976 | Morton et al. |
| 4,038,599 A | 7/1977 | Bove et al. |
| 4,137,867 A | 2/1979 | Aigo |
| 4,161,692 A | 7/1979 | Tarzwell |
| 4,177,554 A | 12/1979 | Deveres et al. |
| 4,194,957 A | 3/1980 | Lipschutz |
| 4,217,183 A | 8/1980 | Melcher et al. |
| 4,295,700 A | 10/1981 | Sado |
| 4,304,641 A | 12/1981 | Grandia et al. |
| 4,312,117 A | 1/1982 | Robillard et al. |
| 4,397,086 A | 8/1983 | Bickos et al. |
| 4,412,642 A | 11/1983 | Fisher, Jr. |
| 4,418,857 A | 12/1983 | Ainslie et al. |
| 4,423,376 A | 12/1983 | Byrnes et al. |
| 4,486,945 A | 12/1984 | Aigoo |
| 4,506,215 A | 3/1985 | Coughlin |
| 4,518,112 A | 5/1985 | Miller et al. |
| 4,518,914 A | 5/1985 | Okubo et al. |
| 4,523,133 A | 6/1985 | Messenger |
| 4,536,470 A | 8/1985 | Amendola et al. |
| 4,542,438 A | 9/1985 | Yamamoto |
| 4,567,433 A | 1/1986 | Ohkubo et al. |
| 4,599,559 A | 7/1986 | Evans |
| 4,622,514 A | 11/1986 | Lewis |
| 4,623,839 A | 11/1986 | Garretson et al. |
| 4,650,545 A | 3/1987 | Laakso et al. |
| 4,659,437 A | 4/1987 | Shiba et al. |
| 4,661,192 A | 4/1987 | McShane |
| 4,665,360 A | 5/1987 | Phillips |
| 4,667,219 A | 5/1987 | Lee et al. |
| 4,705,205 A | 11/1987 | Allen et al. |
| 4,732,313 A | 3/1988 | Kobayashi et al. |
| 4,734,046 A | 3/1988 | McAllister et al. |
| 4,751,199 A | 6/1988 | Phy |
| 4,757,256 A | 7/1988 | Whann et al. |
| 4,764,848 A | 8/1988 | Simpson |
| 4,784,972 A | 11/1988 | Hatada |
| 4,793,814 A | 12/1988 | Zifcak et al. |
| 4,833,402 A | 5/1989 | Boegh-Petersen |
| 4,837,622 A | 6/1989 | Whann et al. |
| 4,866,507 A | 9/1989 | Jacobs et al. |
| 4,891,585 A | 1/1990 | Janko et al. |
| 4,893,172 A | 1/1990 | Matsumoto et al. |
| 4,899,099 A | 2/1990 | Mendenhall et al. |
| 4,916,002 A | 4/1990 | Carver |
| 4,924,589 A | 5/1990 | Leedy |
| 4,943,719 A | 7/1990 | Akamine et al. |
| 4,954,877 A | 9/1990 | Nakanishi et al. |
| 4,955,523 A | 9/1990 | Carlommagno et al. |
| 4,961,052 A | 10/1990 | Tada et al. |
| 4,965,865 A | 10/1990 | Trenary |
| 4,968,589 A | 11/1990 | Pertty |
| 4,969,826 A | 11/1990 | Grabbe |
| 4,975,638 A | 12/1990 | Evans et al. |
| 4,979,289 A | 12/1990 | Dunaway et al. |
| 4,998,885 A | 3/1991 | Beaman |
| 5,037,023 A | 8/1991 | Akiyama et al. |
| 5,042,148 A | 8/1991 | Tada et al. |
| 5,045,975 A | 9/1991 | Cray et al. |
| 5,049,084 A | 9/1991 | Bakke |
| 5,055,778 A | 10/1991 | Okubo et al. |
| 5,066,358 A | 11/1991 | Quate et al. |
| 5,067,007 A | 11/1991 | Otsuka et al. |
| 5,070,297 A | 12/1991 | Kwon et al. |
| 5,090,119 A | 2/1992 | Tsuda et al. |
| 5,095,616 A | 3/1992 | Veenendaal |
| 5,098,305 A | 3/1992 | Krajewski et al. |
| 5,103,557 A | 4/1992 | Leedy |
| 5,110,032 A | 5/1992 | Akiyama et al. |
| 5,120,572 A | 6/1992 | Kumar |
| 5,123,850 A | 6/1992 | Elder et al. |
| 5,152,695 A | 10/1992 | Grabbe et al. |
| 5,157,325 A | 10/1992 | Murphy |
| 5,166,520 A | 11/1992 | Prater et al. |
| 5,173,055 A | 12/1992 | Grabbe |
| 5,177,438 A | 1/1993 | Littlebury et al. |
| 5,180,977 A | 1/1993 | Huff |
| 5,187,020 A | 2/1993 | Kwon et al. |
| 5,189,507 A | 2/1993 | Carlomagno et al. |
| 5,195,237 A | 3/1993 | Cray et al. |
| 5,210,939 A | 5/1993 | Malik et al. |
| 5,221,415 A | 6/1993 | Albrecht et al. |
| 5,225,777 A | 7/1993 | Bross et al. |
| 5,228,862 A | 7/1993 | Baumberger et al. |
| 5,230,632 A | 7/1993 | Baumberger et al. |
| 5,240,588 A | 8/1993 | Uchida |
| 5,255,431 A | 10/1993 | Burdick |
| 5,258,236 A | 11/1993 | Arjavalingam et al. |
| 5,260,926 A | 11/1993 | Kuroda et al. |
| 5,264,696 A | 11/1993 | Toda |
| 5,265,321 A | 11/1993 | Nelson et al. |
| 5,272,913 A | 12/1993 | Toda et al. |
| 5,289,631 A * | 3/1994 | Koopman et al. ............... 29/840 |
| 5,294,039 A | 3/1994 | Pai et al. |
| 5,297,001 A | 3/1994 | Sterling |
| 5,304,534 A | 4/1994 | Ciszek |
| 5,307,561 A | 5/1994 | Feigenbaum et al. |
| 5,309,324 A | 5/1994 | Herandez et al. |
| 5,317,479 A | 5/1994 | Pai et al. |
| 5,323,107 A | 6/1994 | D'Souza |
| 5,345,038 A | 9/1994 | Miyauchi et al. |
| 5,349,495 A | 9/1994 | Visel et al. |
| 5,355,079 A | 10/1994 | Evans et al. |
| 5,371,654 A | 12/1994 | Beaman et al. |
| 5,373,627 A | 12/1994 | Grebe |
| 5,391,521 A | 2/1995 | Kim |
| 5,416,429 A | 5/1995 | McQuade et al. |
| 5,422,574 A | 6/1995 | Kister |
| 5,450,290 A | 9/1995 | Boyko et al. |
| 5,455,390 A | 10/1995 | DiStefano et al. |
| 5,474,957 A | 12/1995 | Urushima |
| 5,476,211 A * | 12/1995 | Khandros .................. 228/180.5 |
| 5,476,818 A | 12/1995 | Yanof et al. |
| 5,480,503 A | 1/1996 | Casey et al. |
| 5,491,426 A | 2/1996 | Small |
| 5,495,667 A | 3/1996 | Farnworth et al. |
| 5,513,430 A | 5/1996 | Yanof et al. |
| 5,517,125 A | 5/1996 | Posedel et al. |
| 5,517,126 A | 5/1996 | Yamaguchi |
| 5,517,280 A | 5/1996 | Quate |
| 5,518,939 A | 5/1996 | Negishi et al. |
| 5,518,964 A | 5/1996 | DiStefano et al. |
| 5,521,518 A | 5/1996 | Higgins |
| 5,521,522 A | 5/1996 | Abe et al. |
| 5,530,371 A | 6/1996 | Perry et al. |
| 5,534,784 A | 7/1996 | Lum et al. |
| 5,541,525 A | 7/1996 | Wood et al. |
| 5,546,012 A | 8/1996 | Perry et al. |
| 5,546,375 A | 8/1996 | Shimada et al. |
| 5,563,509 A | 10/1996 | Small |
| 5,576,630 A | 11/1996 | Fujita |
| 5,580,607 A | 12/1996 | Takekuma et al. |
| 5,601,740 A | 2/1997 | Eldridge et al. |
| 5,608,966 A | 3/1997 | Donner et al. |
| 5,611,696 A | 3/1997 | Donner et al. |
| 5,613,861 A | 3/1997 | Smith et al. |
| 5,635,846 A | 6/1997 | Beaman et al. |
| 5,639,385 A | 6/1997 | McCormick |
| 5,642,056 A | 6/1997 | Nakajima et al. |
| 5,649,385 A | 7/1997 | Acevedo |
| 5,654,647 A | 8/1997 | Uhling et al. |
| 5,665,654 A | 9/1997 | Stansbury |
| 5,716,218 A | 2/1998 | Farnworth et al. |
| 5,718,367 A | 2/1998 | Covell, II et al. |
| 5,774,340 A | 6/1998 | Chang et al. |
| 5,786,701 A | 7/1998 | Pedder |
| 5,794,330 A | 8/1998 | DiStefano et al. |
| 5,801,441 A | 9/1998 | DiStefano et al. |

| | | | |
|---|---|---|---|
| 5,811,982 A | 9/1998 | Beaman et al. | |
| 5,821,763 A | 10/1998 | Beaman et al. | |
| 5,828,226 A | 10/1998 | Higgins et al. | |
| 5,847,445 A | 12/1998 | Wark et al. | |
| 5,852,871 A * | 12/1998 | Khandros | 29/843 |
| 5,879,568 A | 3/1999 | Urasaki et al. | |
| 5,900,738 A | 5/1999 | Khandros et al. | |
| 5,914,218 A | 6/1999 | Smith et al. | |
| 5,914,533 A | 6/1999 | Frech et al. | |
| 5,917,707 A * | 6/1999 | Khandros et al. | 361/776 |
| 5,926,951 A | 7/1999 | Khandros et al. | |
| 5,937,515 A | 8/1999 | Johnson | |
| 5,952,840 A | 9/1999 | Farnworth et al. | |
| 5,976,286 A | 11/1999 | Natarajan | |
| 5,989,994 A | 11/1999 | Khoury et al. | |
| 6,000,130 A | 12/1999 | Chang et al. | |
| 6,021,050 A | 2/2000 | Ehman et al. | |
| 6,028,305 A | 2/2000 | Minne et al. | |
| 6,042,712 A | 3/2000 | Mathieu | |
| 6,044,548 A | 4/2000 | DiStefano et al. | |
| 6,049,976 A | 4/2000 | Khandros | |
| 6,072,190 A | 6/2000 | Watanabe et al. | |
| 6,090,261 A | 7/2000 | Mathieu | |
| 6,110,823 A | 8/2000 | Eldridge et al. | |
| 6,140,830 A | 10/2000 | Ott | |
| 6,184,587 B1 | 2/2001 | Khandros et al. | |
| 6,193,910 B1 | 2/2001 | Ikai et al. | |
| 6,215,670 B1 | 4/2001 | Khandros | |
| 6,232,791 B1 | 5/2001 | Jitsumori et al. | |
| 6,241,838 B1 | 6/2001 | Sakamoto et al. | |
| 6,242,803 B1 | 6/2001 | Khandros et al. | |
| 6,252,175 B1 | 6/2001 | Khandros | |
| 6,255,602 B1 | 7/2001 | Evans et al. | |
| 6,272,020 B1 | 8/2001 | Tosaki et al. | |
| 6,274,823 B1 | 8/2001 | Khandros et al. | |
| 6,275,051 B1 | 8/2001 | Bachelder et al. | |
| 6,279,227 B1 | 8/2001 | Khandros et al. | |
| 6,330,164 B1 | 12/2001 | Khandros et al. | |
| 6,334,247 B1 | 1/2002 | Beaman et al. | |
| 6,336,269 B1 | 1/2002 | Eldridge et al. | |
| 6,341,417 B1 | 1/2002 | Gupta et al. | |
| 6,378,424 B1 | 4/2002 | Hayama et al. | |
| 6,420,884 B1 | 7/2002 | Khoury et al. | |
| 6,475,822 B2 | 11/2002 | Eldridge et al. | |
| 6,476,333 B1 | 11/2002 | Khandros et al. | |
| 6,499,216 B1 | 12/2002 | Fjelstad | |
| 6,538,214 B2 | 3/2003 | Khandros | |
| 6,627,980 B2 | 9/2003 | Eldridge | |
| 6,676,784 B2 | 1/2004 | Setzer et al. | |
| 6,706,975 B2 | 3/2004 | Sumi et al. | |
| 6,727,579 B1 | 4/2004 | Eldridge et al. | |
| 6,729,019 B2 | 5/2004 | Grube et al. | |
| 6,778,406 B2 | 8/2004 | Grube et al. | |
| 6,799,976 B1 | 10/2004 | Mok et al. | |
| 6,815,961 B2 | 11/2004 | Mok et al. | |
| 6,818,840 B2 | 11/2004 | Khandros | |
| 6,835,898 B2 | 12/2004 | Eldridge et al. | |
| 6,894,888 B2 | 5/2005 | Takeuchi et al. | |
| 6,917,525 B2 | 7/2005 | Mok et al. | |
| 6,956,174 B2 | 10/2005 | Khandros et al. | |
| 7,073,254 B2 | 7/2006 | Eldridge et al. | |
| 7,082,682 B2 | 8/2006 | Khandros | |
| 7,084,656 B1 | 8/2006 | Khandros et al. | |
| 7,086,149 B2 | 8/2006 | Eldridge et al. | |
| 7,102,085 B2 | 9/2006 | Ohta et al. | |
| 7,126,358 B2 | 10/2006 | Mok et al. | |
| 7,200,930 B2 | 4/2007 | Khandros et al. | |
| 7,225,538 B2 | 6/2007 | Eldridge et al. | |
| 7,435,108 B1 | 10/2008 | Eldridge et al. | |
| 2001/0002341 A1 | 5/2001 | Eldridge et al. | |
| 2001/0015652 A1 | 8/2001 | Eldridge et al. | |
| 2003/0199179 A1 | 10/2003 | Dozier, II et al. | |
| 2006/0286828 A1 | 12/2006 | Khandros | |
| 2007/0176619 A1 | 8/2007 | Khandros et al. | |
| 2007/0228110 A1 | 10/2007 | Eldridge et al. | |
| 2010/0065963 A1 | 3/2010 | Eldridge et al. | |
| 2010/0093229 A1 | 4/2010 | Eldridge et al. | |

FOREIGN PATENT DOCUMENTS

| | | |
|---|---|---|
| DE | 2618867 | 4/1976 |
| DE | 2652077 | 5/1978 |
| DE | 3129568 | 4/1982 |
| DE | 3704200 | 8/1988 |
| DE | 3709222 | 9/1988 |
| DE | 3744099 | 2/1989 |
| DE | 4232745 | 3/1994 |
| DE | 19952943 | 7/2003 |
| EP | 0002166 | 5/1979 |
| EP | 0205190 | 12/1986 |
| EP | 0275634 | 7/1988 |
| EP | 0295914 | 12/1988 |
| EP | 0320244 | 6/1989 |
| EP | 0396248 | 11/1990 |
| EP | 0432361 | 6/1991 |
| EP | 0460822 | 12/1991 |
| EP | 0500074 | 8/1992 |
| EP | 0528367 | 2/1993 |
| EP | 0593966 | 4/1994 |
| EP | 0610631 | 8/1994 |
| EP | 0614089 | 9/1994 |
| EP | 0642163 | 3/1995 |
| EP | 0701135 | 3/1996 |
| EP | 0845677 | 11/1997 |
| EP | 1014096 | 6/2000 |
| EP | 1077381 | 2/2001 |
| EP | 1098200 | 5/2001 |
| EP | 0729652 | 10/2002 |
| FR | 2622741 | 5/1989 |
| FR | 2643753 | 8/1990 |
| FR | 2680284 | 2/1993 |
| GB | 2149980 | 6/1985 |
| GB | 2247565 | 3/1992 |
| JP | 55113897 | 9/1980 |
| JP | 56021354 | 2/1981 |
| JP | 57012543 | 1/1982 |
| JP | 57017141 | 1/1982 |
| JP | 57084144 | 5/1982 |
| JP | 57-113243 | 7/1982 |
| JP | 57-193051 | 11/1982 |
| JP | 60097655 | 11/1983 |
| JP | 58218131 | 12/1983 |
| JP | 59-088860 | 5/1984 |
| JP | 59155161 | 9/1984 |
| JP | 59211253 | 11/1984 |
| JP | 60150657 | 8/1985 |
| JP | 60236252 | 11/1985 |
| JP | 61051838 | 3/1986 |
| JP | 61160958 | 7/1986 |
| JP | 61170054 | 7/1986 |
| JP | 61244057 | 10/1986 |
| JP | 61-49432 | 11/1986 |
| JP | 61287254 | 12/1986 |
| JP | 61291991 | 12/1986 |
| JP | 62097360 | 5/1987 |
| JP | 62105459 | 5/1987 |
| JP | 62113457 | 5/1987 |
| JP | 62120057 | 6/1987 |
| JP | 63-136657 | 6/1988 |
| JP | 02-034949 | 2/1990 |
| JP | 02-109339 | 4/1990 |
| JP | 02183538 | 7/1990 |
| JP | 02-226996 | 9/1990 |
| JP | 02-140327 | 10/1990 |
| JP | 02-250327 | 10/1990 |
| JP | 03-061339 | 3/1991 |
| JP | 03-065659 | 3/1991 |
| JP | 3142847 | 6/1991 |
| JP | 03-250639 | 11/1991 |
| JP | 04-207047 | 7/1992 |
| JP | 4240570 | 8/1992 |
| JP | 04-294559 | 10/1992 |
| JP | 04-297879 | 10/1992 |
| JP | 04-333250 | 11/1992 |
| JP | 05-018741 | 1/1993 |
| JP | 05-015431 | 2/1993 |
| JP | 05-029406 | 2/1993 |
| JP | 05-102254 | 4/1993 |

| | | |
|---|---|---|
| JP | 05-144897 | 6/1993 |
| JP | 05-164785 | 6/1993 |
| JP | 05-211218 | 8/1993 |
| JP | 5218156 | 8/1993 |
| JP | 05-264590 | 10/1993 |
| JP | 05-264591 | 10/1993 |
| JP | 05259334 | 10/1993 |
| JP | 6018555 | 1/1994 |
| JP | 06-050990 | 2/1994 |
| JP | 06-077295 | 3/1994 |
| JP | 06-084455 | 3/1994 |
| JP | 06-267408 | 9/1994 |
| JP | 07-007052 | 1/1995 |
| JP | 3292406 | 1/1995 |
| JP | 07-063999 | 3/1995 |
| JP | 7072172 | 3/1995 |
| JP | 07-021968 | 10/1995 |
| JP | 07-288271 | 10/1995 |
| JP | 08-083824 | 3/1996 |
| JP | 08-211101 | 8/1996 |
| JP | 07-135240 | 12/1996 |
| JP | 09-004278 | 1/1997 |
| JP | 09-138242 | 5/1997 |
| JP | 10-031034 | 2/1998 |
| JP | 10-163278 | 6/1998 |
| JP | 10-260233 | 9/1998 |
| JP | 11-260871 | 9/1999 |
| JP | 2000-124397 | 4/2000 |
| JP | 2002-22767 | 1/2002 |
| WO | WO 94/23451 | 10/1994 |
| WO | WO 95/14314 | 5/1995 |

OTHER PUBLICATIONS

U.S. Appl. No. 08/735,808, filed Aug. 21, 1996, Khandros et al.
U.S. Appl. No. 08/735,814, filed Oct. 21, 1996, Khandros et al.
"Membrane Probe Technology for MCM Known-Good-Die", article, HP Japan, 1994, MJC 1975640-47.
"Si-Probe—A New Technology for Wafer Probing", Proceedings, 1995, International Test Conference, pp. 106-112 MJC1975652-58.
A. Fach et al., "Multilayer Film Substrates with 30 μm vias for MCM Applications", International Conference on Multichip Modules and High Density Packaging-Proceedings, 1998, pp. 337-341.
A.J. Piloto et al., "Integrated Passive Components: A Brief Overview of LTCC Surface Mount and Integral Options", Proceedings, Sep. 1, 1999, pp. 1-7.
Bruce C. Kim et al., "A High Throughput Test Methodology for MCM Substrates", International Test Conference (ITC)-Proceedings, 1998, pp. 234-240.
C. Narayan et al., "Thin Film Transfer for Low Cost MCM-D Fabrication", Proceedings-SPIE, vol. 2256, International Conference and Exhibition-Multichip Modules, 1994, pp. 105-114.
Daniel T. Hamling, "A 3 GHz, 144 Point Probe Fixture for Automatic IC Wafer Testing", International Test Conference (ITC)-Proceedings, 1992, pp. 940-947.
David H. Carey, "Trends in Low-Cost, High-Performance Substrate Technology", Microelectronics & Computer Technology Corp-Proceedings, Apr. 1993, pp. 19-27.
Defendant *Micro-Probe Incorporated's Invalidity Contentions, FormFactor, Inc. v. Micro-Prove Incorporated and David Browne*, US District Court Northern District of California Oakland Division, Case No. 10-CV-03095-PHJ, including Exhibits E and M, 17 pages (Jul. 15, 2011).
Duane W. Endicott and John R. Knapp, Jr., "Electrodeposition of Nickel-Cobalt Alloy: Operating Variables and Physical Properties of the Deposits" Jan. 1996, pp. 43-60.
Grace Chan et al., "C4 Probe Card Space Transformer Technology Overview", Intel Southwest Test Workshop-Proceedings, Jun. 2000, pp. 1-24.
In the Matter of Certain Probe Card Assemblies, Components Thereof and Certain Tested DRAM and NAND Flash Memory Devices and Products Containing Same, Investigation No. 337-TA-621, Initial Determination on Violation of Section 337 and Recommended Determination on Remedy and Bond, (Jun. 29, 2009), 214 pages.
In the Matter of Certain Probe Card Assemblies, Components Thereof and Certain Tested DRAM and NAND Flash Memory Devices and Products Containing Same, Investigation No. 337-TA-621, Commission Opinion (Dec. 10, 2009), 20 pages.
Kai Zoschke et al., "Stackable Thin Film Multi-Layer Substrates with Integrated Passive Components", Electronic Components and Technology Conference-Proceedings, 2006, pp. 806-813.
Matta, "Wafer Level Testing With a Membrane Probe", article, IEEE, 1989, MJC 1975612-19.
Nancy E. Preckshot et al., "Design Methodology of a 1.2-μm Double—Level—Metal CMOS Technology", IEEE Transactions on Electron Devices—Proceedings, vol. 31, No. 2, Feb. 1984, pp. 215-225.
Nicholas Sporck, "A New Probe Card Technology Using Compliant Microsprings", International Test Conference (ITC)—Proceedings, 1997, pp. 527-532.
Polaris 384 OHP User Guide, Rve. 2, Teradyne, MJC1975620-636, May 2, 1996.
R. Miracky et al., "Technologies for Rapid Prototyping of Multi-Chip Modules", VLSI in Computers and Processors—Proceedings, 1991, pp. 588-592.
R.R. Tummala et al., "High-Performance Glass-Ceramic/Copper Multilayer Substrate with Thin-Film Redistribution", IBM Journal of Research and Development Proceedings, vol. 36, No. 5, Sep. 1992, pp. 889-904.
Search Report European Application 01127397.6-1235/1198001 (Jun. 23, 2008).
Shih, D.-Y et al., "A Novel Elastometric Connector for Packaging Interconnections, Testing and Burn-in Applications", IEEE, Proceedings of the Electronic Components and Technology Conference, Las Vegas, NV, May 21, 1995.
T. Tada et al., "A Fine Pitch Probe Technology for VLSI Wafer Testing", International Test Conference (ITC)—Proceedings, The Changing Philosophy of Test, 1990, pp. 900-906.
United States International Trade Commission, in the Matter of Certain Probe Card Assemblies, Components Thereof and Certain Tested DRAM and NAND Flash Memory Devices and Products Containing Same, Inv. No. 337-TA-621, Respondent Micronics Japan Co., LTD's First Supplemental Responses to Complainant FormFactor, Inc.'s First Set of Interrogatories (Nos. 25-29), Exhibit 3, Mar. 14, 2008.
Weast, Handbook of Chemistry and Physics, CRC Press, Cleveland, OH, pp. D171-D172, (1975-1976).

* cited by examiner

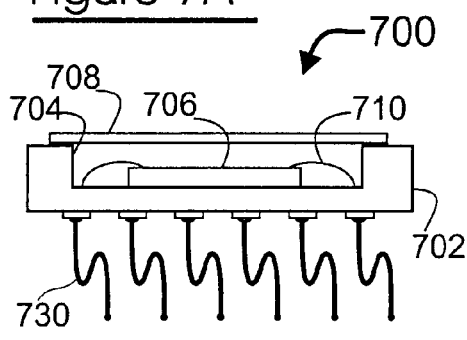
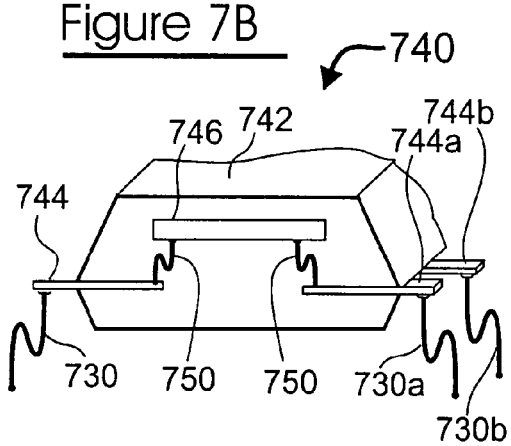
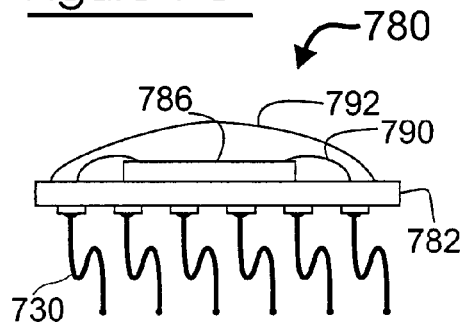
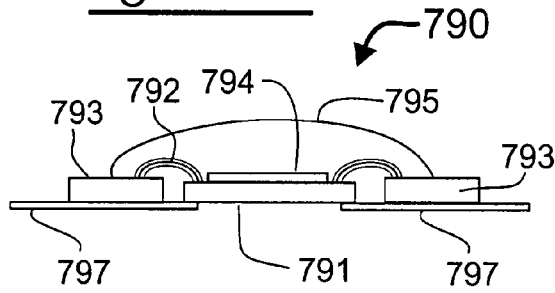

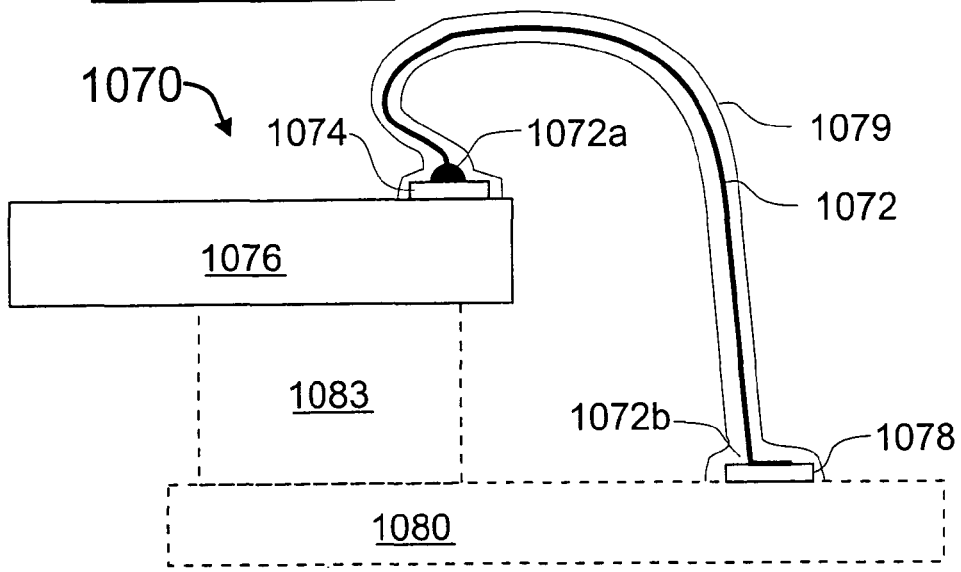
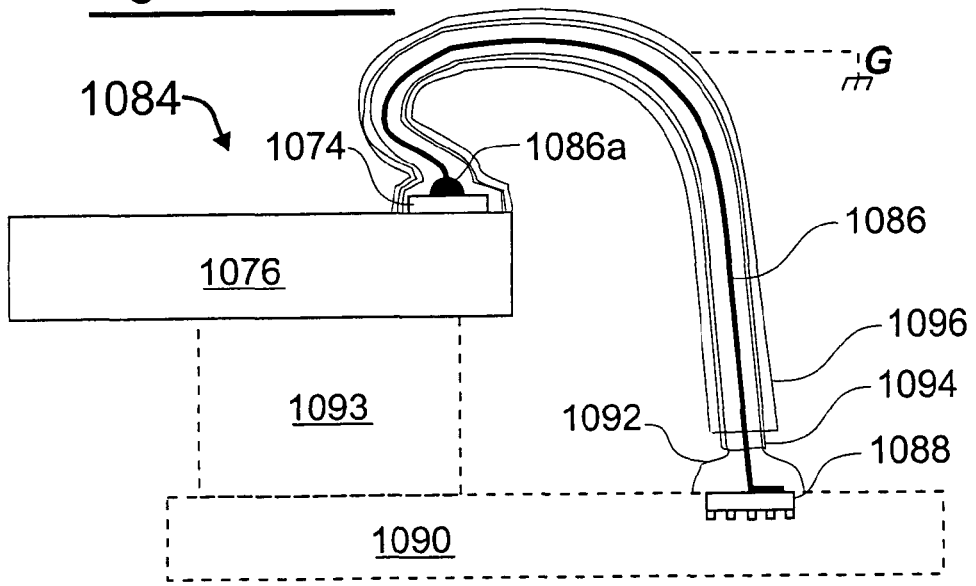

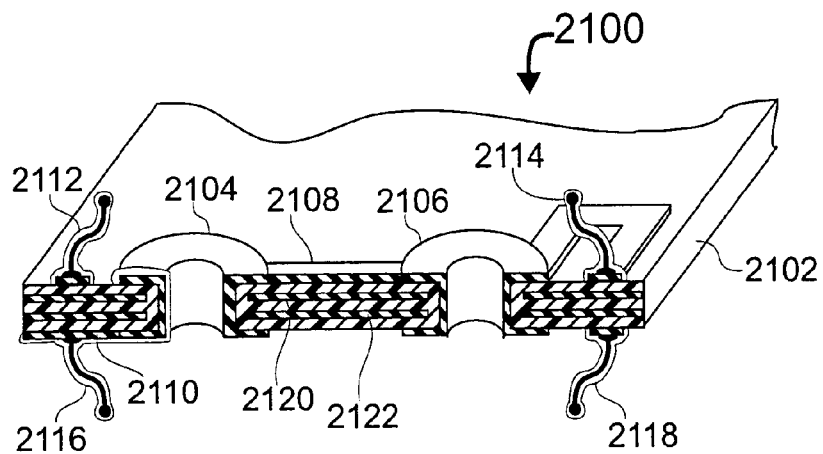
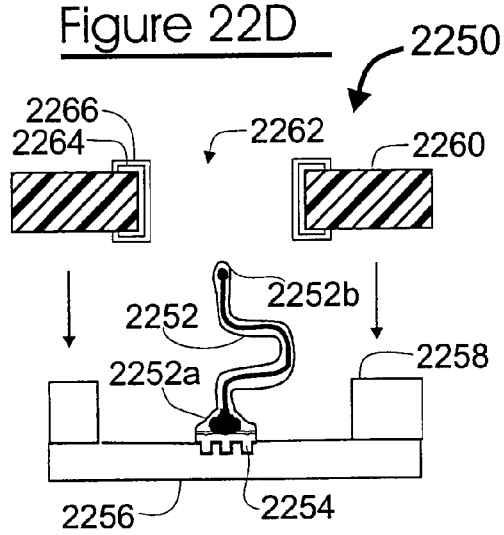
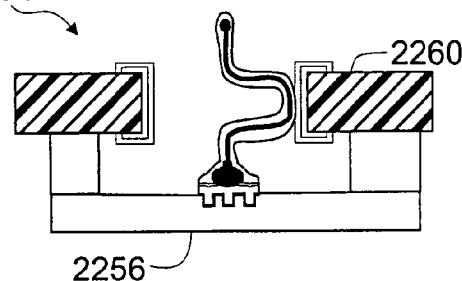
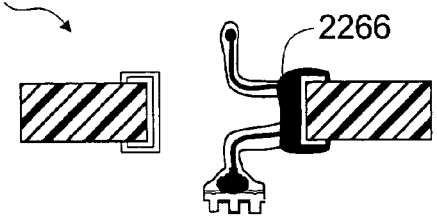

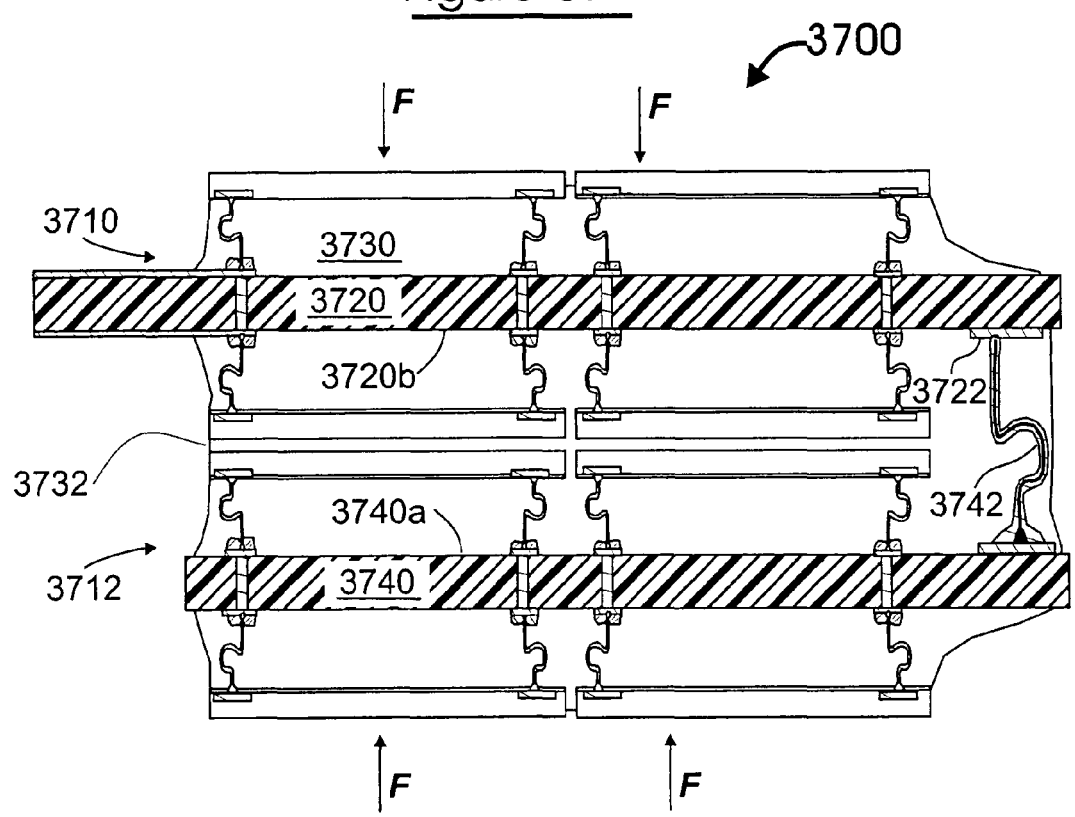

METHOD OF WIREBONDING THAT UTILIZES A GAS FLOW WITHIN A CAPILLARY FROM WHICH A WIRE IS PLAYED OUT

CROSS-REFERENCE TO RELATED APPLICATIONS

This application is division of U.S. patent application Ser. No. 12/500,495, filed Jul. 9, 2009, (abandoned) which is a division of U.S. patent application Ser. No. 11/758,479, filed Jun. 5, 2007 (abandoned), which is a division of U.S. patent application Ser. No. 10/035,633, filed Dec. 28, 2001 (now U.S. Pat. No. 7,225,538), which is a continuation of U.S. patent application Ser. No. 09/746,960, filed Dec. 21, 2000 (now U.S. Pat. No. 6,835,898), which is division of U.S. patent application Ser. No. 08/452,255, filed May 26, 1995 (now U.S. Pat. No. 6,336,269). Each of the foregoing U.S. patent application Ser. Nos. 12/500,495, 11/758,479, 10/035,633, 09/746,960, and 08/452,255 is incorporated herein in its entirety.

TECHNICAL FIELD OF THE INVENTION

The invention relates to contact structures for making electrical connections to, from and between electronic components, especially microelectronic components and, more particularly, to contact structures exhibiting resiliency and/or compliance.

BACKGROUND OF THE INVENTION

Due to its superior conductive and non-corrosive characteristics, gold is a "material of choice" for making electrical connections between electronic components. For example, it is well known to make a plurality of wire bond connections between conductive pads on a semiconductor die and inner ends of leadframe fingers. This is cited as one example of making permanent connections between a first, "active" electronic component (the die) and a second "passive" electronic component (the leadframe).

The present invention advantageously employs wire-bonding equipment in which, generally, wire (e.g., gold wire) is supplied from a spool through a capillary (also referred to as a "bonding head") and is bonded to a substrate. Generally, the nature of the bonding head will be determined by the nature of the bond to be made thereby. When the bonding head is for making a ball bond, it will generally be a "capillary". When the bonding head is for making a wedge bond, it will generally be a "wedge", these terms having recognized meanings in the art. To simplify matters, in the main hereinafter, the term "capillary" will be employed to indicate a bonding head suitable for making either ball or wedge bonds, applying thermal energy and/or compression during bonding.

The following US patents (cited, when applicable, by patent number, first named inventor, month/year of issue, and US Class/Subclass), incorporated by reference herein, are indicative of the state of the art of wirebonding:

(a) U.S. Pat. No. 5,110,032 (Akiyama, et al.; May 1992; USCL 228/102), entitled METHOD AND APPARATUS FOR WIRE BONDING, discloses wire (13) supplied from a wire spool (12) through a capillary (10). (In this patent, the wire 13 is insulated.) A control unit (20) is shown which includes a CPU (processor) and a memory unit (storage for software commands). The control unit exercises control over movement of the capillary, and over a discharge power circuit (18) which, in conjunction with a discharging electrode (17) is used to sever the wire with a discharge voltage.

(b) U.S. Pat. No. 3,460,238 (Christy, et al.; August 1969; USCL 227/111), entitled WIRE SEVERING IN WIRE BONDING MACHINES, is directed to a technique whereby the wire severing operation in a wirebonder comprises moving the bonding needle (or "capillary", as used herein) with holding pressure sufficient to frictionally engage the wire and insufficient to deform the wire away from the bond area. This patent is cited as exemplary of the fact that wire-bonding has been known for decades, and also of the fact that it is generally undesirable to "deform" the wire while moving the capillary.

(c) U.S. Pat. No. 5,095,187 (Gliga; March 1992; USCL 219/68), entitled WEAKENING WIRE SUPPLIED THROUGH A WIRE BONDER, discloses wire-bonding techniques wherein a wire is bonded to a contact on an electronic component by the application of one or a combination of heat, pressure and vibration. This patent discusses weakening or severing the wire by localized application of heat, and how the severing operation may result in a broadened portion on the severed end of the wire. The severing heat may be applied to the wire by means of an electrode from which an electric field can be made to extend to the wire such that an arc is created between the electrode and the wire. This patent describes a severing technique wherein a first portion of the arc is of a first polarity for weakening of the wire, and a second portion of the arc is of a reverse polarity for controlling dispersion of charged particles emitted from the wire.

(d) U.S. Pat. No. 4,860,433 (Miura; August 1989; USCL 29/605), entitled METHOD OF MANUFACTURING AN INDUCTANCE ELEMENT, discloses a technique of winding a coil of fine copper wire on a spool member on a substrate. The copper wire is insulated. It is known that the insulation will be removed from the end of the wire when an electronic flame off (EFO) spark severs the wire, such as at the conclusion of making a previous bond. An end portion of the wire is bonded to a conductive path on the substrate. Then, either the capillary or the substrate is rotated, and a table supporting the substrate may be moved in the vertical direction, to wind the coil of fine copper wire on the spool member. Finally, an opposite end portion of the wire is bonded to another conductive path on the substrate.

Packaging is another milieu (field of endeavor) wherein it is important to effect a plurality of electrical connections between a first electronic component and a second electronic component. For example, in a ceramic package, a semiconductor die is disposed in a cavity in a ceramic package and (typically) wire-bonded to conductive traces extending into the cavity. A plurality (e.g., an array) of pins are disposed on an external surface of the package, and the pins connected by internal traces (patterned conductive layers) and vias to the conductive traces extending into the cavity. The package may then be mounted to a printed circuit board (PCB) having a corresponding plurality (e.g., array) of holes, each hole receiving a corresponding one of the package pins. The pins are typically soldered to the plated-through holes in the PCB to effect a permanent connection between the first electronic component (the packaged semiconductor device) and the second electronic component (the PCB). Alternatively, the package may be received by a socket having a corresponding plurality (e.g., array) of holes, each hole receiving one of the package pins, to effect a temporary connection between the first electronic component (packaged semiconductor device) and the second electronic component (socket).

It is generally well known to protect semiconductor devices against moisture. To this end, various packages exhibit various degrees of hermeticity—ceramic packages generally providing superior protection against the environment at relatively high cost, plastic (e.g., resin) and PCB-type (encapsulated) packages exhibiting relatively poor protection against the environment at relatively low cost, to name a few. In order to have the "the best of both worlds"—namely good hermeticity at low cost, it is known to coat bond wires and their surrounding connections (to the die and to a leadframe, e.g.). One example is found in U.S. Pat. No. 4,821,148 (Kobayashi, et al., April 1989; USCL 361/392), entitled RESIN PACKAGED SEMICONDUCTOR DEVICE HAVING A PROTECTIVE LAYER MEAD OF A METAL-ORGANIC COMPOUND. In this patent, a silver electrode (4) on a leadframe (2) is bonded to an aluminum electrode (5) on a silicon chip (1). The resulting assembly is immersed in a solution of benzotriazole (BTA) in ethyl alcohol. An Ag-BTA film is formed on the surface of the silver electrode, an Al-BTA film is formed on the surface of the aluminum electrode, and a Cu-BTA film is formed on the surface of the copper wire. These three metal-BTA films protect the wire and the electrodes from damage by (environmental) dampness. Notably, in this patent, it is immaterial, at best, whether the metal-BTA films are conductive, interconnection (of die to leadframe) having previously (prior to coating) been achieved by the wire bond itself. Preferably, such a "hermetic" coating would not be conductive, as it would tend to short out the device (die).

Pins, i.e. elongated rigid electrically-conductive elements, are well known, and are generally brazed to pads on electronic packages (including chip carriers).

U.S. Pat. No. 3,373,481 (Lins, et al.; March 1968; USCL 29/471.3), entitled METHOD OF ELECTRICALLY INTERCONNECTING CONDUCTORS, discloses forming pin-like gold pedestal structures (13) atop terminal portions (12) of an integrated circuit device (10) by thermocompressing gold spheres (13, see FIG. 2) and shaping the spheres with a heated vacuum holder (14). The use of an ultrasonic bonder in lieu of the vacuum holder is discussed. As shown in FIG. 3 of the patent, a bond is formed between the pedestal structure (13) and what appears (in the side view) to be the entire surface of the terminal (12).

U.S. Pat. No. 4,418,857 (Ainslie, et al.; December 1983; USCL 228/124), entitled HIGH MELTING POINT PROCESS FOR AU:SN:80:20 BRAZING ALLOY FOR CHIP CARRIERS, discloses an exemplary technique for brazing pins to chip carrying substrates.

U.S. Pat. No. 4,914,814 (Behun, et al.; April 1990; USCL 29/843), entitled PROCESS OF FABRICATING A CIRCUIT PACKAGE, discloses filling an array of pin holes in a pin mold with lead/tin solder, which array of pin holes is in substantial registration with an array of conductive pads on one side of a chip carrier, heating the lead-tin solder in the pin mold such that the solder becomes molten and coalesces with the array of conductive pads on the chip carrier, thereby forming an array of miniature "pins" bonded to the array of conductive pads on the chip carrier. This permits the formation of elongated, solder terminals of controlled height and, apparently, of relatively high aspect ratio.

U.S. Pat. No. 4,955,523 (Carlomagno, et al.; September 1990; USCL 228/179), entitled INTERCONNECTION OF ELECTRONIC COMPONENTS, discloses a technique for interconnecting electronic components in which interconnection wires are bonded to contacts on a first component (such as a semiconductor die (1)) without the use of a material other than the materials of the contacts and the wires. The wires are then severed to a desired length of between two to twenty times the wire diameter (2d to 20d), and bonded to contacts on a second component (21) by means of a conductive material such as solder. The wires, once bonded to the first component, are severed at their desired length (by the bonding head (9) of a wirebonder) via an aperture (13) in the side wall of the bonding head. To this end, an electrode (51) is inserted into the aperture (13). As shown in this patent, the free-standing wires (7) have their ends inserted into pools (27) of conductive material such as solder in recesses of the second component. See also U.S. Pat. No. 5,189,507 (Carlomagno, et al.; February 1993; USCL 257/777), also entitled INTERCONNECTION OF ELECTRONIC COMPONENTS.

Surface mount technology solves certain problems associated with making interconnections between electronic components, but has proven itself not to be the panacea it was once envisioned to be. Generally, in surface mount technology (SMT), including flip-chip technology, solder bumps are formed on a face of a first electronic component, pads are provided on a face of a second electronic component, and the components are brought together, face-to-face, after which heat is applied to reflow the solder of the solder bumps. The challenges to effecting reliable surface mount include forming solder bumps with controlled geometry and high aspect ratio (ration of height to width), sometimes referred to as "solder columns".

U.S. Pat. No. 5,130,779 (Agarwala, et al.; July 1992 USCL 357/67), entitled SOLDER MASS HAVING CONDUCTIVE ENCAPSULATING ARRANGEMENT, describes "elongated" solder columns having high aspect ratios. On an "electronic carrier" (substrate), a pad is formed on which a first solder mass is deposited and capped with a metal layer. An additional (second) solder mass is formed atop the first solder mass. An additional (third) solder mass may be formed atop the second solder mass.

Burn-in and testing is another field of endeavor which employs a plurality of temporary connections to be made between a first electronic component such as a semiconductor die and a second electronic component such as a test card. As discussed in greater detail hereinbelow, this typically involves first packaging the semiconductor die, and contacting pins on the package with special test fixtures such as a "bed of nails" (array of springy pins) arranged in a pattern corresponding to the pattern of pins on the semiconductor package. The manufacture of such test fixtures is a specialty requiring a different test fixture for each array pattern, and is consequently both expensive and time-consuming.

Making resilient interconnections between electronic components is generally known to be desirable, and has been the object of prolonged endeavor. Often (e.g., typically), external connections to semiconductors devices are relatively rigid pins disposed on an exterior surface of a package. Some effort has been made in the past to implement resilient interconnection structures. In some instances, resilient connections have been effected with metal elements. In other instances, resilient connections have been effected with a combination of metallic elements and elastomeric elements.

One recent effort directed to making resilient connections is described in an article entitled *ELASTOMERIC CONNECTOR FOR MCM AND TEST APPLICATIONS*, ICEMM Proceedings, 1993, pages 341-346, which describes an "Elasticon" (tm) connector. The Elasticon connector uses solid gold or gold alloy wires for the conductive elements, embedded in an elastomer material (e.g., liquid elastomer resin injected into a mold cavity), and is generally targeted at the interconnection requirements for land grid array (LGA) packages for multichip (MCM) and single (SCM) chip modules. The size, shape and spacing of the wires, along with the elastomer material properties, can be tailored to specific application requirements which include MCM and SCM packaging, board-to-board and cable-to-board interconnections, as well as high density PCB and IC chip testing applications. The solid gold wires and the silicone elastomer material are impervious to corrosion. FIG. 1 of the article illustrates a basic embodiment of the Elasticon connector, wherein a plurality of wires are ball-bonded to a rigid substrate and extend straight at an angle (e.g., 45-85°) from the surface of the substrate. Attachment of the proximal ends of the wires to the substrate is by an angled flying lead wire bonding process using compressive force and ultrasonic energy applied through the capillary tip and thermal energy applied through the heated stage on the wirebonder. The capillary and substrate are positioned to allow a shear blade mechanism to sever the wire at the desired height and angle from the substrate surface. Electronic flame-off (EFO) is used to melt the wire extending from the capillary tip to start the next ball bond (of the proximal end of the next wire to be bonded to the substrate). After mounting all of the wires to the substrate, a ball-shaped contact is formed at the far (distal) end of each wire by a process of laser ball forming, and the plurality of wires are embedded in an elastomer material. The ball-shaped (enlarged) distal ends help prevent the wires from vibrating loose and causing shorts between contacts. As noted in the article, the angled orientation of the conductors is necessary to minimize plastic deformation of the wires as an Elasticon connector is compressed between two parallel surfaces. The angled orientation also provides a "wiping" contact surface which, when the connector is compressed, will cause the wires to rotate and slide against the mating contact surfaces. The article discusses the use of gold/palladium alloys and platinum for the wires. FIG. 3 of the article describes clustering wires in groups of one to four wires per contact, in conjunction with forming grooves in the elastomer between each group of wires. The various embodiments of the Elasticon connector described in the article require a substrate of ceramic, metal, silicon or epoxy-glass laminate material, and interposer embodiments require an etchable substrate material such as copper with a thin layer of gold on the top surface. FIG. 8 of the article describes integrated probe contacts and aptly notes that the ability to test for known good dies has been one of the stumbling blocks for MCM packaging. As shown therein, a probe matrix uses 2 mil (0.002 inch) diameter gold wires in an array. The probes can permanently be attached to the test module, or fabricated as an interposer structure. U.S. Pat. No. 5,386,344 (Beaman, et al.; January 1995; USCL 361/785), entitled FLEX CIRCUIT CARD ELASTOMERIC CABLE CONNECTOR ASSEMBLY, discloses a related "Elastipac" (tm) elastomeric cable connector.

Another illustrative effort at making resilient connections may be found in U.S. Pat. No. 5,299,939 (Walker, et al.; April 1994; USCL 439/74), entitled SPRING ARRAY CONNECTOR, which discloses independently bendable springs with significant horizontal elasticity, including sine, helix, cantilever, and buckling beam shapes in sheet and wire forms. A connector formed thereby provides substantial compliance in order to provide compensation for variations, including manufacturing tolerances, alignment tolerances, and thermomechanical expansion. Fabrication of the spring connectors proceeds generally as follows. A three-dimensional mandrel defines the inner surface shape of the spring (12). An insulating layer (50) is applied on the spring (12). A conducting layer (14) is applied on the insulating layer at predetermined locations. A plurality of springs (12) are formed as a unitary sheet layer of resilient material (38), which can readily be deposited (on the mandrel), such as nickel 96%-phosphorous 4% and nickel 97%-cobalt 3%. The mandrel is removed after depositing the spring layer (38). Alternatively, the mandrel may be "sacrificial", such as is known in the art of "lost wax" casting". Using a resilient wire as the spring layer (e.g., as an alternative to using a sheet) is discussed, and includes a wire (204), covered by an insulating layer (21), covered by a segmented conductive layer (212), covered by an outer insulating layer (214). The resulting spring connector is principally (if not solely) directed to making contact (versus attachment). As aptly set forth in the patent:

"a distinction must be made between two types of electrical connection: attachment and contact. Attachment is [a] relatively permanent connection and typically involves a durable metallic connection, such as solder, micro-brazing or micro-welding connection. Contact is a relatively temporary connection and implies a segmented connection between mating conductors, usually dependent upon a compressive force without the presence of a durable metallic connection."

Another illustrative effort at making resilient connections may be found in U.S. Pat. No. 4,067,104 (Tracy; January 1978; USCL 29/626), entitled METHOD OF FABRICATING AN ARRAY OF FLEXIBLE METAL INTERCONNECTS FOR COUPLING MICROELECTRONIC COMPONENTS. This patent discloses fabricating an array of cylindrical columns, such as several layers of indium, on active devices, such as semiconductors, wherein the columns can flex to accommodate differential thermal expansion.

U.S. Pat. No. 4,793,814 (Zifcak, et al.; December 1988; USCL 439/66), entitled ELECTRICAL CIRCUIT BOARD INTERCONNECT, discloses a connector arrangement for providing electrical interconnection between corresponding contact pads of opposed first and second circuit boards and includes an electrically nonconductive support member which includes resilient elastomeric material. An electrically conductive interconnect element extends through the thickness of the support and has a pair of pad engagement surfaces disposed to engage the respective contact pads.

U.S. Pat. No. 4,330,165 (Sado; May 1982; USCL 339/59), entitled PRESS-CONTACT TYPE INTERCONNECTIONS, discloses an interconnector composed of an elongated rod member (1) made of a rubbery elastomer, a plurality of linear electrically conductive bodies (2) embedded in the rod member (1), and two sheet members (3,3) bonded to the lateral surfaces of the rod member (1). The ends of the linear bodies (2) appear on the opposite surfaces, i.e. the top surface and the bottom surface, of the rod member (1), forming the contacting surfaces with the circuit boards between which the interconnector is to be mounted as sandwiched. The linear conductive bodies (2) are each a ribbon of, for example, a metal.

U.S. Pat. No. 4,295,700 (Sado; October 1981; USCL 339/61), entitled INTERCONNECTORS, discloses a press-type interconnector having rectangular connecting piece made of a sheet or film of elastic material, which is an assembly of alternating electroconductive elastic material and electrically-insulating material so that the rectangular piece, as a whole, has a plurality of electrically conductive paths (i.e., the electroconductive stripes). The rectangular connecting piece is sandwiched between two holding members which are made of an insulating material.

U.S. Pat. No. 3,795,037 (Luttmer; May 1974; USCL 29/628), entitled ELECTRICAL CONNECTOR DEVICES, discloses a plurality of bent or curved elongated flexible conductors embedded in, and extending between surfaces of a block of elastomeric insulating material. Exemplary flexible conductors are formed from any suitable electrically conductive resilient material such as, for example, phosphor bronze, and have exemplary cross-sectional dimensions on the order of 25 microns (μm), and may have a free length of 2 mm (millimeters).

U.S. Pat. No. 5,067,007 (Kanji, et al.; November 1991; USCL 357/54), entitled SEMICONDUCTOR DEVICE HAVING LEADS FOR MOUNTING TO A SURFACE OF A PRINTED CIRCUIT BOARD, discloses improving the reliability of surface-mount type packages so that when the packages are mounted to a wiring substrate the lead pins that receive load from the axial direction exhibit bending strength which is smaller than the junction strength at the junction portions. To achieve this object, the lead pins are made of a material having large resiliency such as fiber-reinforced material, a transformation pseudo elastic material, an ultra-high tension material, or a heat-resistant ultra-high tension material. This patent also points out the problem that, in the case of pin grid array (PGA) packages, all of the pins are not necessarily of the same length—the result of which is that some of the pins may not contact pads (e.g., on a test substrate). FIGS. 7A and 7B of this patent are of particular interest, wherein pins (20) have a particular shape and are formed of a particular material. The pins (20 are made of a material having Young's modulus of smaller than $15 \times 10^{10}$ Pa, and have their central portions curved in an arcuate form such that the displacement from the axial (straight) direction becomes greater than one half the diameter of the pins. Examples of materials satisfying the Young's modulus criteria are: highly pure copper (Cu), highly pure iron (Fe), highly pure nickel (Ni), copper alloy, and a composite wire comprising of a stringly (sic) resilient fine wire bundled with a soft metal such as copper as a binding material. With such a shape, and being formed of such materials, the deformation strength (yield strength) of the pins becomes smaller than the junction strength of either the brazing material (12, holding the pin to the package) or the solder (13, connecting the pin to the PCB). When thermal or mechanical stresses are exerted on the pins, they undergo elastic deformation to reduce the stress. In an exemplary embodiment shown in FIG. 1D and described with respect thereto, tungsten (W) molybdenum, carbon amorphous metal and fine wires having large resiliency are described. The fine wire may be a composite wire (11A) which is bundled together with a soft metal such as copper as the binding material. The composite wire has a plating (11B) which comprises gold (Au) or gold/nickel. Gold, as discussed hereinabove, is very soft, and inherently not resilient. As specifically mentioned in this patent, "the thickness of the plating is so small that the effect to the bending strength [of the composite wire 11A] can be neglected. The plating is effected for the purpose of easy soldering and, concretely (sic), has a thickness of 1 to 4 μm for nickel and 0.1 to 1 μm for gold." (see paragraph bridging columns 7-8).

U.S. Pat. No. 5,366,380 (Reymond; November 1994; USCL 439/66), entitled SPRING BIASED TAPERED CONTACT ELEMENTS FOR ELECTRICAL CONNECTORS AND INTEGRATED CIRCUIT PACKAGES, discloses a contact element for an electrical connector of for an integrated circuit package (ICP), which is particularly useful for surface mount applications. The contact element has a base portion, a spring portion having at least partially helical spring elements, and a tapered contact portion which mates in a biased manner with a conductive rim of a hole, and can be fabricated from a flat sheet with punching, rolling, and/or forming operations, thin-walled drawn parts, or modular parts. The contact elements are maintained in a compressed state by a hold-down mechanism. The contact elements can be associated with insulating housings and/or spacers which provide functions such as alignment, compression limitation, contact support, and installation fixturing.

U.S. Pat. No. 4,764,848 (Simpson; August 1988; USCL 361/408), entitled SURFACE MOUNTED ARRAY STRAIN RELIEF DEVICE, discloses mounting "roots" of relatively-thin pin-like electrical conductors (22) extending through pin holes in a substrate (16) to which an integrated circuit chip or similar electronic component or device (18) is mounted. The pins (22) are fabricated of an electrically conductive material such as copper, and each pin has at least two bends between its root and its tip for providing strain relief when the tip of the pin is connected to a surface.

U.S. Pat. No. 5,317,479 (Pai, et al.; May 1994; USCL 361/773), entitled PLATED COMPLIANT LEAD, discloses a curved lead which provides a mechanical and electrical connection between a board contact on a circuit board and a chip contact associated with a circuit chip. The curved lead is substantially entirely plated with solder, and is formed of a single piece of conductive material. Generally, the curved lead has two parallel surfaces, one for connecting with the chip contact and one for connecting with the board contact, and at least one curved portion therebetween. The leads are preferably formed from a thin strip of material and, for example, may be 0.018 inches wide and 0.070 inches in overall (e.g., prior to bending) length, and are preferably formed of thick copper beryllium and cobalt alloy 0.003-0.005 inches thick. The lead is covered with solder in a manner which is carefully controlled so that excess solder does not interfere with the desired compliance of the lead.

U.S. Pat. No. 4,989,069 (Hawkins; January 1991; USCL 357/74), entitled SEMICONDUCTOR PACKAGE HAVING LEADS THAT BREAK-AWAY FROM SUPPORTS, discloses a stress buffer frame (16) having flexible metal leads (26) reducing stress caused by the differing coefficients of thermal expansion of a semiconductor package and a printed circuit or the like on which the package is mounted. The leads are essentially flat ribbon-like leads, which are bent to extend away from the buffer frame, then bent again to have a portion (32) parallel to the buffer frame. Nickel/iron alloy is discussed as a material for the frame (and leads thereof).

One reason to provide a degree of compliance in electrical connections is to absorb stresses which occur due to thermal cycling. Generally, as a semiconductor device (die) operates, it generates heat. This causes the die to expand, often at a different rate than the package in which the die is mounted and, similarly, at a different rate than the electrical connections between the package and the die. (Assuming that the heat generated by the die is fairly uniform throughout the die, the die will tend to expand about its centroid, or center of symmetry.) This is similarly the case with surface mounted dies, with the die expanding at a different rate than the board to which it is mounted (and the electrical connections between the die and the board). The difference in thermal coefficients of expansion between the die and surrounding elements (e.g., package, board, electrical connections) results in mechanical stress. Generally, it is desired to account for, and to reduce, such thermally-induced mechanical stresses. For example, U.S. Pat. No. 4,777,564 (Derfiny, et al.; October 1988; USCL 361/405), entitled LEADFORM FOR USE WITH SURFACE MOUNTED COMPONENTS, discloses an electrical connection extending from an electronic component and connecting to a printed circuit board which is highly resistant to stress-related failures resulting from thermal cycling.

U.S. Pat. No. 5,086,337 (Noro, et al., February 1992; USCL 357/79), entitled CONNECTING STRUCTURE OF ELECTRONIC PART AND ELECTRONIC DEVICE USING THE STRUCTURE, discusses the desirability of having deformability (freedom) and "flexibility" (spring property) in a perpendicular (z) direction at the junctions between LSI chips (semiconductor dies having Large Scale Integration) and a wiring substrate. (see, e.g., column 4, lines 50-55). This patent discloses a connecting structure for electrically connecting an electronic part, such as an LSI chip, to a substrate, such as a wiring substrate, having an absorption function of the difference of thermal expansion in a horizontal direction (e.g., in the plane of the chip) and capability of displacement in a vertical (z-axis) direction. A representative embodiment of the connecting structure is shown in FIGS. 2(a), 2(b) and 2(c), wherein the connecting structure is in the form of a flat, spiral spring, a one end of the flat spiral spring being connected to a one electronic component, and another end of the flat spiral spring is connected to another electronic component. This allows for displacement of the two components in the z-axis, while maintaining a connection therebetween. The flat, spiral spring connectors are generally formed as a Cr—Cu—Cr "sandwich", which is annealed and coated with Au to improve its solder-wettability (Cr being comparatively non-wettable as compared with Au). See also U.S. Pat. No. 4,893,172 (Matsumoto, et al.; January 1990; USCL 357/79), entitled CONNECTING STRUCTURE FOR ELECTRONIC PART AND METHOD OF MANUFACTURING THE SAME. (It should be noted that, in the present patent application, the term "flexibility" is generally associated with plasticity, and that the term "resiliency" is generally associated with springiness.)

As a general proposition, it is much easier to fabricate a resilient contact structure on electronic components other than semiconductor dies, due to the fragility (delicate nature) of semiconductor dies. This has led to the development of "passive" electronic components which have resilient contact structures incorporated therein and which, in use, are disposed (i.e., interposed) between two electronic components having corresponding contact pads.

U.S. Pat. No. 4,642,889 (Grabbe; February 1987; USCL 29/840), entitled COMPLIANT INTERCONNECTION AND METHOD THEREFOR, discloses placing an interposer having interconnect areas between a circuit board and a device to be surface mounted with interconnect areas disposed between conductive strips on the circuit board and pads contained on the surface mount device. The interconnect area of the interposer has disposed therein a plurality of fine wires having flux and solder. The desirability of having a high solder pedestal so that substantial compliance will be available to compensate for thermal coefficient of expansion mismatch ("potato-chipping") is disclosed, as well as the desirability of implementing such high solder pedestals in an interposer.

U.S. Pat. No. 3,509,270 (Dube, et al.; April 1970; USCL 29/625), entitled INTERCONNECTION FOR PRINTED CIRCUITS AND METHOD OF MAKING SAME, discloses an insulating body (2) having an aperture (4) extending therethrough with a compression spring (6) inserted therein. The insulating body, with springs inserted into its apertures and extending out of the apertures, is sandwiched between two electrically conducting circuit members (8, 10), which are bonded to the insulating body with resin layers (12). The springs are disclosed as being made of gold alloy containing platinum, silver, copper and zinc, and may be provided with a coating of solder.

U.S. Pat. No. 3,616,532 (Beck; November 1971; USCL 174/68.5), entitled MULTILAYER PRINTED CIRCUIT ELECTRICAL INTERCONNECTION DEVICE, discloses a similar (to Dube, et al.) interconnection arrangement, wherein coil springs are compressed and inserted into a pot of molten solder, and subsequently withdrawn from the pot and the solder allowed to solidify to thereby hold the coils of the compression spring tightly together against the restoring force of the spring. These compressed springs are then inserted into apertures of an interposer-layer 24 which is disposed between two printed circuit boards (10, 12). The assembly (board, interposer with precompressed springs, board) is the heated such that the solder holding the coils of the springs again liquifies and releases the spring tension. The springs are therefore permitted to expand and to establish contact between the abutting printed circuit levels (boards).

U.S. Pat. No. 4,667,219 (Lee, et al.; May 1987; USCL 357/68), entitled SEMICONDUCTOR CHIP INTERFACE, discloses a connector plate (80) having a plurality of apertures (82) disposed beneath a semiconductor chip (18) having an array of contacts (44,46,48). The apertures of the plate are aligned with the contacts of the chip. A plurality of flexible conductors (described as S-shaped copper wires 84 in FIG. 8) extend through the respective apertures of the connector plate to connect (e.g., be soldered) to the chip contacts and terminals (transmission elements 64,67,72) disposed below the connector plate. Thus, each contact on the chip is flexibly and electrically coupled to a respective one of the terminals.

U.S. Pat. No. 4,705,205 (Allen, et al.; November 1987; USCL 228/180), entitled CHIP CARRIER MOUNTING DEVICE describes an "interconnection preform placement device" (also known as an "interposer"). In FIGS. 11A-11C, 12 and 13 of the patent there are described a variety of solder "preforms" which have S-shapes (FIGS. 11A, 11B, 11C) or C-shapes (FIG. 12), or a coiled spring configuration (FIG. 13). The preforms are disposed in apertures (holes) through support ("holder", "retaining") layers (e.g., 50 and 52 in FIG. 11A). The C-shaped preform is disposed around the edge of a support layer. The preforms are a "filled solder composition" (a solder material which contains a filler of discrete particles or filaments) or a "supported solder" (solder supported by a support strand or tape which is disposed about the outside of the solder preform shape), which will retain its shape upon the solder melting or reflowing. For example, the particles in a filled solder composition should have a melting point above the melting point of the solder. Filler materials such as copper, nickel, iron, and metal-coated high-temperature polymer or glass films are disclosed and, as mentioned, can be in the form of discrete particles (e.g., powders) or continuous lengths with a single strand or many strands in each preform.

As mentioned hereinabove, electronic components are often connected to printed circuit boards (PCBs), also known as printed wiring boards (PWBs). Printed circuit board (PCB) technology is well developed, and generally involves forming conductive traces on an insulating substrate to effect often complex interconnections between electronic components mounted to or plugged into the PCB. PCBs having conductive traces on both sides of the board are known, as well as multi-layer arrangements of alternating insulating and conductive layers. Additionally, effecting connections from layer-to-layer, within the PCB, are generally well known. A more comprehensive discussion of basic PCB technology can be found in *Printed Circuits in Space Technology*, Linden, Prentice-Hall Inc., 1962, incorporated by reference herein. It should clearly be understood that, in any of the embodiments described hereinbelow setting forth PCB substrates, these substrates can be formed of materials other than "traditional" printed circuit board materials. For example, the "PCB" substrate can be formed of one or more layers of plastic material, such as polyimide, optionally with conductive foil layers sandwiched therebetween, as is known. The term "circuitized" will also appear hereinbelow, and refers to the conductive patterns, and the like, present on PCB substrates.

U.S. Pat. No. 4,532,152 (Elarde; July 1985; USCL 427/96), entitled FABRICATION OF A PRINTED CIRCUIT BOARD WITH METAL-FILED CHANNELS, discloses a plastic substrate which is injection molded to provide a pattern of channels in at least on of its sides to define a predetermined set of conductive paths. Metallizing the substrate by flame spraying, electroless plating, electroplating, gas plating or vacuum deposition is disclosed. The substrate (e.g., 20 in FIG. 12) may be provided with plated through holes (58) permitting electronic components mounted on one side of the printed circuit board to be electrically interconnected to conductive paths on the other side of the printed circuit board. This patent is cited simply as being illustrative of plated through holes.

Generally, each of the aforementioned techniques for effecting electrical connections between electronic components requires its own "methodology"—in other words, each requires its own distinct type (e.g., bond wires, pins, etc.) of connection structure.

Moreover, each of the aforementioned techniques suffers from inherent limitations. For example, replacing a first electronic component that is permanently connected to a second electronic component typically requires carefully un-soldering the first electronic component from the second electronic component, then carefully soldering a replacement first electronic component to the second electronic component. Sockets address this concern, but add (often unacceptable) cost to the overall system. Moreover, socketing tends to exhibit inferior connection reliability, as contrasted with soldered connections. Surface mount techniques, such as the aforementioned technique of providing the first electronic component with solder balls and providing the second electronic component with conductive pads require carefully controlled processes to effect reliably, and do not lend themselves well to disassembly (replacement of one of the electronic components).

Returning to the popularity of using gold to make connections between electronic components, although gold exhibits excellent electrical conductivity, it suffers from certain shortcomings, as relevant to the present invention. For example, gold has a very low yield strength, a characteristic which makes it extremely counter-intuitive to employ a gold wire in (or as) a resilient contact structure. Simply stated, when physically stressed, gold (e.g., a gold wire) will tend to deform, and to retain its deformed configuration. This is called "plastic deformation".

Another shortcoming of using gold wires as an interconnect medium is gold's propensity to react with solder—namely with the tin content of common lead-tin solder. Notwithstanding this fact, certain "eutectic" materials are known, such as gold-tin, which tend to exhibit desireable interconnection properties. Eutectic materials and their properties are discussed in greater detail hereinbelow.

DISCLOSURE (SUMMARY) OF THE INVENTION

It is a general object of the present invention to provide improved techniques for interconnecting electronic components, especially microelectronic components.

It is another object of the present invention to provide improved techniques for mounting contact structures to electronic components, especially semiconductor dies.

It is another object of the present invention to provide improved techniques for fabricating resilient contact structures.

It is another object of the present invention to provide improved techniques for making electronic assemblies.

It is another object of the present invention to provide improved techniques for making wire bond connections to electronic components, including improvements in severing bond wires.

It is another object of the present invention to provide improved techniques for plating objects.

According to the invention, a flexible elongate member (such as a gold wire) is mounted to a contact area (such as a terminal or a pad) on a surface of an electronic component (such as a semiconductor die, a printed circuit board or a semiconductor package) and is configured to have a springable shape (such as a "wire stem" having at least one bend).

The elongate member functions as a "falsework" for a subsequent "superstructure" (overcoat) which is fabricated over the falsework. The superstructure includes at least one layer applied, such as by plating, over the falsework (or, over previously applied superstructure layers), and covers not only the falsework, but also a remaining area of the contact area on the substrate. The superstructure (overcoat) is a continuous structure covering the contact area and the wire stem.

A resulting resilient and/or compliant (springy) contact structure is thereby formed which is securely mounted to the electronic component and which may be used for effecting temporary and/or permanent connections of the electronic component to another electronic component, or which may be used to effect permanent (e.g., soldered) connections of the electronic component to another electronic component.

Generally, as used herein, compliance encompasses resilience (elastic deformation) and flexibility (plastic deformation). In some instances, both plastic and elastic deformation are desired. In other instances (such as contact structures used for probes), elastic deformation only is desired, but some plasticity may be acceptable. In other instances, true springs, exhibiting purely elastic deformation, are not desired, as they would impose too high of a load upon the substrate whereupon they are mounted. In other instances (such as contact structures on interposers), pure plasticity may be desired to accommodate non-planarity. The present invention permits tailoring the plastic and elastic deformation of a contact structure to the application (e.g., load conditions) for which it is intended.

According to an aspect of the invention, the stem may serve little purpose once the superstructure has been fabricated—a point which is driven home by the fact that, in certain embodiments of the invention, the stem can be partially or fully removed after fabricating the superstructure, without significantly diminishing the structural or electrical characteristics of the resulting resilient contact structure. Moreover, as described in greater detail hereinbelow, the stem need not be electrically conductive. Generally, once overcoated, the stem (if not removed) will have little or no structural impact on the mechanical characteristics of the resulting contact structure.

In most of the embodiments of the invention disclosed herein, the stem has a springable shape so that it can function as an "inchoate" resilient structure. However, in certain embodiments disclosed herein, the stem is simply formed to be straight—resiliency of the resulting contact structure not being of concern in these certain embodiments.

In an exemplary embodiment of the invention, the falsework (wire stem) is a gold wire having a diameter in the range of 0.0007-0.0020 inches (0.7-2.0 mils), and the superstructure (overcoat) is a nickel plating having a thickness in the range of 0.0001-0.0100 inches (0.1-10.0 mils).

According to an aspect of the invention, a plurality of resilient contact structures are mounted to an electronic component having a plurality of contact areas. For example, up to hundreds of resilient contact structures can be mounted to a semiconductor die or to a semiconductor package having up to hundreds of bond pads or package pads, respectively.

According to an aspect of the invention, a plurality of resilient contact structures can originate from contact areas at different levels on one or more electronic components, and can be fabricated so that they all terminate at a common plane, for connecting to another electronic component having a planar surface.

According to an aspect of the invention, two or more resilient contact structures can be fabricated on a single contact area of an electronic component.

According to an aspect of the invention, a first group of resilient contact structures can be fabricated on a first face of an electronic component (such as an interposer substrate), and a second group of resilient contact structures can be fabricated on a second, opposite face of the interposer substrate, for effecting electrical interconnections between two electronic components between which the interposer substrate is disposed.

Alternatively, both groups of resilient contact structures can originate from the same face of the interposer substrate, and one group can extend through openings in the interposer substrate to project from the opposite face of the interposer substrate.

Alternatively, resilient contact structures can be formed in through holes extending through support members, the resilient contact structures extending beyond the opposite surfaces of the support member to contact electronic components disposed against the opposite surfaces of the support member.

According to an aspect of the invention, certain improvements in wirebonding are disclosed, such as providing ultrasonic energy during playing a wire out of a capillary of a wirebonder, and such as providing ultraviolet light during severing the wire by electronic flame off (EFO) techniques.

According to an aspect of the invention, the rigidity (stability) of a "conventional" wire bond (such as a bond wire extending between a bond pad on a semiconductor die and a leadframe finger) can be improved by overcoating the bond wire with a superstructure. This is important, for example, in avoiding shorting adjacent wires during transfer molding of a package body.

Notwithstanding the many alternate embodiments described herein, generally, a wire is bonded at one end to a terminal, pad, or the like, is configured to have a springable shape, and is severed to be a free-standing wire stem. This is suitably performed with wire-bonding equipment. The wire itself, which may be a conventional gold bond wire, does not function as a spring. The ease with which it is shaped (e.g., into an S-shape) is generally contrary to its ability to function as a spring.

The free-standing wire stem is overcoated (e.g., plated) with a conductive, metallic material that serves two principal purposes:

(a) it is a springy (resilient) material such as nickel, so that the resulting overcoated wire stem (contact structure) can behave as a spring; and (b) it covers the terminal (or pad, or the like) to firmly anchor the wire stem (and the resilient contact structure) to the terminal.

In most of the embodiments disclosed herein, it is the overcoat material that effects the desired electrical interconnection. However, in certain embodiments, the wire stem is exposed at the tip (distal end) of the contact structure, and effects (or augments) the electrical interconnection.

Various applications for contact structures fabricated according to the techniques of the present invention are described, including mounting the contact structures to semiconductor dies, packages, PCBs, etc. The use of resilient contact structures as probes is also described. Bonding the wire stem to a sacrificial element (or member, or structure) is also described. Multi-layer coatings over the wire stem are also described.

Numerous additional features and embodiments of the invention are set forth hereinbelow, and it should be understood that certain features described with respect to certain embodiments are not necessarily limited to those certain embodiments.

Advantages of the present invention include, but are not limited to:

(a) resilient and/or compliant contact structures can be mounted directly to semiconductor dies either prior to singulating the dies from a semiconductor wafer or after singulating the dies from a semiconductor wafer;

(b) the resilient contact structures can be used to temporarily connect to the electronic component for procedures such as burn-in and testing of the electronic component, and the same resilient contact structures can be used to permanently connect to the electronic component.

Other objects, features and advantages of the invention will become apparent in light of the following detailed description thereof.

BRIEF DESCRIPTION OF THE DRAWINGS

Reference will now be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

FIG. 7A is a side view of a ceramic semiconductor package which has an array of resilient contact structures disposed in an array on an external surface of the package, according to the present invention.

FIG. 7B is a side cross-sectional view, partially in perspective, of a plastic semiconductor package which has an array of resilient contact structures disposed in an array on an external surface of the package, and which also has a plurality of resilient contact structures interconnecting a semiconductor die within the package, according to the present invention.

FIG. 7C is a side view of a PCB-based semiconductor package which has an array of resilient contact structures disposed in an array on an external surface of the package, according to the present invention.

FIG. 7D is a side view of an overmolded package wherein bond wires have been overcoated to enhance their strength, especially their stability during overmolding, according to the present invention.

FIG. 10J is a side view of an embodiment of a wire configured and overcoated to function as a probe, according to the present invention.

FIG. 10K is a side view of another embodiment of a wire configured and overcoated to function as a probe, according to the present invention.

FIG. 21 is a perspective view of another embodiment of an interposer, suitable for making engineering changes, according to the present invention.

FIGS. 22D-22F are side views of another embodiment of an interposer, according to the present invention.

FIG. 37 is a side view of an embodiment of an assembly of a printed circuit board having electronic components mounted thereto with resilient contact structures, and incorporating another electronic device, according to the present invention.

FIGS. 48A-48E are side views, partially in cross-section, of a technique for removing the wire stem after overcoating, according to the present invention.

FIGS. 49A-49C are side views, partially in cross-section, of a technique for forming a eutectic, braze-ready tip on a contact structure, according to the present invention.

FIGS. 50A and 50B are perspective views of techniques for providing contact structures with topographical (rough) tips, according to the present invention.

FIGS. 51A-51C are side views, partially in cross-section, of a technique for forming a contact structure with a demi-overcoat, according to the present invention.

FIGS. 52A-52D are perspective views of a technique for fabricating a resilient contact structure suitable for making interconnection to an exposed, middle portion of the wire stem, according to the present invention.

FIG. 52E is a perspective view of a technique for fabricating multiple free-standing contact structures without severing the wire stem, according to the present invention.

FIG. 52F is a side view of an alternate technique for fabricating multiple free-standing contact structures without severing the wire stem, according to the present invention.

FIGS. 53A and 53B are side views of an alternate technique for multiple free-standing contact structures without severing the wire stem, according to the present invention.

FIGS. 53C and 53D are side views, illustrating a technique for making free-standing wire stems, without electronic flame off, in this case, from loops, according to the present invention.

FIG. 54 is a side view, showing a portion of a contact structure interconnecting to an external component, according to the present invention.

In the side views presented herein, often portions of the side view are presented in cross-section, for illustrative clarity. For example, in many of the views, the wire stem is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

Figure 1:
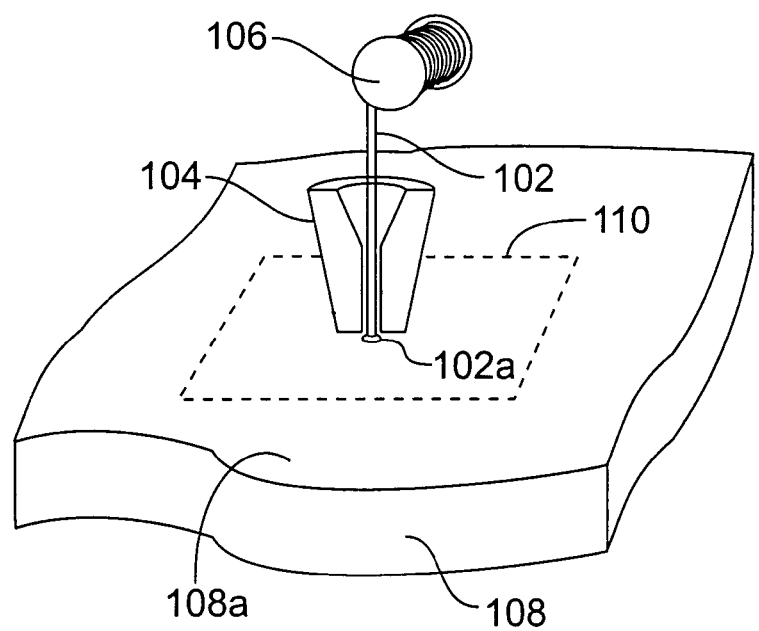
FIG. 1 is a perspective view of a supply wire having its free (proximal) end bonded to a substrate by a bonding head (capillary) of a wirebonder, according to the prior art.
Figure 2:
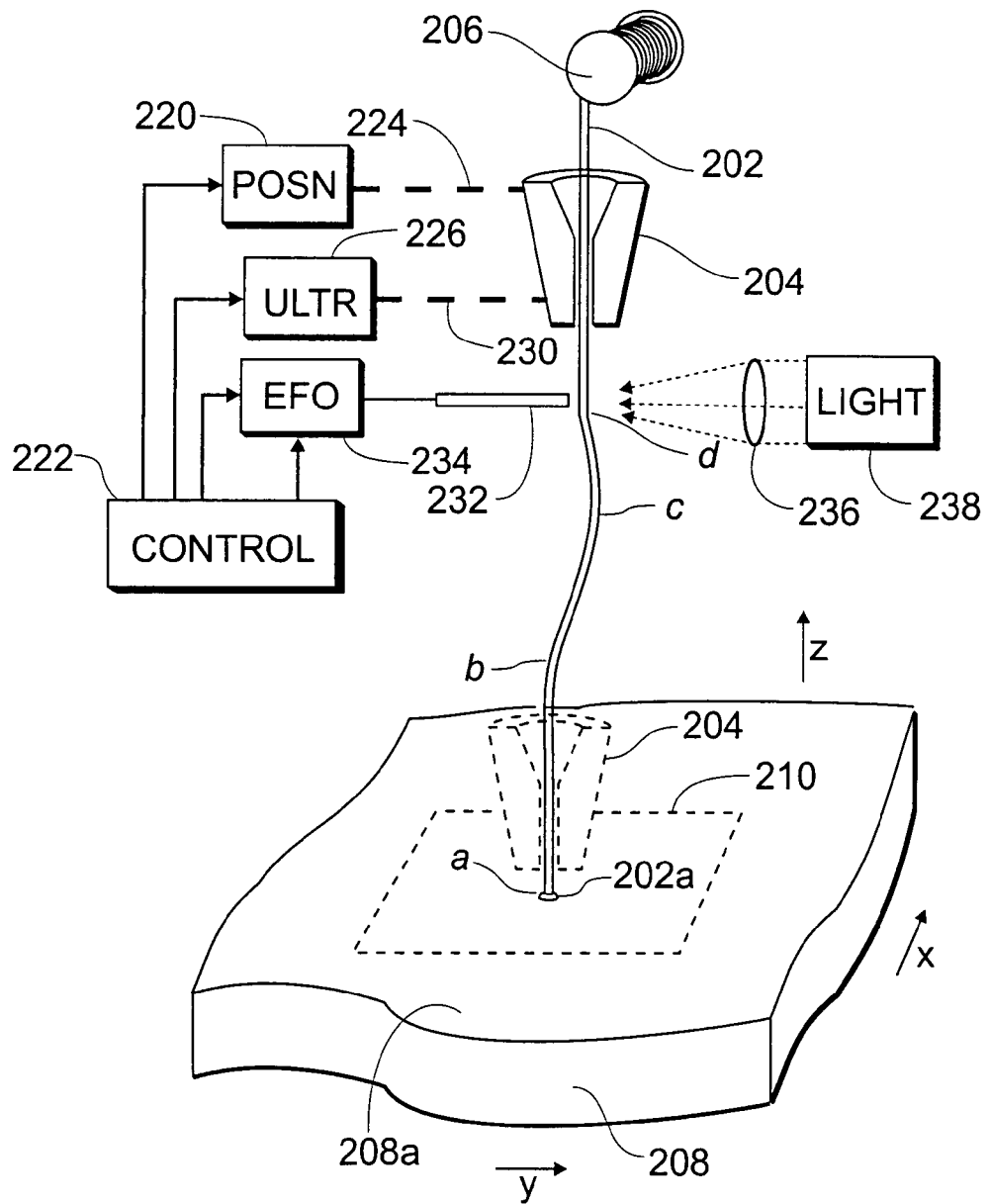
FIG. 2 is a perspective view of a wire, having had its free end bonded to a substrate, and configured into a shape, according to the present invention. This figure also schematically illustrates certain components of a preferred wirebonder (springing machine), according to the present invention.
Figure 8A:
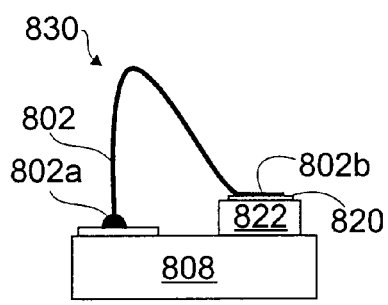
FIG. 8A is a side view of a wire configured into a loop, with the distal end of the wire bonded to a sacrificial element, according to the present invention.

In the figures presented herein, elements are often numbered with the Figure number as a "prefix", and the "suffixes" often refer to similar elements (e.g., element 108 of FIG. 1 is a substrate, as is element 208 of FIG. 2, as is element 808 in FIG. 8A).

DETAILED DESCRIPTION OF THE INVENTION

The aforementioned CASE-1, incorporated by reference herein, discloses a method for manufacturing raised (protuberant), resilient electrical contacts of precise shape and geometry on a wide variety of electronic components, said contacts having a controlled set of physical, metallurgical and mechanical properties, bulk and surface, to satisfy electrical, thermal or geometric requirements in various aspects of electronic interconnection applications.

Generally, a multiple step process is described wherein:
(a) wire stems are created on terminals of an electronic component;
(b) the wire stems are shaped in three-dimensional space to define skeletons of resulting contact structures;
(c) the wire stems are coated in at least one deposition step with a coating which envelops or jackets (partially envelops) the skeletons and the terminals. The common coating not only helps to "anchor" the protruding contact structures to the terminals, but also:
(1) provides for characteristics of the protuberant contacts with respect to long term stability of their engagement contact with mating electronic components;
(2) determines soldering assembly characteristics, as well as long term effects from contact with solder; and
(3) determines the mechanical characteristics of the resulting protuberant contact structure.

Generally, the wire serves as a "skeleton" of a resulting protruding contact (i.e., as a "proto" resilient contact), and the coating serves as its "muscle". In other words, the wire (which is shaped) defines a shape for the resulting contact, and the coating over the wire imparts the sought-after resilient (and conductive) properties to the contact. In this regard, the coating is considered to be a principal structural element of the contact, and to this end has a predetermined combination of thickness, yield strength and elastic modulus to ensure predetermined force-to-deflection characteristics of the resulting spring contacts. An important feature of the coating is that it is continuous. Employing a plurality of (such as two) wire stems to create a skeleton for a resilient contact is also discussed.

CASE-1 discloses mounting the resilient contact structures to a variety of electronic components, including:
(a) ceramic and plastic semiconductor packages;
(b) laminated printed circuit boards (PCBs), Teflon (tm) based circuit boards, multi-layer ceramic substrates, silicon-based substrates, varieties of hybrid substrates, and other substrates for integration of electronic systems known to those skilled in the art.
(c) semiconductor devices, such as silicon and gallium arsenide devices; and
(d) passive devices, such as resistors and capacitors.

CASE-1 discloses the following wire materials and dimensions:
(a) gold, aluminum or copper, alloyed (or doped) with beryllium, cadmium, silicon or magnesium;
(b) solder, specifically lead-tin solder wire;
(c) alloys of silver and platinum; and
(d) diameters ranging between 0.0005 and 0.0050 inches.

CASE-1 discloses employing the following wirebonders and techniques:
(a) ball-and-wedge;
(b) wedge-wedge;
(c) application of pressure, temperature or ultrasonic energy, or combinations thereof to form bonds;
(d) controlling the motion of the capillary to set the shape of the wire stem;
(e) programming the software of the control system of the wirebonder to exclude the common wedge bonding step for severing the wires. Instead, the same electronic or hydrogen flame-off used for ball formation prior to the ball bonding is employed to sever the wires at a predetermined height; and
(f) after the capillary moves up to a predetermined position, an electronic flame off (EFO) electrode is brought under high potential, resulting in generation of a spark which melts and severs the wire stem, and readies the feed end of the wire (from the supply spool) for the next stem bonding step.

According to the invention, any suitable means for severing the wire stem can be employed, including:
(a) Electronic Flame Off (EFO);
(b) mechanical means, such as a knife;
(c) laser; and
(d) Hydrogen torch.

CASE-1 discloses depositing tin as a first layer on a gold wire stem, with a subsequent reaction of gold and tin at a temperature below the melting temperature of gold-tin eutectic. A gold-tin alloy results, which is significantly stronger than (pure) gold.

CASE-1 discloses the following coating materials and dimensions:
(a) nickel, copper, cobalt, iron, and their alloys;
(b) noble or semi-noble metals or alloys, selected from a group consisting of gold, silver, rhodium, ruthenium and copper, and elements of the platinum group and their alloys;
(c) rhodium, ruthenium, or other elements of the platinum group, and their alloys with gold, silver and copper;
(d) tungsten;
(e) thicknesses between 0.00003 and 0.00700 inches;

According to the invention, palladium is also a suitable coating material.

CASE-1 discloses the following coating processes:

(a) wet electrochemical, e.g., through electrolytic or electroless aqueous solution plating of metals o the skeleton and on the terminal;

(b) electroplating of nickel out of nickel and its alloys, tensile strength in excess of 80,000 pounds per square inch (c) wave solder, or electrolytically deposited solder;

(d) physical (PVD) and chemical (CVD) vapor deposition methods, and also the deposition of conductive coatings through various decomposition processes of gaseous liquid or solid precursors.

CASE-1 discloses applying multi-layer coatings over a wire stem. For example:

(a) overcoating nickel (which has a strong tendency to oxidize) with a noble or semi-noble coating layer such as gold, silver, elements of the platinum group, and their alloys.

(b) selecting the multiple layers of the coating to tailor the properties of the protuberant contact to a given application.

CASE-1 discloses that the wire stem (skeleton) can be overcoated with a spring coating having local protrusions. Such a coating can be created through dendritic growth of an electroplated deposit, or through incorporation of foreign particulates into the conductive deposit. Alternatively, a regular uniform first deposit layer can be applied, which provides for resilient properties, and the subsequently deposited top layer incorporates local protrusions or particulates to complete the conductive overcoat. The local protrusions dramatically increase the local pressures exerted by the resilient protruding contact onto a mating terminal during the interconnection engagement, and reduce contact resistance when contacting easily passivating, oxide-forming materials overlying the engaged terminals.

CASE-1 discloses that improvement in the mechanical strength of the resulting contact can be achieved when a coating with a compressive internal stress is deposited, which effectively increases the stress level required to deform or break a resulting protuberant electrical contact. The compressive internal stress in the coating improves the spring characteristics of the resulting contact, as well as providing control over its strength and ductility levels.

CASE-1 discloses achieving coplanarity, in the context of:

(a) the uppermost points (distal ends) of the contacts can be made to extend to a vertical (above the surface of the electronic component) coordinate which is substantially identical (for all of the contacts on the electronic component).

(b) the contacts can originate from two or more electronic components, and their distal ends can be coplanar (all having the same vertical coordinate), for subsequent contact to another, planar, electronic component;

(c) the contacts can originate from different levels of an electronic component, and their distal ends can be made coplanar; and (d) the vertical coordinates of the tips (distal ends) of the contacts is readily controlled by a software algorithm implemented in the control system of a wirebonder.

CASE-1 discloses that the wire stem can span between a terminal and a sacrificial layer, said sacrificial layer being temporarily used for processes such as electroplating of the wire stem.

CASE-1 discloses that columns of solder having controlled (e.g., high) aspect ratios and shapes can be formed. In this context, the application of a barrier layer of 100-1000 microinch thick nickel alloy between the wire stem (especially gold) and the solder overcoat (especially lead-tin alloys, such as near-eutectic lead-tin) is described. Such solder columns are protuberant, but are not resilient. The use of multiple (e.g., two) wire stems per solder column is described as advantageous in causing bridging of the solder as opposed wetting only (with one wire stem).

CASE-1 discloses that "loops" can be formed by bonding both ends of the wire stem to a common terminal, and the loops can be employed as the skeletons of solder columns.

CASE-1 discloses that the suspension of the contact (such as by using a sacrificial arrangement) results in formation of controlled geometry spring contacts capable of resiliently engaging with mating terminals on a component or a substrate for testing, burn-in, or demountable electrical interconnect in service.

CASE-1 discloses that the contacts can be used as "replacements" for standard techniques for attaching pins to plastic and ceramic packages. This usefulness is due to the fact that pin-shaped contacts produced by the methods of the invention do not require pattern-specific tooling or molds.

CASE-1 discloses that a skeleton can be formed as a sequence of loop shapes, as a fence bounding a terminal, then filling in the bounded area with solder. Although not resilient, this provides a massive solder pad on the electronic component for thermal interconnection to heat sinks or substrates.

The invention described in CASE-1 is a dramatic departure from the prior art teachings of bond wires that are overcoated, in that:

(a) typically, such prior art overcoats are non-conductive and/or are targeted at providing protection from corrosion; and (b) the resilient contacts of the present invention advantageously combine the steps of shaping a skeleton (which may be inherently non-resilient, and which may in fact be non-conductive), then overcoating the skeleton with a spring coating (the outer layer of which must be conductive) to obtain a spring (resilient) contact structure.

Among the advantages of the resilient contact structure disclosed in CASE-1 are:

(a) the same contact structure can be used for demountable or permanent attachment of the electronic component.

(b) the spring (resilient) contacts can be used as a standard means of interconnect between substrates and components which have matching patterns of terminals, and can be used on an interposer structure for interconnecting two (or more) electronic components.

The aforementioned CASE-2, incorporated by reference herein, discloses contact structures for interconnections, interposers, and semiconductor assemblies, and methods for making same. Generally, the disclosure of this case "leverages" off the disclosure of CASE-1, insofar as the ability to make resilient contact structures is concerned.

CASE-2 discloses a number of specific uses for resilient contact structures are described, including a variety of interposer embodiments, wherein:

(a) a resilient contact structure is mounted to one side of an interposer substrate at a plated through hole, and a resilient contact structure is mounted to another, opposite side of the interposer substrate at the plated through hole;

(b) a resilient contact structure is mounted to one side of an interposer substrate at a plated through hole, and looped contact structure is mounted to another, opposite side of the interposer substrate at the plated through hole;

(c) a resilient contact structure having a portion extends from a plated through hole up from one side of the interposer substrate, and having another portion which extends through the through hole to beneath the interposer substrate;

(d) a molded plastic interposer substrate is provided with one set of holes extending into the substrate from one side thereof and another set of holes extending into the substrate from an opposite side thereof. Each pair of holes are offset slightly from one another (eccentric). The holes are plated with a conductive material. Because of the offset, each hole has a shoulder (at its bottom) from which a compliant contact structure can be formed. In this manner, a first set of contact structures extend out of one side of the interposer substrate, and another set of contact structures extend out of an other side of the interposer substrate, and the contact structures are electrically connected to one another by respective through hole plating.

CASE-2 discloses forming a contact structure comprising a plurality (three) skeleton structures spaces on a single contact pad and overcoated with solder, to form a solder post.

CASE-2 discloses forming a composite contact structure wherein a plurality (two or three) resilient contact structures are mounted on a single pad, and further describes securing the ends of the plurality of contact structures together with solder.

CASE-2 discloses forming a contact structure that can serve as a probe, and further describes a probing contact which includes a layer of dielectric material over which is disposed a metal layer to provide a shielded contact with controlled impedance.

CASE-2 discloses forming a contact pad at the free end of a probe contact structure, wherein the contact pad is provided with a plurality of sharp points, and wherein the free end of the probe contact structure is provided with a probe-like tip.

CASE-2 discloses disposing resilient contact structures on a semiconductor device (electronic component), with the tips of the contact structures aligned in two rows, with the uppermost tips of alternate contact structures in each row being offset from the uppermost tips of the other contact structure to provide a staggered arrangement making possible three dimensional fan outs.

CASE-2 discloses disposing contact structures having different configurations, with some having larger bends and other having smaller bends, on an electronic component. CASE-2 further describes staggering the orientation of each "type" contact structure in opposite directions. The utility of such a configuration for performing burn-in and testing of a semiconductor device, by yieldably engaging matching contact pads on a burn-in test substrate is discussed. The use of registration or alignment pins is also discussed. The possibility of having a fine pitch on the contact pads of the semiconductor device upon which the contact structures are mounted, and a coarser pitch for the tips of the contact structures is discussed.

CASE-2 discloses a number of semiconductor package assemblies, wherein resilient contact structures are mounted on one or two semiconductor devices which, in the case of two semiconductor devices, are provided on both opposite sides of a printed circuit board. The use of resilient contact structures as spring clips to secure the semiconductor device(s) to the printed circuit board is discussed. Forming resilient contact structures to insert snugly (and removably) within plated through holes is discussed. The use of alignment pins is also discussed, with respect to semiconductor package assemblies.

CASE-2 discloses incorporating an additional component, such as a capacitor in a large plated through hole of a printed circuit board, in a semiconductor package assembly.

CASE-2 discloses mounting additional components, such as capacitors, to a printed circuit board, in a semiconductor package assembly.

CASE-2 discloses a number of additional assemblies, employing the resilient contact structure.

In the description that follows, there will (inevitably) be some overlap with the disclosures of CASE-1 and of CASE-2, for the purpose of providing a complete disclosure herein. In the sections immediately following, there is a discussion of the steps of bonding a wire to a substrate, configuring the wire to have a "springable" (suitable to act as a spring, when overcoated with a spring material) shape, severing the wire to become a wire stem, and overcoating the wire to form a resilient contact structure which is well anchored to the substrate.

Bonding a Wire to an Area on a Substrate

FIG. 1, similar to FIG. 1 of CASE-1, shows a wire 102 feeding through a capillary 104 (shown in cross-section) of a wirebonder (not shown in this figure, see FIG. 2 for an illustration of a complete wirebonder). The wire 102 is fed to the capillary from a spool 106. The capillary 104 is brought towards a surface 108a of a substrate 108, so that the free end 102a of the wire 102 contacts the surface 108a of the substrate 108 and is bonded in any suitable manner thereto. Bonding a free end of a wire to a surface of a substrate is well known, and requires no further elaboration.

As shown in FIG. 1, the free end 102a of the wire 102 is bonded to the surface 108a of the substrate within an arbitrarily defined "contact area" 110 (shown in dashed lines). This contact area 110 may be of any shape (rectangular shown, can be circular or any other arbitrary shape), and is notably larger than and encompasses (subsumes) the location (relatively small area) whereat the free, bonded end 102a of the wire 102 is bonded to the surface 108a of the substrate 108.

As will be discussed in greater detail hereinbelow, the bonded end 102a of the wire 102 will, in many embodiments that follow, become the "proximal end" of a resulting "wire stem".

Figure 1A:
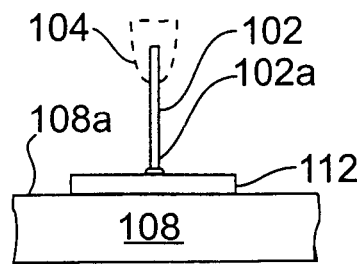
FIG. 1A is a side view of a wire having its free end bonded to a terminal on a substrate, according to the present invention.

FIG. 1A shows that the free end 102a of the wire 102 may be bonded to a conductive terminal 112 on the surface 108a of the substrate 108. The formation of a conductive terminal (or "pad", or "bond pad") on a surface of a substrate, and bonding a wire thereto is well known. In this case, the terminal 112 constitutes (defines) the contact area 110 (see FIG. 1). In FIG. 1A, the capillary 104 is shown in dashed lines, and is stylized.

Figure 1B:
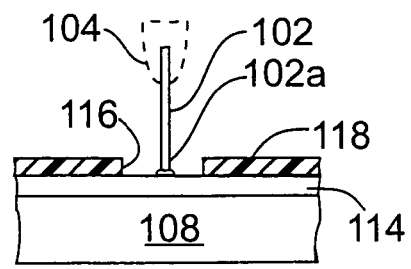
FIG. 1B is a side view of a wire having its free end bonded to a substrate, through an opening in a photoresist layer, according to the present invention.

FIG. 1B shows that the free end 102a of the wire 102 may be bonded to a metal (conductive) layer 114 on a (typically non-conductive, or semiconductive) substrate 108, through an opening 116 etched in an overlying layer of photoresist 118. In this case, the opening 116 in the photoresist constitutes the contact area 110 (see FIG. 1). In FIG. 1B, the capillary 104 is shown in dashed lines, and is stylized.

Figure 1C:
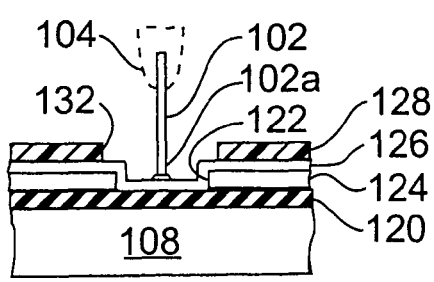
FIG. 1C is a side view of a wire having its free end bonded to a metal layer applied to a substrate, through an opening in a photoresist layer, according to the present invention.
Figure 1D:
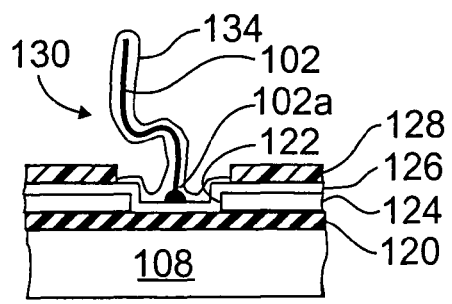
FIG. 1D is a side view of the substrate of FIG. 1C, with the wire overcoated, according to the present invention.
Figure 1E:
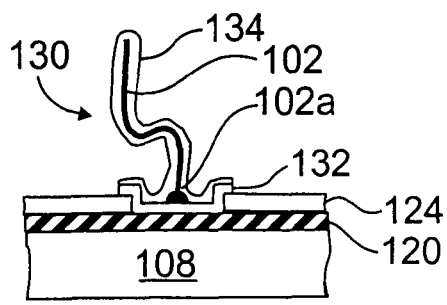
FIG. 1E is a side view of the substrate of FIG. 1D, with the photoresist layer removed and the metal layer partially removed, according to the present invention.
Figure 25:
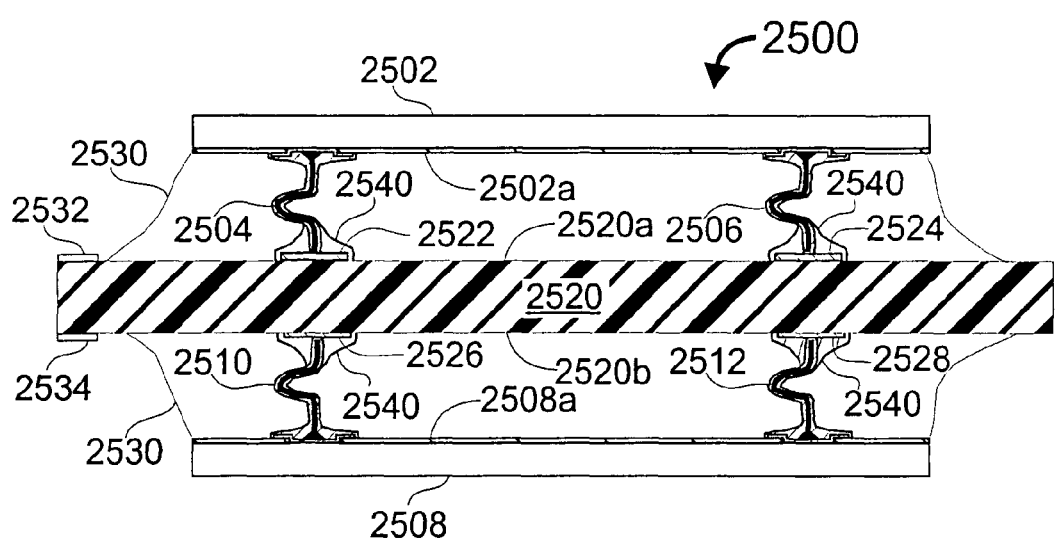
FIG. 25 is a side view of an embodiment of an assembly of a double-sided printed circuit board having electronic components mounted with resilient contact structures to both sides thereof, according to the present invention.

FIGS. 1C, 1D and 1E show a technique for bonding the free end 102a of the wire 102 to a surface of a substrate 108, which is a preferred technique for bonding the wire 102 to semiconductor substrates (see, FIGS. 25, et seq.). In FIG. 1C, the capillary 104 is shown in dashed lines, and is stylized. In FIG. 1C it is shown that the conductive layer 120 is (as in FIG. 1B) disposed on the top surface of the substrate 108. This layer 120 may be a top metal layer, which is normally intended for bond-out to the die, as defined by openings 122 in a passivation layer 124 (typically nitride). In this manner, a bond pad would be defined which would have an area corresponding to the area of the opening 122 in the passivation layer 124. Normally (i.e., according to the prior art), a wire would be bonded to the bond pad.

According to the invention, a blanket layer 126 of metal material (e.g., aluminum) is deposited over the passivation layer 124 in a manner that the conductive layer 126 conformally follows the topography of the layer 124, including "dipping" into the opening 122 and electrically contacting the layer 120. A patterned layer 128 of photoresist is applied over the layer 126 with openings 132 aligned over the openings 122 in the passivation layer 124. An important feature of this technique is that the opening 132 is larger than the opening 122. As will be evident, this will result in a larger bond area (defined by the opening 132) than is otherwise (as defined by the opening 122) present on the semiconductor die (108). The free end 102a of the wire 102 is bonded to the top (as viewed) surface of the conductive layer 126, within the opening 132. After the wire is configured to have a shape (as described hereinbelow with respect to FIGS. 2, 2A-2H) and is severed (as described hereinbelow with respect to FIGS. 4A-4D) to create a "wire stem", the wire stem is overcoated (as described hereinbelow with respect to FIGS. 5, 5A-5F). (For purposes of this discussion, an overcoated wire stem is a termed a "resilient contact structure" 130.) This is shown, in a general exemplary manner, in FIG. 1D, wherein it can be seen that a material 134 overcoating the wire stem (i.e., the shaped wire 102 which is shown in FIGS. 1D and 1E as a thick solid line) completely envelops the wire stem and also covers the conductive layer 126 within the area defined by the opening 132 in the photoresist 128. The photoresist 128 is then removed (such as by chemical etching, or washing), and the substrate is subjected to selective etching (e.g., chemical etching) to remove all of the material from the conductive layer 126 except that portion of the layer 126 which is covered by the material 134 overcoating the wire stem. This results in the structure shown in FIG. 1E, a significant advantage of which is that the contact structure 130 is securely anchored (by the coating material 134) to an area (which was defined by the opening 132 in the photoresist) which can easily be made to be larger than what would otherwise (e.g., in the prior art) be considered to be the contact area of a bond pad (i.e., the opening 122 in the passivation layer 124). In this case, the area defined by the opening 132 in the photoresist 128 is the contact area (110).

Figure 1F:
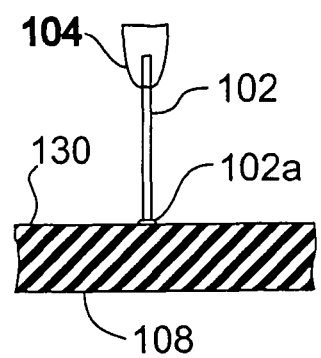
FIG. 1F is a side view of a wire having its free end bonded to substrate, which may be a sacrificial substrate, according to the prior art.

FIG. 1F shows that the free end 102a of the wire 102 may be bonded to a conductive (e.g., metallic, as indicated by single line cross-hatching) substrate 108 which, as will be discussed in greater detail hereinafter, may be a sacrificial substrate (e.g., a substrate that is dissolved away after bonding the wire thereto). In this case, the contact area 110 is not shown, but is arbitrarily defined in the manner indicated in FIG. 1. In FIG. 1F, the capillary 104 is shown in dashed lines, and is stylized.

In all of the cases set forth above (FIGS. 1, 1A, 1B, 1C-1E, 1F), which cases are intended to be exemplary and not limiting, the free end (102a) of the wire (102) is bonded within a defined area (110) on a substrate. However, as is readily apparent from the drawings, the bond (of the proximal end of the wire) itself occupies a relatively small area within the defined area (110). By way of example, the small area of the bond itself may be only 5-50% of the overall area of the contact area 110, and is preferably not at an edge of the contact area, but is preferably more-or-less centered within the contact area.

As is discussed hereinbelow, the wire stem will be overcoated with a material that imparts resiliency thereto, and that anchors itself to the entire contact area.

Properties of the Wire

The wire is an elongate element of a size and of a material that is easily fabricated into a shape (i.e., "flexible"), as discussed hereinbelow. As will become evident, it is not of particular importance to the present invention that wire is capable of conducting electricity between two electronic components since, the wire will (in most of the embodiments described hereinbelow) be entirely overcoated with a conductive material. However, it is certainly within the scope of this invention that the wire is made of a material that is conductive.

Generally, according to the present invention, the "existential" properties of the wire (i.e., its ability to be shaped and overcoated) tend to overshadow its structural or electrical properties. Moreover, once the wire stem is overcoated with a resilient, electrically-conductive material, the wire stem becomes largely superfluous.

An exemplary material for the wire is gold, in the form of a round (cross-section) wire, having a diameter (thickness) of approximately 0.0010 inches (1 mil). This includes, but is not limited to diameters in the range of 0.7-2.0 mils. The wire is preferably in the range of 0.0005 to 0.0030 inches (−3 mils). Such a wire will be very formable (into a desired shape), is an excellent electrical conductor, is very available, and exhibits good long term resistance to corrosion.

Gold wire is readily available from several suppliers, n a variety of sizes (e.g., 0.001 inch diameter) and compositions. For example:
  99.99% gold, plus beryllium;
  99.99% gold, plus copper;
  1% silicon aluminum alloy; and
  1% magnesium aluminum alloy.

Copper wire, preferably as pure as possible, is also readily available and suitable for use as the wire stem of the present invention.

Other (than gold) suitable materials for the wire, for which a similar range of diameters would be applicable, include:
  aluminum;
  copper alloyed with small amounts of other metals to obtain desired physical properties, such as with beryllium, cadmium, silicon and magnesium;
  gold, copper or aluminum alloyed with materials such as lead, tin, indium, cadmium, antimony, bismuth, beryllium and magnesium;
  silver, palladium, platinum;
  metals or alloys such as metals of the platinum group; and
  lead, tin, indium and their alloys.

Generally, a wire of any material that is amenable to bonding (using temperature, pressure and/or ultrasonic energy to effect the bonding) would be suitable for practicing the invention.

Preferably, the material of the wire is gold, aluminum, copper, or their alloys. For example:
  1. Gold, doped (alloyed) with Beryllium (e.g., less than 12 ppm, preferably 5-7 ppm) or Cadmium
  2. Aluminum doped with Silicon or Magnesium, alternatively with Silver or Copper
  3. Platinum/Palladium mixed with Copper/Silver As will be discussed in greater detail hereinbelow, in many of the embodiments described herein, the wire is severed to have a distal end and a length. The wire may have any desired length, but typically would have a length commensurate with its use in conjunction with small geometry semiconductor devices and packages, wherein its length would be: 0.010 inches to 0.500 inches. The wire need not have a circular cross-section, although such is preferred. The wire may have a rectangular cross-section, or may have a cross-section of yet another shape.

As discussed in greater detail hereinbelow (see FIGS. 51A and 51B), the wire stem can be formed of a non-metallic material, such as plastic, and can be overcoated to result in a resilient contact structure.

Traditional wirebonding requires robust bonds to be made at both ends of a wirebond loop to avoid, inter alia, de-cohesion. Bond strength is of paramount importance, and process constraints are relatively very rigid.

According to the present invention, the constraints for bonding a wire stem to a substrate are greatly relaxed (e.g., vis-a-vis traditional wirebonding). Generally, so long as the wire stem stays in place during shaping and overcoating, the bond strength is "sufficient". This also accounts for the wide variety of wire materials set forth hereinabove, the material generally being chosen for properties other than the robustness of a bond formed therewith.

Forming and Shaping of the Wire Stem

Once the free (proximal) end (102a) of the wire (102) has been bonded to the substrate (108), the capillary (104) is moved generally upward (in a z-axis direction) from the surface of the substrate and the substrate, which typically is mounted to an x-y table (not shown) is moved in the x- and y-directions. This imparts a relative motion between the capillary and the substrate which, in the main hereinafter, is described as the capillary being moved in three axes (x-axis, y-axis, z-axis). As the capillary moves, the wire "plays out" of the end of the capillary.

According to the invention, the relative motion between the capillary and the substrate is controlled, and imparts a desired shape to the wire.

In typical wirebonding operations, a free end of a wire is bonded (e.g., to a bond pad on a semiconductor die), the capillary moves up (to a prescribed height above the surface of the substrate), the substrate moves over (typically it is the substrate that is moved to impart relative motion in the x-y plane between the substrate and the capillary), and the capillary is moved back down (e.g., onto a bonding location on conductive traces of a leadframe, a semiconductor package, or the like). The wire plays out of the capillary during this relative movement of the capillary. Although this (e.g., up/over/down) movement of the capillary (in the prior art) imparts a generally arcuate "shape" to the wire (even a straight wire can be considered to have a "shape"), the "shaping" of the present invention is quite different.

As will be quite evident, the wire stem is shaped so that a contact structure comprising a wire stem that is overcoated, such as by plating, functions as a resilient contact structure. With this in mind, it is evident that the concept of "shaping" the wire, according to the present invention, is entirely different from any incidental (i.e., not intended to establish a resulting resilient contact structure) "shaping" of the prior art. As used herein, the concept of "shaping" the wire differs dramatically from the shaping of the prior art in the manner in which the wire is shaped, both in the underlying purpose of shaping the wire, and in the resulting geometry of the wire shape.

As will be discussed in greater detail hereinbelow, once the proximal end of the wire is bonded to the substrate, it is advertently (versus incidentally) "formed", "fashioned", or configured to have a definite, desirable geometric form which will serve as a what has been referred to in the parent cases as a "skeleton" for establishing the physical configuration of a subsequent coating over the wire which will conform to the shape of the wire and which will impart resiliency to a subsequent contact structure of the coated wire (other advantages of the coating, in addition to imparting resiliency to the shaped wire stem, are described hereinbelow). Hence, when the terms "configuring", "fashioning", "forming", "shaping" and the like, as used herein, they are specifically intended to be interpreted as having a meaning which describes the ability of the wire to establish a resulting configuration for a coating which will impart resiliency (springiness) to the resulting contact structure (coated wire).

Upon reading this patent application, one having ordinary skill in the art to which the present invention most nearly pertains will understand that once shaped and overcoated, the wire stem itself is essentially superfluous—the overcoat material providing the requisite electrical conductivity and desired mechanical characteristic of the resulting resilient contact structure. However, as will be evident, in certain embodiments of the invention, it is required that the wire stem is electrically conductive, since electrical contact will be made thereto.

In a sense, the wire stem of the present invention functions in a manner analogous to a "falsework"—a temporary scaffolding or support used in construction to establish the resulting shape of stone or brick arches. As a corollary to this analogy, the overcoat can be considered to function as a "superstructure".

In another sense, the wire stem functions in a manner analogous to a "mandrel"—a core around which other materials may be shaped.

In yet another sense, the wire stem functions as a "template"—a pattern or model for an item being made or synthesized.

It is understood that these analogies are not perfect, in that falseworks, mandrels and templates are typically removed after serving their intended purpose. In the case of the wire stem of the present invention, it is not necessary to remove the wire stem it is overcoated, although embodiments wherein the wire stem is removed are disclosed.

Perhaps a more apt analogy is that the wire stem serves as an "outline", in the manner that an outline can be created prior to writing a book. The outline describes what the book is "going to be", and may be included in the book, or it can be discarded after the book is written. In either case, the outline establishes the resulting form of the book.

In the parent cases, the shaped wire stem was referred to as a "skeleton"—a supporting structure or framework. This too is a useful choice of terms, in that a skeleton typically remains in place. Like the human skeleton (framework of bones) which determines the shape of the overlying tissue, the wire stem of the present invention establishes the shape of the resulting contact structure. However, unlike the human skeleton which must remain in place in order for the overlying tissue to perform its intended function, and which contributes significantly to the "mechanical" characteristics of the human body, the wire stem of the present invention need not remain in place in order for the overlying material coating to perform its intended function, and the wire stem does not contribute significantly to the mechanical characteristics of the resulting contact structure.

One of the significant advantages of using a readily-deformable, malleable, compliant material for the wire stem is that it is readily configured to establish a shape for the overcoat applied thereto, without significantly altering the physical properties (e.g., tensile strength, resiliency, etc.) of the resulting resilient contact structure. Inasmuch as the wire stem serves as an important first step in the overall process (begun, but not completed) of fabricating a resulting contact structure, the wire stem can be characterized as an "inchoate" contact structure.

Figure 2A:
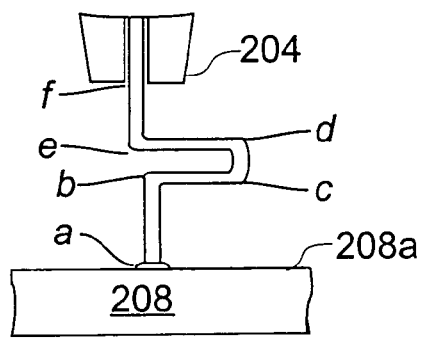
FIG. 2A is a side view of a wire, having had its free end bonded to a substrate, and configured into a shape which will support a resilient overcoat, according to the present invention.
Figure 2B:
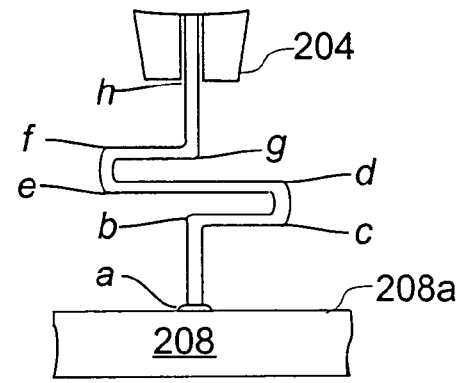
FIG. 2B is a side view of a wire, having had its free end bonded to a substrate, and configured into a shape which will support a resilient overcoat, according to the present invention.
Figure 2C:
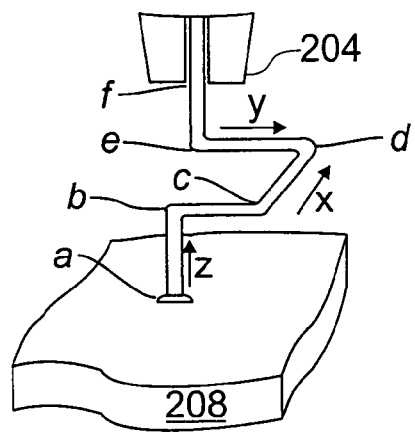
FIG. 2C is a perspective view of a wire, having had its free end bonded to a substrate, and configured into a shape which will support a resilient overcoat, according to the present invention.
Figure 2D:
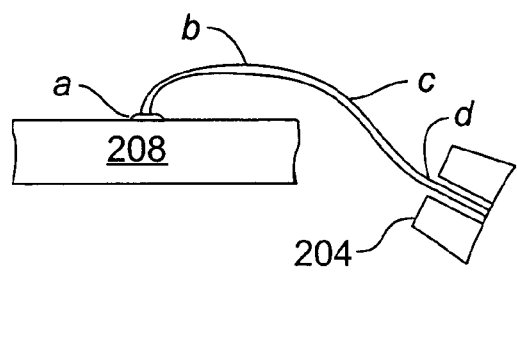
FIG. 2D is a side view of a wire, having had its free end bonded to a substrate, and configured into a shape which will support a resilient overcoat, according to the present invention.
Figure 2E:
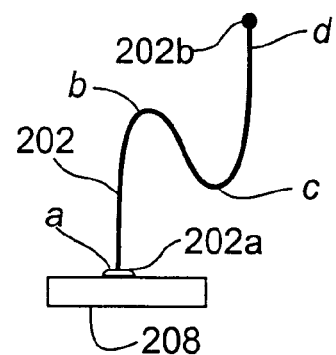
FIG. 2E is a side view of a wire, having had its free end bonded to a substrate, and configured into a shape which will support a resilient overcoat, according to the present invention.

Since the present invention is primarily targeted at fabricating resilient contact structures for interconnecting electronic components such as semiconductor dies, said resilient contact structures, in many cases, being barely visible to the naked eye, the contribution and configuration of the wire stem can more easily be visualized by taking a length (e.g., a six inch length) of malleable wire (such as 14 gauge copper wire, or comparable gauge lead-tin solder wire), mounting a one end of the wire in a hole in a wooden block, and manually (by hand) shaping a free-standing wire stem having any of the springable configurations described herein (e.g., those of FIGS. 2A, 2B or 2E). It will be seen that a compressive force (e.g., of several ounces, applied by the user's fingertip) applied at the tip of the wire stem, towards the block, will result in the wire stem deforming—there being very little "springiness" to the wire stem itself. An analogy to an overcoated wire stem formed according to the present invention would be more like a steel wire (such as a six inch length of coat hanger wire) shaped in the same manner as the solder, in which case the steel wire will exhibit noticeable springiness (or springback) when a compressive force is applied thereto. (It is understood that the steel wire is not an "overcoat" over a deformable wire stem.) The overcoat (e.g., of nickel) on an easily shaped wire stem (e.g., of gold) will exhibit resiliency analogous to that of the coat hanger wire.

In other words, whereas prior art wirebonding, involving bonding an end of a wire at a location, moving (up and over, then down) to another location, then bonding and severing could be considered as imparting a "shape" to the resulting wire, the (generally arcuate) resulting shape is relatively incidental. In contrast to this, according to the present invention, the wire is advertently (rather than incidentally) "fashioned", or "configured", essentially all along its length to have a particular functional (proto-spring) shape. Another useful terminology for describing imparting a to-be-resilient (when overcoated) shape to the wire is "convoluting" (or "configuring") the wire into a "convoluted" shape (or "configuration").

The general inability of a prior art wirebonding loop to function as a resilient contact structure, even if were overcoated (e.g., with nickel) can be demonstrated by inserting both ends of the aforementioned coat hanger wire into two holes in the wooden block, and applying the same compressive force thereto (at the top of the curve, rather than at the tip). Even with this "crude" model, the loss of springiness can readily be observed.

In many of the embodiments described hereinbelow, a wire is fashioned (configured) to have at least two bends, which also distinguishes the "fashioning" (configuring, shaping, forming) of a shape of the present invention from incidental, typically one bend shapes of the prior art. In another sense, the present invention contemplates advertently "developing" a shape which will function (once overcoated) as a spring in the wire.

In many of the embodiments described hereinbelow, the wire is configured to have a shape that commences in a particular direction (typically away from the surface of the substrate), then bends in one direction, then bends in another direction, then finishes in the same particular direction from whence it commenced (i.e., away from the surface of the substrate.

FIG. 2 shows a wire 202 (compare 102) which has had its free end 202a (compare 102a) bonded within a defined contact area 210 (compare 110) on a surface 208a (compare 108a) of a substrate 208 (compare 108), according to any of the techniques described with respect to FIGS. 1, 1A, 1B, 1C-1E or 1F (or other techniques, as described hereinbelow). An initial position of the capillary 204 (compare 104) is shown in dashed lines. A final position of the capillary 204 is shown in solid lines. The surface 208a of the substrate 208 lies in an x-y plane (although the overall surface of the substrate is not required to be planar). The final position of capillary 204 is shown in FIG. 2, in solid lines, as being displaced from the surface of the substrate in a positive z-direction. The wire 202 is fed from a supply spool 206 (compare 106) through the capillary 204, and is configured (to have a shape) in the following manner.

The free (proximal) end 202a of the wire 202 is bonded to the surface 208a of the substrate 208 at a point labelled "a", with the capillary 204 in its initial (dashed line) position. The capillary 204 is then moved along a trajectory of points, which are "generically" labelled "b", "c" and "d" in FIG. 2, to shape the wire in two or in three dimensions.

In the descriptions that follow, for the sake of descriptive clarity, movement of the capillary is discussed as indicative of relative motion between the substrate and the capillary. Often, movements in the x- and y-directions are achieved by moving the substrate (e.g., an x-y table to which the substrate is mounted), and movements in the z-direction are achieved by moving the capillary. Generally, the capillary is usually oriented in the z-axis. However, it is within the scope of this invention that capillaries with many degrees of freedom could be employed to configure the shape of the wire stem.

Generally, movement of the capillary 204 is effected by a positioning mechanism (POSN) 220 under the control of a microprocessor-based controller (CONTROL) 222, and is linked to the capillary 204 by any suitable linkage 224. As will be discussed in greater detail hereinbelow, this permits point-to-point control over the position of the capillary, to describe its trajectory.

As will also be discussed in greater detail hereinbelow, during its traverse of the trajectory, vibratory (e.g., ultrasonic) energy can be supplied to the capillary 204 by a suitable transducer (ULTR) linked 230 to, or mounted directly to, the capillary 204, and operating (e.g., on/off) under control of the controller 222.

As will also be discussed in greater detail hereinbelow, when the capillary has reached its final (solid line) position, the wire 202 is severed. This is illustrated in FIG. 2 by an electrode 232 positioned adjacent the wire 202 (typically at a fixed position with respect to the capillary 204), the electrode 232 receiving electrical energy from an electronic flame-off (EFO) circuit 234 which is operated under control of the controller 222.

As will also be discussed in greater detail hereinbelow, the operation of severing of the wire (e.g., by electronic flame-off) can be enhanced by providing ultraviolet light directed (e.g., by a lens 236) at the cutoff position (position "d" in FIG. 2) from an appropriate light source 238. As will be discussed in greater detail hereinbelow, the light (238) can be directed at a cutoff position (d) on the wire (202), or at the electrode (232), or between the electrode and the wire.

In the figures that follow, a number of exemplary configurations for wire stems are described.

FIG. 2A shows a wire 202 having its free (proximal) end 202a bonded to a point "a" on a surface 208a of a substrate 208. The capillary 204, shown in a final position (compare FIG. 2 final position) moves along a trajectory of points from "a" to "b", from "b" to "c", from "c" to "d", from "d" to "e", and from "e" to "f". From the point "a" to the point "b", the capillary 204 is moved in the vertical (z-axis) direction. From the point "b" to the point "c", the capillary 204 is moved parallel to the surface 208a of the substrate 208 in the y-axis direction. From the point "c" to the point "d", the capillary 204 is moved in the vertical (z-axis) direction to a position "d"

which is more vertically displaced (higher) from the surface 208a of the substrate 208 than the point "b". From the point "d" to the point "e" the capillary 204 is moved parallel to the surface 208a of the substrate 208 in the y-axis direction, opposite to (i.e., in the minus or negative y-axis direction) the direction in which the capillary 204 moved between the points "b" and "c". This "returns" the capillary 204 to a point ("e") which may (or may not) be directly above its starting point ("a"). From the point "e" to the point "f", the capillary 204 is again moved in the vertical (z-axis) direction. The point "f" is more vertically displaced (higher) from the surface 208a of the substrate 208 than the point "d". As is discussed in greater detail hereinbelow, the wire will be severed at the point "f", resulting in a free-standing wire stem having its proximal end bonded to the substrate and its distal end displaced from the surface of the substrate.

This movement of the capillary 204 along the trajectory a→b→c→d→e→f imparts a U-shape to the wire 202. It is, of course, assumed that the wire 202 is sufficiently ductile (e.g., formable) to acquire a shape (e.g., U-shape) which substantially conforms to the trajectory of the capillary. This U-shape is considered to be exemplary of two-dimensional forming of the wire.

As will be discussed in greater detail hereinbelow, the preferred materials for the wire will exhibit small, but noticeable, amounts of springback which must be accounted for in the trajectory of the capillary 204 to impart a desired shape to the wire. As will also be discussed in greater detail hereinbelow, once the capillary 204 has reached its final position ("f"), the wire is severed at (or adjacent to) the capillary 204.

FIG. 2B shows a wire 202 having its free end 202a bonded to a point "a" on a surface 208a of a substrate 208. The capillary 204, shown in a final position (compare FIG. 2 final position) moves along a trajectory of points from "a" to "b", from "b" to "c", from "c" to "d", from "d" to "e", from "e" to "f", from "f" to "g", and from "g" to "h". From the point "a" to the point "b", the capillary 204 is moved in the vertical (z-axis) direction. From the point "b" to the point "c", the capillary 204 is moved parallel to the surface 208a of the substrate 208 in the y-axis direction. From the point "c" to the point "d", the capillary 204 is moved in the vertical (z-axis) direction to a position "d" which is more vertically displaced (higher) from the surface 208a of the substrate 208 than the point "b". From the point "d" to the point "e" the capillary 204 is moved parallel to the surface 208a of the substrate 208 in the y-axis direction, opposite to (i.e., in the minus or negative y-axis direction) the direction in which the capillary 204 moved between the points "b" and "c". This "returns" the capillary 204 past a point ("e") which is not (but which may be) directly above its starting point ("a"). From the point "e" to the point "f", the capillary 204 is again moved in the vertical (z-axis) direction. The point "f" is more vertically displaced (higher) from the surface 208a of the substrate 208 than the point "d". From the point "f" to the point "g", the capillary 204 is moved parallel to the surface 208a of the substrate 208 in the y-axis direction, opposite to (i.e., in the positive negative y-axis direction) the direction in which the capillary 204 moved between the points "d" and "e". From the point "g" to the point "h", the capillary 204 is again moved in the vertical (z-axis) direction. The point "h" is more vertically displaced (higher) from the surface 208a of the substrate 208 than the point "f". As is discussed in greater detail hereinbelow, the wire will be severed at the point "h", resulting in a free-standing wire stem having its proximal end bonded to the substrate and its distal end displaced from the surface of the substrate.

This movement of the capillary 204 along the trajectory a→b→c→d→e→f→g→h imparts an S-shape to the wire 202. Again, it is assumed that the wire 202 is sufficiently ductile (e.g., formable) to acquire a shape (e.g., S-shape) which substantially conforms to the trajectory of the capillary and, as will be discussed in greater detail hereinbelow, the preferred materials for the wire will exhibit small, but noticeable, amounts of springback which must be accounted for in the trajectory of the capillary 204 to impart a desired shape to the wire. As will also be discussed in greater detail hereinbelow, once the capillary 204 has reached its final position ("h"), the wire is severed at (or adjacent to) the capillary 204.

This S-shape of the wire 202, if there is no x-axis displacement during movement of the capillary along the trajectory, is considered to be exemplary of two-dimensional forming of the wire. Evidently, the capillary could be moved in the x-axis in conjunction with any of the aforementioned movements from point-to-point (e.g., while moving from the point "d" to the point "e"), in which case the shape of the wire would be more complex than a simple S-shape and would be considered to be a three-dimensional forming of the wire.

FIG. 2C shows a wire 202 having its free end 202a bonded to a point "a" on a surface 208a of a substrate 208. The capillary 204, shown in a final position (compare FIG. 2 final position) moves along a trajectory of points from "a" to "b", from "b" to "c", from "c" to "d", from "d" to "e", and from "e" to "f". From the point "a" to the point "b", the capillary 204 is moved in the vertical (z-axis) direction. From the point "b" to the point "c", the capillary 204 is moved parallel to the surface 208a of the substrate 208 in the y-axis direction. From the point "c" to the point "d", the capillary 204 is moved in parallel to the surface 208a of the substrate 208 in the x-axis direction to a position "d" which is substantially at the same y- and z-axis coordinates as the point "c". From the point "d" to the point "e" the capillary 204 is moved parallel to the surface 208a of the substrate 208 in the y-axis direction, opposite to (i.e., in the minus or negative y-axis direction) the direction in which the capillary 204 moved between the points "b" and "c". This "returns" the capillary 204 to approximately the same y-axis coordinate as the point "b", but at another (offset) x-axis coordinate than the point "b". From the point "e" to the point "f", the capillary 204 is again moved in the vertical (z-axis) direction. The point "f" is more vertically displaced (higher) from the surface 208a of the substrate 208 than the point "d", is at approximately at the same vertical (z-axis) coordinate as the point "b", and is offset in the x-axis from the points "a" or "b". As is discussed in greater detail hereinbelow, the wire will be severed at the point "f", resulting in a free-standing wire stem having its proximal end bonded to the substrate and its distal end displaced from the surface of the substrate.

This movement of the capillary 204 along the trajectory a→b→c→d→e→f imparts a three-dimensional shape to the wire 202. Again, it is assumed that the wire 202 is sufficiently ductile (e.g., formable) to acquire such a shape which substantially conforms to the trajectory of the capillary and, as will be discussed in greater detail hereinbelow, the preferred materials for the wire will exhibit small, but noticeable, amounts of springback which must be accounted (compensated) for in the trajectory of the capillary 204 to impart a desired shape to the wire. As will also be discussed in greater detail hereinbelow, once the capillary 204 has reached its final position ("f"), the wire is severed at (or adjacent to) the capillary 204.

FIG. 2D illustrates, generally, that the final position of the capillary 204 need not be above the substrate 208, but can be off the edge, and below the surface 208a of the substrate. In FIG. 2D, the wire 202 has its free end 202a bonded to a point "a" on a surface 208a of a substrate 208. The capillary 204, shown in a final position (compare FIG. 2 final position) moves along a trajectory of points from "a" to "b", from "b" to "c", and from "c" to "d". As is discussed in greater detail hereinbelow, the wire will be severed at the point "d", resulting in a free-standing wire stem having its proximal end bonded to the substrate and its distal end displaced from the surface of the substrate. In this case, the point "d" is below the surface of the substrate (rather than above the surface as in the embodiments of FIGS. 2A, 2B and 2C).

From the point "a" to the point "b", the capillary 204 is moved in an arcuate trajectory vertically upward from the surface 208a of the substrate 208 (in the positive z-axis direction) and horizontally away from the point "a" (in the positive y-axis direction). The point "b" represents the maximum vertical (z-axis) displacement of the capillary 204 above (in the positive z-axis direction) the surface 208a of the substrate 208. From the point "b" to the point "c", the capillary 204 is moved in an arcuate trajectory vertically downwards towards the surface 208a of the substrate 208 (in the negative z-axis direction) and further horizontally away from the point "a" (in the positive y-axis direction). The point "c" is nominally at the same z-axis position as the point "a". Notably, however, the point "c" is off the edge of the substrate. From the point "c" to the point "d", the capillary 208 is moved in an arcuate trajectory further vertically downwards beyond the surface 208a of the substrate 208 (in the negative z-axis direction) and further horizontally away from the point "a" (in the positive y-axis direction). The point "d" is thus at a lower (z-axis) position than the surface 208a of the substrate 208, and is clearly off the edge of the substrate.

This movement of the capillary 204 along the trajectory a→b→c→d imparts a two-dimensional shape to the wire 202. It is, however, within the scope of this invention that a three-dimensional shape could be imparted to the wire 202, such as by imparting some x-axis movement to the capillary during its traverse of the trajectory (e.g., between the points "a" and "b"). Again, it is assumed that the wire 202 is sufficiently ductile (e.g., formable) to acquire a shape which substantially conforms to the trajectory of the capillary and, as will be discussed in greater detail hereinbelow, the preferred materials for the wire will exhibit small, but noticeable, amounts of springback which must be accounted for in the trajectory of the capillary 204 to impart a desired shape to the wire. As will also be discussed in greater detail hereinbelow, once the capillary 204 has reached its final position ("d"), the wire is severed at (or adjacent to) the capillary 204.

As shown in FIG. 2D, the capillary 204 has changed its orientation from vertical at the position "a" to nearly horizontal at the position "b". This is beyond the capability presently available in most wirebonders, which typically maintain the capillary in a fixed, vertical orientation, and move the capillary only in the z-axis direction, while the substrate is moved (by an x-y table) in the x- and y-directions. As explained in greater detail hereinbelow, maintaining a vertical orientation of the capillary throughout its traverse of the trajectory (for example, the trajectories illustrated in FIGS. 2A, 2B and 2C) causes the wire to "drag" as it is played out of the capillary. This nuance is addressed by a feature of the invention discussed hereinbelow.

In any of the trajectories described herein, it is contemplated that the capillary (204) will move only in the z-axis direction, and that the x- and y-movement will be imparted by an x-y table to which the substrate is mounted. This would, quite evidently, exacerbate the dragging (stiction) of the wire as it plays out of the capillary in a configuring operation such as is illustrated with respect to FIG. 2D.

Figure 2F:
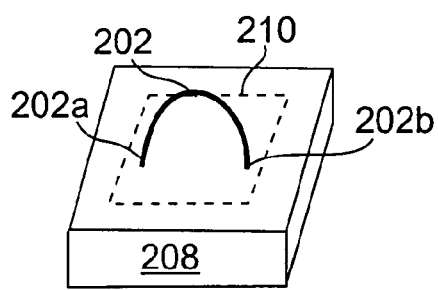
FIG. 2F is a side view of a wire, having had its free (proximal) end bonded to a substrate, and its opposite (distal) end also bonded to the substrate, in a "loop" embodiment of the present invention, wherein the wire loop can be overcoated with solder, according to the present invention.
Figure 2G:
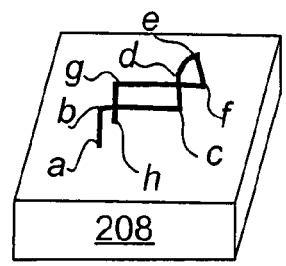
FIG. 2G is a side view of a wire, having had its free (proximal) end bonded to a substrate, configured into a shape which will support a resilient overcoat, and having its opposite (distal) end also bonded to the substrate, according to the present invention.

FIGS. 2E, 2F and 2G illustrate other, viable shapes into which the wire 202 may be configured, wherein the wire 202 is bonded at a proximal end 202a to an exemplary terminal 212, and a distal end 202b of the wire has a region of increased diameter in the form of a ball. These figures are intended to be illustrative, and not limiting, of the large number of shapes that can readily be fabricated.

For example, in FIG. 2E, the wire has been configured to have an S-shape. Notably, as is the case in the embodiments of FIGS. 2A, 2B and 2C, the resulting wire stem commences in a first direction (i.e., from the point "a" to the point "b") which is directly away from the surface of the substrate, and finishes generally in the same direction (i.e., from the points "c" to "d").

In FIG. 2F, a simple loop shape is configured, wherein both the proximal 202a and distal 202b ends of the wire 202 are bonded within the bond area 210. Loops such as this are discussed in greater detail hereinbelow, and generally intended to serve as bump contacts, not as resilient contact structures.

In FIG. 2G, a loop-type resilient contact structure is shown wherein a wire is configured three-dimensionally between the points a→b→c→d→e→f→g, and both the proximal (point "a") and distal (point "g") ends of the wire are bonded to the substrate (in a manner similar to the embodiment of FIG. 2F). In this case, a free-standing structure is fashioned, wherein an intermediate portion of the wire stem (between the points "d" and "e") is intended for making an electrical connection to another electronic component.

Figure 2H:
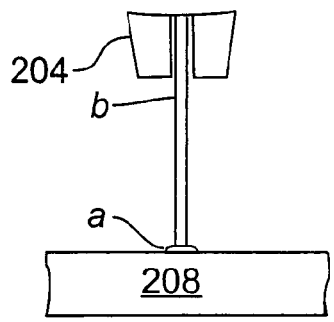
FIG. 2H is a side view of a wire, having had its free end bonded to a substrate, and configured into a straight, pin-like shape, according to the present invention.

FIG. 2H shows a wire 202 having its free end 202a bonded to a point "a" on a surface 208a of a substrate 208. The capillary 204, shown in a final position (compare FIG. 2 final position) moves along a trajectory of points from "a" to "b". From the point "a" to the point "b", the capillary 204 is moved in a straight line to a position ("b") which is displaced from the point "a" in the vertical (positive z-axis) direction. The point "b" is illustrated as having the same y-axis coordinate as the point "a", but this is not necessary. Moreover, during its traverse from the point "a" to the point "b", the capillary 204 may also move in the positive or negative x-axis directions. In any case, a wire (202) extending from points "a" to "b" will be straight, and may be normal (i.e., at 90°) to or at an angle (not normal to) the surface 208a of the substrate 208.

This movement of the capillary 204 along the trajectory a-b imparts a two-dimensional shape to the wire 202. Springback of the wire is not a profound issue in this straight-line forming of the wire. Again, as will also be discussed in greater detail hereinbelow, once the capillary 204 has reached its final position ("b"), the wire is severed at (or adjacent to) the capillary 204. Evidently, forming a straight wire is a "trivial" case of shaping and, although included in the overall technique of fashioning a wire into a shape, according to the present invention, is not intended in any way to be limiting of the other, less "trivial" embodiments discussed hereinabove. Evidently, a straight wire stem such as is shown in FIG. 2H does not exhibit a springable shape, per se. Forces directed axially along the straight wire stem will simply cause the straight wire stem to buckle. With a resilient overcoat, a resulting contact structure may exhibit some restorative force. On the other hand, the free-standing straight wire stem will behave as a "cantilever" in response to forces directed off axis at the straight wire stem (whether the wire stem itself is inclined or the force itself is off-axis).

It should be understood that the exemplary trajectories of the capillary 204 have been illustrated and described with an artificially small number of points (a, b, c, d, etc.), for illustrative clarity and that, in practice, a large number of points along the trajectory can (i.e., should) be programmed into the controller 222.

It should also be understood that at every change of direction of the capillary 204, such as the change from z-axis movement from "a" to "b" and the y-axis movement from "b" to "c" (see any of FIGS. 2A, 2B or 2C), the resulting bend of the wire should have a radius, rather than a sharp right angle bend.

The shapes fashioned in FIGS. 2A, 2B, 2C, 2E and 2G all include at least two bends. Generally, an even number of L- or U-shaped bends of opposite orientation (from one another) will be required to terminate the wire in the same, positive z-axis direction from when it originated (for example, the wire # in FIG. 2E commences its "journey" from the points "a" to "b" in the positive z-axis direction, and completes its journey from the points "d" to "e" in the same, positive z-axis direction). This can be interpreted as creating a "class" of shapes suitable as the basis of resilient contacts, each shape including at least two bends, including S-shaped wire stems.

An S-shape such as is shown in FIG. 2E is merely exemplary, and is not intended (nor should it be interpreted) as limiting. Many, many shapes for the wire stem will serve as the basis for a resilient contact structure, according to the invention. Of note, however, is the fact that the S-shape (e.g., of FIG. 2E) is sideways, as contrasted with (for example) the S-shape shown in the aforementioned U.S. Pat. No. 5,317,479. In that patent, the plated compliant lead contacts pads on electronic components by the surfaces of its parallel "legs". In the present invention, it is preferred that the resilient contact structure contacts a pad on an electronic component by its distal tip. (In a similar manner, the proximal end is bonded to a contact area by an analogous tip of the resilient contact structure.)

Generally, according to the invention, the shape of the resilient contact structure will be modelled for each application, for given stress, spacing, compliance and electrical performance criteria.

As a general proposition, any desired shape for the wire stem can be fashioned using a wirebonder. As noted hereinbelow (see FIGS. 51A and 51B), for non-metallic wire stems, apparatus other than wirebonders are suitably employed to form a stem having a springable shape.

Types of Wirebonders

The present invention can be implemented using conventional wirebonding machines (wirebonders). However, it is preferred that certain "improvements" be made to these machines which will facilitate the formation of the resilient contact structures of the present invention.

The conventional wirebonders that may be employed to implement the present invention include wirebonders that employ any combination of ultrasonic energy, thermal energy and compressive forces to form a ball, wedge or other suitable bond between the free end of a wire and a substrate including, but not limited to:

(a) ultrasonic wirebonders;
(b) thermosonic wirebonders; and
(c) thermocompression wirebonders.

According to an aspect of the invention, the functionality of conventional wirebonders is preferably augmented (enhanced) to perform the techniques of the present invention. Wirebonders, so modified, are referred to herein as "springing machines". Generally, the desired modifications to a wirebonder fall into two classes:

A first class of enhancements to a wirebonder includes:
a. ultrasonic forming hardware and software; and
b. software controlling the forming of the wire stem (e.g., accounting for springback, etc.)

A second class of enhancements, discussed in greater detail hereinbelow, includes:
a. spark stabilization hardware;
b. hierarchical part architecture software;
c. software controlling the severing sequence cycle.

As a corollary to it being preferred to provide conventional wirebonders with enhanced functionality, in order to configure wires into a springable shape, it is within the scope of this invention that the enhancements to functionality disclosed herein are applicable to situations where it is not necessary to configure wires to have a springable shape. In other words, certain teachings of the present invention are applicable as enhancements to "conventional" wirebonding applications.

Generally, wirebonders are well known. In most of the resilient contact structure embodiments disclosed herein, the wirebonder is "incidental", andy any suitable wirebonder could be employed.

Ultrasonic Forming

FIG. 2, discussed hereinabove, illustrates a wirebonding system (wirebonder) suitable for bonding the free end (102*a*, 202*a*) of the wire (102, 202) and for forming the wire into its various shapes, exemplified (but not limited to) the shapes described with respect to FIG. 2A-2G. An enhancement to the wirebonder (making the wirebonder a springing machine) is the addition of transducer (226, see FIG. 2) for vibrating the capillary (204).

According to an aspect of the invention, during forming the wire (moving the capillary along a trajectory to impart a two- or three-dimensional shape to the wire stem) ultrasonic energy is applied via the capillary. Generally, this makes the wire easier to bend, and facilitates the formation of 3D (three-dimensional) shapes that are otherwise difficult to make. Additionally, the use of ultrasonic energy during shaping (forming) improves the predictability of loop-forming in conventional wirebonding.

This aspect of the invention is also applicable to "conventional" wire bonding processes (e.g., connecting a wire from a bond pad to a leadframe finger) which involves moving the capillary in the z-direction while the table (to which the electronic components being interconnected are mounted) is moved in the x- and y-directions. During this movement, it has been observed that the wire tends to get "hung up" on (or stuck to) the capillary, which introduces an undesirable degree of uncertainty into the process. According to the invention, by using ultrasonic energy while moving the capillary (and/or the table), the wire feeds more freely from the capillary, overcoming this "stiction".

Generally, as described hereinabove, creating a wire stem involves bonding a free end of a wire, moving the capillary up (in the z-direction), moving the table in the x and or y directions.

Generally, conventional wirebonding techniques involve the steps of bonding the free end of a supply wire to a substrate, moving the capillary up (in the z-axis direction), moving the substrate in the x- and y-directions (such as with an x-y table, or other suitable positioning mechanism), moving the capillary back down, and bonding and severing the wire—resulting in an arched wire bonded at both ends.

In any wirebonding operation, especially in the process of shaping, a wire stem according to the present invention, any drag exhibited by the wire as it plays out of the capillary is (would) sought to be avoided.

According to the present invention, applying ultrasonic energy during the process of configuring the wire stem generally diminishes the tendency of the wire to drag as it plays out of the capillary. Moreover, the application of ultrasonic energy "works" the wire—breaking grain boundaries in the wire during fashioning the wire to have a springable shape.

Ultrasonic wirebonders are already equipped with a transducer providing ultrasonic energy to implement bonding. According to the invention, the same ultrasonic transducer may be turned on (or left on) during configuring the wire stem to facilitate configuring the desired shape. The turning ON and turning OFF of the ultrasonic transducer is readily implemented in software.

Evidently, if the capillary were to be oriented at the various positions along its trajectory so that the wire was always feeding straight out therefrom (see, e.g., FIG. 2D), the stiction of the wire to the capillary would not be a significant problem. However, such an approach would require major, yet feasible, modifications to existing wirebonders.

The use of ultrasonic energy in wirebonders is generally well known, for example, for reducing stiction. It is preferred, however, that ultrasonic energy be applied during configuring the wire stem to "soften up" the wire for shaping, and reducing residual springback. Lower ultrasonic frequencies are generally preferred.

An alternate approach to using ultrasonic energy to make the wire more workable (and to reduce stiction as it feeds from the capillary), according to an alternate embodiment of the invention, heat may be applied to the wire (e.g., via the capillary) as it feeds from the capillary, such as by an electronic flame-off (EFO) feature in the wirebonder, to soften (e.g., anneal) the wire during the shaping step.

An alternative approach to using ultrasonic energy to overcome stiction of the wire as it feeds out of the capillary is to provide an inert gas or a forming gas through the capillary. This can be implemented as a stand-alone function, or in conjunction with applying ultrasonic energy as described hereinabove, as described in greater detail hereinbelow (see FIG. 52).

Compensating for Springback of the Wire

Another enhancement to a wirebonder, making the wirebonder a springing machine, is programming the controller (222, FIG. 2) so that the trajectory taken by the relative motion of the capillary (vis-a-vis the substrate) results in a desired shape of the wire.

Figure 3A:
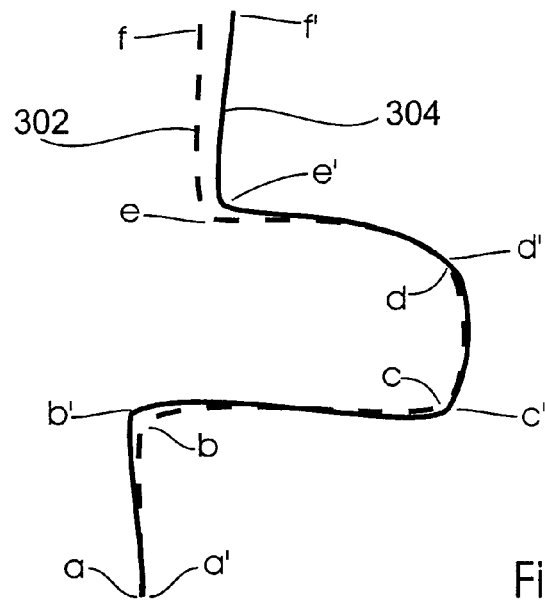
FIG. 3A is a schematic illustration of a "problem" associated with configuring a wire into a desired shape, according to the present invention, illustrating that the wire will tend to "lead" or "lag" a trajectory taken by the capillary.

As mentioned above, the trajectory (relative motion) of the capillary is preferably controlled on a point-to-point basis to impart a shape to the wire, and any springback in the wire will result in the final shape of the wire deviating from the capillary trajectory. FIG. 3A illustrates this 'problem', wherein the dashed line 302 represents the trajectory of the capillary (see, e.g., 204 in FIG. 2A), along a path a→b→c→d→e→f, and wherein the solid line 304 represents the resulting shape of the wire (see, e.g., 202 in FIG. 2A) along a path a'→b'→c'→d'→e'→f'. Evidently, the point "a'" will not deviate from the point "a", since this point is the point whereat the proximal end (compare 202a) of the wire is anchored (bonded to the substrate).

The 'problem' can be viewed (conceptualized) as one in which the wire, once severed, will assume a shape which, at particular portions along the length of the wire, either "leads" the trajectory of the capillary or "lags" the trajectory of the capillary. For example, as shown in FIG. 3A, from the points a' to b', the wire lags (is behind of, or to the left, as viewed) the path a-b of the capillary and, from the points e' to f', the wire leads (is ahead of, or to the right, as viewed) the path e→f of the capillary.

Figure 3B:
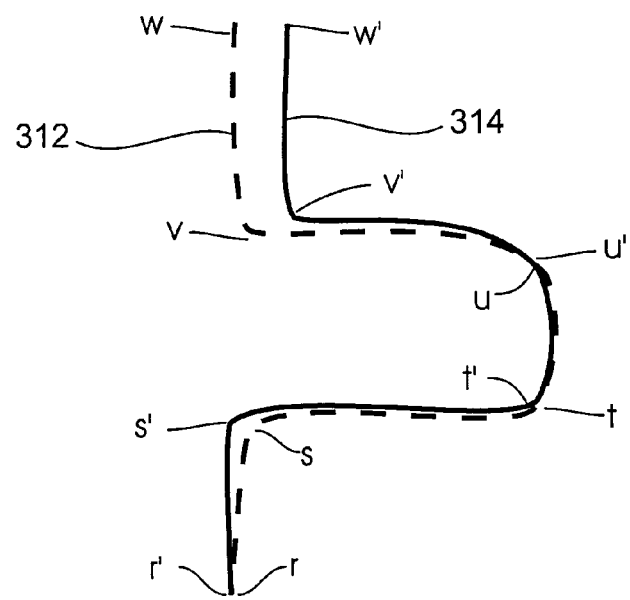
FIG. 3B is a schematic illustration of a "solution" to the "problem" set forth in FIG. 3A, according to the present invention, illustrating that the trajectory of the capillary can advertently be offset (altered) to ensure that the wire is fabricated into its desired shape.

FIG. 3B illustrates the 'solution' to the problem illustrated in FIG. 3A which, generally, involves moving the capillary along a "virtual" path 312 which is offset from (leads, lags) the desired path 314 for the wire (the wire path 314 defining the resulting wire shape).

As illustrated in FIG. 3B, the capillary is caused to move along (traverse) a trajectory (path) 312 (shown in dashed lines) from points r→s→t→u→v→w and, once severed, the wire stem will lie on a path 314 (shown in a solid line) along points r'→s'→t'→u'→v'→w'. The wire will "set" itself in this path, which is offset from the trajectory of the capillary, due to resiliency (inherent springback) in the wire, no matter how small such resiliency may be. (Generally, according to the invention, the resiliency of the wire itself is insufficient for a resulting resilient contact structure.) In the example of FIG. 3B, the trajectory of the capillary between the points r→s is established to lead (to the right, as viewed) the desired path of the wire between the points r' and s', and the trajectory of the capillary between the points v→w is established to lag (to the left, as viewed) the desired path of the wire between the points v' and w'.

This result (offsetting the trajectory of the capillary from the desired wire path) is preferably achieved by first entering (e.g., on a computer workstation) a desired wire path (314), which may be available in a design program already running on the computer, entering the physical characteristics of the wire (e.g., thickness, yield strength, etc.) of the wire, and calculating a capillary trajectory (312) which will result in the wire, once severed, having a shape which matches the desired wire path (314). Factors such as "drag" from the capillary (stiction in feeding the wire out of the capillary) and the effect of vibrating the capillary (as discussed hereinabove) on "working" (forming) the wire should also be accommodated in determining a trajectory for the capillary which will result in the desired wire shape.

Generally, the offset will be due to two factors: (i) drag of the wire as it plays out of the capillary; and (ii) inherent springback of the wire material. Although complex algorithms can be created to ascertain exactly how the path of a given wire will be offset from a given trajectory, it is generally preferred to use an empirical approach for each desired wire shape (from a given wire material), whereby estimates are made of a capillary trajectory that will result in the desired wire shape, the resulting wire shape is analyzed, and the capillary trajectory is modified until the desired wire shape is achieved.

As mentioned hereinabove, heating the wire as it is fed out from the capillary will make the wire easier to form into a wire stem having a springable shape. Another advantage of applying heat to the wire as it is fed out of the capillary is that heating the wire (e.g., annealing the wire at 300° C.-400° C.) will reduce the tendency for the wire to springback (e.g., when it is severed).

The tendency of the wire to spring back (e.g., when severed) can advantageously be employed during the severing process, as described in greater detail hereinbelow. Generally, the tip of a wire stem "poised" to spring back when the wire is severed will move away from the capillary (and away from the EFO electrode), which will help control the formation of a ball at the end of the supply spool.

It is within the scope of this invention that a plurality of capillaries can be employed simultaneously to fabricate a plurality of wire stems. For example, two capillaries operating at once (e.g., in tandem) would be able to bond and fashion twice as many wire stems than a "solo" capillary. Ten capillaries would reduce the manufacturing time by a factor of ten, etc. This is useful for linear or rectangular arrays, where a plurality of like wire stems need to be fabricated in a repeatable pattern on a surface of an electronic component.

In the prior art, compensating for springback is generally known, in the sense that a certain amount of overtravel is advertently induced when shaping traditional wirebond loops.

Severing the Wire

As mentioned hereinabove, once the proximal (free) end (202a) of the wire (202) is bonded to the substrate (208), and the wire (202) is fashioned into a desired shape, the wire (202) is severed, such as by an arc generated by the electronic flame-off (EFO) electrode (232). Once severed, the wire will have an second (distal) and, having been fashioned (configured) into a shape, is considered to be a "wire stem"

According to an aspect of the invention, providing photoemission at the EFO electrode (cathode) stabilizes the arc/plasma formation and produces more reliable and predictable wire cutting (severing) behavior. This technique may be used in conjunction with negative EFO or with positive EFO, and is termed "Photo-Assisted Spark Stabilization" (PASS).

As shown in FIG. 2, a light source 238 directs light at a location whereat the wire 202 is to be severed, such as immediately below the tip of the capillary 204. The light is shown as being focussed at the wire 202, but is preferably focussed at the electrode 232 which may be an anode or a cathode.

Preferably, the light is ultraviolet (UV) light at a wavelength of 184 nm or 254 nm, but the improvement to severing can be achieved with different wavelengths of light.

Figure 4A:
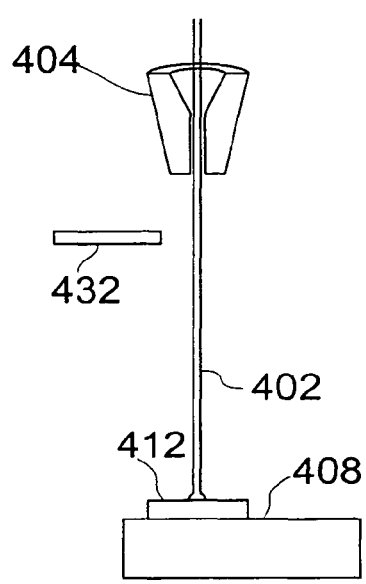
FIG. 4A is a side view of a wirebonding head (capillary) elevated above a substrate, with an electrode for performing electronic flame off (EFO) severing of the wire, according to an aspect of the present invention.

As shown in greater detail in FIG. 4A (light source 238 omitted, for illustrative clarity), a wire 402 (compare 102) which has been bonded to a terminal 412 (compare 112) on a substrate 408 (compare 108) is severed by a spark (not shown) generated by an electrode 432 (compare 232) which is located immediately underneath the capillary 404 (compare 204). This results in severing the wire 402 into two portions: (a) a lower, wire stem portion 430 which is bonded to the substrate, and (b) an upper supply portion 431 which extends from the spool (not shown, see 206 in FIG. 2) through the capillary 404.

Figure 4B:
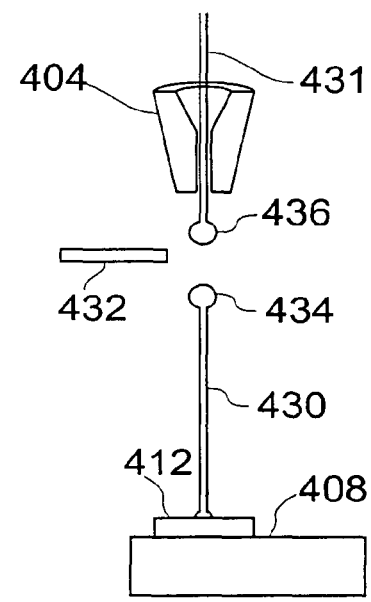
FIG. 4B is a side view of a wirebonding head (capillary) elevated above a substrate, after the wire has been severed by the technique of FIG. 4A, according to an aspect of the present invention.

As illustrated in FIG. 4B, similar to FIG. 7b of CASE-1, this results in the formation of a ball (area of increased diameter) 434 at the distal tip of the wire stem 430, and results in the formation of a similar ball 436 at the feed end of the supply wire 431. These balls are important for the following reasons:

(a) optionally, the ball 434 provides a "profile" to the tip of the wire stem 430 which is advantageous for making connection to an electronic component with the distal tip of the wire stem; and (b) the ball 436 is very suitable for making a subsequent bond between the free end of the supply wire 431 and a substrate, for forming another (subsequent) wire stem on the substrate.

The formation of a ball on the supply side of a wire feeding from a capillary (see (b), immediately above) is not only essential for subsequent bonding of the wire, but represents a major problem to throughput. In conventional wirebonding, the process is intended to run in a highly automated manner. It is known to check (inspect) for the presence of a ball prior to making a subsequent bond, and failure to have a ball will shut the process down—requiring manual intervention.

According to the present invention, the use of photoemission in conjunction with electronic flame-off severing of the wire improves ball formation and ball size distribution, and has been found to reduce the incidence of missing balls. Such photo-assisted spark severing of the wire is advantageous in the context of any (general purpose) wirebonding operation, and can be used in conjunction with various EFO circuit modifications, such as running the process under lower peak voltage conditions.

Generally, from a technical viewpoint, the photo-assisted spark stabilization (PASS) technique of the present invention utilizes field assisted photoemission to make the breakdown (arc severing the wire) more stable, and the cutoff height (z-axis coordinate) of the cutoff more controllable. The advantages of this latter feature of being able to accurately control the cutoff height of the wire is discussed in greater detail hereinbelow.

As mentioned hereinabove, the light (238, not shown in FIG. 4) may be focused at a spot on the wire whereat it is desired to sever the wire. This would be preferred for a wirebonder using positive EFO, wherein the spark starts at the wire. Alternatively, the light could flood illuminate an area which includes the electrode. This would be preferred for a wirebonder using negative EFO, wherein the spark starts at the electrode. In either case, the use of ultraviolet light assists in the avalanche breakdown of ambient gaseous constituents, and makes it "easier" for electrons to travel from the electrode to the wire (or vice-versa). Generally, flood illumination (e.g., in the context of negative EFO) will tend to be self-selective, and more reliable than focused illumination (e.g., in the context of positive EFO). With flood illumination, the sharp tip of the electrode "selects" the point on the wire whereat severing will occur.

In conventional, continuous-feed ball bonding, a high voltage arc (or EFO) is used to sever the wire intermediate each surface bonding event. The wire cutting phase of continuous ball bonding is usually accomplished by shearing of the wire after forming a secondary surface bond. In general, the finished height of the sheared wire is not critical, and so the ability of the EFO to produce a uniform height in a cut wire is not important.

In contrast to this situation, wire height uniformity is of great importance in the continuous feed resilient contact forming process of the present invention. The ability with which the cutting height of the EFO can be controlled directly influences the quality of the final result, since the uniformity and planarity of an array of contacts is a direct function of this capability.

According to the present invention, ultraviolet light is used to stabilize the wire cutting uniformity and spark breakdown when using a high voltage arc to sever the wires. The formation of a high voltage arc in a gas between two electrodes is an avalanche process in which an ever-increasing cascade of electrons produces more and more ionized gas molecules, until a current-carrying plasma is formed between the anode and the cathode of the discharge. Normally, initiation of the arc requires that field emission at the cathode electrode supply a small number of electrons to initiate the breakdown.

According to the present invention, an ultraviolet (UV) lamp is used to illuminate the cathode electrode in order to stimulate the production of photo-electrons at the cathode element of the EFO discharge. This lowers the threshold electric field required for emission by using 3-5 eV (electron volt) UV (ultraviolet) photons to stimulate production of free electrons at the cathode under applied high field conditions.

The role of the cathode may be played by either the cutting electrode (negative EFO arrangement, preferred), or the continuous feed wire (positive EFO alternative embodiment). Either flood or focussed UV illumination may be utilized. Focussed illumination of the wire for positive EFO will localize the electron emission point on the wire and help to control the wire height by controlling the point at which the cutting plasma is first formed. Flood illumination also acts as a stabilizer of wire height, since it stabilizes the arc formation between the cathode and the electrode.

It is believed that the improvement in ball formation due to providing ultraviolet light during electronic flame off can be attributed to the following. In conventional wirebonders, the voltage at the flame-off electrode (e.g., 232) is controlled by a circuit (e.g., 234). The voltage on the electrode is increased (e.g., from zero), and drops noticeably during a firing interval (the spark acting, more-or-less, as a short circuit). The duration of the firing interval is monitored by, and when it exceeds a predetermined duration (as set by a "watchdog" type timer in the control circuitry (e.g., 222), it is assumed that a ball has not been formed. The process is inherently somewhat indeterminate, and a plurality of "tries" can be graphed as a conventional statistical (e.g., bell-shaped) curve having a peak and a statistical variation from the peak. It is generally believed that the provision of ultraviolet light during EFO increases the slope of the graph to the "right" (in time) of the peak thereby reducing occurrences which exceed the predetermined time interval and increasing the likelihood of ball formation within the prescribed time interval. Hence, providing ultraviolet light during electronic flame off not only shortens onset time of the spark, but significantly reduces timeouts indicative of failure to create a ball.

Although the invention has been described in the context of severing the wire stem immediately below the tip of the capillary using electronic flame off (EFO) techniques, it is well within the scope of this invention that the wire can be severed using other instrumentalities, such as by mechanical means, and at other locations such as within the capillary (see, e.g., the aforementioned U.S. Pat. No. 4,955,523, wherein the wire is severed within the capillary (bonding head)). If, however, it is desired to impart a ball shape to the distal end of the wire stem, additional steps (separate ball formation) would need to be performed.

According to an aspect of the invention, wire melting and ball formation are performed in two separate, sequential steps (rather than combined in one step). Wire stems are first melted (severed), then balls are formed at their ends (tips). This results in tighter wire height distribution, which is important in ensuring coplanarity of the tips of a plurality of wire stems, a feature of the invention which is discussed in greater detail hereinbelow.

Figure 4C:
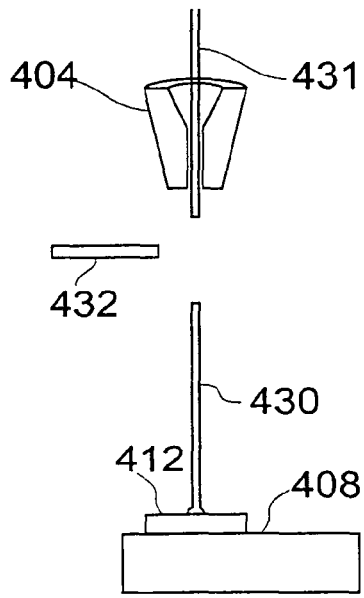
FIG. 4C is a side view of a wirebonding head (capillary) elevated above a substrate, after the wire has been severed by an alternate (to FIG. 4B) technique, according to an aspect of the present invention.

FIG. 4C shows a wire stem that has been severed by an arc from an electrode 432 to have a stem portion 430 extending from a surface of a substrate 408 and a feed portion 431. In this case, the intensity of the arc is controlled (minimized) so as to be just sufficient to sever the wire, without causing balls of significant size (compare 434 and 436 of FIG. 4B) to be formed. Balls comparable to the balls 434 and 436 shown in FIG. 4B can be formed in subsequent processing steps, using any suitable technique for forming balls. It is within the scope of this invention that a ball is formed on the tip of the supply portion (e.g., 431) wire, without forming a ball on the tip of the stem portion (e.g., 430) of the wire.

Figure 4D:
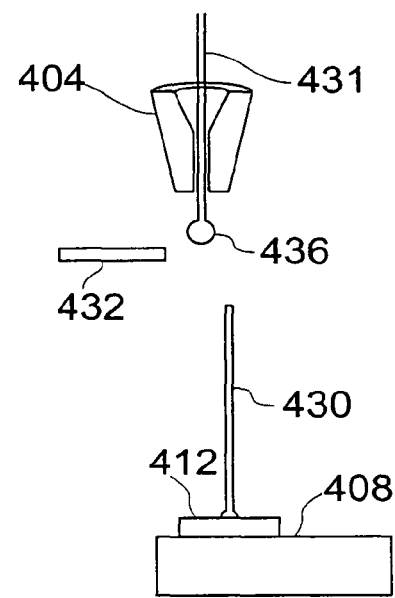
FIG. 4D is a side view of a wirebonding head (capillary) elevated above a substrate, after the wire has been severed by an alternate (to FIGS. 4B and 4C) technique, according to an aspect of the present invention.

FIG. 4D illustrates employing a tendency for the wire stem to springback (when severed) to advantage, in controlling the formation of a ball on the tip of the supply portion 431 of the wire. Prior to generating a spark at the electrode 432, the capillary 404 is moved approximately 0.5 mm (millimeters) in the X or Y direction. (More accurately, it would be the substrate that is moved by an X-Y table.) The EFO electrode 432 moves with the capillary 404. In this figure, the capillary and EFO are illustrated as being moved to the left, relative to the wire stem portion 430 of the wire. This lateral displacement of the capillary/EFO will cause the wire stem portion 430 to snap to the right (as viewed) when the wire is severed. This has a number of significant advantages, including:

(a) by moving the capillary prior to sparking, the wire is pre-loaded, and is "poised" to sever itself at the least provocation (e.g., the spark). This is analogous to stretching a string tight prior to cutting the string with a knife.

(b) the wire stem portion (430) typically representing the shortest path to ground, causing the wire stem portion to snap away from the EFO electrode (432) immediately upon the wire becoming severed will result in the supply portion (431) being the shortest path to ground. Generally, the spark provided by the EFO electrode will "seek" the shortest path to ground. In this manner, ball formation at the tip of the supply portion of the wire is more reliably controlled.

As mentioned hereinabove, failure to create a ball at the tip of the supply portion of the wire, for subsequent bonding, will result in shutdown of the process. A more subtle problem is that balls (e.g., 436) of indeterminate size, although adequate for initiating bonding, can result in indeterminate z-axis control over the wirebonding process. Not only is there supposed to be a ball at the end of the supply wire, but it is also expected to be of a certain, repeatable size. The techniques of the present invention (e.g., ultraviolet light, pre-loading the wire) not only help assure ball formation, but also ensure more uniformity in the size of the balls formed during severing the wire.

Coating the Wire Stem

According to the invention, once the wire is bonded to the substrate, fashioned to have a shape, and severed to have be a wire stem having a distal end, the resulting wire stem is coated.

Generally, the coating applied to the wire stem is a conductive, metallic material, such as a metal, such as nickel, cobalt, copper, alloys thereof, and the like, described in greater detail hereinbelow.

The overcoated wire stem is considered to be a "resilient" and/or "compliant" contact structure which generally derives its spring-like (resilient) characteristics (e.g., compliance without plastic deformation) from the mechanical characteristic of the overcoat material and the springable shape of the wire stem. The overall springiness of the resilient contact structure is a result of these collectively "organized" (selected) features.

Prior to continuing with this discussion, it is advantageous to clarify certain terms that are used herein—namely:

"flexible" refers to the ability of a thing to readily be bent or twisted, without breaking, and is especially applicable to the wire stem of the present invention.

"resilient" refers to the ability of a thing to resume its original shape or position after being compressed or deflected, and is especially applicable to the overcoated contact structure of the present invention.

"elastic" refers to the ability of a thing to resist deflective (compressive or tensile) forces, and to resume its original shape after the compressive forces are removed. A common spring exhibits elastic behavior. Elastic is similar in meaning to resilient.

"plastic" refers to the ability of a thing to be deformed, without breaking, and is similar to flexible.

"compliant", as used herein, refers to a thing exhibiting both elasticity and plasticity. In this sense, the term "compliant" is broader than the term "resilient". The contact structure of the present invention, having a flexible (plastic) wire stem and a resilient (elastic) overcoat, can be considered to be compliant.

For example, compliant contact structures formed according to the techniques of the present invention may exhibit a combination of elastic deformation (pure resiliency) and plastic deformation (pure flexibility), such as 3 mils of elasticity and 7 mils of plasticity for 10 mils of overall deflection. Generally, this ratio of plasticity to elasticity is readily adjusted by the material composition of the overcoat (i.e, for a given wire stem). For example, pure soft nickel will exhibit a relatively large amount of plasticity, as compared with elasticity.

The relevant mechanical characteristics of the coating material include: thickness, yield strength, and elastic modulus. Generally, the greater the thickness, the greater the yield strength, and the lower the elastic modulus of the overcoat material, the greater the resiliency of a resulting resilient contact structure will be.

Generally, the wire stem itself is intended simply to establish a "form-sustaining" shape for the overcoat material, without adversely impacting the mechanical behavior of the resulting resilient contact structure. As mentioned hereinabove, this is akin to the purpose of a "falsework", although the wire stem may remain in place after it is overcoated.

Figure 5:
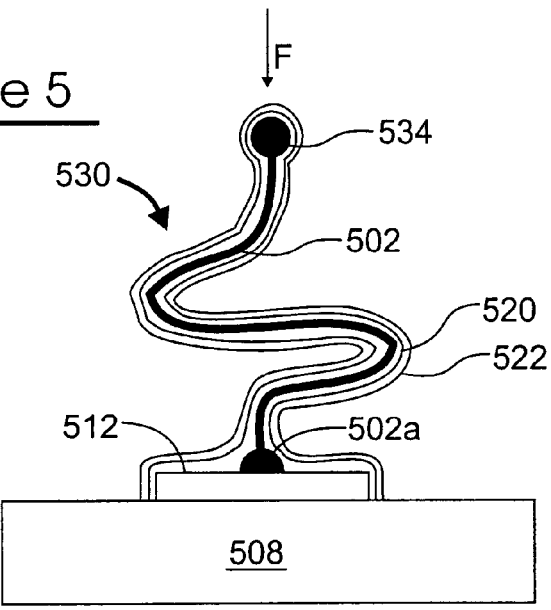
FIG. 5 is a side view of a wire which has been configured to have a shape, and which has been overcoated with multiple (at least two) layers of material to create a resilient contact structure, according to the present invention.

FIG. 5, similar to FIG. 5 of CASE-2, shows an exemplary wire stem 530 (compare 202, 330) comprising a wire 502 which has had its proximal end 502*a* (compare 202*a*) bonded to a terminal 512 (compare 112) on a substrate 508 (compare 108, 208), which has been fashioned to have a shape (which is similar to the shape shown in FIG. 2B, for exemplary purposes only), and which has been severed to have a ball 534 (compare 434) at its distal end.

It is evident that the exemplary wire shape shown in FIG. 5 can be resilient, functioning as a spring and reacting a force (labelled "F") directed axially (i.e, generally in the z-axis direction) downward upon the wire stem. However, as mentioned above, in order for a wire stem to be resilient, it must itself have a significant content of resilient material, and gold (the "conductor of choice" for semiconductor interconnect applications) is not resilient (it is readily plastically deformed in reaction to an applied force). As further mentioned hereinabove, the ability to form resilient contact structures would be (and is) desirable for a wide range of applications. Evidently, if the wire itself were resilient (capable of functioning as a spring), and depending on the particular shape imparted to the wire, a tremendous amount of force could easily be imparted to the bond at the proximal end (bond 502*a*) of the wire stem, resulting in fracture of the bond and total failure of an interconnection effected by the wire stem between electronic components. A key feature of the present invention is avoiding this problem.

According to the invention, one or more layers are coated, such as by plating, onto the wire stem 530 and, in the case of multiple layers, the outermost (top) layer is a conductive material. The principal results achieved by coating the wire stem are:

(a) imparting resiliency to a contact structure comprising the overcoated wire stem, especially in the situation where the wire stem itself is of a material (e.g., gold) that is inherently non-resilient; and (b) improving anchoring of the wire stem to the substrate.

FIG. 5 shows a wire stem 530 having a multi-layer (two layer coating) enveloping (covering the entirety of) the wire 502 and comprising a first, inner coating layer 520 covering the wire 502 and a second, outer (top) coating layer 522 covering the first layer 520. The first layer 520 covers the terminal 512 (compare 112, FIG. 1A) to which the proximal end 502*a* of the wire 502 is bonded, and anchors the wire thereto (i.e., greatly augments the bond anchoring of the wire). The second layer 522 covers the first layer 520 in the area of the terminal 512, and augments anchoring the wire 502 to the terminal.

Vis-a-vis the two layers 520 and 522 overcoating the wire stem, one (or both) imparts resiliency to the (otherwise non-resilient) wire stem, and the outer layer (or both layers) is electrically conductive.

For example:
the wire (502) is a soft gold material, and has a diameter of 0.0008-0.0015 inches;
the inner coating (520) is a copper "strike", having a thickness of 5-10 $\mu"$ (microinches); and
the outer coating (522) is nickel, and has a thickness of 0.0020 inches.

Generally, a coating such as copper would be chosen for two reasons: (i) to enhance the plating ability of the underlying wire stem (as is known, certain materials are notoriously difficult to plate, for example with nickel), and/or (ii) to ensure good electrical current carrying characteristics for the resulting overcoated wire stem (copper is known to be a good conductor of electricity).

Generally, a coating such as nickel, or its alloys, would be chosen for its mechanical characteristics, among which are its high yield strength, to be able to elastically react applied forces, and its ability to firmly anchor the resulting resilient contact structure to the contact area (e.g., terminal).

In some instances, it would be desirable that a top (e.g., third) overcoat layer would provide solderability or the like, and would be galvanically compatible with the material of the contact area. In such instances, for example, a thin top coat hard gold, having a thickness of approximately 100 $\mu"$ (100 micro-inches, 0.0001 inches) would be in order.

In high frequency applications, there would be a tendency for current to be distributed along the outer layer(s) of the coated wire stem. In such a case, gold is a good choice for the outer layer of a multi-layer overcoat.

Figure 5A:
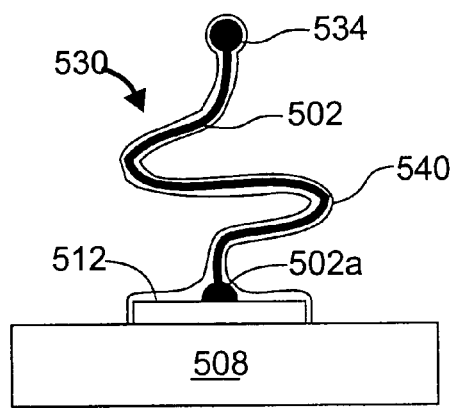
FIG. 5A is a side view of a wire which has been configured to have a "springable" shape (a shape which will determine a configuration), and which has been fully overcoated ("enveloped") with a single layer of material to create a resilient contact structure, according to the present invention.

FIG. 5A shows a wire stem 530 having only one layer 540 (versus the multilayer overcoating 520/522 of FIG. 5) overcoating and enveloping (fully covering) the wire stem, and encompassing the terminal 512 on the substrate 508. As in the example shown in FIG. 5, the proximal end 502*a* of the wire 502 is bonded to the terminal 512, and the distal end of the wire 502 is provided with a ball 534. In this case, the coating layer 540 is both resilient and conductive.

For example:
the wire (502) is a gold material, and has a diameter of 0.0007-0.0020 inches;
the coating (540) is a nickel material, and has a thickness of 0.0005-0.0030 inches).

Figure 5B:
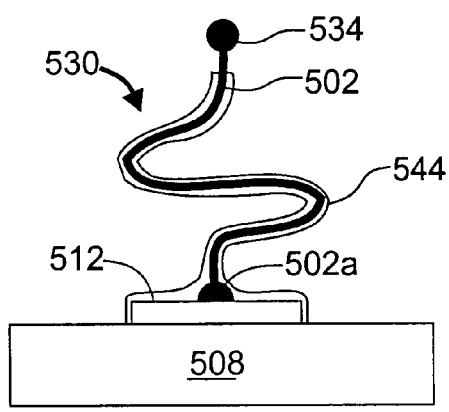
FIG. 5B is a side view of a wire which has been configured to have a springable shape, and which has been partially overcoated ("jacketed") with a single layer of material to create a resilient contact structure, according to the present invention.

FIG. 5B shows a wire stem 530 having only one layer 544 overcoating and jacketing (partially covering) the wire stem, and encompassing the terminal 512. In this case (jacketing), the overcoat layer 544 extends from the proximal end 502*a* of the wire stem only partially towards the distal end 534 of the wire stem. Preferably, and significantly, the overcoat 544 encompasses the bends in the wire stem, as shown. Generally, the vertical (as shown) end portions of the wire stem do not contribute to the overall resiliency of the resilient contact structure. In this case, it is important that the wire stem 530 itself be electrically conductive, since it sticks out from the coating (544) and makes the electrical contact to a contact pad (not shown) on an electronic component (not shown).

For example:
- the wire (502) is a gold material, and has a diameter of 0.0007-0.0020 inches;
- the coating (544) is nickel, and has a thickness of 0.0005-0.0030 inches.

Figure 5C:
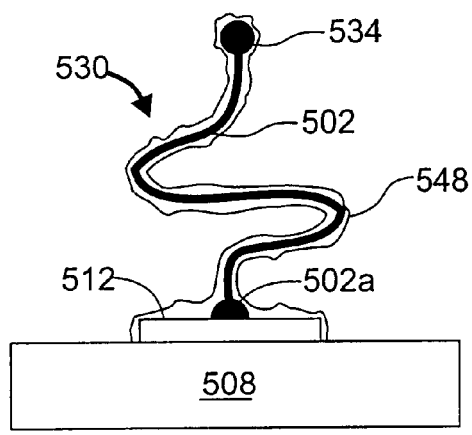
FIG. 5C is a side view of a wire which has been configured to have a springable shape, and which has been fully overcoated ("enveloped") with a single layer of material to create a resilient contact structure having microprotrusions on its surface, according to the present invention.

FIG. 5C shows a wire stem 530 overcoated with a single layer 548, in a manner similar to FIG. 5A (compare 540). In this case, the layer 548 is provided with a plurality of microprotrusions on the outer surface thereof spaced longitudinally along the length of the wire stem. Such a "jagged" coating is sometimes referred to as "dendritic". These protrusions, or surface irregularities, can be created in a number of ways, for example, by adjusting the processing conditions in a plating bath (discussed hereinbelow) to cause sharp nodules to be formed in the layer 548. This is exemplary of the outer, conductive layer of a multilayer coating (compare 522, FIG. 5) being provided with microprotrusions.

For example:
- the wire (502) is a gold material, and has a diameter of 0.0007-0.0020 inches;
- the coating (548) is a nickel material deposited to a thickness of 0.0005-0.0030 inches, using known techniques for co-deposition, the "foreign" (non-nickel) particles of the co-deposition suitably being silicon carbide, alumina, diamond or the like (both conductive and non-conductive materials can be used), having a diameter of approximately 3 μm (microns). Such a co-deposition will result in jagged peaks on the outer surface of the coating, the peaks having an average peak height of approximately 0.0005 inches. Co-deposition can also be performed with particles of the same material as the ion of interest in solution (e.g., nickel particles in a nickel plating bath).

Another technique (i.e., other than the aforementioned co-deposition) for forming a "jagged" coating (e.g., 502) is, in the context of electroplating, to use "abnormally" high current and an "abnormally" low concentration of metal in the plating solution. This, as is known, will produce a "microtreeing" effect, wherein nodules are formed in the plating.

Figure 5D:
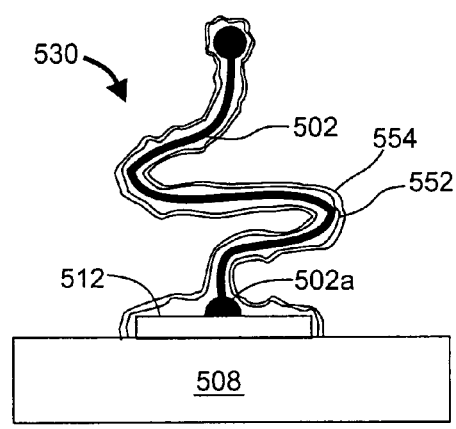
FIG. 5D is a side view of a wire which has been configured to have a springable shape, and which has been fully overcoated ("enveloped") with multiple (at least two) layer of material to create a resilient contact structure having microprotrusions on its surface, according to the present invention.

FIG. 5D shows a wire stem 530 overcoated with a multilayer coating comprising an inner layer 552 (compare 520, FIG. 5) which is provided with microprotrusions (as described with respect to FIG. 5C). An outer, "normal", conformal layer 556 deposited atop the inner layer 552 may be deposited in a "normal" manner (without causing it to have microprotrusions), and will generally conform to the microprotrusion topography of the inner layer 552 to exhibit microprotrusions. (For example, a strike of gold can be applied over a nickel layer having microprotrusions.) This, evidently, is desirable in the case of (i) desiring a multilayer coating, and (ii) it being easier to form the microprotrusions in the inner layer.

Figure 5G:
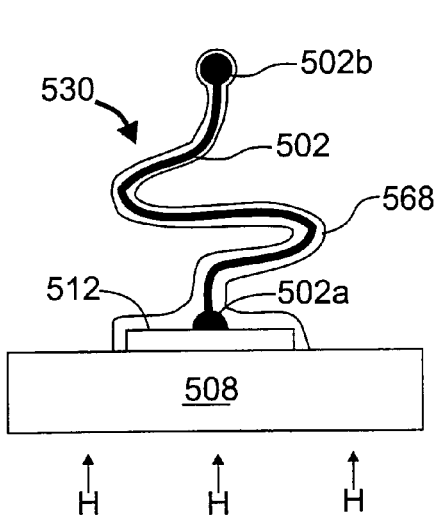
FIG. 5G is a side view of a wire which has been configured to have a springable shape, and which has been fully overcoated ("enveloped") with at least one coating, in conjunction with applying heat during the overcoat (e.g., plating) process, according to the present invention.
Figure 5H:
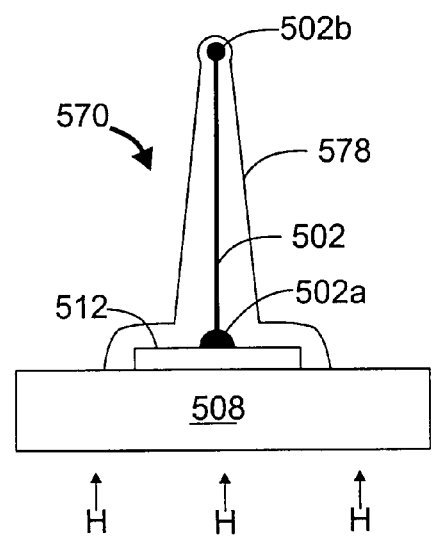
FIG. 5H is a side view of a wire which has been configured to have a straight, pin-like shape, and which has been fully overcoated ("enveloped") with at least one coating, in conjunction with applying heat during the overcoat (e.g., plating) process, according to the present invention.
Figure 5E:
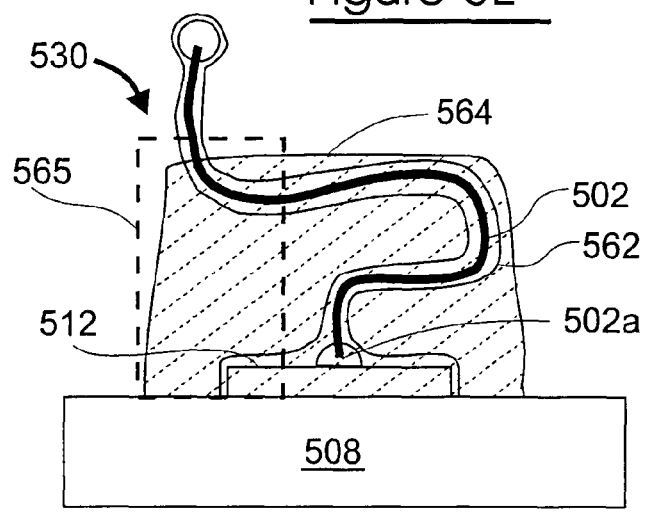
FIG. 5E is a side view of a wire which has been configured to have a springable shape, and which has been fully overcoated ("enveloped") with a layer of material, and which has further been embedded in a compliant electrically-conducting material, such as an elastomer material, according to the present invention.

FIG. 5E shows an embodiment of the invention wherein a wire 502 is bonded at its proximal end 502a to a terminal 512 on a substrate 508, and is overcoated with an exemplary single layer conductive coating 562. In this case, the entire lower portion of the wire stem 530, including an area encompassing the terminal 512 is embedded in a mass 564. The mass 564 is preferably an electrically conductive polymer mass, such as silicon rubber filled with silver particles, and serves to reduce any parasitic inductance exhibited by the wire stem. Suitable electrical characteristic of the mass 564 are conductivity in the range of $10^{-2}$ to $10^{-6}$ ohm centimeters. The material of the mass 564 is selected so as not "creep", or to significantly adversely affect (restrict) movement (resilience, compliance) of the wire stem 530.

For example:
- the wire (502) is a gold material, and has a diameter of 0.0007-0.0020 inches;
- the coating (562) is nickel, and has a thickness of 0.0005-0.0030 inches; and
- the polymer mass (564) has a Shore A hardness of between 10 and 60 (such as between 30 and 50), and is filled with silver particles to impart the desired conductivity. Generally, the polymer mass is chosen so that it does not significantly impair the compliance of the contact structure. It is within the scope of this invention that intrinsically conductive polymers, which are becoming available, may be used for the polymer mass (564).

Figure 5F:
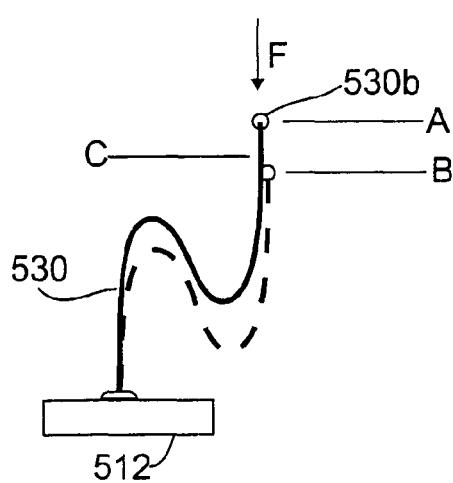
FIG. 5F is a schematic illustration of an exemplary resilient contact structure configured into a springable shape and overcoated (overcoating omitted from this figure), according to the present invention, showing the ability of the contact structure to deflect in response to an applied deflecting force (F).
Figure 5I:
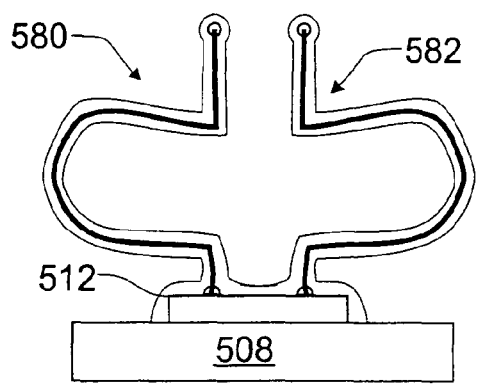
FIG. 5I is a side view of an embodiment wherein two wire stems are mounted to a single terminal and overcoated, according to the present invention.

The main purpose of the elastomer mass 564 is to provide a conductive path between the distal tip and the proximal end of the wire stem (or, more accurately, the closest point on the terminal 512 to the distal tip of the wire stem) which is shorter than the overall length of the wire stem. The shortest path between two points being a straight line, it is within the scope of this invention that the polymer mass is provided only within the area indicated by the dashed lines FIG. 5F shows an exemplary, overcoated, freestanding, resilient contact structure 530 (compare the shaped wire 202 of FIG. 2E) extending from a terminal 512 (compare 212) on a substrate. In this illustration, the distal end (tip) 530b of the contact structure 530 (without any force applied thereto, and shown as a solid line) is at a position "A" above the surface of the substrate. A force, indicated by the arrow "F", applied axially (towards the substrate 508) through the distal end of the resilient contact structure 530, will cause the resilient contact structure 530 to deflect—as shown in dashed lines—so that the tip of the contact structure (with the force applied thereto) is at a position "B" above the surface of the substrate. The deflecting force "F" will result from urging the substrate 508 which may, itself, be an electronic component, against another electronic component to effect an interconnection, via the resilient contact structure, between the two electronic components, or vice-versa.

The position "B" is closer to the surface of the substrate 508 than the position "A". Between these two positions (A and B), a position "C" is indicated. In use (e.g., as an interconnect between two electronic components), upon application of a force (F) the resilient contact structure 530 may first plastically deform from the position "A" to the position "C" and, upon further application of force ("F"), will elastically (resiliently) deform from the position "C" to the position "B".

This "combination" of plastic deformation and resiliency is what is meant by "compliance" (versus "resilience") and is not necessarily bad, and may be very advantageous in ensuring uniform contact force, from contact-to-contact, when the tips of a plurality of contact structures do not uniformly contact an electronic component, such as a printed circuit board (PCB), the surface of which is not perfectly planar. Those contact structures first striking the surface of the PCB will plastically deform more than those contact structures last contacting the surface of the PCB, but the compressive force experienced by all of the contact structures will be fairly uniform.

An exemplary resilient contact structure (e.g., 530 of FIG. 5F) will, according to the present invention, will preferably have an overall height (i.e., the distance, in the z-axis, from the surface of the substrate to the distal end of the contact structure) of 0.0100-0.1200 inches, and will likely (i.e., for most conceivable applications) have a spring constant ("k")

of between 0.1 and 20.0 g/mil (grams per thousandth of an inch), preferably between 0.5 and 5.0 g/mil.

One having ordinary skill in the art will appreciate that it is difficult to set forth a "preferred" spring constant, the resiliency and/or compliancy of the contact structure being dictated by the particular application requirements. Suffice it to say that virtually any conceivable combination of elasticity and plasticity can be achieved, according to the techniques set forth hereinabove, by manipulating the thickness, shape and material of the wire stem, and the materials and thicknesses of the overcoat(s). For purposes of this discussion, however, a spring constant ("k") of 3.0 g/mil is generally "preferred" for electronic applications such as using the contact structures of the present invention to connect to semiconductor dies (whether mounted directly to the dies or as a probe). Overall compliance of the contact structure is suitably up to 15 mils (0.015 inches) of plastic deformation (e.g., the distance between the positions "A" and "C") and up to 3 mils (0.003 inches) of elasticity (e.g., the distance between the positions "C" and "B"). The relative contributions of elasticity and plasticity are readily tailored for individual applications. For example, contact structures on an interposer may be fabricated to exhibit a total of 10 mils of deformation, allocated as 5 mils of plastic deformation and 5 mils of elastic deformation. Contact structures exhibiting substantially "pure" elasticity can also be fabricated.

Coating Techniques, Materials and Thicknesses

The possibility of coating the wire stem by plating has been mentioned hereinabove. According to the invention, a number of different techniques can be used to overcoat the wire stem to establish the mechanical and chemical properties of the resulting resilient contact structure.

A notable (e.g., important) feature of the coating applied to the wire stem is that it is continuous—in other words, formed of a homogeneous material along the entire length of the wire stem. This advertent avoidance of discontinuities in the composition or metallurgy of the coating minimizes the occurrence of local stress points which would tend to lead to failures from repeated flexing of the resulting resilient contact structure.

Generally, the material of the coating is significantly stronger than the material of the wire and imparts the desired "springiness" to the resulting contact structure.

The coating can be applied using a number of readily-available techniques including, but not limited to:

(a) wet electrochemical techniques, including electrolytic or electroless aqueous solution plating of metals;

(b) electroplating, such as electroplating nickel out of nickel and its alloys, or electroplating nickel out of standard nickel sulfamate solution. This method is capable of depositing a controlled thickness coating on the wire stem having a tensile strength in excess of 80,000 pounds per square inch (psi), such as in excess of 200,000 psi.

(c) chemical vapor deposition (CVD), microwave enhanced CVD (MECVD), physical vapor deposition (PVD), and the like, including any process involving evaporating and sputtering.

(d) any of a number of processes (CVD being one of such processes) that cause deposition of materials (e.g., conductive materials) through the decomposition of gaseous, liquid or solid precursors.

(e) for depositing solder on the wire stems, wave soldering or electrolytically-deposited solder.

The aforementioned wet electrochemical and electroplating processes are generally performed according to "standard" procedures, and can be performed using molten salts, ionic solutions, and the like.

For the purposes of this patent application, the process of providing a coating on the wire stem according to any of the techniques described above are, in aggregate, termed "overcoating" (the wire stem).

A useful analogy in describing the resilient contact structure of the present invention, which was set forth in CASE-1, is conceptualizing the wire stem to be a "skeleton", and the coating on the wire stem to be "muscle", since it is the wire stem that defines the shape of the resulting contact structure, and it is the coating on the wire stem that imparts the salient mechanical characteristic (e.g., resiliency) to the wire stem. As noted hereinabove, a more useful analogy may be to consider the shaped wire to be a "falsework" or a "mandrel", which functions primarily to establish the resulting shape of the overcoat.

Generally, the importance of overcoating (e.g., plating) to the process cannot be underemphasized, and should not be under-appreciated, the overcoat serving as the principal structural element in the resulting contact structure.

In the past, plating has generally been viewed as a process whereby the properties of an underlying structure can be enhanced. This would include plating to avoid corrosion of the underlying structure, to alter the appearance of an underlying structure, and to impart desirable characteristics (such as solderability) to the surface of the underlying structure. In other words, plating, per se, has generally not been viewed as an "end", in and of itself—plated structures relying on properties of the underlying structure itself to perform their intended function. Automobile bumpers, for example, would work quite well if they were not plated—the plating providing protection against corrosion as well as an aesthetic appearance to the bumper.

In conventional electronic interconnections, such as described, for example, in the aforementioned U.S. Pat. No. 5,317,479, plating is used to enhance the solderability of the underlying lead structure. Without the underlying lead structure remaining intact, the concept of a compliant lead falls apart.

In contrast to the conventional plating "mind set", the present invention relies on the plating (i.e., the overcoat material) to establish the desired functionality—virtually all of it. It will be described hereinbelow how the wire stem could be removed, virtually in its entirety, after overcoating it, and the result would still be a completely functional resilient contact structure. (It is recognized, however, that processes of plating on mandrels of ceramic, wax, plastic, and the like, have been employed for phonograph record mastering, radiators for motor vehicles, etc.)

Returning to a discussion of coating (e.g., plating), in the context of fabricating resilient and/or compliant electrical contact structures, according to the present invention:

Suitable materials for the coating (i.e., for any one of the coating layers in a multi-layer coating over the wire stem) include, but are not limited to:

nickel, copper (especially in a thin "strike", as an intermediate layer of a multilayer coating, such as over a gold wire stem, or as a current-carrying layer), cobalt, iron, and their alloys (such as nickel-cobalt), including Kovar™ (e.g., 29% Nickel; 17% Cobalt; 0.3% Manganese; remaining % Iron), "Alloy 42" (42% Nickel; 0.1% Carbon, remainder iron), or any similar material having Fe/Ni/Co content (e.g., 42% Nickel, 40.7% Iron, 17% Cobalt and 0.3% Manganese), or low expansion alloys;

gold (especially hard gold) and silver, both of which exhibit excellent current-carrying capabilities;
elements of the platinum group;
noble or semi-noble metals;
tungsten and molybdenum (both of which are suitably deposited by CVD processes);
cobalt;
zinc (especially over an aluminum wire stem);
tin (especially for forming a eutectic, as discussed hereinbelow);
solder (primarily for fabricating raised solder contacts);
semi-noble metals and their alloys, selected from a group consisting of platinum, rhodium, ruthenium, other elements of the platinum group, and copper, and their alloys with gold, silver and copper (especially for top coating layers).

The technique selected for applying these coating materials over the various wire stem materials set forth hereinabove will, of course, vary from application-to-application. For example, gold is one of the preferred materials for the wire stem. However, due to its superior electrical characteristics, it is somewhat counter-intuitive to plate over gold. Moreover, gold is not a good "initiator" for plating. Hence, according to an aspect of the invention, when plating (especially electroless plating) nickel over gold, it is desirable to first apply a thin copper "strike" layer over the gold wire stem.

In a freestanding resilient contact structure, nickel is a suitable overcoating material, especially as an inner one (compare 520) of a multiple-layer coating. Such an inner layer of nickel, which has a tendency to oxidize, is suitably overcoated with a noble or semi-noble top coating layer (compare 522) such as gold, silver, elements of the platinum group and their alloys.

In use for a contact structure intended to function as a raised solder contact (as described in greater detail hereinbelow), nickel, cobalt and their alloys are suitable overcoat materials and, for example, can suitably have a thickness in the range of from 0.00003 to 0.00500 inches, preferably from 0.00005 to 0.00300 inches.

Solder, which typically includes lead and tin elements, is also suitable for an overcoat, and can be applied to the wire stem by conventional wave soldering equipment. Embodiments of the invention utilizing a solder overcoat are described in greater detail hereinbelow.

A significant advantage of forming a multiple layer coating over the wire stem is that the materials of each individual coating layer can be selected to tailor the set of physical properties of the resulting resilient contact to a given application. These physical properties include tensile strength, yield strength, and the like.

Another advantage of forming a multilayer coating over the wire stem is exemplified by the fact that nickel has a strong tendency to oxidize, and consequently typically requires large contact forces to break through the formed oxides. (Low contact forces resulting in good electrical connections are generally universally preferred.) For this reason, nickel tends not to be the best choice for a single layer coating, or for the top layer of a multilayer coating on the wire stem.

Similarly, although a solder top coat would be highly desirable for certain applications, typical solders include tin, and gold (i.e., a gold wire stem) is very reactive with tin. To inhibit such undesired reactions, an intermediate "barrier" layer can be applied between the wire stem and a top layer of the coating. In the case of a gold wire stem and a solder (having tin) top layer, a barrier layer of nickel alloy will deter the reaction between the gold (wire) and the tin (solder overcoat), in most instances. For example, a first coating layer of nickel alloy, having a thickness of 100 to 1,000 microinches, can be applied between a gold wire and a top coating layer of solder.

Inasmuch as the resilient contact structure is intended to function as a "spring", certain advantages will accrue (in certain applications) when internal compressive stresses are induced in a coating (at least one layer of the coating) during applying the coating to the wire stem. For example, to induce internal stress in the coating, as it is being plated onto the wire stem, certain additives can be added to the plating solution. For example, in a nickel sulfamate plating solution, the following additives (additive agents) can be added to the plating solution: saccharin (sodium salt), thiourea, butyne diol, metabenzene disulphonic acid (sodium salt), 1,3,6 napthalene trisulphonic acid (trisodium salt), and the like. Boric acid can also be added to the plating solution (bath), for pH control. Internal stress in the plating can also be controlled by the overall temperature of the plating bath, plating rate, pH of the plating solution, nickel (e.g.) concentration, and other plating parameters. Generally, the additives agents mentioned hereinabove are the primary contributors to controlling stresses in the plating, including compressive stresses, tensile stresses and "theta" ($\Theta$) stresses.

If the wire stem itself has some inherent resilience which is sought to be "adjusted", vis-a-vis the resilience of the coating, a shaped wire stem (or a plurality of shaped wire stems) can be placed under stress (pre-compressed by a force "F", as shown in FIG. 5F) while overcoating (e.g., plating) the stem. Such a "mechanical" means of pre-stressing the contact structure may also be desirable in certain applications.

According to the present invention, an overcoated wire stem functions as a spring, the spring constant ("k") of which can readily be calculated for any given configuration, based on known properties of materials. Generally, as described hereinabove, the overcoat is applied to a more-or-less uniform thickness along the length of the wire stem—at least, along the bend portions of the wire stem—simplifying such calculations. Using processes such as electroplating tend to result in substantially uniform thickness along the length of the wire.

According to an aspect of the present invention, the coating is applied so as to have an advertent, non-uniform thickness along the length of the wire stem.

FIG. 5G illustrates a wire stem 530 that has been plated with an overcoat 568 while applying "localized" heat (arrows marked "H") to the substrate. This is readily accomplished by disposing the substrate 508 atop a heat strip (not shown). In this manner, the substrate and the wire stem will be hotter than the surrounding plating bath.

Despite the fact that a gold wire (502) is a reasonably good thermal conductor, the fact that the entire wire stem 530 is immersed in a plating bath during the plating operation will result in there being a noticeable temperature gradient along the length of the wire stem, with the proximal end 502a of the wire stem being hotter than the distal end 502b of the wire stem. This will result in the coating having a greater thickness at the proximal end of the wire stem than at the distal end of the wire stem. (This variation in thickness is exaggerated in the illustration of FIG. 5G, for illustrative clarity. Compare FIG. 5B.)

By advertently causing the coating (568) to be thicker where the wire stem is anchored to the substrate, than at the free-standing end of the wire stem, the following advantages accrue:
the anchoring of the wire stem to the substrate will be greater, for a given "average" coating thickness;
the compliance of the resulting resilient contact structure will be greater—there being a lesser thickness of coating material for a given average coating thickness—at the distal, resiliently-operative portion of the wire stem; and consequently, stresses imposed by a resilient force will better be reacted at the proximal end (502a) of the wire stem—thereby reducing any tendency of the resilient contact structure to fracture from the substrate.

By way of example, elevating the temperature of the substrate to 80° C.±10° C. (the overall temperature of the plating bath being at room temperature), coatings which otherwise would deposit themselves uniformly along the length of the wire stem can be induced to demonstrate a thickness gradient of from 1.5:1 to 5:1 (thick:thin). This aspect of the invention is applicable both to electroplating and to electroless plating.

Conversely, cooling the substrate (relative to the bath), for example with a thermocouple device, can be employed to tailor the coating thickness.

It is within the scope of this invention that any suitable technique can be employed to tailor the thickness of a member being plated by imposing a temperature gradient upon the member being plated.

According to the present invention, localized heat (i.e., versus overall heating of the plating bath), applied during a plating process, can advantageously be employed to "tailor" coating thickness in a number of contexts. It can be employed, as described hereinabove, to advertently make the coating thicker, the closer it is to the heat source. It can be used to make an otherwise uniform thickness coating non-uniform. For example, if, without applying heat, the coating (e.g., nickel) tended to be thicker at the distal end of the wire stem, the coating thickness can be "beefed" up to make the coating exhibit a uniform thickness along the length of the wire stem or, as described hereinabove, to make the coating thicker at the proximal end of the wire stem. Additionally, in certain applications wherein it is desired to deposit a uniform thickness coating across the surface of a planar substrate, heat can be employed to "counteract" certain inherent tendencies for the plating to be non-uniform (i.e., thinner in spots), thereby ensuring a uniform coating thickness across the surface of the substrate (e.g., a silicon wafer). (Spots or areas on the surface of the substrate tending to have a thin coating can be locally heated to thicken the coating in these areas.) This, too, is within the scope of the present invention.

FIG. 5H illustrates an example of tailoring coating thickness similar to that shown with respect to FIG. 5G, but in the context of coating a straight wire stem (e.g., "pin") 570. A straight wire stem 502 is bonded by its proximal end 502a to a terminal on a substrate. Heat ("H") is applied to the substrate during plating. The resulting overcoat 578 will be thinner towards the distal tip 502b of the wire stem 502 than at the proximal end 502a of the wire stem.

In many of the embodiments described herein, nickel is very suitable for the overcoat material (e.g., of at least one of the overcoat layers), and is deposited onto the wire stem by plating. Although such processes are generally well understood, and well within the purview of one having ordinary skill in the art to which the present invention most nearly pertains, a comprehensive discussion of nickel plating can be found in *Nickel Plating* by Roger Brugger, Robert Draper Ltd. (UK), 1970, the relevant teachings of which are incorporated by reference herein.

Characteristics of the Contact Area

The present invention has been described in the context of bonding the free end of the wire to a contact area (see, e.g., 100, FIG. 1) which may be a terminal (see, e.g., 112, FIG. 1A) on a substrate (e.g., an electronic component). It is generally required that the contact area (110) be metallic and be formed of materials including, but not limited to:

(a) gold, and its alloys;
(b) aluminum, and its alloys;
(c) silver, and its alloys;
(d) copper, and its alloys; and
(e) metals of the platinum group.

In many of the examples presented herein, the contact area is a terminal (112). However, it will be understood that the contact area is not limited to a terminal, or to a bond pad, and there may be a plurality of contact areas on a single, continuous layer which is subsequently patterned, such as by photoresist and etching (see, e.g., FIG. 1B), to have a plurality of contact areas.

The contact area (such as a terminal) may include multiple layers, the topmost layer of which is a material such as gold or aluminum. Generally, the materials of the contact area of the substrate are within a suite of known materials for such contact areas.

Properties of Materials

A number of materials have been described hereinabove as being suitable for the wire, for the coating(s) and for the defined area to which the wire is bonded. Although not forming part of this invention, a brief description of the salient characteristics of a number of these materials follows, with comments as to their utility (in some cases, nonobvious or non-intuitive) in the present invention. These brief descriptions are intended to be elaborative, and are not intended to be construed as limiting in any way. A more comprehensive "shopping list" of metal materials and their relevant properties can be found in chapter 5 ("Metals") of *Electronic Materials and Processes Handbook*, Harper and Sampson, McGraw-Hill, Inc., Second Edition, 1994, pages 5.1-5.69.

Aluminum—Because of its good electrical and mechanical properties, aluminum is an important contact material. However, as a contact metal, aluminum is generally poor because it oxidizes readily. In cases where aluminum is used in contacting joints, it should be plated or clad with copper, silver or tin.

Beryllium—This material exhibits high stiffness and strength to density ratios, high thermal conductivity, and low thermal expansion.

Copper—Copper is widely used in electrical contacts because of its high electrical and thermal conductivity, low cost, and ease of fabrication. The main disadvantages of copper contacts are low resistance to oxidation and corrosion. Pure copper is relatively soft, anneals at low temperatures, and lacks the spring properties sometimes desired.

Epoxy—Epoxy is a resin which is generally nonconductive, and which will cure (harden) at room temperature or at elevated temperatures. When used for electrical connections (e.g., in lieu of solder), a conductive epoxy filled with silver or gold particles is employed. These conductive epoxies will typically exhibit volume resistivities of less than 1 m$\Omega$/cm (milliohms per centimeter). There are a plethora of epoxies to choose from, the ultimate choice being dictated by the application in which the epoxy will be employed.

Eutectic—A "eutectic" is a combination of metals, such as gold and tin, which exhibits a lower melting temperature than either of the constituent metals. Examples include 80% gold—20% tin (percent, by weight), and 63% tin—37% lead. A characteristic of eutectics to expand when melted is exploited in certain of the embodiments described hereinbelow.

Gold—Pure gold has unsurpassed resistance to oxidation and sulfidation, but a low melting point and susceptibility to erosion limit its use in electrical contacts to low current applications. Gold, in contact with palladium or with rhodium, has a very low contact resistance.

Nickel—Nickel and its alloys are typically characterized by good strength and corrosion resistance. Nickel metal has relatively good electrical conductivity.

Platinum Group Metals—Platinum and palladium are the two most important metals of the platinum group. These metals have a high resistance to tarnishing, and therefore provide reliable contact closure for relays and other devices having low contact forces.

Precious Metals: The following materials generally all exhibit good corrosion-resistance (except for silver in sulfide environments): Gold, Iridium, Osmium, Palladium, Platinum, Rhodium, Ruthenium and Silver.

Silver—Silver, in pure or alloyed form, is a widely used material for make-and-break contacts. The mechanical properties and hardness of puree silver are improved by alloying, but its thermal and electrical conductivity are adversely affected.

Solder—Solders are a widely used group of alloys in the electronic and electrical industries. Their compositions are based primarily on tin and lead, with minor alloying elements such as silver and antimony. Solders are low strength materials at room temperature, and decrease rather rapidly in strength, even at the moderately elevated temperatures experienced by electronic equipment. The relative ratio of tin:lead in solder can range widely, and is nominally 50:50.

Tungsten and Molybdenum—Most tungsten and molybdenum contacts are made in the form of composites, with silver or copper as the principal other component.

Self-Planarizing Features

In most applications having contact structures extending from a surface of an electronic component (such as pins extending from a semiconductor package), it is highly desirable that the distal ends (tips) of the contact structures be coplanar. For protuberant contact structures (e.g., pins) originating from a planar surface, this also means that the pins are of uniform height. Often, the manufacturing tolerances of the electronic component are such that planarity of the component cannot be guaranteed, due to warping, or the like, which may result (for example) from thermal assembly or processing steps. Consequently, the tips of pins having perfectly uniform length mounted to a warped substrate will, by definition, not be coplanar.

According to the invention, the vertical (z-axis) position of the tips of the wire stems is readily controlled during the severing operation (discussed hereinabove). This, in conjunction with the relative ease with which coatings are uniformly applied (from wire stem to wire stem) to a plurality of wire stems, ensures predictable locations (preferably coplanar) of the tips of the plurality of wire stems. This feature of the invention is particularly applicable in instances wherein the wire stems originate from different levels on an electronic component, and are intended to terminate on a planar surface of another electronic component (including coplanar surfaces of two or more electronic components), or vice-versa. A related instance would be the case when the wire stems originate from an electronic component and from an electronic device mounted to the component, and are intended to terminate on a planar surface of another electronic component, or vice-versa. Ensuring precision in the severing operation is discussed hereinabove, with respect to FIGS. 4A-4D.

Figure 6A:
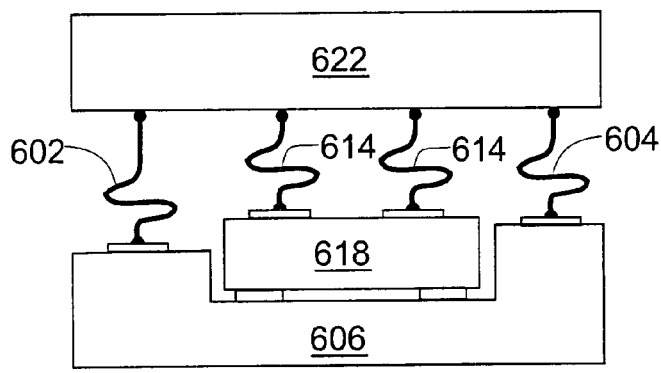
FIG. 6A is side view of an application for the resilient contact structures of the present invention, illustrating that the contact structures can "originate" from various levels on one or more electronic components and can "terminate" at a common, coplanar level.

FIG. 6A shows an application 600 of the invention wherein a first and a second plurality of protuberant contact structures 602 and 604, (one of many shown, in each plurality) respectively, extend (originate) from a first electronic component 606 having terminals (by way of example, only) at two different levels (different z-axis coordinates), respectively, on a top (as viewed) surface thereof, and which has a third plurality (two of many shown) of protuberant contact structures 614 extending from a top (as viewed) surface of a second electronic component 618 which is mounted to the top surface of the first electronic component 606. In this example, the protuberant (resilient) contact structures are shown as S-shaped (in a manner similar to the S-shaped wire stem of FIG. 5A), and the overcoat is omitted, for illustrative clarity.

As shown in this figure, the first, second and third groups of protuberant contacts all originate from different levels (z-axis coordinates), and all terminate (at their tips) on a bottom (as viewed), exemplary planar, surface of a third electronic component 622. (Contact pads, terminals and the like, which the tips of the resilient contact structures would contact, are omitted, for illustrative clarity.)

Due to the different distances that the contact structures 602, 604 and 614 must traverse (a result of originating at different levels and terminating coplanar with one another), a portion of each protuberant contact must be "stretched". This is accomplished, for example, simply by making the distal portions of the contacts longer (or shorter), as required, without modifying the bends in the contact structures. This is illustrated, and is preferred so as to endow the variety of contact structures with the same resilient characteristics.

In this exemplary embodiment 600 of the invention, the component 606 can be a printed circuit board substrate, the component 618 can be a decoupling capacitor, a resistor, or the like (i.e., a passive electronic component), and the component 622 can be a bare, unpackaged semiconductor device (die). The present invention is not limited to any particular electronic components. Among the benefits of making interconnections in this manner is the feature that parasitic inductance between the components can be minimized, which is of paramount importance when dealing with semiconductor devices (e.g., 622) operating at high frequencies. This illustration (FIG. 6A) is similar to FIG. 12 of CASE-1, which shows two straight contact structures per pad (92).

Figure 6B:
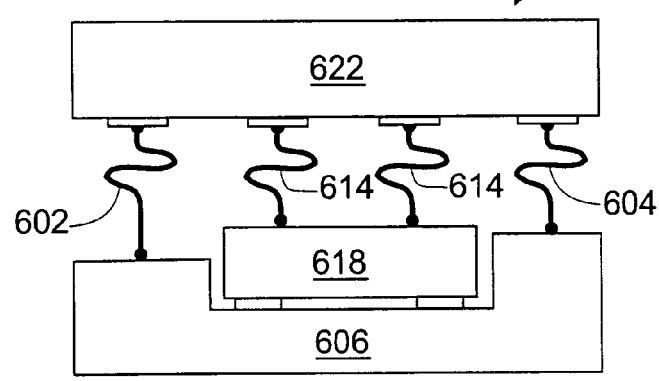
FIG. 6B is side view of an application for the resilient contact structures of the present invention, illustrating that the contact structures can "originate" from a level on an electronic component and can "terminate" at a various levels on one or more electronic components.

FIG. 6B illustrates a corollary to (reverse situation of) FIG. 6A wherein, in this application 620, the contact structures 602, 604 and 614 originate on the third component 622, and terminate on the first component 606 and the second component 618.

FIGS. 6A and 6B both illustrate degree of control over the height of the contact structures that can be achieved, according to the present invention. In the first case (FIG. 6A) the contacts originate from different levels and terminate at the same (coplanar) level. In the second case (FIG. 6B), the contacts all originate from the same level and terminate at different levels. In either illustrated case, the positions of the tips of the resilient contact structures can be precisely controlled during the cut-off (severing) operation, as discussed with respect to FIGS. 4A-4D.

It is within the scope of this invention that an arrangement such as is shown in FIGS. 6A and 6B could be used to mount and connect a one die on another die. Moreover, with respect to FIG. 6A, it is not necessary that there be a recess in the surface of the component 606 to take advantage of the ability of the inventive technique to create contact structures which originate from different levels and have their tips all in a given plane.

Figure 6C:
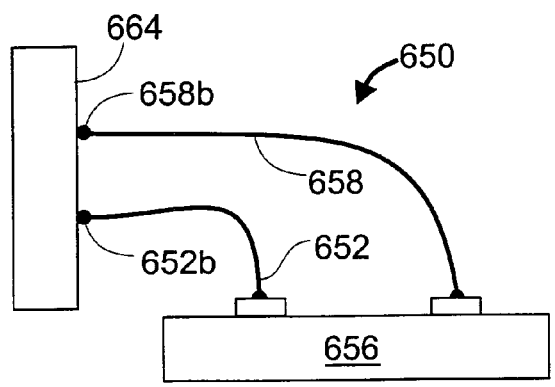
FIG. 6C is side view of an application for the resilient contact structures of the present invention, illustrating that the contact structures can "originate" from a surface of a first electronic component, and can "terminate" at a surface of a second electronic component, wherein the surface of the second electronic component is not parallel to the surface of the first electronic component.

FIG. 6C illustrates another arrangement 650 benefiting from the "self-planarizing" feature of the present invention. In this example, a first representative contact structure 652 originates from a terminal on the top (as viewed) surface of a first electronic component 656, and a second representative contact structure 658 originates from a terminal on the top surface of the first electronic component 656. The contact structures 652 and 658 (shown with only one bend, for illustrative clarity) terminate with their respective tips (distal ends) 652b and 658b off the edge of the component 656, and contact a surface of another electronic component 664. Notably, however, the tips 652b and 658b are coplanar, lying in the x-z plane (compare FIG. 2), while their proximal ends lie in the x-y plane of the surface of the electronic component 656. This illustrates that it is not necessary that the proximal ends and the distal ends of the contact structures lie in parallel planes, and that the contact structures can be fashioned to extend from any set of points (such as the plane, if any, of a surface of a first electronic component) to any other set of points (such as the plane, if any, of a surface of a second electronic component), irrespective of and not limited by the relative orientations of the two (or more) electronic components. In other words, so long as a "free" (not blocked) path exists between two (or more) electronic components desired to be interconnected, contact structures can be fashioned which will extend between the two electronic components, and said contact structures can be made to exhibit any and all of the advantages disclosed herein (e.g., resiliency).

It is within the scope of this invention that a first group of resilient contact structures all terminate on a one plane (which may or may not be coplanar with the substrate from which the resilient contact structures originate), and another group of resilient contact structures originating from the same surface of the same substrate all terminate in a different plane which is not coplanar with either the substrate or with the plane at which the first group of resilient contact structures terminate.

It is also within the scope of this invention that each of the resilient contact structures originating from a surface of a substrate all terminate at different (distinct, individual) heights above the surface of the substrate.

The "self-planarizing" feature of the present invention (i.e., resilient contact structures originating from different levels can all be made to terminate in a common plane) affords many opportunities not present with prior art interconnection techniques. The "common contact tip plane" capability permits incorporating additional components underneath electronic components having resilient contact structures (or, to which resilient contact structures on a board connect), said additional components including resistors and capacitors (e.g., decoupling capacitors), as well as active devices, for enhanced function integration. This permits the desirable realization of very low inductance/capacitance interconnects.

Although not explicitly shown, it should be understood that the resilient contact structures of the present invention need not originate from a "level" terminal, and that the terminal can be skewed (at an angle to other terminals on the substrate). Generally, this is due to the fact that the proximal end of the wire stem (i.e., the end of the wire that is first bonded to the terminal, or the like) is essentially a point, and the configuring of the wire stem is generally insensitive to the orientation of the terminal. This would be important in the context of incorporating additional components (e.g., 618, as shown in FIG. 6A), the terminals of which are not coplanar with one another. This would also be important in instances of bonding to a terminal that is skewed with respect to other terminals. Although the process of bonding the wire to a terminal will perform best when the wire is bonded substantially normal (e.g., at 90°±20-30°) to the surface of the terminal, some skew can be accommodated—the degree of skew generally being limited only in cases where a terminal (i.e., contact area) is so skewed that it would interfere with movement of the capillary (i.e., in cases where an edge of the capillary hits the terminal, thereby mechanically interfering with the bonding operation).

Electronic Components

The invention has been described in the context of bonding a free end of a wire to a "substrate", configuring a compliant wire stem to have a springable shape, and overcoating the wire with a spring material to form a resilient contact structure for making interconnections between two (or more) electronic components (one of which is the "substrate" on which the resilient contacts are formed). Suitable substrates include, but are not limited to the following, many of which are described in greater detail hereinbelow:

(a) interconnect and interposer substrates;
(b) semiconductor wafers and dies, made of any suitable semiconducting material such as silicon (Si) or gallium-arsenide (GaAs);
(c) production interconnect sockets;
(d) test sockets;
(e) sacrificial members, elements and substrates, as described herein;
(f) semiconductor packages ("packages"), including ceramic and plastic packages, and chip carriers, as described herein; and
(g) a connector.

Semiconductor Packages

The present invention is well-suited to providing resilient (including compliant, deformable and flexible) contact structures on an external surface of a semiconductor package.

Semiconductor packages are used for (1) enclosing (protecting) a semiconductor (IC) die in some kind of package body, and (2) providing external connections for connecting the packaged die to external systems. Typically, the external connections provided by the semiconductor package are spaced wider apart from one another than the connections to the semiconductor die. In this sense, a semiconductor package acts as a "space transformer". In this section, the applicability of the contact structures of the present invention in the context of making interconnections from a packaged die to a component of an external system is described.

A number of techniques for packaging a semiconductor device are known, including plastic molding, ceramic packaging and PCB substrate-type packaging.

Generally, prior art ceramic packaging techniques involve mounting a die within a cavity of a package body made of one or more layers of conductive traces (conductive lines) interleaved between ceramic layers. The die is connected, such as by conventional wire bond techniques, to inner ends of the conductive traces which extend to within the cavity. Outer ends of the traces are connected, within the ceramic, to external pins, leads or pads on an external surface of the ceramic package body.

Generally, prior art plastic molding techniques involve a mounting a die to a paddle of a relatively rigid lead frame, wherein the leadframe has a patterned layer of conductive leads (conductive lines). The die is connected, such as by conventional wire bond techniques, to inner end portions of the conductive leadframe leads. The die and the inner portion of the lead frame are encapsulated by plastic molding compound. Outer end portions of the conductive leads extend outside of the molded plastic body for making connections to external components.

Generally, PCB-substrate type packaging techniques involve mounting a die to a printed circuit board (PCB) substrate having conductive traces. The die is connected, such as by conventional wire bond techniques, to inner ends of the conductive traces, which extend to an area adjacent the die. Once connected to the inner ends of the traces, the die and inner ends of the traces may be encapsulated with plastic or resin. Outer ends of the conductive traces are connected, within the PCB to external pins, leads or pads on an external surface of the ceramic package body.

FIG. 7A illustrates a ceramic package 700 having a plurality of resilient contact structures 730 mounted to an external (bottom, as viewed) surface of the package body 702. The contact structures 730 in this example have an S-shape (as shown in FIG. 2E). The package body 702 is provided with a cavity 704 extending into the package body from the top (as viewed) surface thereof. A semiconductor die 706 is disposed within the cavity, which is closed off by a lid 708. The semiconductor die is connected by bond wires 710 to ends of conductive traces (not shown) extending into the cavity 704. These traces are connected by conductive vias (not shown), additional patterned layers of conductive traces (not shown), and the like, to conductive pads (not shown) on the bottom surface of the package body 704. The resilient contact structures 702 are mounted, on a one-to-one basis, to the conductive pads. In such a "cavity-up" package, the entire bottom surface of the package body can be "populated" with contact structures, arranged in an array of rows and columns. (In this figure, and in certain other figures presented herein, the resilient contact structure (e.g., 730, 750) is shown simply as a thick black line, and it will be understood that these contact structures are overcoated.)

FIG. 7B illustrates an exemplary plastic semiconductor package 740 having a plurality of resilient contact structures 730a and 730b (two of many shown) used as external interconnects. The contact structures 730a and 730b in this example have an S-shape (as shown in FIG. 2E). Conductive leadframe elements (fingers) 744a and 744b are illustrated extending from within the package body 742 to without the package body. The resilient contact structures 730a and 730b are mounted to outer portions of the respective leadframe fingers 744a and 744b extending without the package body. Similarly, a semiconductor die 746 can optionally be connected (as shown) by resilient contact structures 750 to inner ends of the leadframe fingers 744.

As illustrated in FIG. 7B, the leadframe fingers 744a and 744b can extend alternately to two different distances from the semiconductor package body 742 (e.g., short-long-short-long, etc.). In this manner, the effective pitch of the distal ends of the resilient contact structures 730a and 730b can be increased. Further discussion of such "pitch spreading" can be found in the description of FIG. 15A. Generally, the ability to increase effective pitch from the proximal ends to the distal ends (tips) of the contact structures allows for more facile connection of an electronic component to a printed circuit board. In a sense, this is what all semiconductor packages do, providing an external interconnect pitch that is wider that the spacing of bond pads on a semiconductor die. In the prior art, peripheral lead packages are limited to approximately a 20 mil pitch between leads, due to constraints of soldering the leaded component to a printed circuit board. By staggering the peripheral leads (744a, 744b), as illustrated in FIG. 7B, greater density can readily be achieved, while maintaining these constraints.

FIG. 7C illustrates a PCB-type package 780 having a plurality of resilient contact structures 730 mounted to an external (bottom, as viewed) surface of a printed circuit board (PCB) 782. The contact structures 730 in this example have an S-shape (as shown in FIG. 2E). A semiconductor die 786 is mounted to the top (as viewed) surface of the PCB 782, and is connected by bond wires 790 to conductive traces (not shown) atop the PCB 782. The contact structures 730 are mounted to conductive pads (not shown) on the bottom (as viewed) surface of the PCB 782. The conductive pads on the bottom surface of the PCB 782 are connected, via plated through holes (not shown), additional wiring layers (not shown) within the PCB 782, to the conductive traces on the top surface of the PCB 782. A quantity of epoxy 792 is applied over the die 786 and the bond wires 790, to encapsulate the die 786. Alternatively, the PCB 782 may be overmolded with plastic.

FIG. 7D illustrates another package 790, wherein a semiconductor die 791 is bonded in a conventional manner with bond wires 792 to inner ends of leadframe fingers 793. A passivation layer 794 overlies the die, with openings for bonding to the die. This is fairly conventional. According to the present invention, the integrity of the bonds (i.e., bond wires) can be enhanced by immersing the die, bonded to the leadframe, in a suitable plating bath, to plate (i.e., overcoat) the bond wires (and the inner ends of the leadframe fingers)—the plating (e.g., nickel) serving to stiffen the bond wires and to securely anchor the bond wires to the bond pads on the die (and, optionally, to the inner ends of the leadframe fingers), in the manner discussed hereinabove. Such stiffening of the bond wires will help minimize problems (e.g., wire-to-wire shorting) associated with wire wash (movement), and the like, in a subsequent process step of molding (or glob-topping) an insulating body 795 onto the die, and will help minimize problems (stresses on the bonds) associated with thermal expansion. Overcoating the bond wires also helps support the die in cases where the back of the die is open, as illustrated.

As shown in this example, the die (and leadframe) can be partially (rather than fully) overmolded, leaving the back surface of the die exposed. This would be advantageous for mounting a heatsink (not shown) to the back of the die, or for accommodating heatsink structures (discussed hereinbelow, e.g., with respect to FIGS. 24D and 24E) which have been fabricated on the back of the die. Generally, this would best be accomplished by mounting the die and the leadframe atop a support layer 797 (e.g., polyimide film) having an opening aligned with a central portion of the back of the die (the edges of the die being supported by the support layer). In this illustration, external connections to the package have been omitted, so as not to clutter up the drawing. It is within the scope of this invention that any suitable external connection could be employed, including the resilient contact structures of the present invention.

Sacrificial Elements

According to an aspect of the invention, resilient contact structures can be formed on, or from an electronic component to, a sacrificial element.

Figure 8B:
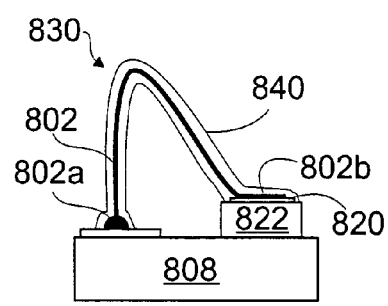
FIG. 8B is a side view of the looped wire of FIG. 8A after being overcoated, according to the present invention.
Figure 8C:
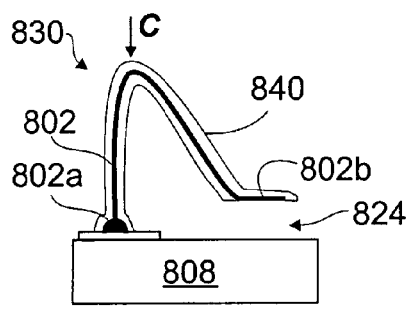
FIG. 8C is a side view of the looped, overcoated wire of FIG. 8B after the sacrificial element has been removed, according to the present invention.

The use of a sacrificial element in conjunction with forming a resilient contact structure is discussed in CASE-1, at FIGS. 6a-6c therein, which are similar to FIGS. 8A-8C herein.

FIG. 8A illustrates at a wire 802 having its proximal end 802a bonded to a first terminal 812 on a substrate 808 can be formed into a U-shaped loop and, rather than severing the distal end 802b of the wire 802, bonding the distal end 802b of the wire to a second terminal 820 with a suitable wedge-bond or the like.

The resulting loop-shaped wire stem 830 is overcoated, as shown in FIG. 8B, with a one or multi-layer coating 840 which envelops the entire wire stem 830 and the terminals 812, 820. The second terminal 820 is suitably positioned atop a sacrificial layer which serves as an electrical contact point for electroplating processes (if such processes are employed to overcoat the wire stem), and also serves to provide a different (higher) z-axis coordinate for the two ends of the wire stem 802a and 802b.

As illustrated in FIG. 8C, after overcoating the wire stem, the sacrificial layer 822 can be removed (such as by selective etching), leaving a gap 824 between the end 802b and the surface of the substrate 808. The "suspension" of the end 802b is especially important for formation of controlled geometry spring contacts, capable of resiliently engaging with mating terminals on a component or a substrate for burning-in or testing (discussed in greater detail hereinbelow) an electronic component (such as a semiconductor die), or for providing a demountable electrical interconnect to an electronic component. The gap 824 allows for z-axis deflection (movement) of the tip 802b of the resulting contact structure when a force is applied thereto.

As illustrated in FIG. 8C, it is intended that the contact structure 830 make contact at a point along its length, rather than at its distal end (802b). This is illustrated by the downward pointing arrow labelled "C". (A similar result would pertain to the contact structures 1640 and 1642 shown in FIG. 16C.)

Figure 8D:
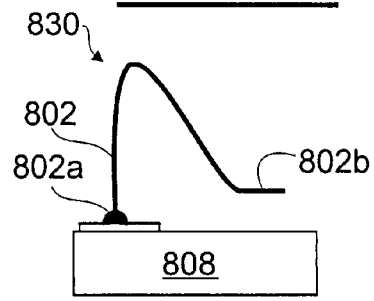
FIG. 8D is a side view of the looped wire of FIG. 8A after the sacrificial element has been removed, but before the wire has been overcoated, according to an alternate embodiment of the present invention.

FIG. 8D illustrates that the procedure described immediately hereinabove could be re-ordered, so that the sacrificial member (822 of FIG. 8A) could be removed prior to overcoating the wire stem (see, e.g., FIG. 8B).

As used herein, a "sacrificial element", such as the element 822 described hereinabove, is generally an element (such as a layer) on the electronic component (808) to which the resilient contact structure is mounted.

Sacrificial Members and Probe Embodiments

Figure 9A:
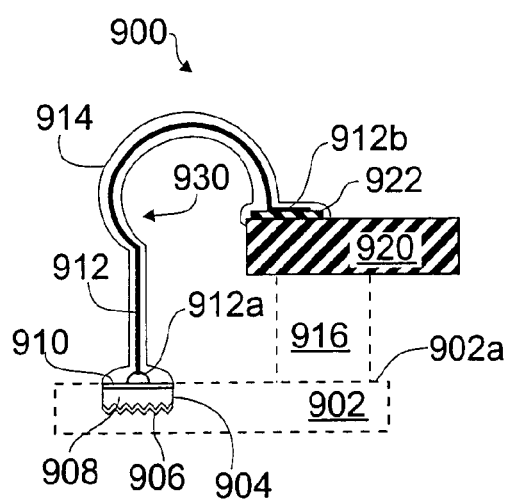
FIG. 9A is a side view of a wire configured into a shape and overcoated, in an embodiment of a resilient probe, according to the present invention.
Figure 9B:
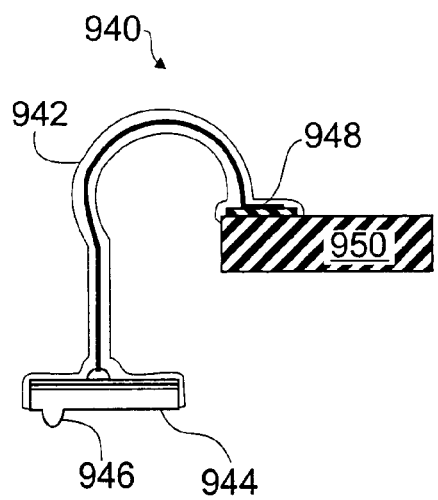
FIG. 9B is a side view of a wire configured into a shape and overcoated, in an alternate embodiment of a resilient probe, according to the present invention.
Figure 14A:
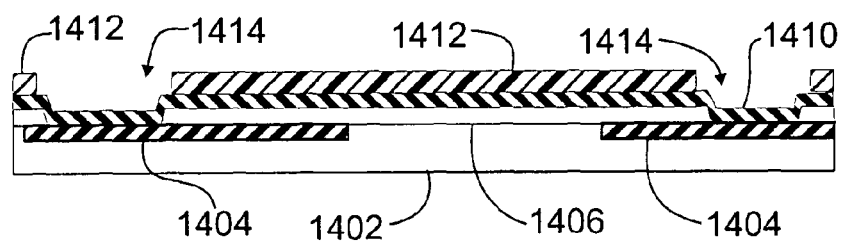
FIGS. 14A-14E are side views of a technique for mounting resilient contact structures to a semiconductor die, according to the present invention.
Figure 14B:
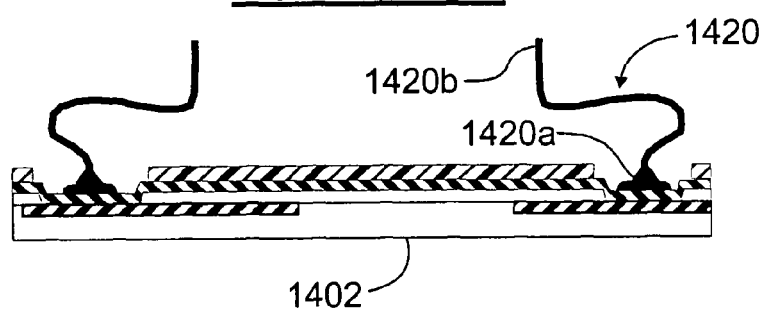
Figure 14C:
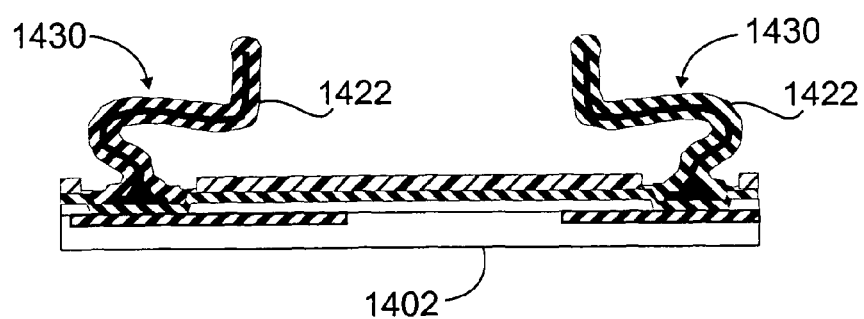
Figure 14D:
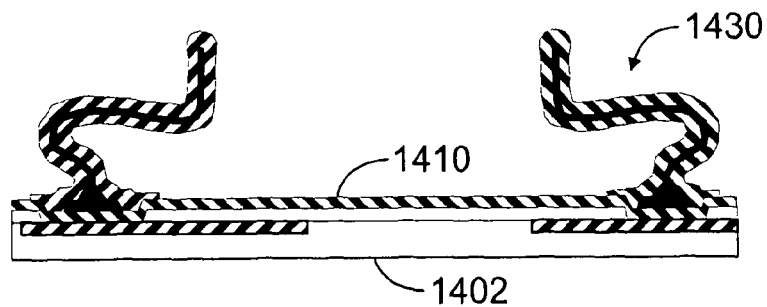
Figure 14E:
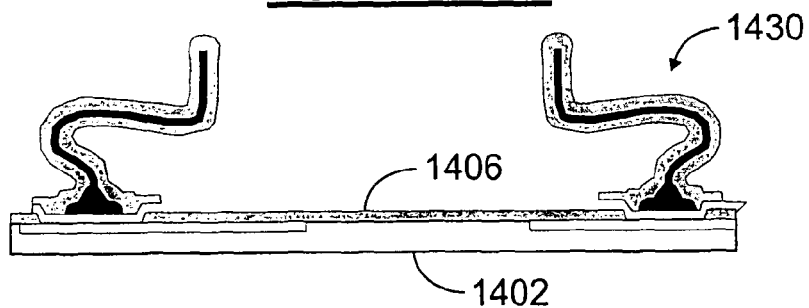
Figure 14F:
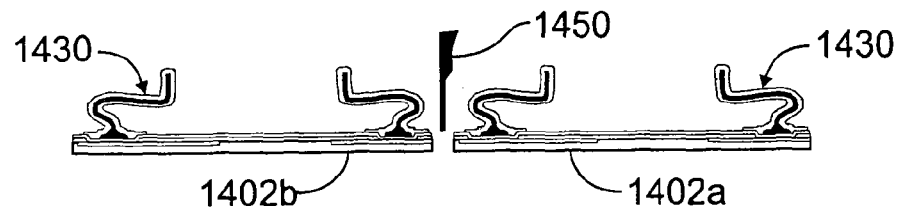
FIGS. 14F and 14G are side views of a technique, similar to that described with respect to FIGS. 14A-14E, for mounting resilient contact structures to semiconductor dies prior to their singulation from a wafer, according to the present invention.
Figure 14G:
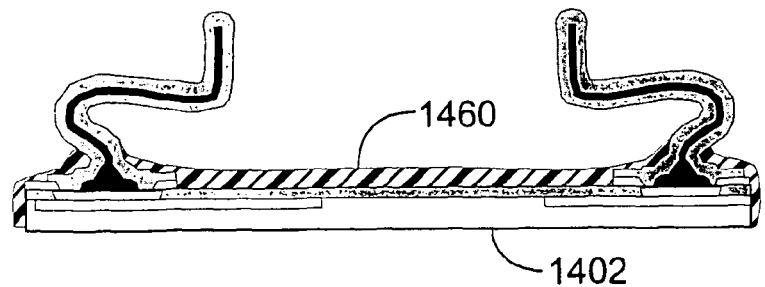
Figure 15:
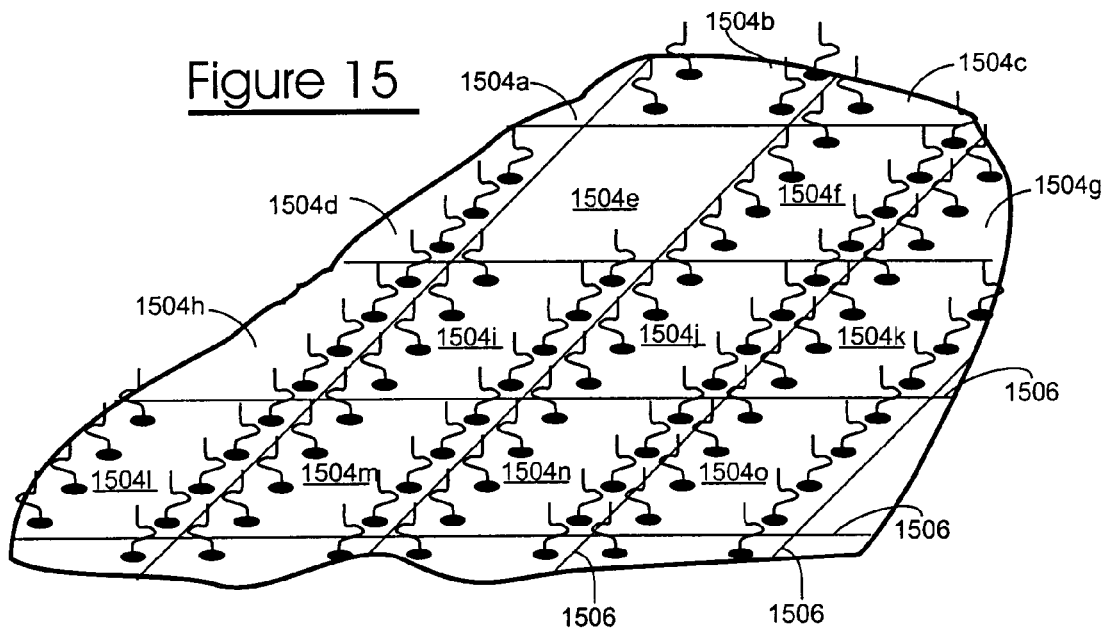
FIG. 15 is a perspective, partial view of a plurality of resilient contact structures mounted to multiple die sites on a semiconductor wafer, according to the present invention.

The use of a sacrificial member in conjunction with forming a resilient contact structure useful as a probe is discussed in CASE-2, at FIGS. 14-15 therein, which are similar to FIGS. 9A-9B herein.

FIG. 9A illustrates an embodiment 900 of the use of a sacrificial member 902 (shown in dashed lines) in conjunction with forming a resilient contact structure 930 suitable for use as a probe. In this example, the sacrificial member is suitably formed of aluminum.

A plurality (one of many shown) of depressions 904 are formed, such as by etching, engraving, stamping, or the like, in the top surface 902a of the sacrificial member 902. The bottom (as viewed) surface of the depression 904 has an irregular topography, such as in the form of inverted pyramids ending in apexes. A thin layer 906 of a conductive material, such as gold or rhodium (alternatively, tin or solder, such as when contacting solder terminals) is deposited in the depression, in any known manner. The depression 904 is then substantially filled with a conductive material 908 such as nickel, in any known manner. A layer 910 of a conductive material such as gold is then deposited over the filler material 908, in any known manner. This sandwich structure of gold (906), nickel (908) and gold (910) forms a suitable tip structure ("contact pad") for a probe.

A wire 912 is bonded at its proximal end 912a to the surface of the layer 910, and is configured to extend over an edge of an electronic component 920, whereat the wire is severed and its distal end 912b bonded to a terminal 922 on the electronic component 920. The configured shape of the wire is similar to the shape shown in FIG. 2D (i.e., in that it projects off the edge of the component 920).

The wire is then overcoated with a conductive material 914, such as nickel, or with a multilayer coating as discussed with respect to FIG. 5, which also overcoats the terminal 922 on the electronic component, in the manner described hereinabove. To ensure that the overcoating covers only a desired area on the sacrificial member, the entire surface of the sacrificial member, except for the depressions (904) can be masked with a suitable masking material, such as with photoresist (not shown). (This masking may be "leftover" from forming and filling the depressions to fabricate the contact pads.)

As is shown, the sacrificial member 902 is maintained in a predetermined position with respect to the electronic component 920 by a suitable standoff element 916 (shown in dashed lines), which may simply be photoresist material.

Upon completion, the standoff element 916 and the sacrificial member 902 are removed, leaving resilient contact structures 930 extending from the electronic component 920, each of which has a contact pad of controlled geometry at its end. For example, the apexes of the inverted pyramids of the contact pad are useful, in the context of probing, for effecting reliable electrical connection to a terminal (pad) of another electronic component (not shown) which is desired to be probed (e.g., for burn-in, testing or the like). With relatively low overall forces involved, the points (apexes) will partially penetrate the terminal of the electronic component being probed. Generally, in this case, the electronic component 920 would be a test card (printed circuit board) having a plurality of probe structures (930) extending to an area whereat an electronic component being probed would be introduced. The test card would suitably be in the form of a ring, with the probes 930 extending from an inner edge of the ring to below the ring.

It is within the scope of this invention that the sequence of events described hereinabove be re-arranged so that:
(a) the wire 912 is bonded first to the terminal 922 of the electronic component 920; and/or
(b) the wire 912 is overcoated (914) after the sacrificial member 902 is removed.

FIG. 9B shows an embodiment 940 of a completed probe 942 which is similar to the probe 930 of the previous embodiment 900, with the following differences. In this case, the end of the probe 942 (compare 930) is wedge-bonded to a contact pad 944 which has a single projecting nub 946, rather than a plurality of points, and the end 948 (compare 912b) of the probe 942 is ball-bonded to the electronic component 950 (compare 920).

Figure 9C:
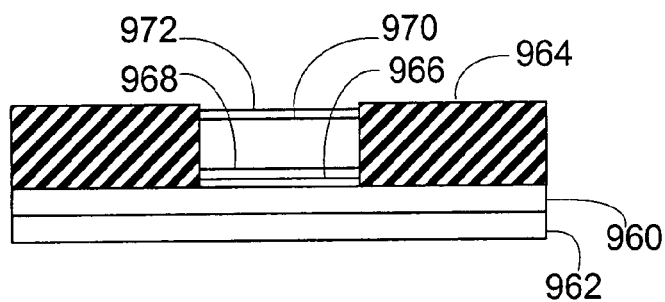
FIG. 9C is a side view of a multilayer contact pad for a resilient contact structure, according to the present invention.

As illustrated in FIG. 9C, a useful (e.g., preferred) contact tip for a probe can be formed in (or on) a sacrificial member, in the following manner, on a thin aluminum (foil) sacrificial member 960:
provide a temporary backing 962, such as a plastic sheet, for the foil, to increase the structural integrity of the foil;
pattern the face of the foil with a thin (approximately 3 mil) layer of photoresist 964, or the like, leaving openings at locations whereat it is desired to form contact tips;

deposit (such as by plating) a thin (approximately 10 μ") layer 966 of hard gold onto the foil, within the openings in the photoresist;

deposit (such as by plating) a very thin (approximately 5-10 μ") layer ("strike") of copper 968 onto the layer of hard gold (it should be understood that such a copper strike is somewhat optional, and is provided principally to assist in subsequent plating of the previous gold layer 966);

deposit (such as by plating) a thick (approximately 2 mil) layer 970 of nickel onto the copper strike; and deposit (such as by plating) a thin (approximately 100 μ") layer 972 of soft gold onto the nickel.

This forms a 4-layer contact tip, to which a gold wire (not shown) is readily bonded (to the soft gold layer), having a hard gold surface (966) for contacting electronic components, a nickel layer (970) providing strength, and a soft gold layer (972) which is readily bonded to. As described hereinabove, after bonding the wire to the sacrificial member (960), the wire is plated (e.g., with nickel) and the sacrificial member is removed (or vice-versa).

Additional Probe Embodiments

The ability to form a resilient contact structure using a sacrificial element on the substrate (as in FIG. 8A) or using a sacrificial member off of the substrate (as in FIG. 9A) has been generally discussed, hereinabove.

As discussed hereinabove, the resilient contact structure described in FIGS. 9A and 9B are suitably employed as probes, contacting an electronic component for burning-in, and testing and exercising the functionality of the probed component.

According to the invention, resilient contact structures can be incorporated into a chip probing card.

FIGS. 10A-10I illustrate fabrication method for making a chip probing card, using a sacrificial member. Generally, openings are formed in photoresist on the sacrificial member (e.g., aluminum or copper), an optional topography is created in the sacrificial member within the resist openings (typically by an additional etching step or by a shaped tool), then at least one conductive layer is plated or deposited inside the openings, at which point the sacrificial member is mounted to (e.g., underneath) a chip probing card (this mounting could be the first step which is performed). Then, wires are bonded to the sacrificial member and to the card, and are overcoated with spring material (or any other material). Finally, the sacrificial layer is removed, without adversely impacting the contacts (probes).

It is of note, in the probe embodiments described herein having a contact pad formed at the tip of the wire, said contact pad typically having a topography favorable to making temporary connections to devices being tested (probed), that the material coating the shaped wire need not be conductive, so long as it provides the sought-after resiliency—for many applications, the wire itself providing the necessary conductive path between the probe card (e.g.) and the device being probed.

Figure 10A:
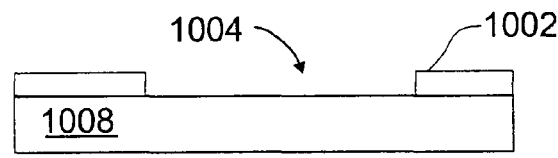
FIGS. 10A-10C are side views of a first phase (Phase-1) of a process for forming a chip-probing card having resilient contacts, according to the present invention.
Figure 10B:
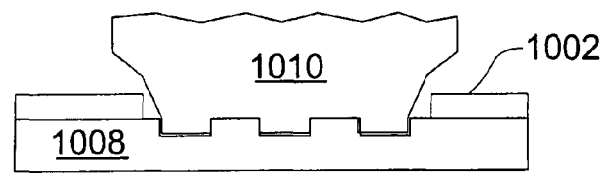
Figure 10C:
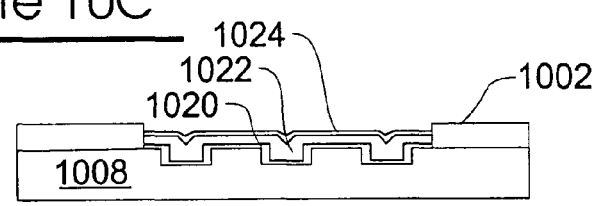

A first "phase" (Phase-1) of the process flow, involving processing a sacrificial member, is illustrated in FIGS. 10A-10C, wherein:

FIG. 10A illustrates a first step wherein a patterned layer of photoresist 1002, having openings 1004 (one of many shown) defined therein, is applied over a sacrificial material substrate 1008, such as an aluminum or copper sheet.

FIG. 10B illustrates a next step wherein the otherwise generally smooth, planar substrate material within the openings 1004 is "embossed" to exhibit a topography, such as by micromachining or by lithography (e.g., including etching). This is illustrated by an embossing tool 1010 pressing down upon the surface of the substrate, within the opening 1004, to create a plurality of depressions 1012 extending into the surface of the substrate 2008.

FIG. 10C illustrates that, after the tool (1010) is removed (or the surface of the substrate is otherwise embossed, such as by etching), the surface of the substrate within the opening (1004) is plated with a thin layer 1020 of a material suitable for making contact with another electronic component, such as rhodium. Another, thicker layer 1022 of a material such as nickel is applied over the thin layer 1020. This layer 1022 substantially fills the depressions 1012 formed by embossing, and preferably overfills the depressions 1012, as illustrated. Next, a thin layer 1024 of bondable (e.g., soft) gold is applied, over the thick layer 1022, within the opening 1004. The layered structure 1026 (see FIG. 10D) in the opening 1014 defines a contact pad to which a wire will be bonded.

Having performed the steps illustrated in FIGS. 10A-10C, the sacrificial member 1008 is ready for contact mounting.

Figure 10D:
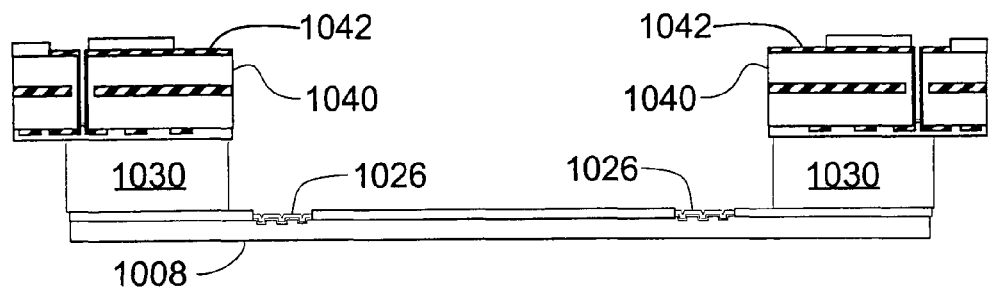
FIGS. 10D-10G are side views of a second phase (Phase-2) of a process for forming a chip-probing card having resilient contacts, according to the present invention.

A second "phase" (Phase-2) of the process flow, involving mounting a contact-carrying substrate to the sacrificial member (1008) and fabricating resilient probe contact structures is illustrated in FIGS. 10D-10C, wherein:

FIG. 10D illustrates that a sacrificial member 1008, prepared per the steps of Phase-1, has a standoff element 1030 mounted to its surface, in a peripheral region thereof. The standoff element 1030 is suitably formed as a thick layer of photoresist (alternatively of a polymer, alternatively a metal shim), patterned to have a ring (e.g., square ring) profile with a central area 1032 corresponding to an area wherein, upon completion of the process, a semiconductor die (e.g.) will be introduced for contacting by probes (discussed below). A ring-shaped substrate 1040 having a central open area corresponding to and aligned with the open area 1032 is disposed atop the standoff element 1030. (The substrate 1040 is, for example, a multi-layer PCB.) A top (as viewed) surface of the ring-shaped substrate 1040 has a plurality of contact areas 1042 (compare 110, FIG. 1) defined preferably near the opening in the substrate 1040. The substrate 1040 is illustrated as being a multi-layer circuit board (e.g., PCB) having alternating layers of insulating material and conductive material, and may have discrete electronic components mounted thereto (such as test circuitry, and the like).

It is within the scope of this invention that the substrate 1040 could simply be an insert mounted to a distinct and separate probe card (not shown).

Figure 10E:
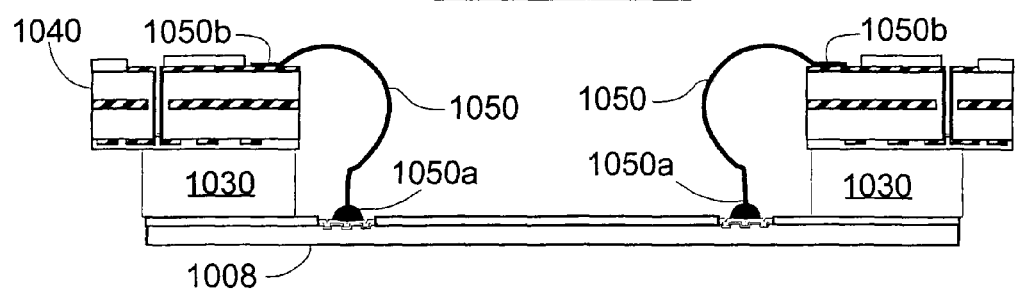

FIG. 10E illustrates that a wire 1050 is bonded at both its ends 1050a and 1050b (in a manner akin to that of the aforementioned loop 802) between the contact areas 1042 on the PCB 1040 and the material (1022) in the openings on the sacrificial substrate 1008 to make an electrical connection therebetween. For example, a one end 1050a of the wire 1050 is ball bonded to the layer 1022 in the area 1012, and an other end 1050b is wedge bonded to the contact area 1042. The wire 2050 is fashioned (as described hereinabove) into a shape that is suitable (once overcoated, as described hereinbelow) for functioning as a resilient probe contact structure. It is, essentially, immaterial which end of the wire 1050 is bonded first, and which end of the wire is bonded second.

Figure 10F:
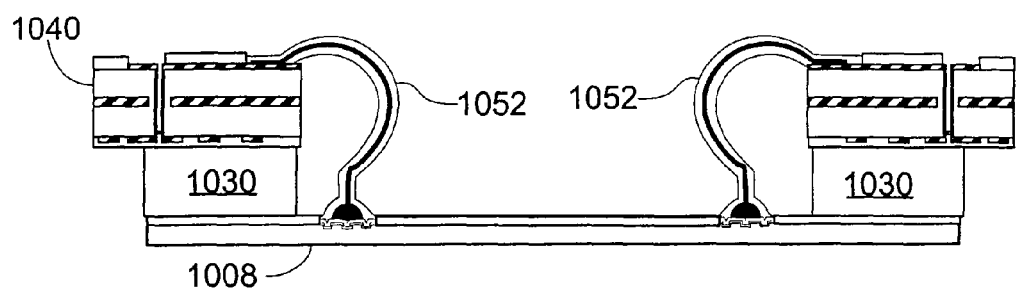

FIG. 10F illustrates that, after the wire 1050 is bonded between the substrates 1008 and 1040 (and fashioned into a shape after the first bond and prior to the second bond), the wire 1050 is overcoated with a conductive material 1052 which completely covers the wire 1050, and which also covers the contact area on the substrate 1040, and which also completely covers the area within the opening 1012 in the sacrificial substrate 1008. The method and manner of overcoating the wire with a material that will impart resilient properties to the resulting contact (prove) structure is any of the techniques described hereinabove.

Figure 10G:
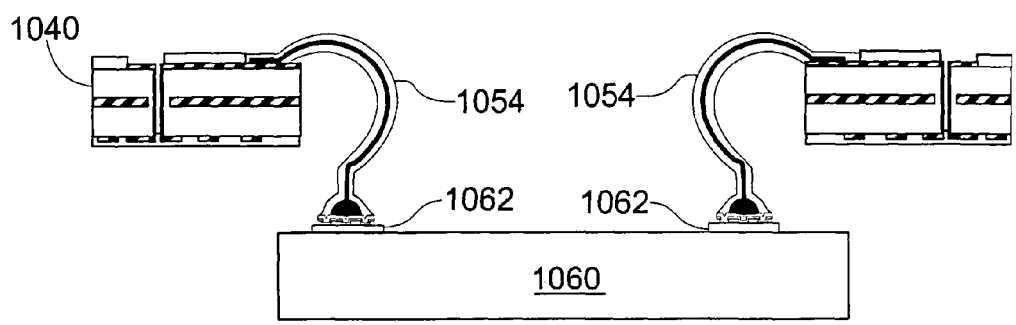

FIG. 10G illustrates that, after the wire 1050 is overcoated, the sacrificial substrate 1008 can be removed, such as by chemical etching. As illustrated, removing the sacrificial substrate will include removing the layer 1002, as well as removing the standoff element 1030. This will result in the card substrate 1040 having a plurality (two of many shown) of probe contact structures 1054 (each comprising a wire 1050 which is overcoated 1052) extending from a plurality (two of many shown) contact areas 1042 to within and below the opening in the card substrate 1040, for making resilient contact to a corresponding plurality (two of many shown) of contact areas 1062 on a semiconductor device 1060. These contact areas 1062 are typically bond pads arranged just inside the perimeter of the die 1060.

As is clearly shown in FIG. 10G, each resilient contact probe 1054 has a tip 1054b which is formed by the layers 1022 and 1020, which is the "mirror image" of the embossed pattern provided by the areas 1012.

In this manner, resilient, temporary connections can be made between a test card (1040) and a device under test (DUT) 1060 which, as described in greater detail hereinbelow, is important for performing burn-in and testing of semiconductor devices prior to packaging the devices, or in order to produce fully-validated devices.

Figure 10H:
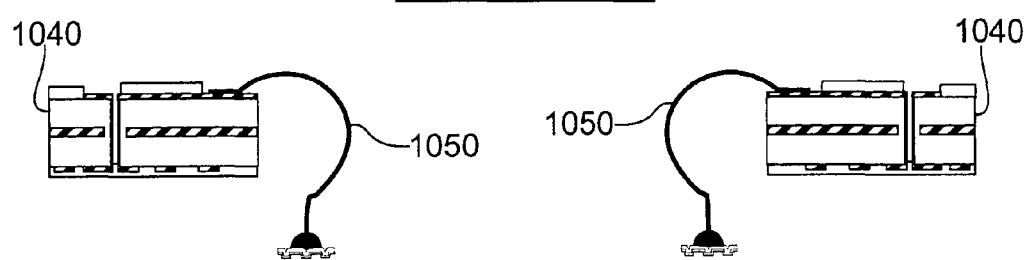
FIGS. 10H-10I are side views of an alternate embodiment of a second phase (Phase-2) of a process for forming a chip-probing card having resilient contacts, according to the present invention.
Figure 10I:
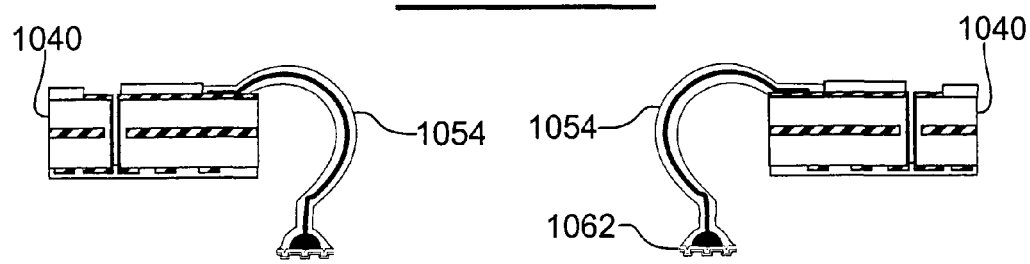

FIGS. 10H and 10I illustrate alternate final and penultimate steps in Phase-2, wherein the sacrificial substrate 1008 (and standoff element 1030) are removed (FIG. 10H) prior to overcoating (FIG. 10I) the shaped wire 1050.

FIGS. 10J and 10K illustrate alternate embodiments of resilient contact structures, functioning as probes, according to the present invention. FIG. 10J shows an embodiment of a probe which is similar to FIG. 11 of CASE-2, and FIG. 10K shows an embodiment which is similar to FIG. 12 of CASE-2.

FIG. 10J illustrates another embodiment 1070 of a probe-like contact structure. As in previous embodiments, a wire stem 1072 (flexible elongate element) has one end 1072a bonded to a contact area 1074 on a substrate 1076. Another end 1072b of the wire stem is bonded (shown as wedge-bonded) to a pre-formed contact tip 1078 on a sacrificial member 1080, in any suitable manner, and is overcoated (e.g., with nickel material 1079) to provide the desired deflection characteristics for the resulting probe. A suitable standoff element 1083 (compare 1030) is suitably employed. Ultimately, both the standoff element 1083 and the sacrificial substrate 1080 are removed.

FIG. 10K illustrates another embodiment 1084 of a probe-like contact structure. As in previous embodiments, a wire stem 1086 (flexible elongate element) has one end 1086a bonded to a contact area 1074 on a substrate 1076. Another end 1086b of the wire stem is bonded (shown as wedge-bonded) to a pre-formed topological contact pad 1088 on a sacrificial member 1090, in any suitable manner. The wire stem 1086 is provided with a multi-layer coating, in the following manner. A layer 1092 of a conductive material (such as nickel) is deposited (e.g., plated) over the wire stem 1086, to impart resiliency to the wire stem and to anchor the wire stem to the contact pad 1092. A layer 1094 of dielectric material (such as silicon dioxide) is applied over the nickel layer 1092. The dielectric material (1094) may encompass (not shown) the contact pad 1088 to assist in anchoring the wire stem thereto. Next, the wire stem is masked, such as by dipping the tip of the wire stem, with contact pad attached, into a suitable masking material, such as photoresist (not shown). Finally, another layer 1096 of conductive material (such as gold) is deposited over the wire stem. This forms a coaxial (shielded) conductor, the outer layer (1096) of which can be grounded (as indicated by the ground symbol "G"), in any suitable manner, to control the impedance of the probe structure. A suitable standoff element 1093 (compare 1030) is suitably employed. It is within the scope of this invention that the wire stem can be overcoated (as described hereinabove) prior to attaching (e.g. by brazing) the contact pad (1088) thereto. In this example, the contact pad 1088 is shown as being "topological" (compare 1026 of FIG. 10D), a feature which is especially useful for probing, especially for probing solder bumps (see, e.g., FIG. 12E).

Contact-Fabrication on a Sacrificial Substrate

In the main, hereinabove, techniques have been described for fabricating resilient contact structures by bonding an end of wire to an electronic component, configuring the wire to be a wire stem having a springable shape, overcoating the wire with a resilient material, and optionally bonding another end of the wire to a sacrificial element or to a sacrificial member. In this manner, a resilient contact structure is mounted to an electronic component.

According to the invention, a plurality of resilient contact structures are fabricated, as separate and distinct structures, without mounting the resilient contact structures to an electronic component, for subsequent (after the resilient contact structures are fabricated) mounting (such as by brazing) to an electronic component. In other words, a supply (e.g., "bucket") of contact structures can be fabricated and warehoused, for later attachment (mounting) to electronic components. This is akin to the prior art technique of fabricating a plurality of pins, then later brazing them to package bodies.

Figure 11A:
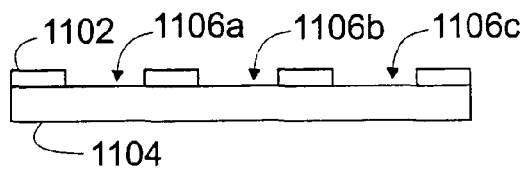
FIGS. 11A-11F are side views illustrating a process sequence for mounting resilient contact structures to a sacrificial substrate, according to the present invention.

FIG. 11A illustrates a first step in fabricating discrete resilient contact structures, wherein a patterned layer of photoresist 1102 is applied to a surface (top, as viewed) of a sacrificial substrate 1104. The photoresist 1102 is provided with a plurality (three of many shown) of openings 1106a, 1106b and 1106c (e.g., using conventional screening techniques).

Figure 11B:
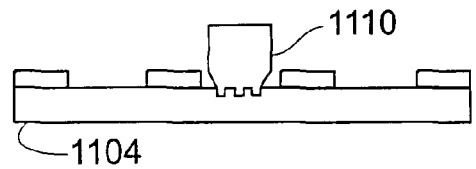

FIG. 11B illustrates a next step, wherein a topography is (optionally) created in the sacrificial substrate 1104 within the resist openings by using a shaped (embossing) tool 1110. (The use of a tool is an alternate to etching a topography in the surface of the sacrificial substrate.) As illustrated in this figure, a topography has been created in the sacrificial substrate 1104 within the opening 1106a, is being created in the sacrificial substrate 1104 within the opening 1106b, and is yet to be created in the sacrificial substrate 1104 within the opening 1106c.

Figure 11C:
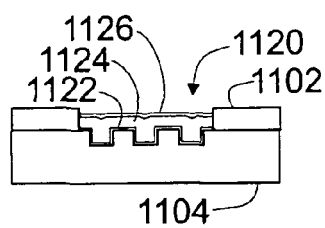
Figure 11D:
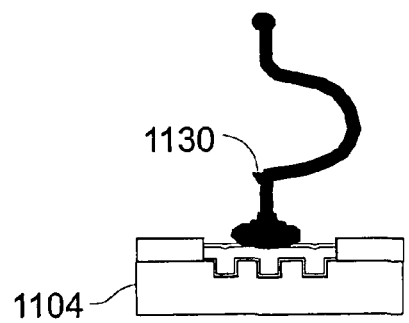
Figure 11E:
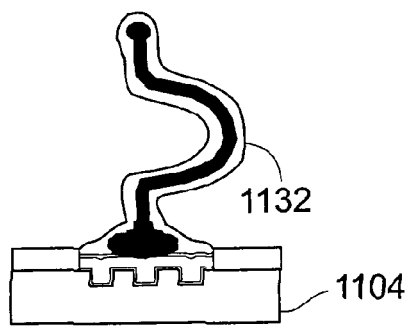

FIGS. 11C-11E illustrate subsequent steps in the process of fabricating a plurality of discrete resilient contact structures, for an exemplary one of the plurality of contact structures (within an exemplary corresponding one of the openings 1106a).

FIG. 11C illustrates the formation of a contact tip 1120 (compare 990) within the opening 1106a, by plating a first conductive layer (e.g., of hard gold) 1122 on the sacrificial substrate 1104 within the opening 1106a, plating a second conductive layer (e.g., of nickel) 1124 atop the first layer 1122, and plating a third conductive layer 1126 (e.g., of hard gold) atop the second layer 1124. (The three-layer contact tip shown in this set of figures is merely exemplary, it being understood that at least one layer is required.) Generally, the bottom layer 1122 should be of a material which is amenable to making contact with electronic components, and the top layer 1124 should be of a material that is amenable for bonding to a wire stem. As describe hereinabove, a four-layer structure can be formed, comprising a thin layer of hard gold (for contacting electronic components), followed by a very thin layer of copper, followed by a layer of nickel, followed by a thin layer of soft gold (for bonding a gold wire stem). It should be understood that the thin copper layer is optional.

FIG. 11D illustrates the bonding of a wire to the contact tip 1120, and shaping of the wire to be a wire stem 1130 in any suitable manner set forth hereinabove. (Compare, e.g., FIG. 2A).

FIG. 11E illustrates overcoating the wire stem with a springy (e.g., nickel) material 1132, in any suitable manner set forth hereinabove. (Compare, e.g., FIG. 5A).

Figure 11F:
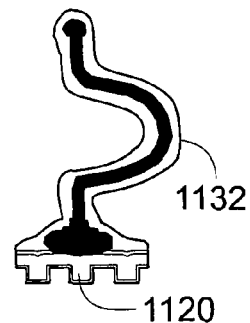

FIG. 11F illustrates a final step, wherein the sacrificial substrate 1104 and photoresist 1102 are removed, by any suitable process, such as washing off the photoresist, and dissolving the sacrificial substrate. This completes the fabrication of a resilient contact structure 1130 having a contact tip 1120.

In this manner, a plurality of individual resilient contact structures can be formed. Contact structures formed, for example, by the technique illustrated in FIGS. 11A-11F can be mounted (such as by brazing, soldering, epoxy attachment, or the like) to pads on an external surface of a semiconductor package, individually, on a one-by-one basis. As described immediately hereinbelow, it is preferable, in a number of applications, that a plurality of contact structures be transferred at once ("gang" transferred) to the external surface of a semiconductor package.

Contract Gang Transfer

As described hereinabove, with respect to FIGS. 11A-11F, a plurality of discrete "not-mounted" resilient contact structures can be formed for subsequent mounting to an electronic component.

According to the invention, a plurality of resilient contact structures can be fabricated on a sacrificial substrate (e.g., in the manner of FIGS. 11A-11E), then mounted en masse (gang transferred) to an electronic component. (Generally, this is achieved by omitting the step of de-mounting the contact structures from the sacrificial substrate—or, omitting the step illustrated in FIG. 11F).

According to the invention, a plurality of previously-formed, resilient contact structures, mounted to a sacrificial carrier (sacrificial substrate), can be transferred in a single step (gang transferred) to an electronic component, such as a fully-assembled ceramic package. (Ceramic packages having a plurality of resilient contact structures mounted to an external surface thereof are generally described, hereinabove, with respect to FIG. 7A).

Figure 12A:
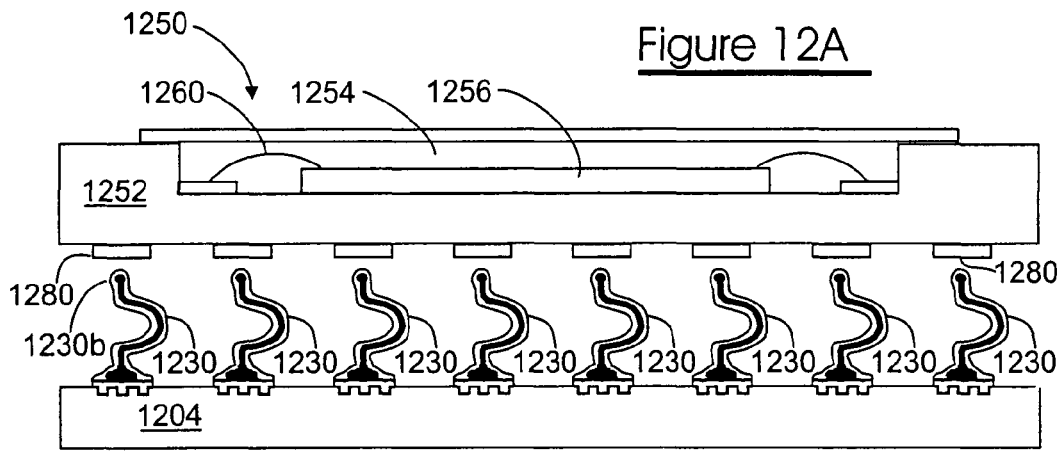
FIGS. 12A-12C are side views of a "gang transfer" technique for mounting resilient contact structures to an external surface of a semiconductor package, according to the present invention.

FIG. 12A shows a fully-assembled ceramic package 1250 comprising a package body 1252 (compare 702) having a central cavity 1254 (compare 704) in which a semiconductor device (die) 1256 (compare 706) is mounted. As illustrated, the die 1256 has a plurality (two of many shown) of bond pads disposed about a peripheral region of its front surface, and the package body has a corresponding plurality (two of many shown) of terminals (inner ends of conductive traces) disposed about the periphery of the cavity. The bond pads of the die 1256 are connected, on a one-to-one basis, to the terminals of the package body, in a conventional manner, with bond wires 1260 (compare 710), and the cavity 1254 is sealed with a lid 1258 (compare 708). This is exemplary of prior art "cavity-up" packaging techniques, wherein the entire bottom surface of the package body can be "fully-populated" with an array of conductive pads 1280, to which pins, ball bumps, or the like are mounted for effecting connections between the semiconductor package and external devices or systems. In the case of "cavity-down" packaging, the lid would occupy a central region of the package exterior, and the pads (1280), would "partially-populate" the surface of the package body, outside of the central region of the lid. The present invention is applicable to either cavity-up or cavity-down packaging techniques, and to either fully- or partially-populated arrays.

Generally, in the prior art, contact structures such as pins are individually transferred to an electronic component such as a ceramic package using automated equipment. Generally, special molds or fixtures are required which typically can be used only for a given, individual package (and pin) configuration. This represents a tooling step which throws a time lag into the product development cycle, and a tooling cost which is difficult to amortize for short-run devices. Moreover, control over the process is imperfect, resulting in one or more pins requiring removal and replacement, typically by hand. This is not cost effective, as illustrated by an example of a package containing an expensive chip (e.g., a $1000 semiconductor device). Re-working the package to replace defective pins can result in damaging the chip.

FIG. 12A shows a plurality of resilient contact structures 1230 (compare 1130) which have been fabricated on a sacrificial substrate (compare 1104). This corresponds to the previously-described FIG. 11E, with the photoresist (1102) washed off the sacrificial substrate (1104), although washing off the photoresist at this step in the process is not absolutely necessary. As illustrated in this figure, a plurality of contact structures 1230 mounted to a carrier 1204 are brought into a position to be mounted to the package 1252, with the tips 1230b of the contact structures aligned with the pads 1280 on the package. This is readily accomplished with automated parts handling equipment. As further illustrated in this figure, a quantity of solder 1282 (alternatively, braze material, conductive epoxy, or the like) is disposed on each of the contact pads 1280, prior to introducing the contact structures 1230.

Figure 12B:
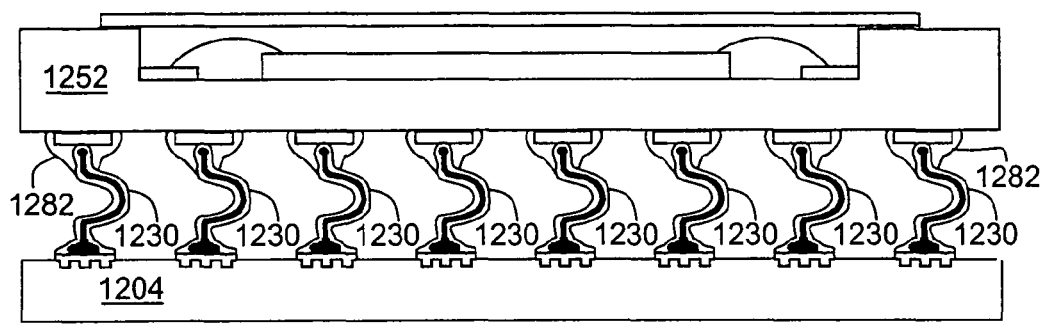

In FIG. 12B, it is illustrated that the contacts have been brought to bear, en masse, upon the corresponding contact pads 1280, with their tips immersed in the solder 1282. This is accomplished (in the case of using solder) by performing this step in a furnace (to reflow the solder). As illustrated in this figure, it is not essential that the tips 1203b of the contact structures physically contact the contact pads 1280, since the solder will reflow around the tip portion of the contact structure 1203 and effect a reliable electrical connection between the contact structure and the contact pad.

Figure 12C:
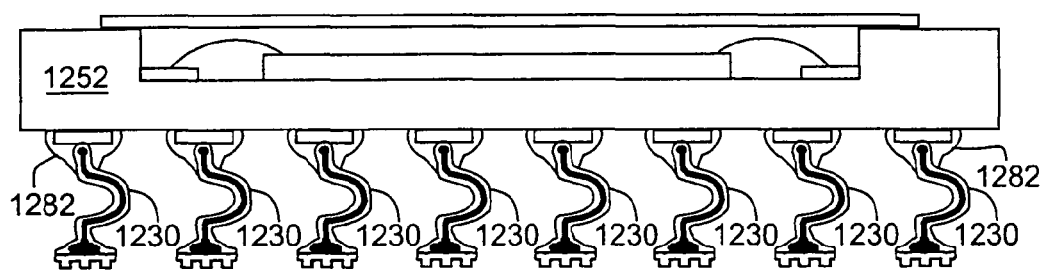

FIG. 12C illustrates a final step, wherein the sacrificial substrate 1204 is removed (compare FIG. 11F).

In the aforementioned manner, a plurality of resilient contact structures can be pre-formed, and subsequently (later) mounted to a surface of an electronic component (e.g., a package body). It is within the scope of this invention that pre-forming the contact structures can be accomplished by molding techniques using, for example, ceramic or graphite molds. Additionally, it is within the scope of this invention that contact structures can be mounted to any electronic component, such as the interconnect boards of the assembly embodiments described hereinbelow, or to silicon dies, or the like.

An advantage of the gang-transfer technique of the present invention is that tooling (and costs associated therewith) are minimized (i.e., virtually eliminated), and for any given package configuration, a "template" (not to be confused with the shaped wire stem serving as a template, as mentioned hereinabove) for a given pattern (e.g., array) of resilient contact structures can be specified in a matter of minutes. (Generally, the desired pin layout is already available on CAD software, and a simple "macro" can be invoked to convert array points to a masking pattern for forming the contact areas on the carrier.)

It is within the scope of this invention that, subsequent to gang-transferring a plurality of resilient contact structures to an electronic component (see, e.g., FIGS. 12A-12C), the mounted (to the component) resilient contact structures can be plated or further plated. In other words, (i) a plurality of wire stems which have not been overcoated can be gang-transferred to an electronic component, then overcoated, or (ii) a plurality of wire stems having one or more overcoat layers applied thereto can be gang-transferred to an electronic component, then overcoated with an additional layer of material.

It is also within the scope of this invention that the techniques of gang-transferring a plurality of resilient contact structures to an electronic component can be applied to non-resilient contact structures, such as package pins. In such a case, a plurality of package pins would be fabricated on, or mounted to, a sacrificial substrate for subsequent gang transfer (and, typically, brazing) to an electronic component.

An exemplary process of gang-transferring a plurality of contact structures to an electronic component is described with respect to FIGS. 12A-12C. It is within the scope of this invention that the process is applicable to "regular" contact structures, such as package pins, as well as to the resilient contact structures of the present invention. However, the gang-transfer process is particularly beneficial in the context of the present invention, for the following reasons.

When bonding a wire to a terminal (e.g., on a package), and employing electronic flame off (as would be the case if one were to construct the resilient contact structures of the present invention directly on the package pads), it is possible to generate a spark that will adversely affect a packaged semiconductor device. In many cases, semiconductor devices are mounted in their packages (e.g., ceramic packages) prior to mounting external interconnects to the package. Damage to the semiconductor device at this "late" stage in the process is a costly situation which would best be avoided, if at all possible. The gang-transfer technique of the present invention resolves this issue in a favorable manner, with improved yield.

An additional advantage accruing to fabricating a plurality of contact structures on a sacrificial substrate, then gang-transferring the structures to a package (or to any electronic component) is that the spacing between the contact ends can be controlled. The contact structures can be "originated" on a sacrificial substrate with a first spacing (pitch), and can be fashioned to have a second spacing at their opposite ends. It is within the scope of this invention that contact structures can originate on the sacrificial substrate with a coarse pitch, and can connect to the package (or to any electronic component) at a fine pitch, or vice-versa.

Another advantage accruing to the techniques set forth above is that what will ultimate be the "tips" of the package "pins" (i.e., the contact structures gang-transferred to the package body, or to any electronic component), can be well controlled, not only in their spacing (as discussed in the previous paragraph), but in their shape and topography (in the manner of fabricating probe contact pads, discussed in greater detail hereinabove). By reliably controlling the spacing and disposition of the tips of contact structures on an electronic component, the requirements for fabricating conductive traces, pads, and the like on a substrate (e.g., a printed circuit board) to which the electronic component will be mounted can somewhat be relaxed.

The gang-transfer technique(s) described herein are particularly beneficial for mounting a plurality of contact structures to semiconductor dies, whether singulated or un-singulated. It is within the scope of this invention that contact structures may be fabricated on a sacrificial substrate which are of a sufficient size to gang-transfer a plurality of contact structures to the plurality of unsingulated semiconductor dies on a wafer, at one fell swoop. Alternatively, it is possible to fabricate contact structures on a sacrificial substrate which is the size of a single unsingulated semiconductor die, and to gang-transfer contact structures only to selected "good" dies on the wafer. In either case, the contact structures can be mounted to dies on a wafer prior to dicing (singulating).

Figure 12D:
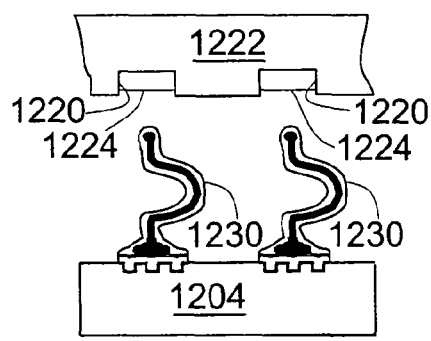
FIG. 12D is a side view of a technique for mounting resilient contact structures to recesses in a surface of a semiconductor package, according to the present invention.

In an alternate embodiment of the gang-transfer technique of the present invention, illustrated in FIG. 12D, a plurality of resilient contact structures are inserted into holes in a package, such as in a plastic package.

FIG. 12D illustrates the gang transfer of contact structures 1230 (two shown, sacrificial substrate omitted, for illustrative clarity) into recesses 1220 in a surface of an electronic component 1222 such as a plastic package body. The recesses 1220 are filled with a conductive material 1224 which may, for example, be solder which is reflowed, or a conductive epoxy material.

It is within the scope of this invention that the contact structures would not be gang-transferred, rather they would be individually transferred (mounted) to the package, on a one-by-one basis.

It is within the scope of this invention that the gang-transfer technique described hereinabove can be used to form a plurality of probe structures on a probe card, or the like.

A general advantage of the gang-transfer technique of the present invention becomes evident, in contrast to certain prior art techniques of mounting contact structures on semiconductor packages. These prior art techniques involve preparing the package, fabricating pins, feeding the pins one-by-one from a supply ("bucket") of pins and mounting them to the package body with reheating processes. According to the present inventive technique, steps analogous to these are all tied together.

Figure 12F:
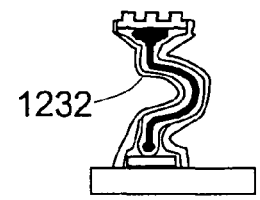
FIG. 12F is a side view of a technique for disposing an outer layer on a resilient contact structure, such as to make it more secure on the substrate to which it is mounted, according to the present invention.
Figure 12E:
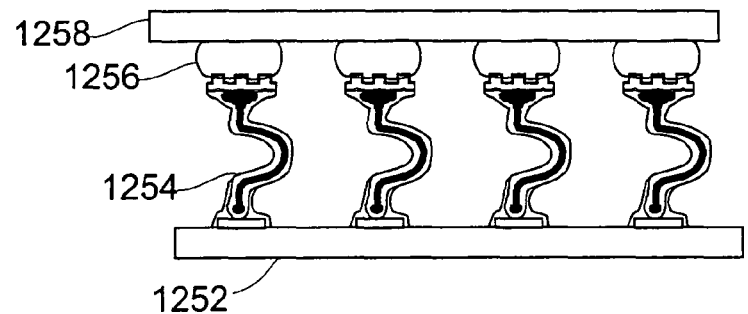
FIG. 12E is a side view of a technique for making a probe card, according to the present invention.

FIG. 12E illustrates a probe card (board) 1252 which has had a plurality of resilient contact structures 1254 (compare 1230) preferably gang-transferred thereto. (Sacrificial gang transfer substrate (1204) omitted, for illustrative clarity.) The contact structures can be tailored, by their shape and overcoat material, to allow for various levels of overtravel and elasticity. The tips of the contact structures 1254 are topographical, to allow controlled penetration of solder bumps 1256 on an electronic component 1258, said solder bumps having been formed (for example) by the "C-4" process.

As shown in FIG. 12F, after fabricating a plurality of resilient contact structures (1230), the contact structures can be further overcoated, in the manner described above with respect to FIG. 5G, to result in a tapered outer layer 1232 of the coating, said outer layer being thicker at the mounted (proximal) end of the contact structure to augment anchoring of the contact structure. This augmented anchoring feature is preferred in the context of probe embodiments, wherein the contact structures are subject to repeated flexing.

Temporary/Permanent Methodology

A well-known procedure among integrated circuit (chip) manufacturers is the burn-in and functional testing of chips. These techniques are typically performed after packaging the chips.

Modern integrated circuits are generally produced by creating several, typically identical integrated circuit dies (usually as square or rectangular die sites) on a single (usually round) semiconductor wafer, then scribing and slicing the wafer to separate (singulate, dice) the dies (chips) from one another. An orthogonal grid of "scribe line" (kerf) areas extends between adjacent dies, and sometimes contain test structures, for evaluating the fabrication process. These scribe lines areas, and anything contained within them, will be destroyed when the dies are singulated from the wafer. The singulated (separated) dies are ultimately individually packaged, such as by making wire bond connections between bond pads on the die and conductive traces within the package body (see, e.g., FIGS. 7A-7C, hereinabove).

"Burn-in" is a process whereby a chip (die) is either simply powered up ("static" burn-in), or is powered up and has signals exercising to some degree the functionality of the chip ("dynamic" burn-in). In both cases, burn-in is typically performed at an elevated temperature and by making "temporary" (or removable) connections to the chip—the object being to identify chips that are defective, prior to packaging the chips. Burn-in is usually performed on a die-by-die basis, after the dies are singulated (diced) from the wafer, but it is also known to perform burn-in prior to singulating the dies. Typically, the temporary connections to the dies are made by test probes of by "flying wires".

Functional testing can also be accomplished by making temporary connections to the dies. In some instances, each die is provided with built-in self test (self-starting, signal-generating) circuitry which will exercise some of the functionality of the chip. In many instances, a test jig must be fabricated for each die, with probe pins precisely aligned with bond pads on the particular die required to be tested. These test jigs are relatively expensive, and require an inordinate amount of time to fabricate.

As a general proposition, package leads are optimized for assembly, not for burn-in (or functional testing). Prior art burn-in boards are costly, and are often subjected to thousands of cycles (i.e., generally one cycle per die that is tested). Moreover, different dies require different burn-in boards. Burn-in boards are expensive, which increases the overall cost of fabrication and which can only be amortized over large runs of particular devices.

Given that there has been some testing of the die prior to packaging the die, the die is packaged in order that the packaged die can be connected to external system components. As described hereinabove, packaging typically involves making some sort of "permanent" connection to the die, such as by bond wires. (Often, such "permanent" connections may be un-done and re-done, although this is not generally desirable.)

Evidently, the "temporary" connections required for burn-in and/or pre-packaging testing of the die(s) are often dissimilar from the "permanent" connections required for packaging the die (s).

It is an object of the present invention to provide a technique for making both temporary and permanent connections to electronic components, such as semiconductor dies, using the same interconnection structure.

It is a further object of the present invention to provide a technique for making temporary interconnections to dies, for performing burn-in and or testing of the dies, either before the dies are singulated from the wafer, or after the dies are singulated from the wafer.

It is a further object of the present invention to provide an improved technique for making temporary interconnections to dies, whether or not the same interconnect structure is employed to make permanent connections to the die(s).

According to the invention, resilient contact structures can serve "double duty" both as temporary and as permanent connections to an electronic component, such as a semiconductor die.

According to the present invention, resilient contact structures can be mounted directly to semiconductor dies, and the resilient contact structures can serve multiple purposes:

(a) the resilient contact structures can make reliable, temporary contact to test boards, which may be as simple and straightforward as ordinary printed circuit boards;

(b) the same resilient contact structures can make reliable permanent contact to circuit boards, when held in place by a spring clip, or the like; and (c) the same resilient contact structures can make reliable permanent connection to circuit boards, by soldering.

Figure 13A:
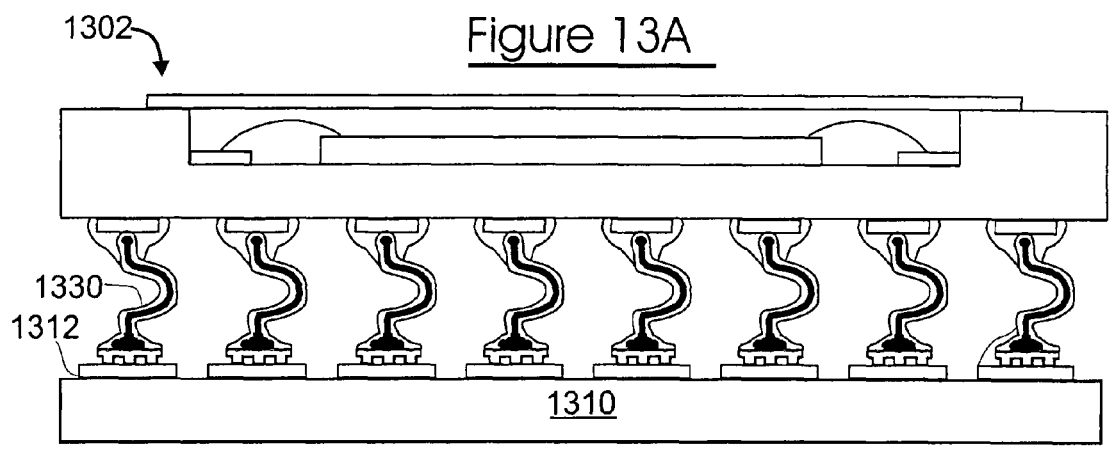
FIG. 13A is a side view of a semiconductor package having resilient contact structures and making temporary (e.g., resilient) connection to a test board, such as for test and burn-in, according to the present invention.

FIG. 13A illustrates a technique for performing "socketless" test and burn-in of a packaged electronic component 1302 having a plurality of resilient contact structures 1330 disposed on an external surface of the package. Such a component may be fabricated according to the process described with respect to FIGS. 12A-12C.

In order to perform test, burn-in and the like, of the electronic component 1302, it is brought to bear upon a test card (board) 1310, which can be as straightforward (e.g., readily and inexpensively manufactured) printed circuit board (PCB) having a plurality of pads 1312 patterned on its top (as viewed) surface. The component 1302 is aligned with the card 1310, using any suitable alignment means (such as locating pins, not shown) so that each resilient contact structure 1330 bears upon a corresponding pad 1312. This effects a resilient, "temporary" connection between the card 1310 and the electronic component 1302. The card 1310 is provided with edge connectors or the like (not shown) and optionally with built-in test circuitry (not shown), so that test and burn-in of the component is readily performed. Among the advantages of this technique are that a "special" socket need not be constructed in order to perform these operations.

Figure 13B:
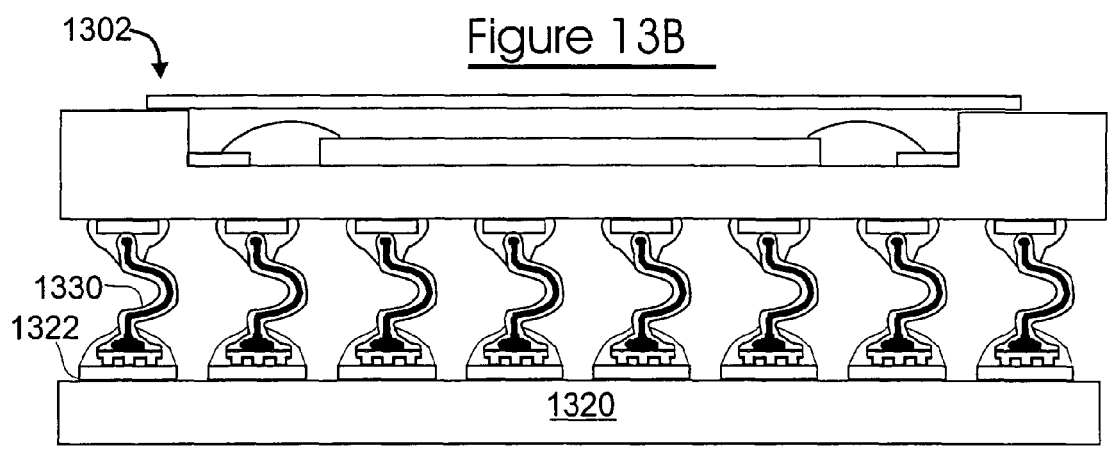
FIG. 13B is a side view of the semiconductor package of FIG. 13A making permanent (e.g., soldered) connection to a printed circuit board, according to the present invention.

FIG. 13B illustrates that the same resilient contact structures 1330 that were used for socketless test and burn-in of the packaged electronic component (FIG. 13A) can later advantageously be employed to effect a "permanent" connection between the electronic component 1302 and an interconnection substrate (system board) 1320, or the like. The substrate 1320 is provided with a plurality of contact pads 1322 aligned, on a one-for-one basis, with the tips of the resilient contact structures 1330 on the packaged component 1302. The permanent connection between component 1302 and substrate 1320 can be accomplished (i) by applying "permanent" pressure to the component 1302, via spring clips and the like (not shown), to bias the component against the substrate, or (ii) by soldering the component 1302 to the substrate 1320.

As shown, the resilient contact structures 1330 are soldered to the pads 1322 on the substrate 1320. This is readily accomplished by preparing each pad with a quantity of solder (e.g., solder paste) 1324, urging the component against the substrate, and running the assembly through a furnace, for reflowing (thermally cycling) the solder.

The inventive technique of using the same resilient contact structures (1330) for making both temporary and permanent connections to an electronic component is especially beneficial in the context of resilient contact structures mounted to active semiconductor devices (i.e., bare, unpackaged dies). (In these cases, the package illustrated in FIGS. 13A and 13B would simply be replaced by a "bare" semiconductor device, with the resilient contact structures (1330) mounted thereto.)

It is within the scope of this invention that tip structures, such as the contact tip 1120 of FIG. 12F can be employed on the tips of the resilient contact structures 1330.

It is within the scope of this invention that the substrate 1320 and card 1310 can be one and the same, rather than distinct entities (as shown and described).

Chip-Level Mounting Process

As mentioned hereinabove, it is well within the scope of this invention to mount the resilient contact structures of the present invention directly to (on) semiconductor dies. This is particularly significant when viewed against prior art techniques of wire bonding to dies which are disposed in some sort of package requiring external interconnect structures (e.g., pins, leads and the like). Generally, a semiconductor die is not tolerant of significant imposition of heat, such as is generally required when brazing pins to packages, because a significant amount of heat will cause carefully laid-out diffusion areas in the die to further diffuse. This is becoming more and more of a concern as device geometries shrink (e.g., to submicron geometries). As a general proposition, for any fabrication process (e.g., CMOS), there is a heat "budget", and the impact of every processing step in which the die is subjected to heat (e.g., reflow glass) must be carefully considered and accounted for.

Generally, the present invention provides a technique for mounting contact structures directly to semiconductor dies, without significantly heating the die. Generally, the bonding of the wire stem to the die and the subsequent overcoating (e.g., plating) of the wire stem are performed at temperatures which are relatively "trivial" when compared to device fabrication processes (e.g., plasma etching, reflow glass) which subject the dies to temperatures on the order of several hundreds of degrees Celsius (° C.). For example, bonding of gold wires will typically occur at 140°-175° C. Bonding of aluminum wires can occur at even lower temperatures, such as at room temperature. Plating temperatures are process dependent, but generally do not involve temperatures in excess of 100° C.

FIGS. 14A-14E illustrate the process of putting resilient contact structures on a silicon chip, or onto silicon chips (dies) prior to their having been singulated from a semiconductor wafer. An important feature of this process is the provision of a shorting layer, which is important for overcoating the shaped wire stems of the resilient contact structures by electroplating (discussed hereinabove). Inasmuch as electroplating involves depositing material out of a solution in the presence of an electric field, and the electric field could damage sensitive semiconductor devices, as well as the fact that an electric arc (such as in electric flame-off techniques for severing the wire, as discussed hereinabove) certainly has the potential to damage semiconductor devices, the shorting layer will provide electrical protection, during the process, for such sensitive electronic components. Optionally, the shorting layer can also be grounded.

FIG. 14A shows a semiconductor substrate 1402 having a plurality (two of many shown) bond pads 1404. The bond pads 1404 are covered by a passivation layer 1406 (typically silicon nitride) which has openings over each of the bond pads 1404. Typically, these openings in the passivation layer 1406 permit a bond wire to be bonded to the bond pad, for wirebonding the substrate (e.g., die) to a leadframe or the like. For all intents and purposes, the openings in the passivation layer define the size (area) of the bond pad 1404, irrespective of the fact that the metallization of the bond pad may (and typically will) extend beyond the opening in the passivation layer 1406. (Typically, the bond pad, per se, is simply a location in a pattern of conductors in a layer of metallization.) The preceding is well known in the art of semiconductor fabrication, and additional layers of conductive, insulating and semiconducting material between the bond pads (top metallization layer) and the substrate 1402 are omitted, for illustrative clarity. Typically, but not necessarily, the bond pads are all at the same level (e.g., if a preceding layer has been planarized) on the semiconductor substrate (device), and it is immaterial for the purposes of the present invention whether or not the bond pads are coplanar.

FIG. 14A further shows that the bond pads 1404 are shorted together by a conductive layer 1410 of aluminum, Ti—W—Cu (titanium-tungsten-copper), Cr—Cu (chromium-copper), or the like, applied by conventional processes to the entire surface of the substrate 1402 (over the passivation layer 1406 and into the openings in the passivation layer) so as to make electrical contact with the bond pads 1404. A patterned layer of resist (photoresist) 1412 is applied over the shorting layer 1410, and is patterned to have openings 1414 aligned directly over the bond pads 1404. Notably, the openings 1414 in the resist layer 1412 can be of an arbitrary size, and are preferably larger than the openings in the passivation layer 1406 so that a "virtual" bond pad (defined by the opening 1414 through the resist 1412 to the shorting layer 1410) has a larger area than the "actual" bond pad 1404. According to an aspect of the invention, the area of the virtual bond pad is significantly, such as up to 10%, 20%, 30%, 40%, 50%, 60%, 70%, 80%, 90% or 100% larger than the actual bond pad (as defined by the opening in the passivation layer. Typically, bond pads (and their openings) are square (as viewed from above). However, the particular shape of the bond pads is not particularly germane to the present invention, which is applicable to bond pads having rectangular, round or oval shapes, and the like.

FIG. 14B illustrates a next step in the process of mounting resilient contact structures to the substrate 1402. Wires 1420 are bonded at their distal ends 1420a to the shorting layer, in the openings 1414, and fashioned to have a shape suitable for functioning as a resilient contact structure when overcoated. Generally, any of the above-mentioned techniques for fashioning wire stem shapes can be employed in this step. In this example, the wire 1420 is fashioned into a wire stem having a shape similar to the shape set forth in FIG. 2A.

FIG. 14C illustrates a next step in the process of mounting resilient contact structures to the substrate 1402, wherein the wire stems (shaped wires 1420) are overcoated with one (or more) layer(s) 1422 of a conductive material. (As in previous examples, only the topmost layer of multilayer coatings are required to be conductive.) Again, any of the aforementioned processes and materials for overcoating shaped wire stems may be employed in this step. In this example, the wire (1420) is electroplated (overcoated) with nickel. As in the previous examples, the overcoat is what determines the resiliency of the resulting contact structure, and also greatly enhances the anchoring of the contact structure to the substrate. In this example, the entire substrate is submersed in an electroplating bath, and nickel is plated up inherently selectively on the wire stems and in the openings 1414 of the resist 1412 (nickel will not electroplate to resist material). In this manner, resilient contact structures 1430 are provided FIG. 14D illustrates a next step in the process of mounting resilient contact structures to the substrate 1402, wherein the wire stems (1420) have been overcoated (1422) to form resilient contact structures 1430. The resist 1412 layer, evident in the last three steps, has been removed. At this point in the process, the virtual bond pads are simply contact areas (compare 110) on the continuous shorting layer 1410.

FIG. 14E illustrates a final step in the process of mounting resilient contact structures to the substrate 1402. In this step the shorting layer 1410 is removed at all location except under the overcoating 1422. For shorting layers formed of materials that are readily selectively etched (i.e., without etching the overcoat material 1422 or the passivation material 1406), this can be accomplished by selective wet etching (i.e., by selecting the appropriate etchant). The only "basic" requirement to implement selective etching, in this example, is that the material of the layer 1410 is different from the material of the coating 1422, and that there is a reagent which will dissolve the one (1410) without dissolving the other (1422). This is well within the purview of one having ordinary skill in the art to which the present invention most nearly pertains.

A distinct advantage of the process of the present invention is that a larger "virtual" contact area is created than otherwise existed (i.e., in the opening of the passivation layer). The overcoat 1422 firmly anchors the wire stem 1420 to this virtual contact area, greatly increasing the base adhesion of the wire stem. Moreover, although a die substrate may have square (or rectangular, or round) actual contact pads, the process of the present invention allows for the creation of virtual contact pads (openings in the resist 1412 of any profile (e.g., rectangular, round, oval, etc.). Moreover, it is only required that the virtual contact pad overlap the actual contact pad. In other words, the center of the virtual contact pad can be offset from the center of the actual contact pad. This permits "staggering" the tips (distal ends) of the resilient contacts, a feature which would otherwise (if bonding directly to a linear array of actual contact pads) would require fashioning at least two different wire shapes or orientations.

As mentioned hereinabove, this process of mounting resilient contact structures (1430) to a substrate can be performed on a already-singulated die, or on dies (die sites) prior to their having been singulated from a semiconductor wafer.

The steps described hereinabove can also be performed on semiconductor dies which have not been singulated from a wafer. (See FIG. 15 for a discussion of mounting contact structures to dies prior to singulating the dies from the wafer.) FIGS. 14F and 14G, discussed immediately hereinbelow, describe a process similar to the process of FIGS. 14A-14E, but wherein contact structures are applied to dies prior to singulating the dies from a wafer.

FIG. 14F illustrates a post-finishing step wherein the resilient contact structures 1430 have been mounted to a plurality of die sites 1402a and 1402b (two of many shown) on a semiconductor wafer. A suitable scribing or kerfing tool 1450 (such as a saw) is brought to bear on the wafer, between adjacent die sites, resulting in a plurality of singulated dies, each die having resilient contact structures mounted thereto.

FIG. 14G illustrates another, optional post-finishing step, which can be performed prior to or after (i.e., independently of) the post-finishing step shown in FIG. 14F. In this step, a suitable hermetic (e.g., polymer) coating 1460 is applied to the surface of the substrate, covering the entire surface as well as the proximal ends 1430a of the resilient contact structures 1430, as well as the edges of the substrate (as shown). Typically (i.e., preferably) such coatings are an insulating material, and covering the distal end (tip) 1430b of the resilient contact structure 1430 is to be avoided (as shown). If not avoidable, insulating material (1460) covering the tip 1430b of the resilient contact structure must be removed. Additionally, coating any more than an incidental (very small) portion of the length of the resilient contact structure with the insulating material (1460) is to be rigorously avoided, as the insulating material may alter the resilient (spring) characteristics of the contact structure 1430 imparted thereto (largely) by the overcoat 1422. This step represents an important feature of the invention in that semiconductor dies, especially the aluminum bond pads thereof, can hermetically be sealed from the environment (atmosphere). Such hermetic sealing of the die permits the use of less hermetic (and typically less expensive) packages to be used. For example, ceramic packages are very hermetic (moisture proof) and very expensive. Plastic packages are less hermetic, and less expensive. PCB-substrate type packages tend to be even less hermetic, and comparable in cost to plastic packages.

Wafer-Level Mounting Resilient Contact Structures

Discussions set forth hereinabove have generally emphasized mounting the resilient contact structures of the present invention to discrete substrates, including to semiconductor dies. The present invention is of broader scope, and is especially advantageous for mounting the resilient contact structures of the present invention to dies, prior to singulating (dicing) the dies from a wafer. This affords the opportunity to perform testing and burn-in of unsingulated dies prior to dicing them from the wafer, using the resilient interconnection techniques of the present invention. The mounting of contact structures to unsingulated dies has been briefly discussed hereinabove, with respect to FIGS. 14F and 14G.

Generally, in the prior art, testing unsingulated dies at wafer-level required some sort of die selection techniques, whether electrical (e.g., die selection mechanism built into the wafer and/or dies) or mechanical (e.g., probes, flying wires, and the like), both of which tends to be complex and add a significant increment to the cost of production. The opportunity, according to the present invention, to construct "final" contact structures on unsingulated dies, and to use these contact structures both for testing and permanently connecting the dies, avoids these intermediate steps, and will also tend to be more economical than test-after-dice methodologies.

Additionally, during the fabrication of dies on a wafer, it is often the case that imperfections in the wafer will be identified prior to wafer processing. Any dies fabricated at such imperfect die sites should immediately be discarded (after dicing), without even "bothering" to test these dies.

FIG. 15 illustrates a portion 1502 of a semiconductor wafer, illustrating a plurality of die sites 1504a ... 1504o defined by a grid of kerf (scribe) lines 1506. Resilient contact structures 1530 have been mounted to bond pads (not shown) on each of die sites 1504a ... 1504d and 1504f ... 1504o. Resilient contact structures (1530) are not mounted to the die site 1504e (which may have been determined, prior to mounting the resilient contact structures, to be defective). As shown in this figure, all of the resilient contact structures on a die site are "oriented" so no portion of the resilient contact structure occupies a position directly above a kerf line 1506.

After singulating the dies from the wafer, they can be coated (or encapsulated) with a suitable insulating material, leaving the tips of the resilient contact structures exposed for subsequent interconnect to a board or to a card.

Generally, the ability to fabricate resilient contact structures directly on semiconductor dies, prior to singulating the dies from a wafer, represents a tremendous advantage in the overall process of manufacturing semiconductor devices. This can be exemplified by the following:

In a typical process flow of the prior art, dies are probed while on the wafer, then are diced from the wafer, then are mounted to a die attach pad on a leadframe, then are wirebonded to fingers of the leadframe, then the assembly of die and leadframe are inserted into a mold for encapsulation, and the resulting packaged die is removed from the mold, trimmed (e.g., of "flash") and formed (e.g., the portions of the leadframe fingers extending from the package body are formed into suitable gull-wing configurations or the like.

In a typical process flow of the present invention, dies are probed while on the wafer, resilient contact structures are mounted to the "good" (passed) dies, the dies are diced from the wafer, then the dies are coated or encapsulated. As a general proposition, it is preferred that probing dies in the manner described hereinabove be limited to dies having fewer than one hundred bond pads to be probed, such as memory devices. Nevertheless, probing dies at the wafer level (prior to singulation), especially for purposes of burn-in, is greatly facilitated by the disclosed process.

In FIG. 15, the resilient contact structures 1530 on any are disposed on two sides of a die, and the resilient contact structures on any one side of the die are illustrated as all being shaped the same and oriented in the same direction. This establishes a "pitch", or spacing between tips of adjacent resilient contact structures which, as is evident, will be the same as the pitch of the bond pads to which the resilient contact structures are mounted.

This illustrates an advantage of the invention, in that resilient contact structures, suitable for connecting directly to a printed circuit board or the like, can be mounted directly to semiconductor (e.g., silicon) devices, to form a "chip size package". Such a device, with resilient contact structures mounted directly thereto are ready for test and burn-in, and ready for interconnect to a card or a board, as discussed, for example, with respect to FIGS. 13A and 13B.

For purposes of this discussion, it is assumed that a given semiconductor device will have a lower limit on how close bond pads can be disposed, especially a single row of bond pads, and that this lower limit establishes a pitch for what is termed herein the "pin-out" of the device. (It is understood that the term "pin-out" is typically used to describe the signal assignments of bond pads rather than their physical spacing.) This pin-out pitch tends to be relatively fine (small), as compared with pad spacing which can feasibly be achieved on printed circuit boards, which partially accounts for the general acceptance of using bond wires, lead frames, and the like, in the context of packaging dies, to amplify (spread) the pin-out pitch.

Generally, a critical constraint on board design is that contact (solder) pads must be spaced far enough apart so that, in some cases, conductive traces can pass therebetween to effect "complex" interconnection schemes. Moreover, as a general proposition, the larger the solder pad, the better, as it will "accept" more solder—making for a more reliable solder connection.

According to a feature of the invention, resilient contact structures having various shapes and orientations can be mounted to substrates (e.g., semiconductor dies), which is useful in increasing the effective pitch of the device pin-out.

Moreover, it is possible, when mounting resilient contact structures to singulated dies, it is a relatively straightforward matter to shape the contacts so that they extend beyond the perimeter of the die. Generally, when mounting resilient contact structures to electronic components, according to the present invention, the shape and extent of the wire stem (which will be overcoated) is virtually unconstrained, readily allowing for fan-out (increasing from a relatively small spacing, such as on a die, to relatively larger spacing, such as on a printed circuit board).

It is, however, within the scope of this invention that contact structures extending beyond the perimeter of a die can be mounted to unsingulated dies on a wafer. This would require, for example, sawing the wafer from the opposite side, since such contact structures would overlie the kerf lines.

Another advantage of the present invention is that, when the wire stem is plated (overcoated), the overcoat material can be permitted to build up in areas of the electronic component which are not specifically intended for making interconnections. For example, the edges of the electronic component could be plated while plating wire stems mounted to the face of the electronic component. Or, the opposite side of the electronic component can be plated while plating the wire stems. Generally, any area on the electronic component which is not masked will be plated. (In many of the embodiments described hereinabove, the contact area (e.g., 110) where the wire stem is bonded to the electronic component is defined by an opening in photoresist, or the like.)

Figure 15A:
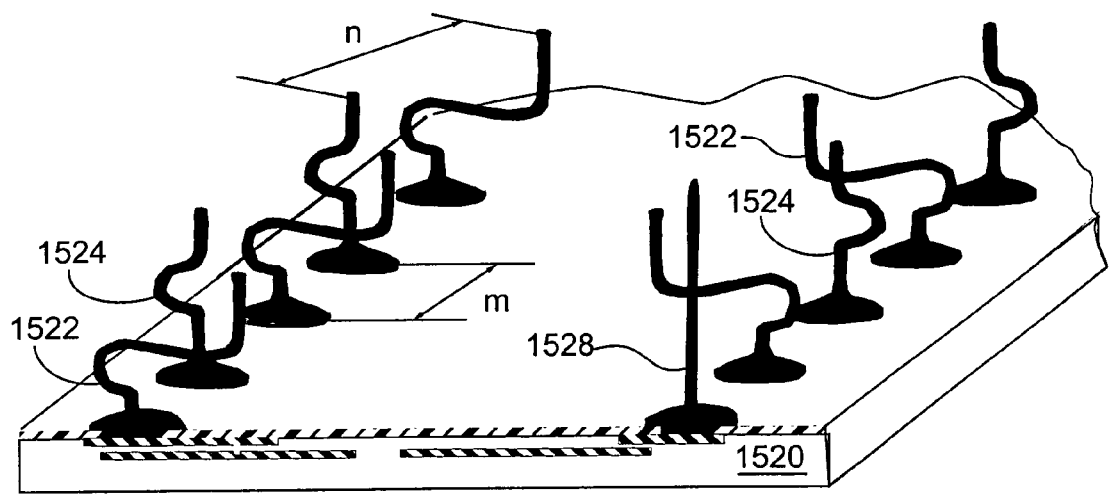
FIG. 15A is a perspective, partial view of a plurality of resilient contact structures mounted to a semiconductor die, and increasing the effective pitch of the "pin out" (bond pad spacing, as used herein), according to the present invention.

FIG. 15A illustrates an embodiment of the invention wherein the orientation of contact structures is staggered to increase their effective density, and is similar to FIG. 24 of CASE-2. The figure illustrates a semiconductor die 1520 atop which a plurality of dissimilar contact structures have been mounted, according to the techniques set forth above. A first portion 1522 of the contact structures are configured (shaped, bent) to have a relatively large offset (i.e., distal end from the proximal end). A second portion 1524 of the contact structures are configured (shaped, bent) to have a relatively small offset (i.e., distal end from the proximal end). In this manner, as illustrated, the spacing between the proximal ends of adjacent contact structures (1522 and 1524) is "m", and the spacing between the distal ends of adjacent contact structures is "n", where n>m. For example, "m" is approximately five mils, and "n" is five-to-ten mils. As further shown in the figure, straight contact structures 1528 extending normal to the surface of the electronic component 1520 can be formed on the electronic component. These contact structures 1528 are intended to function as alignment pins which will mate with corresponding alignment features (such as holes) on another electronic component such as a printed circuit board (PCB). Preferably, these alignment pins 1528 are not resilient, but they may certainly be fabricated in the same process steps as the resilient contact structures 1522 and 1524.

Optionally, an encapsulant can be disposed on the surface of the substrate, encompassing the lower (as viewed) portions of the contact structures, mechanically reinforcing the attachment of the resilient contact structures to the surface of the substrate.

The staggering of the tips of the contact structures, according to the present invention, allows the designer to relax the "ground rules" (design rules) for a board to which the electronic component will be mounted, allowing for contact (soldering) pads disposed further from one another and/or larger individual soldering pads.

In use, temporary connections can be made to the electronic component 1520 via the contact structures (1522, 1524 1526), and subsequent permanent connections can be made to the electronic component 1520 via the same contact structures (1522, 1524 1526), in the manner discussed hereinabove with respect to FIGS. 13A and 13B. This facilitates wafer-level burn-in of un-singulated dies on a wafer, if desired, a feature which is particularly advantageous for semiconductor memory devices (but not limited thereto). It is within the scope of this invention that the contact structures 1522, 1524, 1526 and 1528 are gang-transferred to the wafer (or chip) 1520, in the manner set forth hereinabove. The gang-transfer technique generally avoids the need to form a shorting layer (compare 126) on the electronic component, since the contact structures are fabricated "off-line" (i.e., on a sacrificial substrate).

No Shorting Layer Required

In a number of the embodiments described hereinabove, the use of a shorting layer has been described (see, e.g., conductive layer 126 in FIGS. 1C-1E). A shorting layer is especially pertinent to overcoating the wire stems by electroplating processes. The use of a conductive sacrificial structure, to which all of the wire stems are connected, also facilitates electroplating, by similarly shorting out (electrically connecting together) a plurality of wire stems.

Figure 16A:
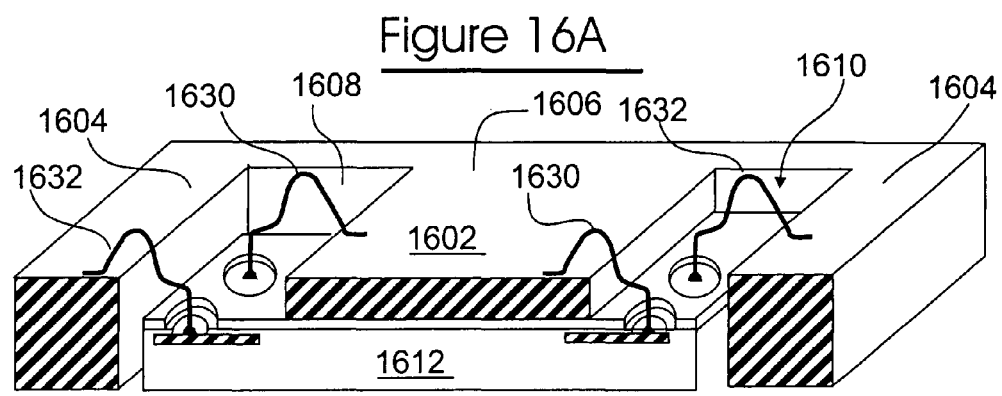
FIGS. 16A-16C are perspective views of a process for forming resilient contact structures on dies (either on a wafer or diced therefrom), according to the present invention.

FIG. 16A illustrates a first step in a process, wherein a sacrificial structure 1602 is used in connection with shaping and overcoating a plurality of wire stems 1630 and 1632 mounted (bonded) to a semiconductor die 1612.

The sacrificial structure 1602 is formed as a cage-like structure, from a conductive (and readily removed, in a final step of the process) material, such as aluminum, and includes an outer ring 1604 defining an area into which the die 1612 is disposed, and a cross-bar 1606 spanning from one side of the ring 1604 (as shown) to an opposite side (not visible in this cross-sectional perspective drawing) of the ring 1604. This results in their being openings 1608 and 1610 spanning from the one side of the ring to the opposite side of the ring, parallel to the cross-bar 1606 (and to one another).

Generally, the sacrificial structure (cage) is positioned over the semiconductor die 1612, so that the openings 1608 and 1610 are aligned with respective parallel rows of bond pads on the die 1612, prior to mounting the wire stems 1630 and 1632 to the die 1612.

As shown, the wire stems in each row of bond pads along a respective side of the die extend alternately to the outer ring 1604 and the inner cross-bar 1606, and are bonded to the sacrificial structure, such as by having their distal ends wedge-bonded thereto. In this manner, the sacrificial structure 1602 shorts all of the wire stems together, and is readily connected to (not shown) for subsequent plating of the wire stems.

Figure 16B:
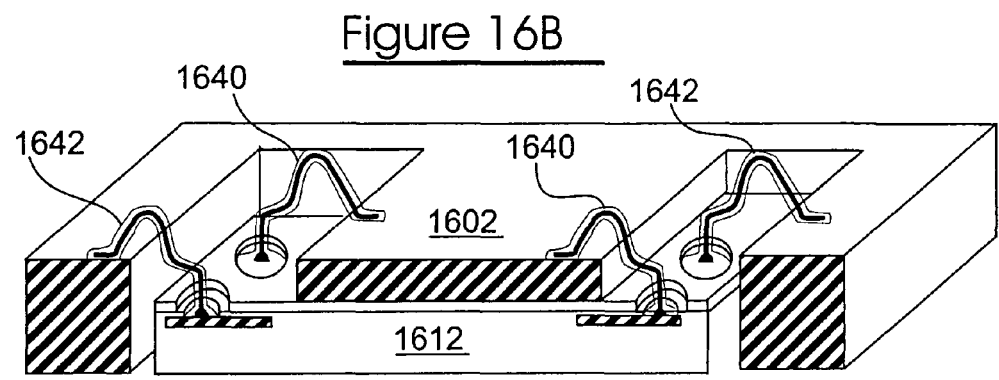

FIG. 16B shows a next step in the process, wherein the wire stems 1630 and 1632 are plated, in the manner described hereinabove, to function as resilient contact structures 1640 and 1642, respectively.

In the next step, it is desired to remove (eliminate) the sacrificial structure, and there are generally two possibilities: (i) the distal ends of the resilient contact structures can be severed (cut) from the sacrificial structure, or (ii) the sacrificial structure can be dissolved (e.g., etched) away without severing the tips of the resilient contact structure.

Figure 16C:
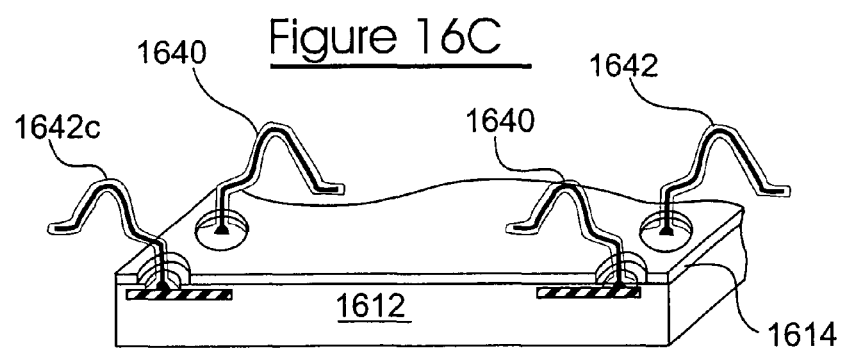

FIG. 16C shows the first possibility, wherein the sacrificial structure (1602) has been dissolved away, leaving the die 1612 with the resilient contact structures 1640 and 1642 mounted thereto. Whereas in most of the previous embodiments, it was generally intended that the extreme distal ends of the resilient contact structures make contact with another component, in this embodiment the resilient contact structures 1640 and 1642 are shaped so that an intermediate portion 1640c and 1642c of the contact structures 1640 and 1642, respectively, make contact (as indicated by the arrows labelled "C") to another component (not shown).

Generally, by alternating the orientation of the contact structures 1640 (pointing in towards the interior of the die surface) and 1642 (pointing out towards the exterior of the die), the effective pitch of the contact structures can be larger than the pin-out pitch of the die. (Compare FIG. 15A). Vis-a-vis the interior-pointing contact structures 1640, there is a gap between their tips 1640b and the surface of the die, in a manner akin to the embodiment shown and described with respect to FIGS. 8A-8C, which allows for deflection of the resilient contact structure without its tip contacting the surface of the semiconductor die. Vis-a-vis the exterior-pointing contact structures 1642, their tips 1642b are off the edge of the die 1612, presenting no such apparent problem (i.e., the tip of the contact structure touching the surface of the die, in response to contact forces).

Throughout FIGS. 16A-16C, the die 1612 is shown with a passivation layer 1614 on its top (as viewed) surface, in the manner described hereinabove.

Figure 16D:
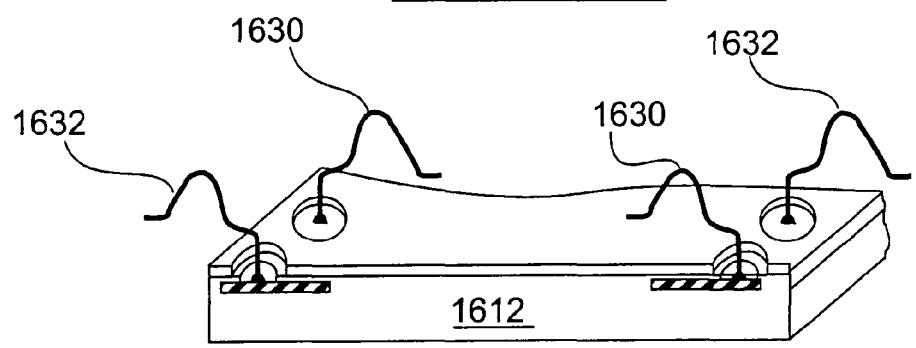
FIG. 16D is a perspective view of an alternate (to FIGS. 16A-16C) process for forming resilient contact structures on dies (either on a wafer or diced therefrom), according to the present invention.

FIG. 16D illustrates an alternate sequence of events, wherein the sacrificial structure 1602 is removed prior to overcoating the wire stems 1630 and 1632. The first step, described with respect to FIG. 16A would remain the same, and a resulting structure would be as illustrated in FIG. 16C.

The technique described hereinabove with respect to FIGS. 16A-16C can be performed at wafer-level, simply by providing a thinner sacrificial structure (1602) which simply sits atop the wafer (rather than extending below the side edges of individual dies, as illustrated in FIGS. 16A-16C).

It is within the scope of this invention that the electronic component (1612) is "freed" from the sacrificial structure (1602) simply by cutting the contact structures (e.g., of FIG. 16B) or the wire stems (e.g., of FIG. 16D).

A general advantage of using a sacrificial structure (e.g., 1602) is that no electronic flame-off is required, which otherwise would subject the electronic component (1612) to extremely high and potentially-damaging voltages (e.g., 2000 volts).

It is also within the scope of this invention that the contact structures (or wire stems) can stabilized, such as with a hard wax material, and subjected to grinding (polishing) in a plane parallel to the plane of the electronic component, which will result in the contact portion (e.g., 1642c) becoming the free end of the contact structure (e.g., by polishing completely through the contact structure or wire stem). This is described hereinbelow, for example, with respect to FIGS. 53C and 53D.

When using any of the "mechanical" severing techniques described herein, not only are problems associated with the high voltage of spark-severing avoided, but the height of the resulting contact structures is assured, in a direct, physical, straightforward manner.

Figure 16E:
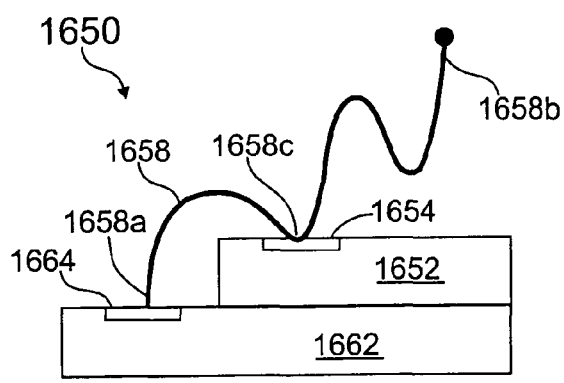
FIGS. 16E and 16F are side views of a technique for fabricating resilient contact structures in a manner suitable for stacking chips (semiconductor dies), one atop another, according to the present invention.
Figure 16F:
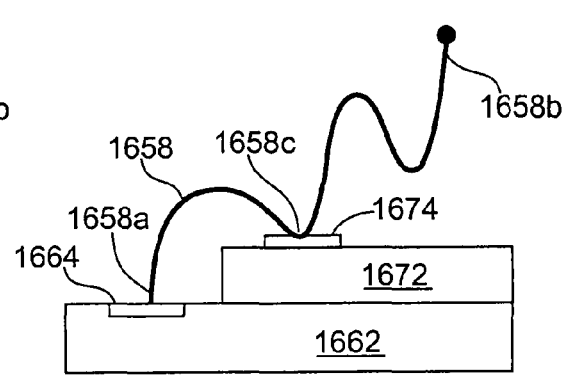

FIGS. 16E and 16F illustrate a technique 1650 for fabricating resilient contact structures in a manner suitable for stacking chips (semiconductor dies), one atop another. A sacrificial structure 1652 (compare 1602) is disposed atop a first electronic component 1662 (compare 1612). A wire 1658 is bonded at one end 1658a to a pad 1664 on the first electronic component 1662, is configured to have a springable shape (in a manner similar to that of FIG. 16A), and an intermediate portion 1658c of the wire 1658 is bonded to the sacrificial structure 1652 (without severing). As illustrated, the sacrificial structure 1652 may be provided with a contact tip 1654 (compare 1026 of FIG. 10C) to which the intermediate portion of the wire is bonded. The wire is further shaped to extend from the sacrificial structure 1652 in a springable shape (e.g., compare the S-shape of FIG. 2E), and is severed to have a free end 1658b. The shaped wire stem may be plated either prior to (compare FIG. 16B) or after (compare FIG. 16D) removing the sacrificial structure 1652 to become a resilient contact structure, and may have a topological contact (compare 1026) applied to its free end 1658b.

After the sacrificial structure 1652 is removed, a second electronic component 1672 is disposed between the first electronic component 1662 and the intermediate portions 1658c of the resilient contact structures (overcoated wire stems) to effect interconnections between the first electronic component 1662 and terminals 1674 of the second electronic component 1672. An advantage of this technique is that the interconnects (overcoated portion of the wire stem between 1658c and 1658b) also extend from the second electronic component 1672, for making connections to external systems (other electronic components). By way of example, the first electronic component 1662 is a microprocessor, and the second electronic component 1672 is a memory device.

Interposers

FIGS. 17A-17D of this application are similar to FIGS. 6, 7, 13 and 22 of CASE-2, respectively, and describe contact structures mounted to a printed circuit board (PCB) for use as interposers. As used herein, "interposers" are generally planar substrates having contact structures disposed on both sides thereof, contacts on one side (face) being electrically connected, within the interposer, to contacts on another side (face). Such interposers are disposed between two electronic components desired to be interconnected. Generally, interposers are used when it is not desirable to mount contact structures directly to the electronic components being interconnected.

Figure 17A:
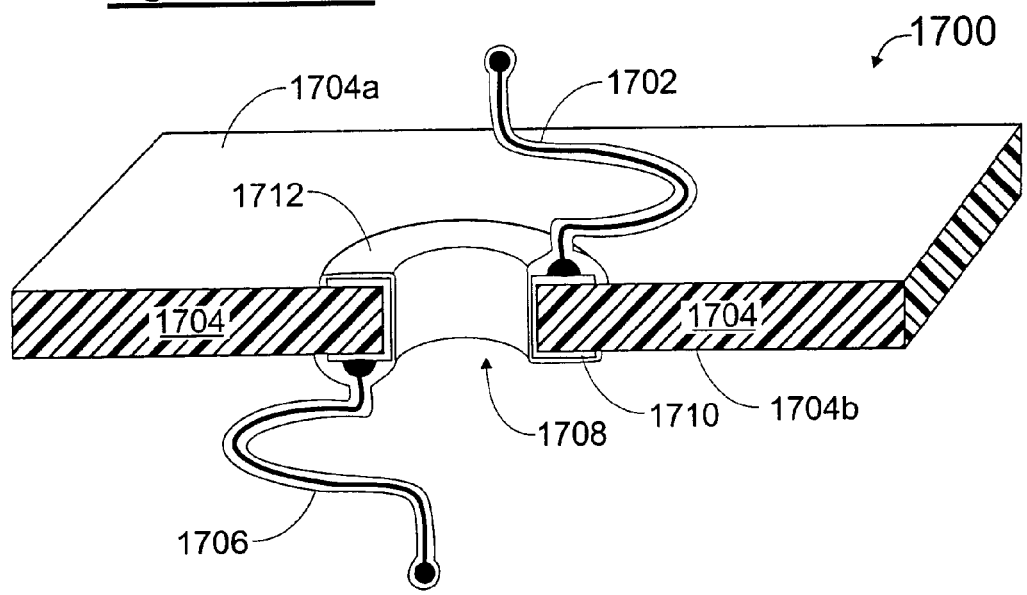
FIG. 17A is a perspective view of an embodiment of an interposer, according to the present invention.

FIG. 17A shows an embodiment 1700 of an interposer wherein a plurality (one of many shown) of fashioned wire stems 1702 are disposed on an upper (as viewed) surface 1704a of a printed circuit board 1704, and a plurality (one of many shown) of fashioned wire stems 1706 are disposed on a lower (as viewed) surface 1704b of the printed circuit board 1704. More particularly, the printed circuit board 1704 is provided with a plurality (one of many shown) of plated through holes 1708 comprising one or more layers of conductive material 1710, fabricated in a known manner. The wire stems 1702 are mounted (bonded, in any suitable manner described hereinabove) to the plating 1710 so as to protrude upward (as viewed) from the printed circuit board 1704, and the wire stems 1706 are mounted (bonded, in any suitable manner described hereinabove) to the plating 1710 so as to protrude downward (as viewed) from the printed circuit board 1704. The wire stems 1702 and 1706 are then overcoated (in any suitable manner described hereinabove) with one or more (one shown, for illustrative clarity) layers 1712 of a conductive material which will impart resiliency to the wire stems. The coating 1712 also firmly anchors the wire stems to the through hole plating 1710, and covers the entire surface of the through hole plating 1710, as shown. An electrical path is provided by the overcoat 1712 from the contact structures 1702 to the contact structures 1706. In this manner, resilient contact structures are formed on both sides of the interposer substrate, the top "set" of contact structures 1702 making contact with terminals, pads or the like on a first electronic component (not shown) disposed above the interposer, the bottom "set" of contact structures 1706 making contact with terminals, pads or the like on a second electronic component (not shown) disposed below the interposer—both sets of contact structures making electrical connection to respective electronic components in a compliant (resilient) manner.

Thus, it is readily observed that, in FIG. 17A, an interposer has been provided with springy contact structures on both side of a "circuitized" (metallized) dielectric substrate. It will readily be understood that, in this embodiment (1700), any suitable means of connecting the upper springs (1702) to the lower springs (1706), which may or may not include a through hole (1708) would fulfill the intended purpose of the interposer. The contact structures (1702 and 1706) of this embodiment may be resilient (pure springs), or may be compliant (exhibiting a combination of elasticity and plasticity).

Figure 17B:
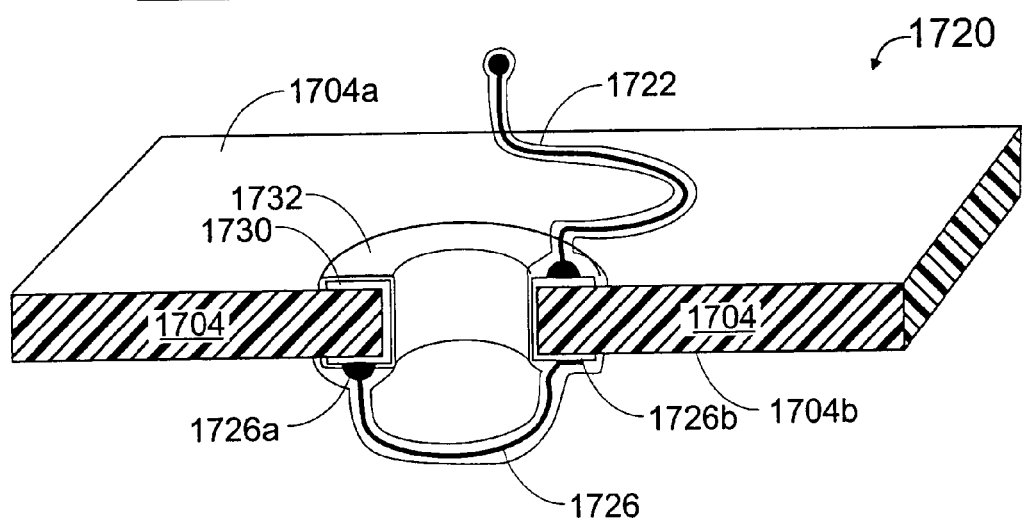
FIG. 17B is a perspective view of an embodiment of an interposer, according to the present invention.

When compliant (or resilient) electrical connection is required on only one side of the interposer, an interposer embodiment 1720 such as is shown in FIG. 17B can be fabricated and utilized. In this embodiment, a plurality (one of many shown) of fashioned wire stems 1722 are disposed on an upper (as viewed) surface 1724a of a printed circuit board 1724. When overcoated with a conductive resilient coating 1732, these wire stems 1722 will form resilient contact structures for making contact with terminals, pads or the like on a first electronic component (not shown) disposed above the interposer.

As in the previous embodiment (1700), the printed circuit board 1724 is provided with a plurality (one of many shown) of plated through holes 1728 comprising one or more layers of conductive material 1730, fabricated in a known manner. The wire stems 1722 are mounted (bonded, in any suitable manner described hereinabove) to the plating 1730 so as to protrude upward (as viewed) from the printed circuit board 1724.

In this embodiment 1720, non-resilient contact structures 1706 are formed on a lower (as viewed) surface 1724b of the printed circuit board 1724 by bonding a one end 1726a of the wire 1726 to a one position on the through hole plating 1730, and bonding another end 1726b of the wire 1726 to another, preferably diametrically opposed, position on the through hole plating 1730, in a manner akin to forming a traditional wire bonding loop (a wire is bonded at two ends between two points, and has an arched configuration between the two points).

The wire stems 1722 and 1726 are then overcoated (in any suitable manner described hereinabove) with one or more (one shown, for illustrative clarity) layers 1732 of a conductive material which will firmly anchor the wire stems 1722 and 1726 to the through hole plating 1730, and which covers the entire surface of the through hole plating 1730, as shown. The overcoat 1732 will also impart resiliency to the wire stems 1722. An electrical path is provided by the overcoat 1732 from the contact structures 1732 to the contact structures 1736. In this manner, contact structures are formed on both sides of the interposer substrate, the top "set" of contact structures 1722 making contact with terminals, pads or the like on a first electronic component (not shown) disposed above (as viewed) the interposer, the bottom "set" of contact structures 1726 making contact with terminals, pads or the like on a second electronic component (not shown) disposed below the interposer. In this case, only the top set of contact structures 1722 makes resilient contact (to the first electronic component). Since, in this embodiment 1720, it is presumed that resilient connections are not required between the interposer and the second electronic component, the contact structures 1726 can be formed as free-standing, pin-like contact structures (as described hereinabove).

Evidently, in this embodiment 1720, only the upper contact structures (1722) are resilient (or compliant), and the lower contact structure (1726) is rigid and well-suited to effecting a solder connection to another component disposed below the interposer 1720.

Figure 17C:
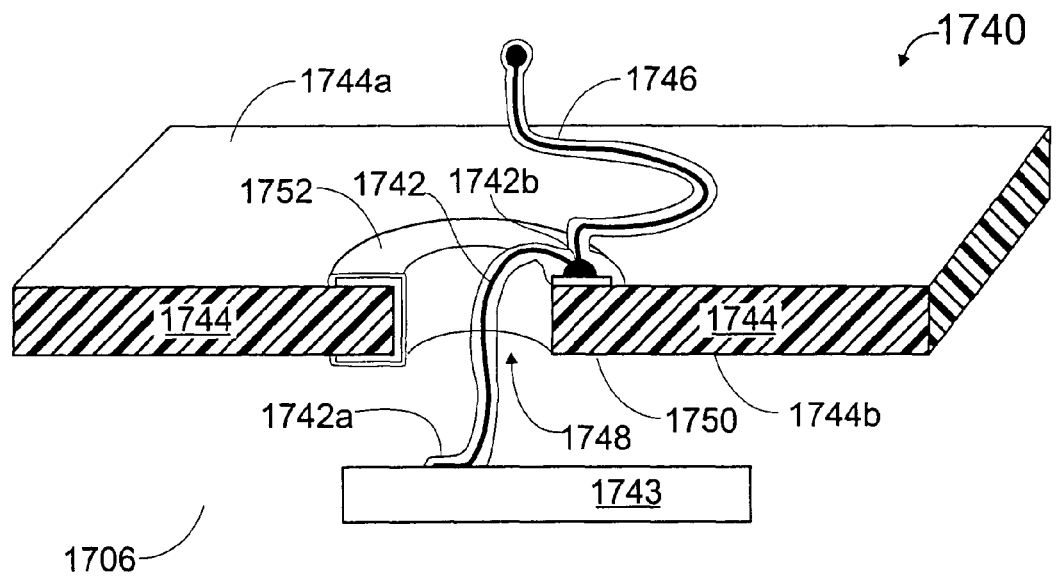
FIG. 17C is a perspective view of an embodiment of an interposer, according to the present invention.

FIG. 17C shows another embodiment 1740 of an interposer. As in the previously-described embodiments, a printed circuit board substrate 1744, having a top (as viewed) surface 1744a and a bottom (as viewed) surface 1744b is provided with a plurality (one of many shown) of through holes 1748 which are plated with one or more layers of a conductive material 1750. This embodiment is suitably fabricated by inserting a capillary (not shown) through the through hole 1748, bonding a free end 1742a of a wire 1742 to a sacrificial member 1743, moving the capillary up through the through hole 1748, bonding an intermediate portion 1742b of the wire 1742 to the through hole plating 1710 atop the printed circuit board 1704, then fashioning a resilient wire stem 1746 protruding upward from the top surface 1744a of the printed circuit board 1744. Upon overcoating with a conductive material 1752 (in any suitable manner, described hereinabove), resilient contact structures are formed which protrude upward (as viewed) from the top surface 1744a of the printed circuit board 1744, and which protrude downward (as viewed) from the bottom surface 1744b of the printed circuit board. Evidently, the diameter of the through hole 1748 must be greater than the diameter of the capillary, to enable this technique. Capillaries feeding wire having a diameter of approximately 0.001 inch are known with diameters as small as approximately 0.006 inches. Hence, a through hole having a diameter of approximately 0.010 inches will provide plenty of clearance for the capillary to traverse therethrough. As described hereinabove, upon completing fabricating the resilient contact structures on the interposer, the sacrificial member 1743 is removed. (Alternately, the sacrificial member can be removed prior to overcoating the wire stems, as described hereinabove.)

Evidently, in this embodiment 1740, it is only necessary to have conductive traces on one side of the interposer substrate (1744), even though plated through holes having presenting conductive areas on both sides of the substrate are illustrated. Moreover, it is not necessary that the wire stem portion (1742) extend through a through hole. A similar scheme could readily be effected by bonding the stem portions 1742 and 1746 to a conductive pad near an edge of the interposer substrate (1744).

In the interposer embodiments described hereinabove, it is evident that the "top set" of contact structures can differ from the "bottom set" of contact structures, and that one or both sets can be resilient contact structures. Generally, it is preferred that all of the contact structures of a given (i.e., top or bottom) set are the same as one another. However, it is within the scope of this invention that they would differ from one another.

The resilient contact structures formed (fashioned and overcoated) according to the present invention are compliant. Depending on the application for which they are intended to be used, it may be desirable to limit their compliance. To this end, "stops" are readily fabricated to limit compliance (spring deflection) of the resilient contacts.

Figure 17D:
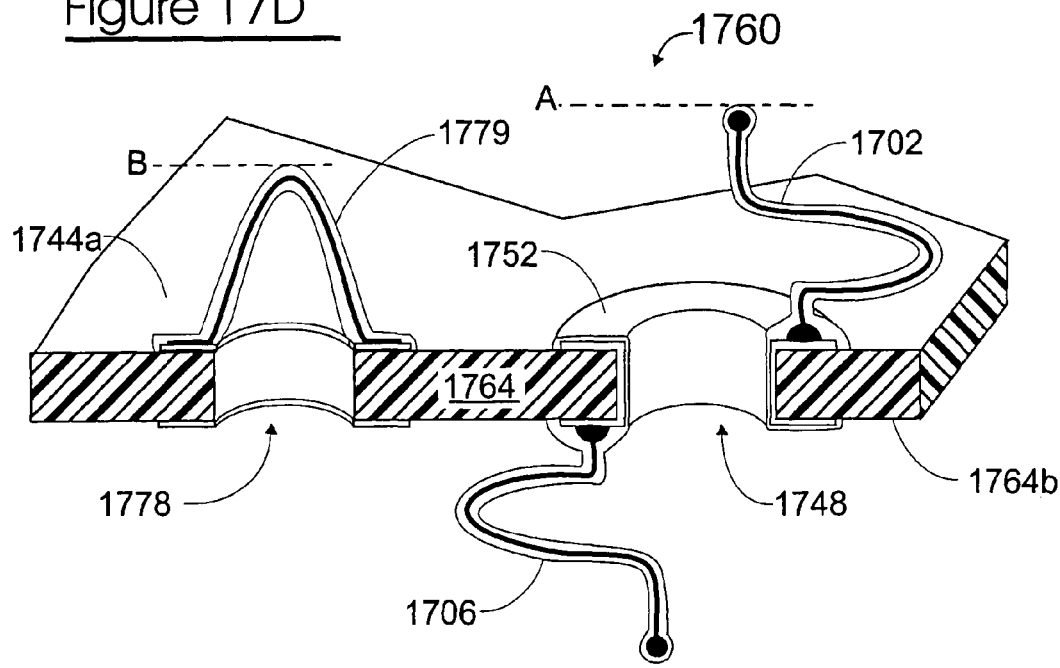
FIG. 17D is a perspective view of an embodiment of an interposer, according to the present invention.

FIG. 17D shows an embodiment 1760 of an interposer which has "stops" incorporated therein. This embodiment incorporates the substance of the interposer embodiment 1700 of FIG. 17A, as indicated by the dashed line. In this embodiment 1760, in addition to fashioning the wire stems 1702 and 1706, a compliance-limiting stop (standoff) 1779 is formed as a simple loop (compare the loop 1726 of FIG. 17B) on a plated through hole 1778 of the printed circuit board 1764. As mentioned hereinabove, such loops 1779, when overcoated, will not be resilient. I order to limit the compliance of the resilient contact 1702 on the top surface of the printed circuit board 1764, the loop extends to a position labelled "B", which is established at any desired distance, such as 0.003 inches, below (as viewed) the vertical extent (labelled "A") of the resilient contact structure 1702. In this manner, the deflection (resulting from a force imposed by an electronic component bearing down upon the interposer) of the resilient contact structure 1702 can be controlled (i.e., limited).

A notable feature of the embodiment 1760 of FIG. 17D is that the standoff element 1779 can be fabricated in the same process as the resilient contact structures (1702, 1706).

Figure 17E:
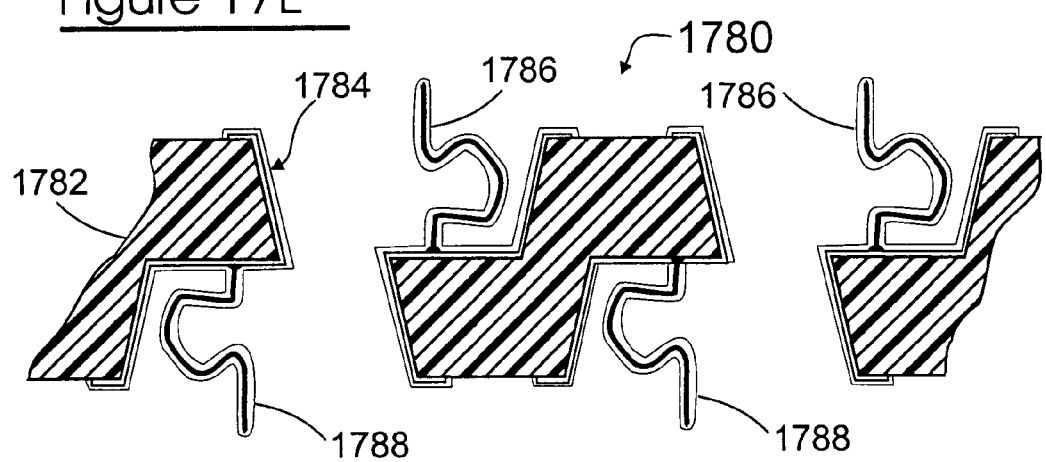
FIG. 17E is a side view of an embodiment of an interposer, according to the present invention.

FIG. 17E illustrates another embodiment 1780 of an interposer. In this case, the interposer substrate 1782 has a plurality (two of many shown) of stepped, plated through holes 1784 extending from the top (as viewed) surface thereof to the bottom (as viewed) surface thereof. More particularly, the substrate 1782 is, preferably, a molded thermoplastic substrate with offset holes molded therein, as shown in the figure. The offset holes result in there being "steps" (or "plateaus" within the body of the substrate which, when metallized, are suitable for having contact structures mounted thereto. A plurality (two of many shown) of resilient contact structures 1786 are mounted within the through holes 1784 to extend beyond the top (as viewed) surface of the substrate 1782, and a plurality (two of many shown) of resilient contact structures 1788 are mounted within the through holes 1784 to extend beyond the bottom (as viewed) surface of the substrate 1782. In this manner, the deflection of the resilient contact structures in response to a compressive force is inherently limited by the substrate 1782 itself acting as a "stop" (compare the aforementioned deflection-limiting stop 1779 of FIG. 17D). A resilient contact structure (1786, 1788) which has been fully deflected in this manner, will be contained entirely within the through hole. It is within the scope of this invention that the through hole is optionally filled with a soft, conductive elastomeric mass, in the manner described hereinabove with respect to FIG. 5E, for similar reasons.

Additional Interposer Embodiments

The use of the present invention in the context of interposers has briefly been described hereinabove, with respect to FIGS. 17A-17E.

It is within the scope of this invention that:

(a) the same resilient contact structures can be formed on both sides of the interposer;

(b) different resilient contact structures can be formed on each side of the interposer;

(c) the spacing between adjacent resilient contact structures can be different, from side-to-side on the interposer;

(d) more than one resilient contact structure can be formed at each "site" on a given side of an interposer; and (e) standoff and/or alignment and/or spring clip elements can be formed in conjunction with forming the resilient contact structures (see, e.g., element 1528 of FIG. 15A, and element 1780 of FIG. 17D).

Figure 18A:
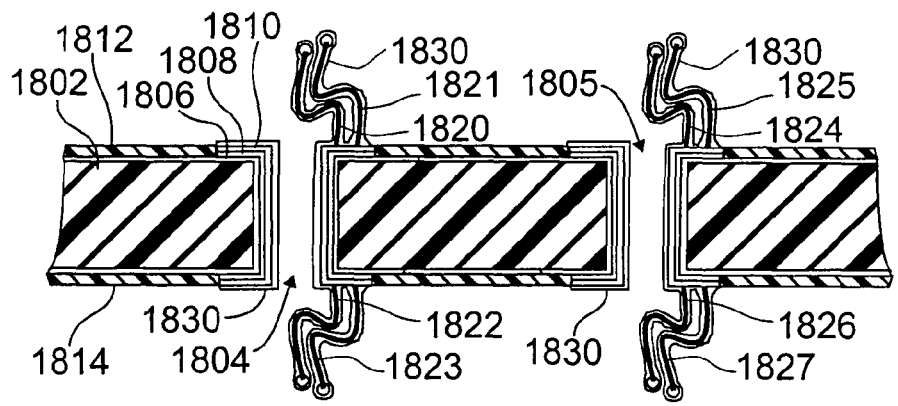
FIG. 18A is a side view of an embodiment of an interposer, according to the present invention.

FIG. 18A shows an embodiment of an interposer 1800 suitable to be disposed between spaced, opposing surfaces of two electronic components (1840 and 1850, shown in FIG. 18B), such as a semiconductor die (1840) and a printed circuit board (1850).

The interposer 1800 is made of a substrate 1802, such as a laminated printed circuit board, having a plurality (two of many shown) of holes 1804 and 1805 extending therethrough. The substrate 1802 is clad with a conductor 1806, such as copper, which covers both surfaces thereof and extends through the through holes 1804 and 1805. This is known.

A layer of resist 1812 is applied to the top (as viewed) side of the PCB 1802, and extends nearly to the through holes 1804. A similar layer of resist 1814 is applied to the bottom (as viewed) side of the PCB 1802, and extends nearly to the through holes 1804 and 1805. The through holes 1830 are plated with a layer 1808 of nickel, which is overcoated with a layer 1810 of gold. These layers 1808 and 1810 cover the copper 1806 within the through holes 1804 and 1805, and extend over the edges of the holes 1804 and 1805 onto a portion of the surfaces of the PCB 1802 which are not covered with resist 1812, 1814. This provides plated through holes (1804, 1805) suitable for mounting resilient contact structures according to the present invention. PCBs having cladding (1806) and multi-layer (e.g., nickel 1808, gold 1810) coated through holes (1804, 1805) are known, and commercially-available.

A first wire stem 1820 is bonded to the top (as viewed) surface of the PCB 1802 at the through hole 1804, and is fashioned into a skeleton (shape suitable to function as a spring, once overcoated), as described hereinabove. A second wire stem 1821 is bonded to the top (as viewed) surface of the PCB 1802 at the through hole 1804, at a circumferential position of the through hole 1804 which is preferably near the wire stem 1820, and is fashioned into a skeleton (shape suitable to function as a spring, once overcoated), as described hereinabove. The wire stems 1820 and 1821 extend upward (as viewed), in the same direction as one another, towards a first terminal of a first electronic component (not shown) disposed above (as viewed) the interposer 1800.

A third wire stem 1822 is bonded to the bottom (as viewed) surface of the PCB 1802 at the through hole 1804, and is fashioned into a skeleton (shape suitable to function as a spring, once overcoated), as described hereinabove. A fourth wire stem 1823 is bonded to the bottom (as viewed) surface of the PCB 1802 at the through hole 1804, at a circumferential position of the through hole 1804 which is preferably near the wire stem 1822, and is fashioned into a skeleton (shape suitable to function as a spring, once overcoated), as described hereinabove. The wire stems 1822 and 1823 extend downward (as viewed), in the same direction as one another, towards a first terminal of a second electronic component (not shown) disposed below (as viewed) the interposer 1800.

A fifth wire stem 1824 is bonded to the top (as viewed) surface of the PCB 1802 at the through hole 1805, and is fashioned into a skeleton (shape suitable to function as a spring, once overcoated), as described hereinabove. A sixth wire stem 1825 is bonded to the top (as viewed) surface of the PCB 1802 at the through hole 1805, at a circumferential position of the through hole 1804 which is preferably near the wire stem 1824, and is fashioned into a skeleton (shape suitable to function as a spring, once overcoated), as described hereinabove. The wire stems 1824 and 1825 extend upward (as viewed), in the same direction as one another, towards a second terminal of the first electronic component (not shown) disposed above (as viewed) the interposer 1800.

A seventh wire stem 1826 is bonded to the bottom (as viewed) surface of the PCB 1802 at the through hole 1805, and is fashioned into a skeleton (shape suitable to function as a spring, once overcoated), as described hereinabove. A eighth wire stem 1827 is bonded to the bottom (as viewed) surface of the PCB 1802 at the through hole 1805, at a circumferential position of the through hole 1805 which is preferably near the wire stem 1826, and is fashioned into a skeleton (shape suitable to function as a spring, once overcoated), as described hereinabove. The wire stems 1826 and 1827 extend downward (as viewed), in the same direction as one another, towards a second terminal of the second electronic component (not shown) disposed below (as viewed) the interposer 1800.

Once the wire stems (1820 . . . 1827) are mounted to the substrate 1802 and fashioned into resilient shapes, the wire stems are overcoated with a spring material 1830, such as nickel, in the manner described hereinabove. The overcoating 1830 covers the entire exposed (not covered by resist 1812 or 1814) surface of the through holes 1804 and 1805 to provide secure anchoring for the wire stems, and envelops the wire stems to impart resiliency thereto. During the coating (1830) process, the copper layer (1806) serves as a "shorting" layer (shorting all of the through holes together, hence all of the wire stems together), which facilitates electroplating.

Once the wire stems (1820 . . . 1827) are overcoated (1830), the resist (1812, 1814) is removed, and the copper cladding 1806 between the through holes (1804, 1805) is removed, such as by selective etching (i.e., with a chemical that is selective to the copper cladding 1806, versus the nickel overcoat 1830).

This results in an interposer having pairs of resilient contact structures extending upward (as viewed) for connecting to the first electronic component (1840), and corresponding pairs of resilient contact structures extending downward (as viewed) for connecting to the second electronic component (1850) shown), making connections between the two electronic components on a one-to-one (e.g., pad-for-pad) basis.

As is evident in this embodiment, the wire stems are provided in pairs (e.g., the pair 1820 and 1821, the pair 1822 and 1823, the pair 1824 and 1825, and the pair 1826 and 1827. Generally, the stems of each pair of stems (e.g., the stems 1820 and 1821) extend to the same height above the surface to which they are mounted (although the illustration in the figure is slightly in perspective). Each pair of stems makes connection to a corresponding terminal (or pad, or conductive area) on a corresponding electronic component. The pair of contact structures 1820/1821 connect to the terminal 1842 (shown in dashed lines) on the first electronic component 1840 (shown in dashed lines). The pair of contact structures 1822/1823 connect to the terminal 1852 (shown in dashed lines) on the second electronic component 1850 (shown in dashed lines), and are connected to the pair 1820/1821 by the through hole 1804 of the interposer 1800. The pair of contact structures 1824/1825 connect to the terminal 1844 (shown in dashed lines) on the first electronic component 1840 (shown in dashed lines). The pair of contact structures 1826/1827 connect to the terminal 1854 (shown in dashed lines) on the second electronic component 1850, and are connected to the pair 1824/1825 by the through hole 1805 of the interposer 1800.

An advantage of making connections with pairs (e.g., 1820, 1821) of resilient contact structures is reduced inductance (i.e., versus using only one resilient contact structure per connection).

Another advantage of making connections with pairs (e.g., 1820, 1821) of resilient contact structures is simply providing redundancy, under the general premise that two contacts are better than one.

Figure 18B:
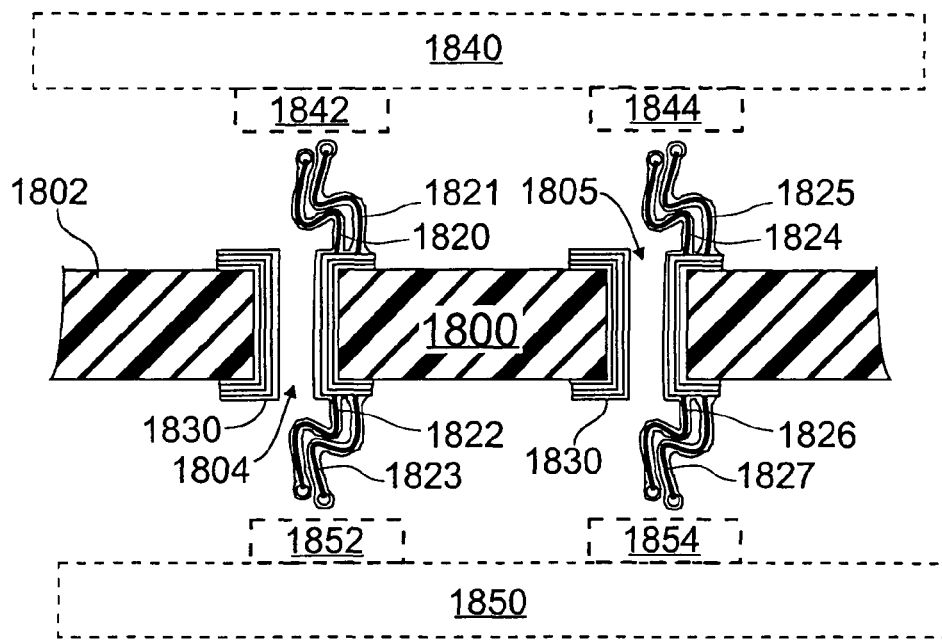
FIG. 18B is a side view of the interposer of FIG. 18A disposed between two electronic components, according to the present invention.

The interposer embodiment 1800 of FIGS. 18A and 18B are shown with identical contact structures at each interconnection site, and on both sides of the interposer. Although it is generally desirable that the contact structures be identical on a given side of the interposer (e.g., the wire stems 1820, 1821, 1824 and 1825 are all fashioned with generally the same height and shape), the contact structures on the other side of the interposer (e.g., the wire stems 1822, 1823, 1826 and 1827) may be fashioned with a different shape and with a different height than the contact structures of the opposite side of the interposer.

In the descriptions of interposers that follow, the plated through holes are generally shown as having one layer, for illustrative clarity, it being understood that multi-layer through holes, as described hereinabove, are preferred. Also, for illustrative clarity, only one of a plurality of contact structures formed on the interposers are shown.

Figure 19A:
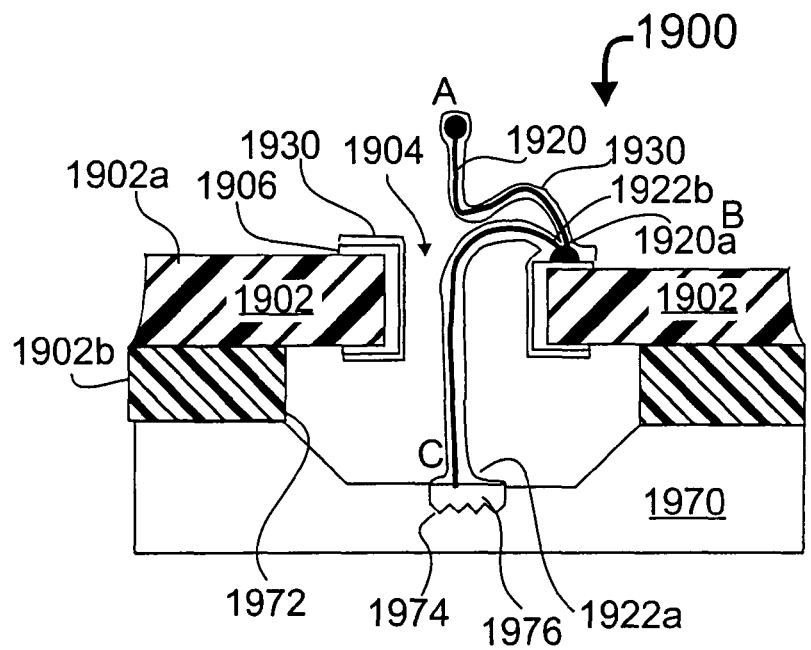
FIG. 19A is a side view of another embodiment of an interposer, according to the present invention.

FIG. 19A shows an embodiment of an interposer 1900 suitable to be disposed between spaced, opposing surfaces of two electronic components (1940 and 1950, shown in FIG. 19B), such as a semiconductor die (1840) and a printed circuit board (1850).

The interposer 1900 is made of a substrate 1902, such as a fibrous printed circuit board, having a plurality (one of many shown) of holes 1904 extending therethrough. The substrate 1902 is clad with a conductor 1906, which has been patterned in a known manner and which has been plated in a known manner so that the through holes 1804 are plated through holes. (Steps involving application of resist to effect patterning are omitted, for illustrative clarity.)

A sacrificial member 1970 is disposed beneath the bottom face 1902b of the substrate, and is adhered thereto with a suitable, removable, temporary adhesive 1972, such as common photoresist. The sacrificial member 1970 is provided with depressions 1974 for forming a topolological (topographical) contact tip 1976 on a wire stem, such as in the manner described hereinabove with respect to FIGS. 10D and 11D.

A free end 1920a of a first wire stem 1920 is bonded to the though hole conductor 1906 on a one face 1902a of the interposer substrate 1902, and is fashioned to extend upward, above the face 1902a, in a spring shape.

A free end 1922a of a second wire stem 1922 is bonded to the topological tip 1976. This may be accomplished by moving the capillary down through the hole 1904. Typically, the diameter of the capillary is on the order of 0.006 inches, and the diameter of the hole is on the order of 0.010 inches, or larger, to allow the capillary to traverse within the hole. The wire stem 1922 is then fashioned to extend upward, through the through hole 1904, to have a spring shape, and is bonded at its second end 1922b to through hole conductor 1906 on the one face 1902a of the interposer substrate 1902, preferably immediately adjacent the bonded end 1920a of the first wire stem 1920.

The wire stems 1920 and 1922 are then overcoated, such as with a layer 1930 of nickel, to form contact structures having resiliency (and to anchor the bonded ends of the wire stems).

Figure 19B:
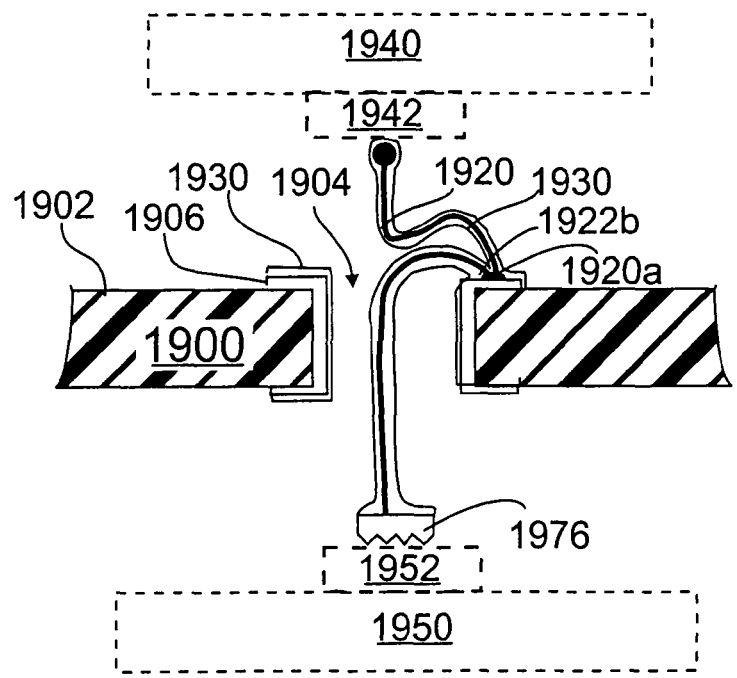
FIG. 19B is a side view of the interposer of FIG. 19A disposed between two electronic components, according to the present invention.

Finally, as shown in FIG. 19B, the sacrificial member 1970 is removed (such as by dissolving it and the adhesive 1972 away, with a suitable solvent). In this manner, an interconnection can be made between a terminal 1942 (shown in dashed lines) on a first electronic component 1940 (also shown in dashed lines) and a terminal 1952 (shown in dashed lines) on a second electronic component 1950 (also shown in dashed lines).

As is generally the case in previously-described embodiments employing a sacrificial member, the sacrificial member (1970) serves as a shorting member to facilitate electroplating of the coating (1930) onto the wire stems. Also, as in previous embodiments, the sacrificial member (1970) may be removed prior to applying the overcoat (1930), rather than after (as illustrated).

By way of example, the interposer 1900 may be disposed between a package (electronic component 1940) and a printed circuit board (electronic component 1950), in which case it is advantageous that the contact tip 1976 terminates with a tin or solder layer (for connecting to pads on the printed circuit board) and that the tip of the stem 1920 terminate as solder (for connecting to pads on the package).

As was mentioned with respect to the interposer 1800 of FIGS. 18A and 18B, in the interposer 1900 of FIGS. 19A and 19B, the contact structures (1920) on a one side (1902a) of the interposer (1900) may be fashioned with a different shape and with a different height than the contact structures (1922) on the other side (1920b) of the interposer (1900). Moreover, the tip topography of the contacts (1920) on one side (1902a) can be different than the tip topography of the contacts (1922) on the other side (1902b). Moreover, the material of the wire stem (1920) on one side (1902a) of the interposer (1900) may be different than the material of the wire stem (1922) on the other side (1902b) of the interposer (1900), although using the same materials is preferred. Generally, it is preferred that the overcoat (1930) is the same (material and process) for the contact structures on both sides of the interposer, since this avoids discontinuities in the overcoat (1930), although it is within the scope of this invention that the overcoat be different for the wire stems of each side of the interposer. These "variations on the theme" are generally applicable to all of the interposer embodiments described herein.

It is within the scope of the present invention that the interposer substrate 1902 would be provided with pads on its upper side (1902) only, rather than with plated through holes (1904) as shown, due to the fact that the electrical connection between the two components 1940 and 1950 is not dependent on the through hole (i.e., as in the embodiment of FIGS. 18A and 18B).

Additionally, it is within the scope of this invention that the two wire stems 1920 and 1922 be formed as one wire stem, which is easily visualized by bonding the end 1922a of the wire stem 1922 to the sacrificial member 1970, extending the capillary up through the through hole 1904, bonding an intermediate portion of the wire 1922 to the terminal (at the same location shown as 1922b in FIG. 19A), then continuing to move the capillary to fashion the wire stem 1920 as a "continuation" of the wire stem 1922. In this manner, a direct, one wire connection would be made between the terminal 1942 of the first electronic component 1940 and the terminal 1952 of the second electronic component 1950, without relying on the electrical conductivity of the through hole material (1906).

If it desired to form the wire stems 1920 and 1922 as two distinct wire stems (as illustrated), it is evidently preferably to first form the lower wire stem 1922 (extending through the through hole 1904), prior to forming the upper wire stem 1920. Otherwise, the wire stem 1920 would tend to be "in the way" while fashioning the lower wire stem 1922. This is illustrative of the fact that, generally, throughout all of the embodiments discussed in this application, the sequence of events can be rearranged to suit particular applications.

Figure 20A:
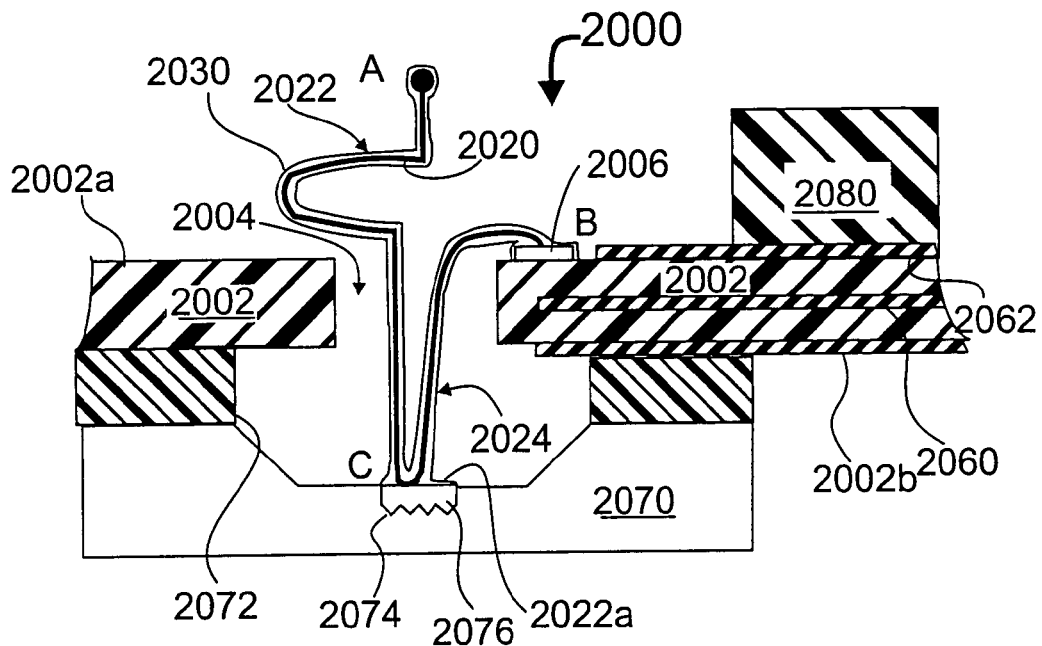
FIG. 20A is a side view of another embodiment of an interposer, according to the present invention.

FIG. 20A shows an embodiment of an interposer 2000 which is similar to the embodiment 1900 of FIG. 19A, except that it is particularly directed to making the interconnection between the two electronic components (2040 and 2050, shown in FIG. 20B) with a single wire. Again, as with previous interposer embodiments, the interposer 1900 is intended to be disposed between spaced, opposing surfaces of two electronic components (1940 and 1950) such as a semiconductor die (1840) and a printed circuit board (1850), but is not limited to these two particular electronic components.

The interposer 2000 is made of a substrate 2002, such as a printed circuit board, having a plurality (one of many shown) of holes 2004 extending therethrough. As was suggested in the discussion of the previous embodiment (1900), it is only necessary to have a plurality (one of many shown) of pads 2006 (shown herein as a single layer, but which may be a multilayer pad, such as gold over nickel over copper) disposed on the top (as viewed) surface 2002a thereof.

This embodiment illustrates a feature that can be incorporated into other interposer embodiments described herein (i.e., hereinabove and hereinbelow)—namely, incorporating a ground or power plane 2060 within a circuit board type substrate (2002). Moreover, the substrate 2002 can be provided on its top (as viewed) surface with a ground or power plane 2062 (which would be a power plane if the plane 2060 is a ground plane), and with a signal plane 2064 on its lower (as viewed) surface 2002*b*, or vice-versa. It is within the scope of this invention that substrates such as 2002 can be provided with resistors, capacitors, capacitive layers, planar resistors and the like, to enhance their functionality.

In a manner similar to the previously-described embodiment (1900), a sacrificial member 2070 is disposed beneath the bottom face 1902*b* of the substrate, and is adhered thereto with a suitable, removable, temporary adhesive 2072, such as common photoresist. The sacrificial member 1970 is provided with depressions 2074 for forming a topological tip 2076 on a wire stem, such as in the manner described hereinabove with respect to FIGS. 10D and 11D.

A free end 2020*a* of a wire 2020 is bonded to the conductive pad 2006 on the face 2002*a* of the substrate 2002, and is fashioned in a spring shape to extend downward, through the through hole 2004 to the sacrificial member 2070, whereat an intermediate portion 2020*c* of the wire is bonded to the tip 2076. This, the wire extending from the pad 2006 to the tip 2076 constitutes a first portion 2022 of a shaped wire stem, and has a shape which is suitable to form a first conductive contact, when overcoated in the manner described hereinabove.

After bonding the intermediate portion 2020*c* of the wire 2020 to the tip 2076, the wire 2020 is further fashioned by moving the capillary back up through the hole, to form a second portion 2024 of the wire stem which terminates above (as viewed) the top surface 2002*a* of the substrate 2002 and which is suitable to form a second conductive contact when overcoated in the manner described hereinabove.

The wire stems 2020 (i.e., both portions 2022 and 2024 thereof) is then overcoated, such as with a layer 2030 of nickel, to form a resilient contact structure having an end which extends above (as viewed) the top surface 2002*a* of the substrate 2002 and an end which extends below (as viewed) the bottom surface 2002*b* of the substrate 2002.

Figure 20B:
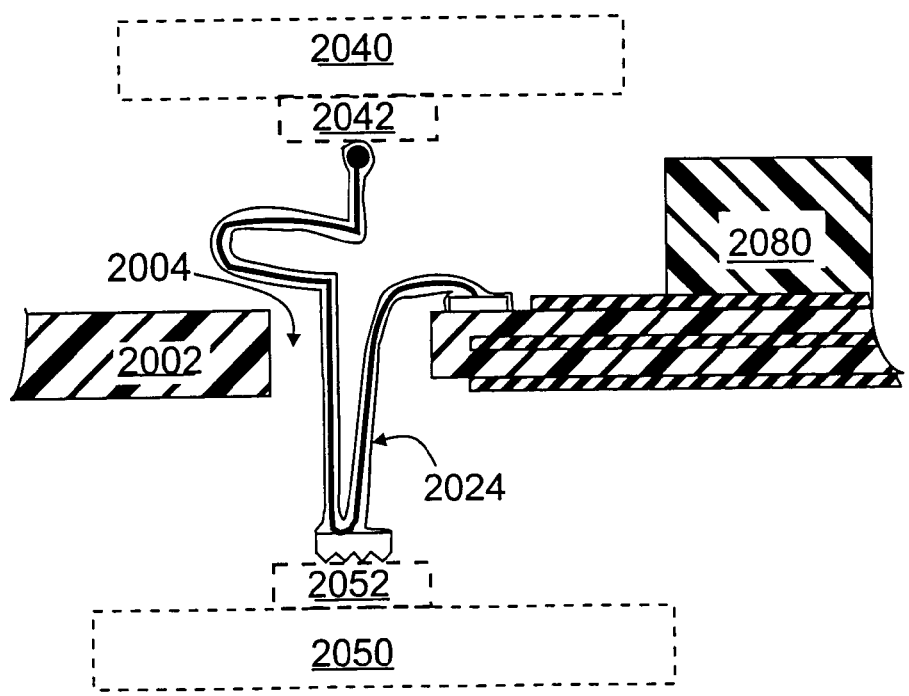
FIG. 20B is a side view of the interposer of FIG. 20A disposed between two electronic components, according to the present invention.

Finally, as shown in FIG. 20B, the sacrificial member 1970 is removed (such as by dissolving it and the adhesive (e.g., photoresist) 2072 away, with a suitable solvent). In this manner, an interconnection can be made between a terminal 2042 (shown in dashed lines) on a first electronic component 2040 (also shown in dashed lines) and a terminal 2052 (shown in dashed lines) on a second electronic component 2050 (also shown in dashed lines).

As is generally the case in previously-described embodiments employing a sacrificial member, the sacrificial member (2070) serves as a shorting member to facilitate electroplating of the coating (2030) onto the wire stem portions 2022 and 2024. Also, as in previous embodiments, the sacrificial member (2070) may be removed prior to applying the overcoat (2030), rather than after (as illustrated).

As illustrated in FIGS. 20A and 20B, in this embodiment 2000, a spacer 2080 is preferably provided on the top (as viewed) surface 2002*a* of the substrate. The first portion 2024 of the wire stem extends above the top (as viewed) surface of the spacer 2080, such as by 0.005 inches. As in other embodiments described herein, it is typically sufficient that the wire stem protrude beyond any other structures (i.e., such as the spacer 2080) approximately 0.005 inches, and that it be designed to have approximately 0.003 inches of compliance in reaction to "normal" load forces. For example, the wire stem of this embodiment is fashioned so that the lower (as viewed) portion of the wire stem (i.e, the topological tip thereof) extends 0.005 inches beyond the lower surface 2002*b* of the substrate.

An advantage of the interposer 2000 of this embodiment is that the overall wire length (electrical path) between the terminal 2042 and the terminal 2052 is typically shorter than the overall wire length between the terminal 1942 and 1952 (see previous embodiments 1900). In this case, the overall wire length is determined by the path taken by the wire between the points "A" and "C". In the previous embodiment (1900), the overall wire length is determined by the path taken by the wire stem 1920 from the points "A" to "B", plus the path taken by the wire stem 1922 from the points "B" to "C". (In other words, AC<AB+BC.) This shorter electrical path is generally preferred, due to inductance considerations.

In this embodiment 2000, it is evident that the interposer substrate 2002 primarily serves as a support for the wire. However, as mentioned hereinabove, the interposer substrate 2002 can be provided with ground, power and signal planes. Having ground and signal planes within (including on the surface of) the substrate would be applicable to any of the other PCB-type substrate embodiments described herein, and is beneficial in reducing stray capacitances.

FIG. 21 shows an embodiment 2100 of an interposer with which it is possible to make "engineering changes"—in other words, to reassign the signals going to particular pins (i.e., contact pads) of an electronic component. A multi-layer PCB-type substrate 2102 is provided with a plurality (two of many shown) of plated through holes 2104 and 2106. A top (as viewed) surface of the substrate 2102 is provided with a patterned conductive layer 2108. A bottom (as viewed) surface of the substrate 2102 is provided with a patterned conductive layer 2110. Resilient contact structures 2112 and 2114 are illustrated as being mounted to contact pads formed of the top conductive layer 2108. Resilient contact structures 2116 and 2118 are illustrated as being mounted to contact pads formed of the bottom conductive layer 2110.

As is illustrated, the pattern of the conductive layers 2108 and 2110 is such that an electrical interconnect path is formed between the resilient contact structure 2116 and the resilient contact structure 2114, rather than to the contact structure 2112 directly above it (2116). The substrate in this example is shown as having a ground plane 2120 and a power plane 2122, formed as layers within the multi-layer substrate.

The ability to make engineering changes (e.g., re-assignment of pin-outs), with an interposer such as is described with respect to FIG. 21, affords a great deal of flexibility, since the interposer itself effects the engineering changes. Engineering changes are simply (hence, economically) effected simply be re-routing the conductive traces on the interposer substrate.

Figure 22A:
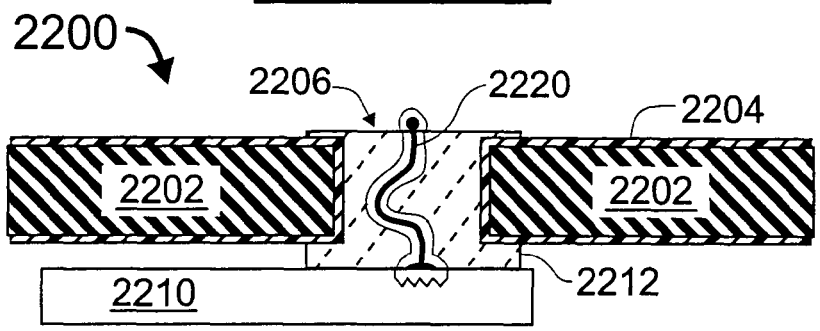
FIGS. 22A and 22B are side views of additional embodiments of interposers, according to the present invention.

FIG. 22A illustrates an embodiment 2200 of a technique of forming resilient contact structures in an interposer structure having dimensional stability. In this case, a metallic substrate (stiffener) 2202, such as copper, is employed, and is provided with a coating of a dielectric material 2204. The substrate 2202 has a plurality (one of many shown) of openings 2206 extending through the substrate, within which resilient contact structures will be formed. A conductive sacrificial substrate 2210 (compare 1104, FIG. 11A) is disposed under (as viewed) the substrate 2202, and is spaced therefrom by any suitable sacrificial spacer 2212. A wire stem 2220 is bonded to the sacrificial substrate 2210 and fashioned to have a springable shape, and is then overcoated to be resilient, in the manner described hereinabove, to become a resilient contact structure 2230. The throughhole 2206 is then, optionally, filled with a conductive elastomer material 2208 (compare 564, FIG. 5E). The sacrificial substrate 2210 and spacer 2212 are then removed (such as by dissolving), in the manner described hereinabove. In this manner, the top (as viewed) end of the resilient contact structure 2230 is suitable for contacting a first electronic component, and the bottom (as viewed) of the resilient contact structure is suitable for contacting a second electronic component (compare, e.g., FIG. 18B), each interconnection being made with a single resilient contact structure 2230 extending from both faces of the interposer. In is within the scope of this invention that the substrate 2202 (and those like it, as described herein) can be made of plastic, or reinforced plastic.

Figure 22B:
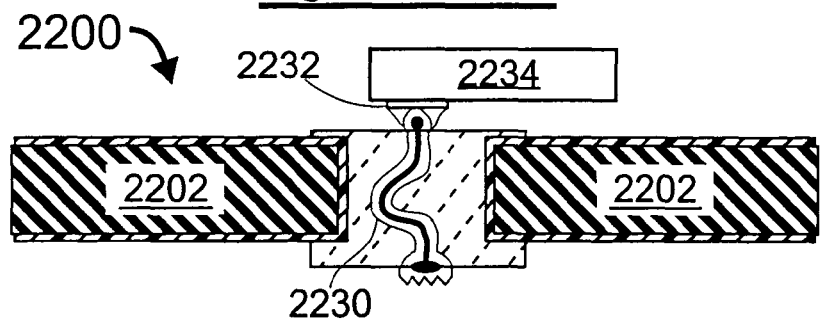

As shown in FIG. 22B the resilient contact structure 2230 can be soldered to a pad 2232 on an electronic component 2234.

The structures illustrated, for example, in FIGS. 22A and 22B derive their value (to a great extent) from the fact that an interconnect structure is loosely held within a stiffener (2202), simply with a "blob" of elastomer.

It is within the scope of this invention that the stiffener (2202) is a multi-layer structure, such as two semi-rigid sheets (with an array of holes in each sheet), having a gel between the two sheets. In any case (i.e., whether the stiffener is monolithic or multi-layer) the contact structures are loosely held (suspended) within openings in the stiffener. This permits the contact structures to self-align themselves to contact pads on external components which are not perfectly coplanar with one another.

It is also within the scope of this invention that the elastomer material can cover the contact structures which, under compression, will "punch" through the elastomer material to make contact to external components.

The elastomer mass serves two purposes: (1) loosely retaining (suspending) the contact structure in the stiffener, and (2) optionally, shorting out the contact structure to provide a direct electrical path from one end thereof to the other.

Figure 22C:
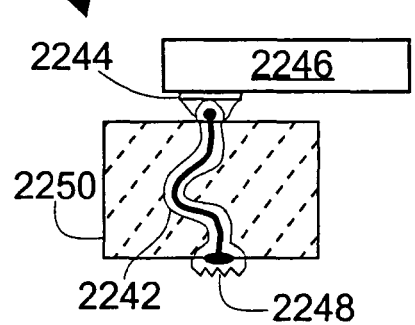
FIG. 22C is a side view of another embodiment of an interposer, according to the present invention.

FIG. 22C illustrates an embodiment 2240 of a technique of forming a support structure around contact structures after mounting the contact structures to an electronic component. Generally, a plurality (one of many shown) of contact structures 2242 are mounted to a contact pad 2244 of an electronic component 2246, in any suitable manner, such as the gang-transfer technique described hereinabove with respect to FIGS. 12A-12C. The component is then inverted, and a flexible, dielectric molding compound 2250 is poured around the contact structures 2242, leaving the tips 2248 of the contact structures exposed.

Vis-a-vis interposers, it is evident from the discussions presented hereinabove that the tips of the contact structure extending from the two sides of the interpose can be fabricated according to a variety of techniques.

FIGS. 22D-F illustrate another interposer embodiment 2250. Resilient contact structures 2252, preferably with topographical tips 2254 are fabricated on a sacrificial substrate 2256 (compare FIG. 11E), such as aluminum. Spacers of photoresist 2258 or the like are disposed on the top (as viewed) surface of the sacrificial substrate 2256. A printed circuit board 2260 with an array of plated through holes 2262 is aligned over the sacrificial substrate 2256, so that the resilient contact structures 2252 line up with the through holes 2262. The plated through holes preferably have a layer 2264 of copper, covered by a layer 2266 of tin-lead (e.g., solder).

FIG. 22E shows the printed circuit board 2260 having been positioned so that the resilient contact structures 2252 are positioned within the through holes 2262, with an intermediate portion of each contact structure in contact with the tin-lead layer of a corresponding through hole, and with the two ends 2252a and 2252b of the contact structures extending out of the through holes 2262.

Heat is then applied, to re-flow the tin-lead (solder) layer 2264, so that the intermediate portions of the resilient contact structures are permanently mounted to the printed circuit board 2260. The sacrificial structure 2256 and spacers 2258 are then removed (as shown in FIG. 22F), leaving the two ends 2252a and 2252b of the resilient contact structures extending out of the through holes 2262, each end suitable for making contact to a respective other electronic component. In FIG. 22F, the reflowed solder (2266) is illustrated as a solid black mass.

Additional Semiconductor Package Embodiments

There have been described, hereinabove a number of "straightforward" schemes for using resilient contact structures on external surfaces of "conventional" semiconductor packages. Such semiconductor packages typically have a number of internal interconnections, such as conductive vias, between layers (i.e., between the layers of a ceramic package). Each of these interconnects represents a level of complexity in the design, layout and implementation of the package, which tends to make each package unique from another, depending on the interconnect required. This translates into additional expense and additional fabrication time, per semiconductor package, the avoidance of which would be a desirable goal.

According to a feature of the invention, "via-less" packages are provided which avoid the problems associated with intra-layer interconnect, and the problems associated therewith.

Figure 23A:
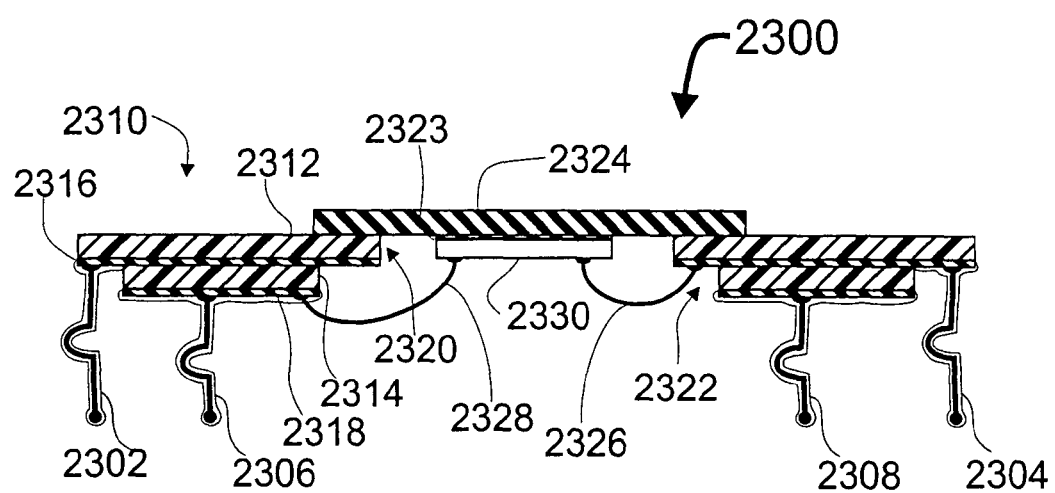
FIG. 23A is a side view of an embodiment of a semiconductor package incorporating resilient contact structures mounted thereto, according to the present invention.

FIG. 23A illustrates an embodiment 2300 of a semiconductor package which is based on a multi-layer substrate 2310, such as a PCB substrate.

The multi-layer substrate 2310 is illustrated as having two (can be more than two) insulating layers 2312 and 2114, the layer 2312 being disposed atop (as viewed) the layer 2114. The bottom surfaces of the layers 2312 and 2314 are provided with patterned conductive traces 2316 and 2318, respectively, in a known manner.

The top (as viewed) insulating layer 2312 is formed as a square ring, having a central opening 2320, and the bottom (as viewed) insulating layer 2314 is also formed as a square ring, having a central opening 2322 aligned with the central opening 2320. As illustrated, the top layer 2312 extends beyond the outer (to the left or to the right, as viewed) edges of the bottom layer 2314, and the opening 2320 is smaller than the opening 2322. In this manner, the conductive layer (traces) 2316 of the upper layer 2312 are exposed.

An electronic component 2330 such as a semiconductor device is mounted by a die-attach material 2323 (e.g., silver-filled adhesive, or silver-glass composite) to a plate 2324. The plate is preferably a metal plate, and is larger than the opening 2320. As illustrated, the plate 2324 is mounted to the layer 2312, on a side of the layer opposite the conductive traces 2316, with a suitable adhesive (not shown). In this manner, the semiconductor die 2330 is disposed within the opening 2320.

Bond wires 2326 (one of many shown) are provided between the front (bottom, as viewed) face of the semiconductor die 2330 and exposed inner portions of the conductive traces 2316. Likewise, bond wires 2328 (one of many shown) are provided between the front face of the semiconductor die 2330 and inner portions of the conductive traces 2318. This is readily accomplished with "standard" wirebonding equipment.

Resilient contact structures 2302 and 2304 are mounted to exposed outer portions of the conductive traces 2316. Likewise, resilient contact structures 2306 and 2308 are mounted to outer portions of the conductive traces 2318. It will be understood that each contact structure (2302, 2304, 3206 and 2308) is bonded to an individual one of a plurality of conductive traces (2316, 2318). In this manner, each of the conductive traces is electrically interconnected to a particular one of the bond pads on the face of the semiconductor die, via bond wires (2326, 2328).

In the manner described hereinabove, the contact structures 2302, 2304, 2306 and 2308 preferably extend to a common height (downward, as viewed in the figure), although they originate from different levels of the PCB 2310. Moreover, the contact structures can be shaped (and overcoated) to be resilient.

In the manner described hereinabove, complex interconnections between a semiconductor die (2330) and external connections (2302, 2304, 2306, 2308) suitable for mounting to a motherboard (or the like) can be effected, without requiring a package having a complex pattern of vias (layer-to-layer conductive paths) which require relatively expensive processing steps.

Figure 23B:
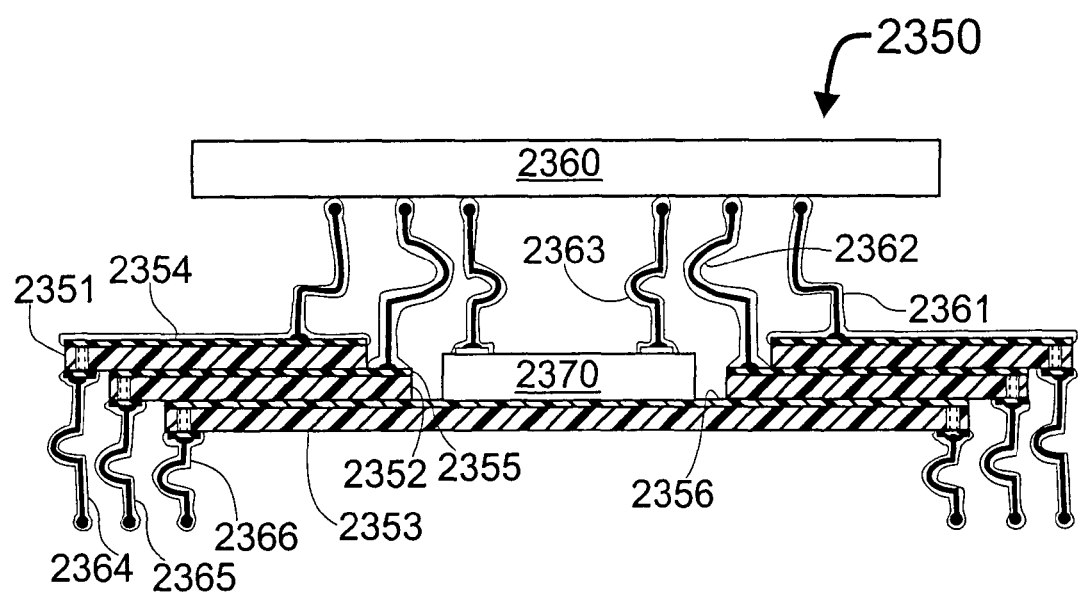
FIG. 23B is a side view of another embodiment of a semiconductor package incorporating resilient contact structures, according to the present invention.

FIG. 23B illustrates another embodiment 2350 of a package assembly, wherein a multi-layer substrate is formed with a three exemplary insulating layers 2351, 2352 and 2353, each insulating layer having conductive traces disposed on their top (as viewed) surfaces 2354, 2355 and 2356, respectively. Each of the top two insulating layers 2351 and 2352 is a ring-like structure, having a central opening. The opening in the layer 2351 is larger than the opening in the layer 2352, so that inner portions of the conductive traces 2355 are exposed. The layer 2353 need not be ring-like. The conductive layer 2353 will be exposed within the opening of the second insulating layer 2352.

An electronic component 2360, such as a semiconductor die is disposed atop the openings, and is connected to the conductive layers 2354 and 2355 with resilient contact structures 2361 and 2362, respectively. The resilient contact structures 2361 and 2362 preferably originate from (are mounted to) the conductive layers 2354 and 2355, and terminate in a common plane, as described hereinabove.

A discrete electronic device 2370, such as a decoupling capacitor, is mounted and connected to conductive traces on the conductive layer 2356, within the opening of the insulating layer 2352. The electronic component 2360 is connected to the decoupling capacitor 2370 with resilient contact structures 2363, in the manner described hereinabove.

External connections to the package are provided in a manner similar to that of the previous embodiment 2300. However, in the case of this embodiment 2350, resilient contact structures 2364, 2365 and 2366 are mounted to the different levels of the bottom surface of the package at through holes connecting to conductive layers 2354, 2355 and 2356, respectively.

As is evident, this embodiment 2350 exhibits reduced interconnects (vias) between layers (e.g., 2351, 2352, 2353). These through-layer interconnects (e.g., the vias) are relatively straightforward, and can be somewhat reduced in number, as compared with typical prior art schemes.

Another feature illustrated in FIG. 23B is that the contact structures (2361, 2362 and 2363) can all have different spring-shapes. In this manner, a wide variety of applications can be accommodated, and this principle extends to numerous other embodiments described herein.

Figure 23C:
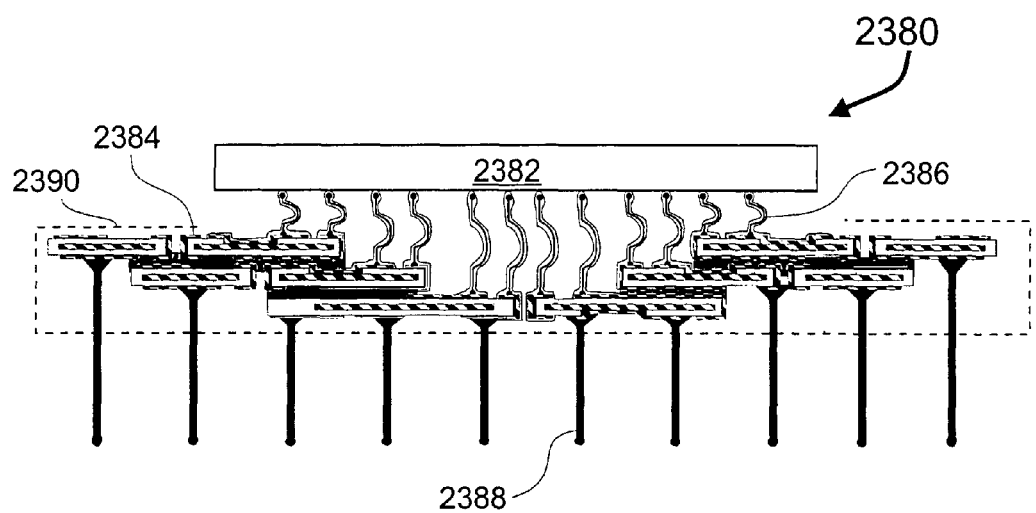
FIG. 23C is a side view of a flip-chip ready, via-less PCB substrate having external contacts, according to the present invention.

FIG. 23C illustrates another embodiment 2380 of a package assembly. In this case, a discrete electronic device (compare the decoupling capacitor 2370 of the previous embodiment 2350) is omitted, for illustrative clarity.

This embodiment 2380 is generally similar to the previous embodiment 2350, and similarly avoids interconnections between the stand-alone, laminated inner layers of the multi-layer substrate 2384.

As illustrated in this embodiment, a semiconductor die 2382 is connected to a multi-layer substrate 2384 by a plurality of resilient contact structures (flip-chip contacts) 2386 originating from different levels on the multi-layer substrate 2384. Further, in this embodiment, the bottom (as viewed) surface of the substrate 2384 is provided with a plurality of non-resilient, straight, pin-like contact structures 2388, which may be formed by the techniques discussed hereinabove. It is within the scope of this invention that any suitable scheme for implementing external connections (2388) to the substrate 2384 can be employed, including resilient or compliant contact structures or solder columns (bumps), rather than the illustrated pins (2388).

Optionally, the substrate 2384 can be encapsulated with a suitable insulating material 2390, such as epoxy, to protect the package from ambient conditions (e.g., humidity).

This embodiment 2380 is exemplary of a flip-chip "ready" PCB-based substrate which does not require via drilling.

A general advantage of the embodiments shown in FIGS. 23A, 23B and 23C are that they are "self-planarizing", essentially "via-less" semiconductor packaging techniques.

"Loop" Embodiments

It has been described, hereinabove, how the proximal end of a wire can be bonded to a substrate, the wire configured and severed to be a freestanding wire stem having a shape suitable for overcoating to become a resilient contact structure, and overcoated to result in a freestanding contact structure having resiliency (and improved anchoring to the substrate).

It has also been mentioned (see, e.g., FIG. 2F, hereinabove) that the distal end of the wire stem can be bonded within the contact area on the substrate. Such an arrangement is particularly well adapted to overcoating the resulting loop with solder, to make solder contacts having controlled geometry and high aspect ratio, as discussed in CASE-1 and in CASE-2. These solder-overcoated loop embodiments of the invention are described only briefly, herein, since they generally fall into a category which is different than "resilient contact structures".

In many electronic applications, it is desireable to form a plurality, such as a pattern or an array, of raised solder contacts (also referred to as "solder bumps") on an electronic component, for subsequent mounting of the solder-bumped component to another electronic component, such as a printed circuit board (PCB) having a matching pattern of pads. Many efforts have been made in the past to achieve substantial heights, or aspect ratios (height:width), of such solder bumps. This is due to the inherent tendency for a solder bump to be only as high as it is wide (aspect ratio of 1:1), due to its surface tension (comparable to that of water) in its molten state. As a general proposition, higher is better. Moreover, the ability to control the height and shape of a solder contact is an ancillary concern.

A product which is exemplary of the great effort that has gone into making connections using solder bumps on an external surface of a package is found in Motorola's Overmolded Plastic Pad Array Carrier (OMPAC), wherein a semiconductor die is mounted to a central area on a front surface of a printed circuit board (PCB), and the front surface of the PCB is provided with a number of conductive traces that extend from near the periphery of the PCB to the central area. The die is connected to inner ends of the traces with conventional bond wires. Near the periphery of the PCB, there are plated (conductive) through-holes (vias) extending to the back surface of the PCB, connecting to the respective traces on the front surface of the PCB. The back surface of the PCB is provided with conductive traces, each having an end connected to a respective via. In this manner, signals (and power) to and from the die are connected through the bond wires, through the front surface traces, and through the vias, to the bottom surface traces. A plastic molded body is formed over the die, and partially covers the front surface of the PCB. Each of the bottom surface traces terminates at a "site" (particular location) on the back surface of the PCB. These sites are arranged in a rectangular array of evenly spaced rows and columns. Each site is provided with a solder bump (ball bump) which, in aggregate, constitute the external connections for the package (assembly). In this manner, the entire assembly can be surface-mounted to a corresponding "mother board"—in other words, to a circuit board containing other circuit elements and the like for integrating the assembly into an electronic system. This type of package can be considered to be a "ball-bump grid array" (BGA) type package, in contrast to other package types known as pin grid array (PGA), or to a leaded package.

U.S. Pat. No. 5,014,111 (Tsuda, et al.; May 1991; USCL 357/68), entitled ELECTRICAL CONTACT BUMP AND A PACKAGE PROVIDED WITH SAME, discloses providing a substrate with conductive terminals and providing another substrate with electrode pads. Two-stepped electrical contact bumps are formed on the electrode pads, each consisting of a first raised portion and a second raised portion formed on the first raised portion.

It is an object of the present invention to provide an improved bump grid array type package.

The present invention is not limited to making solder bump type connections to packages, and is also useful for making "flip-chip" type connections between dies. Generally, as mentioned for example in the aforementioned U.S. Pat. No. 4,067,104, the technique of flip-chip bonding involves depositing thin pads, or bumps of metal on one side of a silicon chip and an appropriate substrate with interconnecting circuitry. The chip is then "flipped" over on top of the substrate, and corresponding pads on the chip and substrate are bonded together.

It is an object of the present invention to provide an improved technique for making flip-chip type connections between electronic components.

According to the invention, solder bumps of controlled geometry and exhibiting a relatively high aspect ratio can be formed on electronic components. Solder bumps having high aspect ratios are often referred to as "solder columns".

Figure 24A:
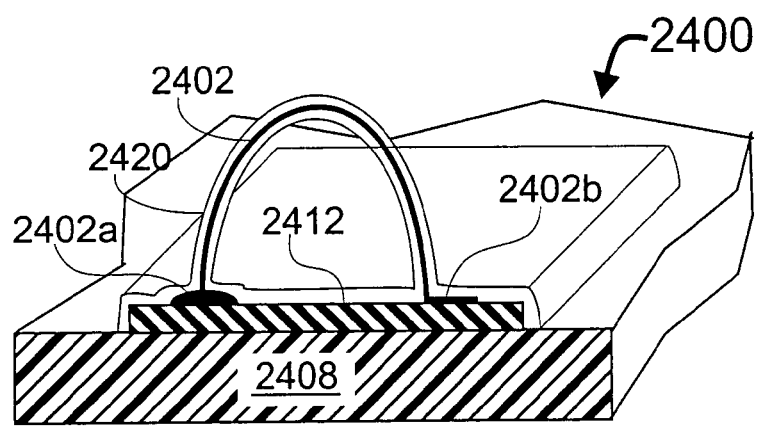
FIG. 24A is a partial perspective view of an embodiment of a loop-shaped contact formed on a terminal of a substrate, according to the present invention.

FIG. 24A, similar to FIG. 16 of CASE-2, illustrates an embodiment 2400 of a raised bump type electrical contact formed on a terminal 2412 on a surface of a substrate 2408. The bump type contact is formed by bonding a first end 2402*a* of a wire 2402 at a first position on the terminal 2412 (such as with a ball bond, as shown), shaping the wire 2402 into a loop (in the manner of FIG. 2F), and bonding a second end 2402*b* at a second position on the terminal 2412 (such as with a wedge bond. The shaped (e.g., U-shaped) wire stem is overcoated in the manner described hereinabove, with a conductive material 2420 which is deposited over the entire length of the wire 2402, and over the terminal 2412 (including over the edge of the terminal and covering the bonds at the ends of the wire). In this manner, it is possible to provide a relatively rigid contact structure protruding from the surface of the terminal which has a controllable geometry, and which has a relatively high aspect ratio (height:width). The overcoat material 2420 is suitably solder, which would result in the contact structure being relatively inflexible. The overcoat material 2420 can, however, be of a springable conductive material, such as nickel, so that the contact structure has some resiliency. The overcoat (2420) can be a multilayer overcoat, in the manner of FIG. 5.

If desired, two (or more) identical contact structures of the type described with respect to FIG. 24A can be formed on the same terminal, to provide two (or more) "redundant" raised bump type electrical contacts on the terminal (2412), each having an enveloping overcoat (2420).

Figure 24B:
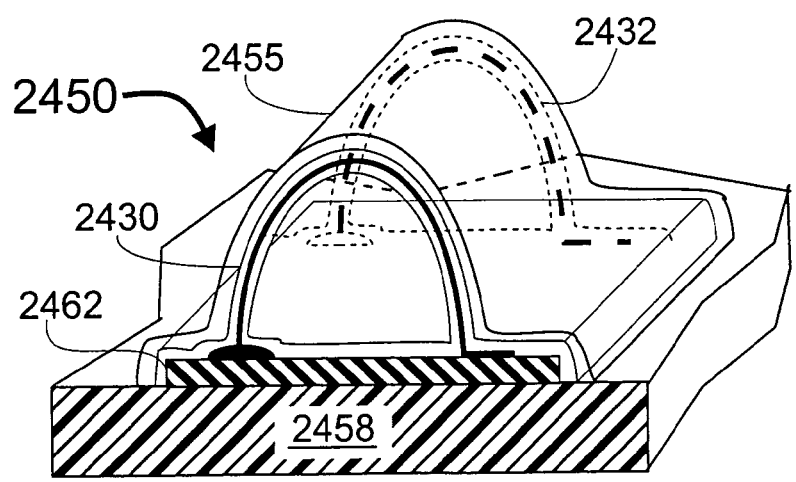
FIG. 24B is a partial perspective view of an embodiment of a solder bump type contact formed on a terminal of a substrate, according to the present invention.

FIG. 24B, which is similar to FIG. 17 of CASE-2, illustrates another contact structure 2450. In this example, two wire stems 2430 and 2432, each formed in the manner of the contact structure 2400 (FIG. 24A). In this case, the wire stems are overcoated with a material that, in the case of gold wires, prevents reaction of the gold with the tin content of solder (described hereinbelow).

The two contact structures 2430 and 2432 are spaced apart on the terminal 2462 (compare 2412) on the substrate 2458 (compare 2408) and may be parallel to one another, as shown. It within the scope of this invention that any number of contact structures, in any orientation with respect to one another, can be mounted to the terminal (2462) on the substrate (2458).

In the illustration of FIG. 24B, the wire stems 2430 and 2432 are overcoated with solder 2455, which is shown as "bridging" (filling in the space between) the two separate contact structures 2430 and 2432 to provide a single, "unitary" solder bump. It should, however, be appreciated that, if desired, the two contact structures 2430 and 2432 can be spaced far enough apart so that the solder 2455 will not bridge between the two (or more) contact structures, resulting in two (or more) solder bump contacts per terminal. However, in most cases it is desirable that the solder fill in the space between the wires and the terminal.

In a preferred embodiment, the solder bump contact will contain more than 70% (seventy percent), by volume, of solder, such as more than 80% solder, the remainder of the bump contact being the wire itself and the (virtually negligible) barrier layer (e.g., of nickel alloy) covering the gold wire.

Thermal Path Embodiments

Heat is inevitably generated during operation of a semiconductor device, and may become destructive of the device if left unabated. Therefore, it is generally well known to provide some sort of heat sink for such devices. Generally, heat sinks take one of two forms. They may be integral with the device package or they may be external to the device package. In either case, heat sinks generally include a thermal mass in intimate heat conductive relationship to the semiconductor device, and may involve air convection or forced air cooling of the thermal mass. Providing an effective thermal path between a die and its heat sink has been the object of prolonged endeavor.

It is an object of the present invention to provide an improved technique for providing an effective thermal path between a heat-generating die and a thermal mass (heat sink).

According to the invention, a thermal interconnect is formed on a terminal of a substrate. Generally, the thermal interconnect serves to conduct heat away from the substrate, which may be a semiconductor die. Generally, it is not required that the terminal upon which the thermal interconnect is formed be an "active" electrical terminal of the semiconductor die, although it within the scope of this invention that it can be. Moreover, the thermal interconnect terminal can be fabricated on the same side of the die as other, "active"

terminals (e.g., bond pads), or can be formed on the opposite side of the die from the bond pads.

Figure 24C:
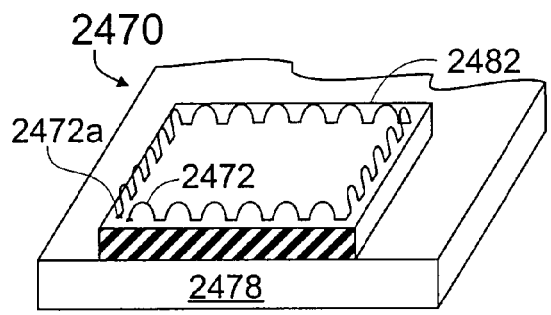
FIGS. 24C-24D are partial perspective views of an embodiment of a thermal interconnect formed on a terminal of a substrate, according to the present invention.

FIG. 24C shows an embodiment 2470 of a technique for forming a thermal interconnect on a substrate 2482. An "oversize" terminal 2682 (i.e., versus electrical connection terminals) is formed on the surface of the substrate 2478. A wire 2472 has its free end 2472a bonded to the terminal, near the periphery thereof. Using techniques described hereinabove, the wire is shaped into a loop and, rather than being severed, is bonded again to the terminal, formed into another loop, bonded again to the terminal, and repeatedly bonded and formed, to create a fence structure of a plurality of loops extending around the periphery of the terminal, as shown. In a final step, the final loop is severed at a position corresponding to the origin (2472a) of the first loop. The plurality of loops forming the fence structure preferably extend to a common (same) height above the terminal.

Figure 24D:
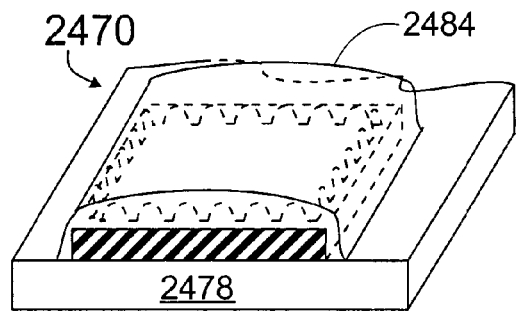

FIG. 24D illustrates that the fence structure of FIG. 24C can be filled with solder 2475 (using any suitable means, such as wave soldering) to provide a freestanding solder contact or a bump which can serve as a heat sink or as a slug which conducts heat from the substrate 2478 to a heat sink (not shown). The solder 2475 preferably encompasses the entire terminal 2482, in the manner of the solder (2455) of FIG. 24B. Generally, the fence outline will conform to the (typically rectangular) outline of the terminal, and the outline of the solder mass will conform to the outline of the fence.

Figure 24E:
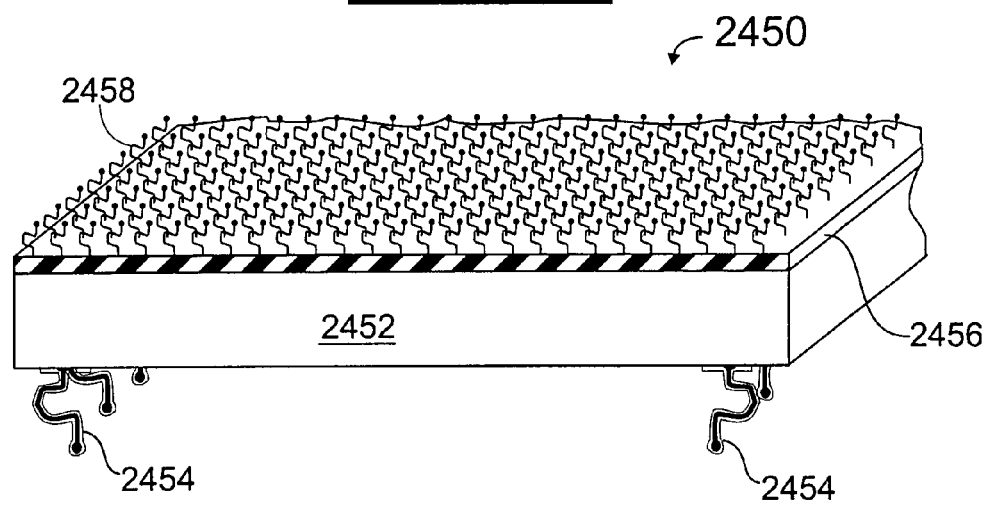
FIG. 24E is a perspective view of another embodiment for providing an electronic component with thermal-dissipation structures, according to the present invention.

FIG. 24E illustrates another embodiment 2450 directed to providing heat dissipation via the back of a semiconductor die.

In this example, a semiconductor die 2452 has a plurality of resilient contact structures 2454 mounted to its front surface. The back of the die is covered with a layer 2456 of conductive material, such as gold. A plurality of heat-dissipating structures 2458 are bonded to the back of the die, to the layer 2456. These heat-dissipating structures are not intended to effect interconnect between the die and another electronic component (although, it is within the scope of this invention that they could, in aggregate, effect a ground connection). Rather, these heat-dissipating structures 2458 are intended to dissipate heat from the die as it operates. The plurality of heat-dissipating structures increase the overall effective surface area of the back of the die (i.e, the aggregate surface areas of the heat-dissipating structures, plus the area of the back of the die), to enhance convective cooling. In the case that the back of the die is urged against a structure capable of heat-sinking (e.g., a housing or the like), a conductive thermal path is also effected by the heat-dissipating structures. Preferably, the heat dissipating structures 2358 are fabricated with a copper wire stem (copper being an excellent thermal conductor), and may be overcoated in the same process step as overcoating the resilient contact structures 2454 (which may have, for example, gold wire stems).

Assemblies of Electronic Components

The subjects of (i) connecting two (or more) electronic components with resilient contact structures mounted to an interposer structure, and (ii) mounting (such as individually, or by gang transfer) a plurality of resilient contact structures to an electronic component, especially to a packaged electronic component have been discussed hereinabove. In the figures that follow, exemplary assemblies of electronic components are described.

FIG. 25, similar to FIG. 25 of CASE-2, illustrates an embodiment 2500 of an assembly of electronic components wherein a first electronic component 2502 is provided with a plurality (two of many shown) of resilient contact structures 2504 and 2506 on a surface 2502a thereof. Another electronic component 2508 is provided with a plurality (two of many shown) of resilient contact structures 2510 and 2512 on a surface 2508a thereof. The surfaces 2502a and 2508a of the two electronic components 2502 and 2508, respectively are spaced apart and facing each other, as shown. The resilient contact structures 2504, 2506, 2510 and 2512 are shown bonded to a bond area (110) in a manner similar to the technique illustrated in FIGS. 1C-1E. It is within the scope of this invention, however, that the resilient contact structures may be bonded (i.e., the wire stems thereof) and overcoated in any of the exemplary manners set forth hereinabove.

A double-sided ("circuitized"—i.e., having conductive traces/pads on its two surfaces) printed circuit board (PCB) 2520 is disposed between the surfaces 2502a and 2508a of the two electronic components 2502 and 2508, respectively, as shown. The top surface 2520a of the PCB 2520 is provided with a plurality (two of many shown) of contact areas 2522 and 2524 which may be terminals, pads or the like, and the bottom surface 2520b of the interposer structure is provided with a plurality (two of many shown) of contact areas 2526 and 2528 which may be terminals, pads or the like. Additional electronic devices (not shown) may be mounted to either side of the printed circuit board.

As shown, the tip of the resilient contact structure 2504 contacts the pad 2522, the tip of the resilient contact structure 2506 contacts the pad 2425, the tip of the resilient contact structure 2510 contacts the pad 2526, and the tip of the resilient contact structure 2512 contacts the pad 2528. In this manner, both electronic components 2502 and 2508 are electrically connected to the PCB 2520.

The PCB has conductive traces (not shown) on both sides 2520a and 2520b thereof. In a known manner, each trace terminates on an edge of the PCB 2520 at an edge-connector terminal (edge-connector pad). Two (of many) of these terminals 2532 and 2534 are shown. The terminal 2532 is shown on the top (as viewed) side 2520a of the PCB 2520 and may be connected via a trace to the terminal 2522 (by way of example), and the terminal 2534 is shown on the bottom (as viewed) side 2520b of the PCB 2520 and may be connected via a trace to the terminal 2526 (by way of example), The electronic components 2502 and 2508 are brought to bear upon the interposer substrate 2520, with suitable clamps or the like (not shown) so that their respective resilient contact structures (2504, 2506, 2510, 2512) contact respective pads (2522, 2534, 2526, 2528) on the PCB 2520. Preferably, the contact pads 2522, 2524, 2526 and 2528 are provided with a solder mass 2540 which can be reflowed, such as by passing the assembly through an oven (furnace), to cause the solder carried by the contact pads to form a solder joint with the distal ends of the respective resilient contact structures 2504, 2506, 2510, and 2512. In the illustration, the solder is shown as having been reflowed. Generally, throughout the embodiments of electronic assemblies discussed herein, a conductive epoxy mass can be used in lieu of solder.

In a final step, the compressed assembly is optionally (as shown) internally encapsulated with a suitable, insulating material 2530, which may be an adhesive material or a polymeric material filled with appropriate particles, such as thermally-conducting particles, in order to enhance the heat-dissipating characteristics of the assembly 2500. Additionally, an appropriate particulate filler can be instrumental in reducing the coefficient of thermal expansion of the polymeric encapsulant.

The compressive force can be removed either after reflow soldering, or after applying the insulating material 2530.

Figure 36A:
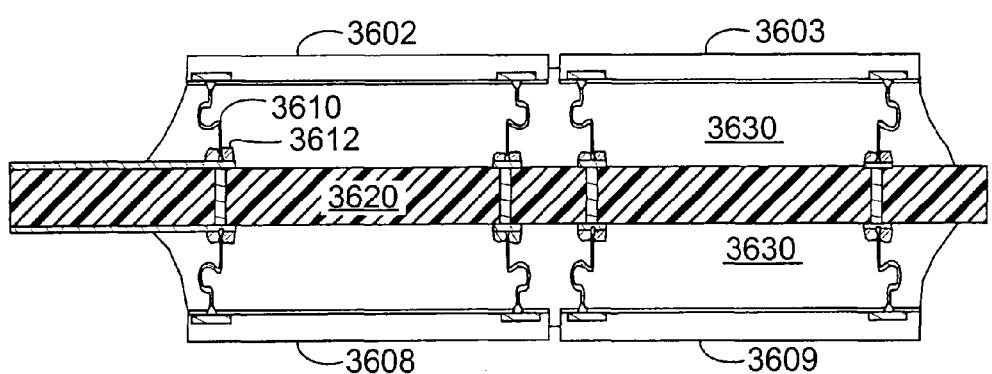
FIG. 36A is a side view of an embodiment of an assembly of a printed circuit board having electronic components mounted thereto with resilient contact structures, according to the present invention.
Figure 36B:
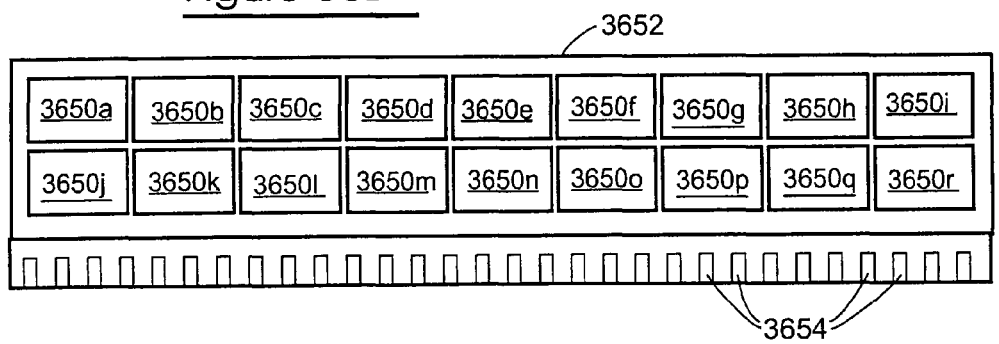
FIG. 36B is a plan view of an electronic assembly, according to the present invention.
Figure 36C:
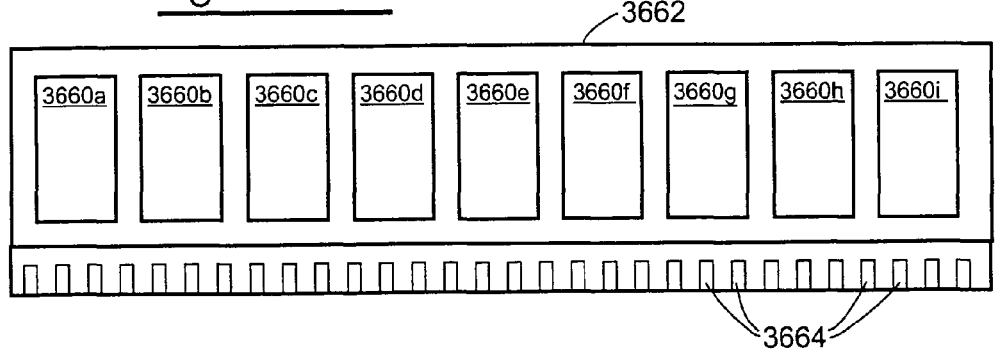
FIG. 36C is a plan view of an electronic assembly, according to the present invention.

This arrangement is suitable, for example, for mounting and electrically connecting a plurality of electronic components (such as bare, unpackaged memory chips) to each side of a printed circuit board. For example, a memory (e.g., RAM) module can be formed by this technique having a large number of memory chips mounted edge-to-edge, on one side or on both sides of a PCB, as illustrated in FIGS. 36A-C. A SIMM (Single In-Line Memory Modules) module (board, card) made in this manner can thus have much more storage capacity than a "standard" SIMM module, using the same chips, but can be manufactured at a lower cost (excluding the cost of the chips) than lower-capacity SIMM modules having packaged chips assembled by soldering to a PCB.

Generally, by fabricating electronic assemblies according to the techniques of the present invention, more semiconductor chips can be mounted in a given PCB area, more effectively utilizing the "real estate" on the PCB. Moreover, since the dies mounted to the PCB are not packaged (e.g., plastic packaging), the overall thickness of the PCB with dies attached thereto will be less than with conventional assemblies of packaged dies.

The assembly of FIG. 25, and subsequently-described assemblies of electronic components (e.g., semiconductor dies) to printed circuit boards may be thought of as a packaging technique, although the semiconductor die is not entirely disposed within a package body, in the traditional sense of "packaging".

An alternative approach to that set forth in FIG. 25 would be where the resilient contact structures (2504, 2506, 2510 and 2512) originate from the board 2520 (rather than from the electronic components 2502 and 2508, as illustrated in FIG. 25), to effect double-sided, flip-chip attachment of two silicon dies (2502, 2508) to an interconnection substrate that has its own resilient contact structures.

In practice, the resilient contact structures may be overcoated (pre-wetted) with a quantity of solder, such as predominantly upon the tips of the resilient contact structures. When the parts are brought together and heated, the solder will reflow to form an "hourglass" joint, with most of the solder distributed at the proximal and distal ends of the resilient contact structures, a minimum amount of solder remaining on the bent (springy) portions of the resilient contact structures. This would be the case, irrespective of whether the resilient contact structures are mounted to the board (e.g., 2520) or to the electronic components (e.g., 2503, 2508) themselves. Alternatively, small amounts of solder paste can be applied to the pads (e.g., 2522), to secure the tips of the contact structures thereto (with re-flow heating).

An important aspect of this, and other electronic assemblies described herein, is that compliant (including purely resilient) contact structures (e.g., 2504) can be mounted directly to silicon devices (e.g., 2502), without damaging the devices. Such contacts are extremely well suited to validating (testing, burning-in) the electronic components, prior to their final packaging. Moreover, such compliant contact structures can accommodate differences in thermal expansion rates between the electronic component (e.g., 2502) and the component (e.g., 2520) to which it is mounted, thereby increasing the reliability of the interconnects made thereby (refer, e.g., to description of FIG. 44).

It would appear, from an examination of the prior art, that limited efforts have been made, in the past, to put contact structures (other than solder bump type contacts) directly on silicon. For example, in the aforementioned U.S. Pat. No. 4,955,523 ("Raychem"), wires (7) are bonded to contacts (3) on an electronic component (1) such as an integrated circuit chip. The wires are severed to be of substantially the same length as one another. An insulating material (17) is applied as a layer to the surface of the component so as to encapsulate the bonds between the wires and the contacts. The insulating material is described in the Raychem patent as being a relatively inflexible polymer, such as one that is partially crystallized. The need for such a layer would, presumably, be to aid in anchoring the wires to the contacts, likely augmenting the integrity of the bond. In contrast thereto, as mentioned previously, according to the techniques of the present invention, the overcoat material firmly secures the wire stem to the terminal, imparts the desired resiliency/compliance to the resulting contact structure, and (in most embodiments) is of a conductive, metallic material. The anchoring function of the overcoat is particularly poignant in the context of a resilient (or compliant) contact structure reacting compressive forces. As mentioned hereinbelow, in most of the embodiments described herein, the wire stem, per se, becomes essentially superfluous, once it has been overcoated. The same could clearly not be said of the technique of the Raychem patent, irrespective of any similarities it may exhibit to the present invention.

A subtle advantage to embodiments such as are shown in FIG. 25, and the like, are that an "inventory" of "cards" (a "card", in this context, comprising electronic components (3.g., 2502) pre-assembled to substrates (e.g., 2520)) can be prefabricated (and pre-tested), later to be joined in more complex assemblies (such as shown in FIG. 37, hereinbelow).

In FIGS. 25-32, assemblies of electronic components (e.g., 2502) having spring (resilient or compliant) contacts mounted thereto are shown interconnecting to an interconnect board (e.g., 2520). It is within the scope of this invention that the contacts could be "reversed", to originate from the interconnect board—in which case, the interconnect board would be an interposer (of sorts). However, this would not be preferred (i.e., to use the interconnect board as an interposer, with contacts mounted thereto), and more effective interposer arrangements have been described hereinabove (see, e.g., FIGS. 17A-22F). In embodiments of electronic assemblies illustrated in FIGS. 25-32, it is generally preferred that the electronic components (e.g., 2502) would be soldered to the interconnect board (e.g., 2520) by applying solder paste to contact pads (e.g., 2522) on the interconnect board (e.g., 2520) and reflowing the solder paste once the assembly is assembled.

Figure 26:
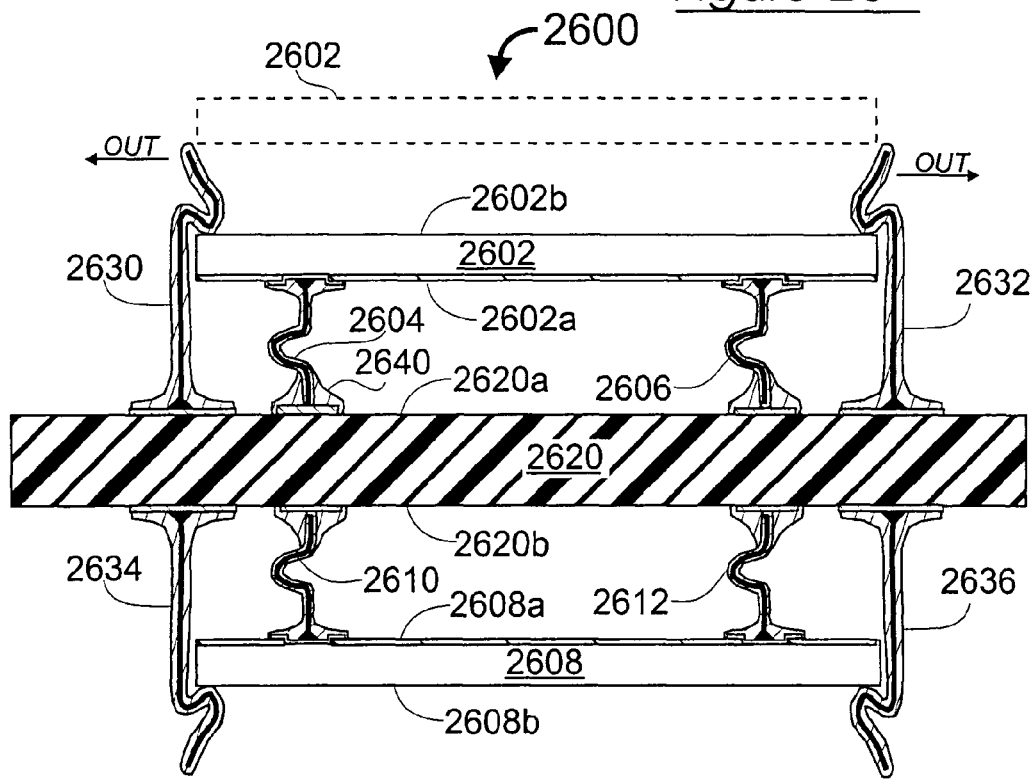
FIG. 26 is a side view of an embodiment of an assembly of a double-sided printed circuit board having electronic components mounted with resilient contact structures to both sides thereof, according to the present invention.

FIG. 26, similar to FIG. 26 of CASE-2, illustrates another embodiment 2600 of an assembly of electronic components 2602 and 2608 having resilient contact structures 2604, 2606, 2610 and 2610 extending from surfaces 2602a and 2608a thereof, in an exemplary manner that is similar to the assembly 2500 of FIG. 25. Whereas, in the previous embodiment 2500, an compressive force ("F") was used to yieldably urge the electronic components (2502 and 2508) against the PCB (2520), and the electronic components (2502 and 2508) were held in place either by the solder itself (2540) or by the insulating material (2530), in this embodiment, the electronic components 2602 and 2608 are held in place against the PCB 2620 by means of specially-formed wire stems 2630, 2632, 2634 and 2636, acting as spring clips (retaining springs), which are disposed on (mounted to) the surfaces 2620a and 2620b of the PCB 2620. Four such spring clips 2630, 2632, 2634 and 2636 are shown. All four of these specially-formed wire stems (spring clips) 2630, 2632, 2634, and 2636 are overcoated to be resilient, suitably in the manner of a resilient contact structure intended for making electrical connections, but need not be electrically conductive.

Generally, the spring clips would be disposed at a plurality of locations on the PCB so that they will cooperate with one another to secure the respective electronic components to the PCB. For example, for securing a rectangular electronic component to the PCB, four spring clips may be used, engaging opposite side edges of the electronic component in pairs. For illustrative clarity, only two spring clips are shown, per electronic component.

As illustrated, a representative one 2630 of the spring clips is fashioned into a shape so as to cause the resilient contact structures of the electronic component 2602 to remain compressed (urged) against the interposer structure 2620. More particularly, the spring clip 2630 extends generally straight upward from the top (as viewed) surface 2620*a* of the PCB 2620, and is bent inward (towards the spring clip 2632), and is further bent outward (away from the spring clip 2632) to allow the electronic component to be "inserted" between the tips of the spring clips 2630 and 2632. The spring clip 2632 is the "mirror image" of the wire stem 2630. In this manner, the electronic component 2602 can be inserted between the tips of the spring clips 2630 and 2632, as indicated by an initial position of the electronic component 2602 shown in dashed lines, and urged (by means, not shown) towards the interposer structure 2620, deflecting the tips of the spring clips 2630 and 2632 outward (away from one another, as indicated by the arrows labelled "OUT"), until the electronic component 2603 reaches a final position (shown in solid lines), whereupon the bent portions of the tips of the spring clips 2630 and 2632 "snap" back towards each other and engage the back surface 2602*b* of the electronic component 2602. Preferably, the wire stems 2604 and 2606 commence contacting the respective pads on the PCB 2620 (and, hence, commence compressing) after the electronic component 2602 has commenced spreading the tips of the spring clips 2630 and 2632. Evidently, it is intended that when the electronic component is "snapped" into place (as indicated by the solid lines), the wire stems 2604 and 2606 will be compressed. The spring clips 2634 and 2636 may be fashioned to operate in the same manner as the wire stems 2630 and 2632. If the electronic component 2608 is identical to the electronic component 2602, and their respective resilient contact structures (2604, 2606, 2610, 2612) stems are identical, the spring clips 2634 and 2636 are preferably identical to the spring clips 2630 and 2632. The spring clips 2630, 2632, 2634 and 2636 are primarily intended to hold the electronic components 2602 and 2608 in place against the PCB 2620 and, as such, any electrical connection which may be effected between these spring clips (i.e., the bent portions thereof) and the back faces 2602*b* and 2608*b* of the electronic components 2602 and 2608 is somewhat incidental, although a connection to the back side of an electronic component can be useful as establishing the "body" of the electronic component at ground (or any other selected) electrical potential.

In this embodiment 2600, edge connectors (compare 2352 and 2534 of FIG. 25), if any, are omitted, for illustrative clarity. As in the previous embodiment 2500, the PCB contact pads can be pre-coated with solder 2640, prior to insertion onto the PCB, and the assembly passed through a furnace to reflow the solder, to effect a solder connection between the distal ends of the resilient contact structures and the PCB contact pads. It will be understood that the amount of solder disposed on the PCB contact pads is controlled to be sufficient to secure the distal ends of the resilient contact structures, and not so much that the solder would impair the resiliency of the resilient contact structures (which would be likely to occur if the solder flowed onto the bend portion of the resilient contact structures).

It is within the scope of this invention, vis-a-vis the assembly 2600 of FIG. 26, or any of the other assembly embodiments disclosed herein involving spring clips or the like, that the electronic components are not soldered to the PCB. This would facilitate removing an electronic component, such as for replacement or upgrading thereof, simply by urging the ends of the spring clips outward (see arrows labelled "OUT"), by hand, to release the electronic component from engagement with the PCB.

It is also within the scope of this invention that the resilient contact structures (2604, 2606, 2610, 2612) originate on the board (2620), in which case electronic components (2602, 2608), such as semiconductor devices, having compatible contact pads (solderable metallization) on their surfaces could simply be "snapped" into place, with their contact pads contacting the tips of the resilient contact structures.

Evidently, when spring clips (e.g., 2630, 2632, 2634, 2636) are employed, solder (2640) or the like (e.g., conductive epoxy) is not essential, but rather is optional. This is true of other embodiments where a "retaining means" is employed, such as in the embodiment 2700 of FIG. 27, described immediately hereinbelow.

Figure 27:
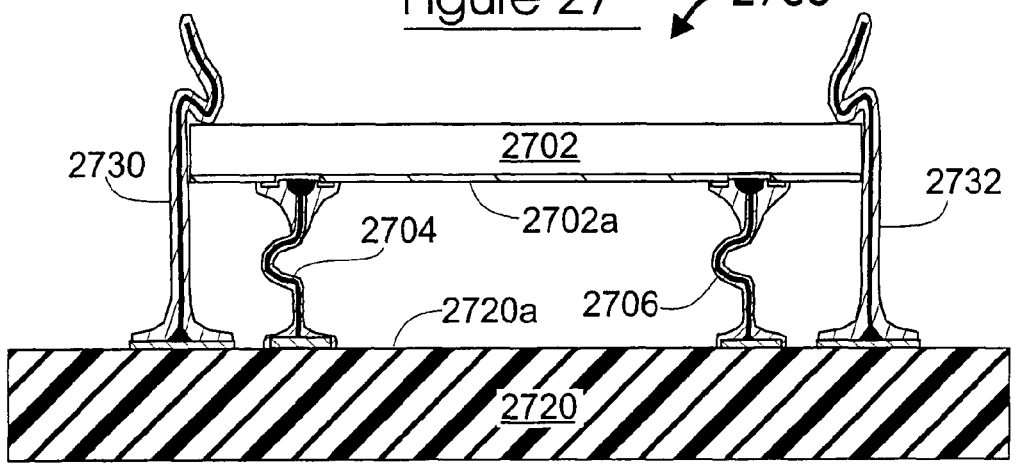
FIG. 27 is a side view of an embodiment of an assembly a printed circuit board having an electronic component mounted thereto with resilient contact structures, according to the present invention.

FIG. 27, similar to FIG. 27 of CASE-2, illustrates an embodiment 2700 of mounting and electrically connecting electronic components 2702 (one of many shown) to only one side 2720*a* of a printed circuit board 2720, and is essentially "one half" (i.e., the top, as viewed) of the arrangement 2600 of FIG. 26.

As in the previous embodiment (2600), in this embodiment 2700, resilient contact structures 2704 and 2706 are mounted in any suitable manner (e.g., soldering, brazing) to the front surface 2702*a* of the electronic component 2702. Again, it should be understood that the arrangement could be reversed, so that the contacts are mounted to (extend from) the board 2720.

It is within the scope of this invention that in any of the assemblies where the electronic component (e.g., 2702) is maintained in compression against the interconnect board (e.g., 2720), soldering (or the like, such as epoxying) is generally optional. The compression may be sufficient to effect a reliable electrical interconnect, and replacing the electronic component (e.g., for upgrade or for repair) would certainly be simplified somewhat by relying solely on compression. (For example, spread out the clips 2730 and 2732, remove the component 2702, and replace with another, similar component.)

As in the previous embodiment (2600), in this embodiment 2700, the electronic component 2702 is mechanically mounted to the PCB 2720 by means of spring clips 2730 and 2732 mounted to the top (as viewed) surface 2720*a* of the PCB 2720.

In this figure, no solder (compare 2540, 2640) is shown. This illustrates that the electronic component 2702 is advertently assembled to the PCB 2720 so as to be removable (by deflecting the spring clips).

It is within the scope of this invention that any external spring element, clamp, or the like, could be employed in lieu of the exemplary, illustrated spring clips (2730, 2732).

Although FIGS. 25, 26 and 27 all refer to a "printed circuit board" (2520, 2620 and 2720), it should be understood that the printed circuit board element can be any suitable substrate upon which terminals can be formed, to which resilient contact structures mounted to electronic components can be electrically connected.

As was the case with the embodiment 2600 of FIG. 26, it is within the scope of this invention that the resilient contact structures (2704, 2706) originate on the board (2720), in which case an electronic components (2702) having compatible contact pads on its surface could simply be "snapped"

into place, with the contact pads of the electronic component contacting the tips of the resilient contact structures of the board.

Generally, the embodiments of FIGS. 25-30 all contemplate mounting the resilient contact structures to the electronic components, rather than to the PCB, although the latter is an alternative.

Figure 28:
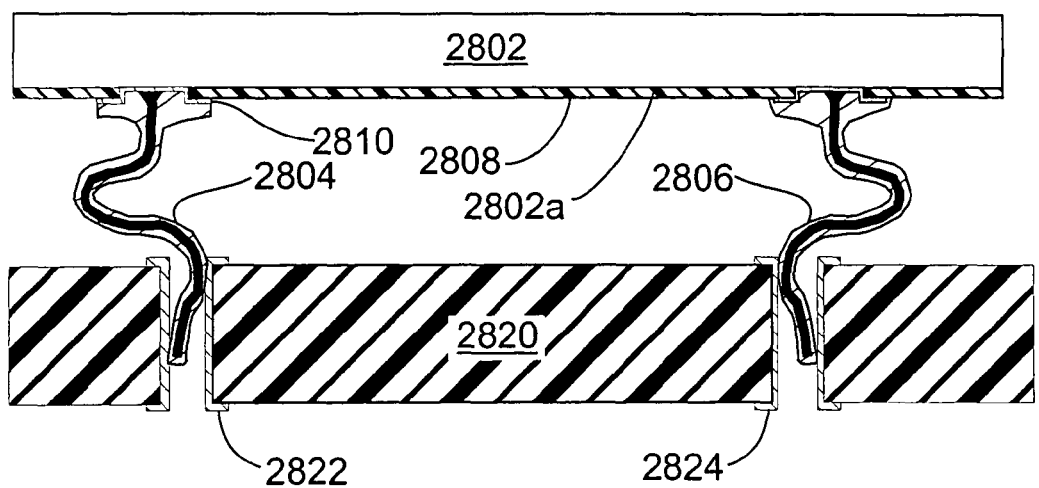
FIG. 28 is a side view of an embodiment of an assembly of a printed circuit board having an electronic component mounted thereto with resilient contact structures, according to the present invention.

FIG. 28, similar to FIG. 28 of CASE-2, illustrates an embodiment 2800 of an assembly of an electronic component 2802 (such as a semiconductor die) to a PCB 2820 which, as in the embodiment 2700 of FIG. 27 is intended to facilitate removal of the electronic component 2802.

The electronic component 2802 has a plurality (two of many shown) of resilient contact structures 2804 and 2806 mounted to and protruding from a surface thereof, in any suitable manner hereinbefore described. In this case, resilient contact structures 2804 and 2806 are configured to have a shape that permits the resilient contact structures 2804 and 2806 to be inserted snugly within corresponding plated through holes 2822 and 2824 in the printed circuit board 2820. An advantage of this arrangement is that the electronic component 2802 is readily demounted (disconnected) from the printed circuit board 2820 and replaced (e.g., to replace a defective component, or to upgrade a component). Conductive traces on one or more (i.e., both) surfaces of the printed circuit board 2820 are omitted, for illustrative clarity.

More particularly, the distal end regions of the resilient contact structures 2804 and 2806 are shaped to have a bend that extends laterally (across the page, as viewed) a distance "d" which is slightly, such as 0.0003 to 0.0015 inches greater than the inside diameter "D" of the through holes 2822 and 2824. This ensures that the ends of the resilient contact structures will fit snugly (resiliently, with a slight interference fit) within the plated through holes. This assembly 2800 could, of course, be soldered, but soldering would attenuate the ease with which the electronic component (2802) could be demounted from the PCB (2820).

As mentioned hereinabove, there is a preferred technique for mounting resilient contact structures to semiconductor components, according to the present invention. FIGS. 25-29, as well as subsequent embodiments of assemblies set forth herein illustrates the technique set forth in FIGS. 1C-1E, wherein the resilient contact structures 2804 and 2806 (compare 130) are anchored to conductive pad 2810 (compare 132) penetrating a passivation layer 2808 (compare 124).

The embodiment of FIG. 28 is elegant in its "simplicity". Electrical contact structures (2804, 2806) are readily mounted to a silicon electronic component (2802), which can then be "plugged into" conventional plated through holes of a printed circuit board (2820). In this manner, the "springs" (i.e., contact structures) on the electronic component are spring-loaded against the walls (plated bores) of the through holes. The electronic component can optionally soldered in place (such as by applying a quantity (dab) of solder paste in the through holes and heating the assembly to re-flow the solder paste.

Figure 29:
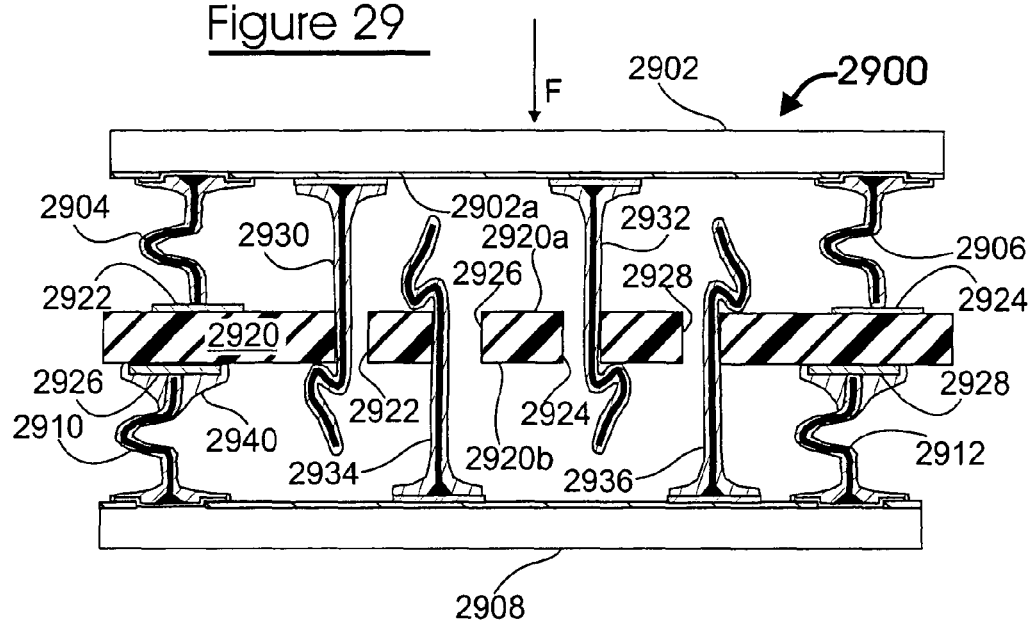
FIG. 29 is a side view of an embodiment of an assembly of a printed circuit board having electronic components mounted thereto with resilient contact structures, according to the present invention.

FIG. 29, similar to FIG. 29 of CASE-2, shows another embodiment 2900 of an assembly of two electronic components 2902 and 2908 to a printed circuit board (PCB) 2920, in a manner similar to the embodiment 2600 of FIG. 26. In this case, the spring clips 2930, 2932, 2934, and 2936 are mounted on the electronic components 2902 and 2908 themselves, rather than to the PCB 2920, and function in a similar manner to effect mechanical coupling of the components 2902 and 2908 to the PCB 2920. Two spring clips ("latching springs") 2930 and 2932 are illustrated extending from the front surface 2902a of the electronic component 2902. Two spring clips ("latching springs") 2934 and 2936 are illustrated extending from the front surface 2908a of the electronic component 2908.

As illustrated, a representative one 2630 of the spring clips, is fashioned into a shape so as to cause the resilient contact structures of the electronic component 2602 to remain compressed against the interposer structure 2620. More particularly, the spring clip 2630 extends generally straight upward from the front surface 2902a of the electronic component 2902, and is bent outward (away from the spring clip 2932), then is bent back inward (towards the spring clip 2932). The bends in the distal portion of the spring clip 2930 are sized, shaped and located to fit within a corresponding through hole 2922 extending through the PCB 2920. The spring clip 2932 is sized and shaped in the manner of the spring clip 2930, and is positioned to extend fit within a corresponding through hole 2924 extending through the PCB 2920. These through holes 2922 and 2924 are illustrated as not being plated. However, it is within the scope of this invention that they could be plated through holes and, if they were plated, an electrical connection could be effected by the spring clips 2930 and 2932 between the electronic component 2902 and the PCB 2920 (in a manner similar to the embodiment 2800 of FIG. 28). When the electronic component 2902 is urged against the PCB 2920, as indicated by the arrow "F", the spring clips 2930 and 2932 enter the holes 2922 and 2924, deflect, and spring back so that they "catch" the opposite side 2920b of the PCB 2920. This mechanically secures the electronic component 2902 to the PCB 2920, with the resilient contact structures 2904 and 2906 compressed against corresponding pads 2922 and 2924 on the surface 2920a of the PCB 2920. To remove the component 2902, the distal tips of the spring clips 2930 and 2932 would need to be manipulated so that they could be withdrawn through the through holes 2922 and 2924. The spring clips 2934 and 2936 operate in the same manner as the spring clips 2930 and 2932, by fitting through respective through holes 2926 and 2928 in the PCB 2920 to secure the electronic component 2908 to the PCB 2920.

Generally, to effect a demountable interconnection between the electronic components and the PCB, the resilient contact structures would not be soldered to the PCB. It is, however, within the scope of this invention that the resilient contact structures could be soldered to the PCB in the manner, for example, described with respect to the embodiment 2500 of FIG. 25.

In the case where solder is not employed, and an electrical connection between the components (2902, 2908) and the board (2920) relies solely on mechanical contact, the resilient contact structures can be overcoated to have microprotrusions (as described hereinabove), topological tips (as described hereinabove with respect to the probe embodiments). In either case, the electronic component (2902, 2908) would simply be "clicked" in place on the board (2920) and retained therein by the latching springs (2930, 2932, 2934, 2936).

In a manner similar to the embodiment 2700 of FIG. 27 being essentially "half" of the embodiment 2600 of FIG. 26, the embodiment 2900 of FIG. 29 could be "halved" to facilitate the mounting of one electronic component (e.g., 2902) to the board (2920), such as to effect a similar "pressure contact" (if no solder is used) interconnect.

Generally, in the embodiments of electronic assemblies disclosed herein having means (e.g., spring clips) for compressing the electronic components against the PCB, soldering the distal ends of the resilient contact structures is optional, and contact structures with attenuated resiliency (e.g., straight pin-like structures) could be utilized in cases where solder is employed. However, as will be discussed in greater detail hereinbelow (see, e.g., FIG. 44), shaped contact structures are preferred, as they facilitate accommodating the effects of thermal expansion, and the like.

Figure 30:
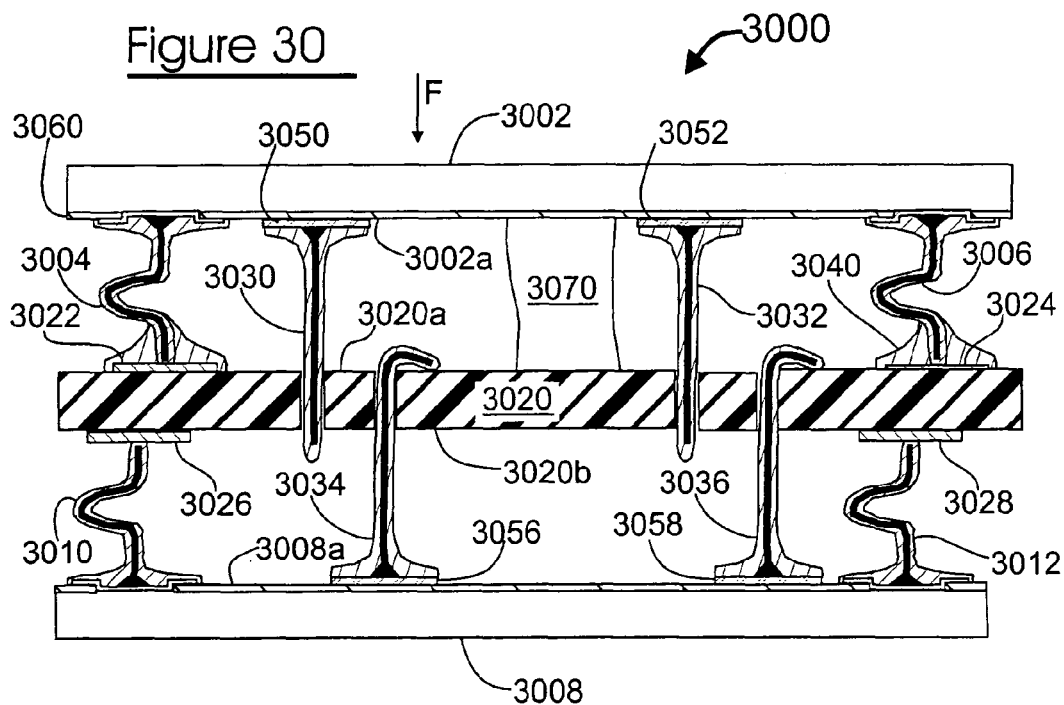
FIG. 30 is a side view of an embodiment of an assembly of a printed circuit board having electronic components mounted thereto with resilient contact structures, according to the present invention.

FIG. 30, similar to FIG. 30 of CASE-2, illustrates another embodiment 3000 of mounting two electronic components 3002 and 3008 to a printed circuit board (PCB) 3020. In the manner described hereinabove (for example, with respect to the embodiment 2500 of FIG. 25) resilient contact structures 3004 and 3006 extend from the front 3002a of the electronic component 3002 and contact corresponding pads 3022 and 3024 on a surface 3020a of the PCB 3020, and resilient contact structures 3010 and 3012 extend from the front 3008a of the electronic component 3008 and contact corresponding pads 3026 and 3028 on a surface 3020b of the PCB 3020. Both electronic components 3002 and 3008 are urged against the PCB 3020, as indicated by the arrows labelled "F", and this figure illustrates two techniques of securing the electronic components 3002 and 3008 to the PCB 3020.

The component 3002 is provided with straight alignment pins 3030 and 3032, which may be formed in the manner described hereinabove with respect to FIG. 2E. These alignment pins 3030 and 3032 need not be resilient, nor need they be conductive, but they are easily mounted to the component 3002, shaped (straight) and overcoated in the same process steps that are employed for forming the resilient contact structures 3004 and 3006 extending from the front surface 3002a of the component 3002. The pins 3030 and 3032 are sized and located to fit through respective through holes (compare 2922 and 2924) extending through the PCB 3020. These pins 3030 and 3032 simply align the component 3002 with respect to the PCB 3020, to ensure proper alignment of the distal ends of the resilient contact structures 3004 and 3006 with respective pads 3022 and 3024 on the surface 3020a of the PCB 3020. The component 3022 is compressed, as indicated by the arrow "F" against the PCB 3020, and is secured thereto with a suitable adhesive 3070 (shown in partial section; compare 2530 of FIG. 25).

The component 3008 is provided with initially-straight alignment pins 3034 and 3036, which may be formed in the manner described hereinabove with respect to FIG. 2E. These alignment pins 3034 and 3036 need not be resilient, nor need they be conductive, but they are easily mounted to the component 3008, shaped (straight) and overcoated in the same process steps that are employed for forming the resilient contact structures 3010 and 3012 extending from the front surface 3008a of the component 3008. The pins 3034 and 3038 are sized and located to fit through respective through holes (compare 2926 and 2928) extending through the PCB 3020. These pins 3034 and 3036 initially align the component 3008 with respect to the PCB 3020, to ensure proper alignment of the distal ends of the resilient contact structures 3010 and 3012 with respective pads 3026 and 3028 on the surface 3020b of the PCB 3020. Once the component 3028 is compressed against the PCB 3020 it is secured thereto by bending the distal ends of the pins 3034 and 3036, as shown, to bear against the surface 3020a of the PCB 3020. This "locks" the component 3008 in place vis-a-vis the board 3020.

In this embodiment, it will be noted that the pins 3030, 3032 and the pins 3034, 3036 are bonded (at their proximal ends) to conductive pads 3050, 3052, 3054 and 3056, respectively, on the surfaces 3002a and 3008a of the electronic components 3002 and 3008, and that these pads (i.e., 3050 and 3052) overlie a passivation layer 3060 (compare 2808 of FIG. 28). These pads 3050 and 3052 are suitably formed of the material and in the same step as forming the bond pads to which the wire stems of the resilient contact structures 3004 and 3006 are bonded (compare metallic layer 126 and photoresist 128 of FIGS. 1C-1E).

In this example, it is shown that the resilient contact structures 3004 and 3006 are soldered (with solder 3040) to respective pads 3022 and 3024 on the PCB 3020 in the manner, for example, of the embodiment 2500 of FIG. 25. As mentioned hereinabove, conductive epoxy can be used in lieu of solder. It is also shown that the resilient contact structures 3010 and 3012 are not soldered, but are held in intimate contact with the respective pads 3026 and 3028 on the PCB 3020 by the bent-over alignment pins 3034 and 3036.

Although it has been illustrated that the two components 302 and 3008 are secured to the PCB in two different manners, this is merely illustrative. Both components can be secured to the PCB in the same manner (e.g., both with alignment pins and an adhesive, both with soldering, etc.).

In practice, the lower (as viewed) electronic component (3008) would be put in place first, its pins (3034, 3036) bent over, then the upper electronic component (3002) would be mounted to the board. As in embodiments discussed hereinabove, it is optional that solder be used to effect an electrical connection between the components (notably, the component 3008 having bent alignment pins) and the board (3020), and the user may prefer to rely on tips of the resilient contact structures aggressively contacting the pads on the board for electrical connection (and easier demounting of the electronic component). It would generally be preferred, however, that dollops of solder paste (omitted from the figure, for illustrative clarity, and to illustrate that said solder/epoxy is optional) would be applied to the pads 3026 and 3028, in the assembly process, and re-flowed along with dollops of solder paste on the pads 3022 and 3024. Generally, the bending over of the pins 3034 and 3036 is intended to keep the component 3008 from falling off of the board 3020 during subsequent process steps (e.g., mounting the other component 3002 and re-flowing the assembly). In the prior art, techniques such as gluing (the lower component 3008 to the board 3020) have been employed.

The use of an adhesive (e.g., 2530, 3070) has been discussed, which will serve, typically in the absence of locking structures (e.g., 3034, 3036), to secure the electronic component (e.g., 2502, 3002) to the board (e.g., 2520, 3020). Preferably, the adhesive is of the type that will exhibit shrinkage upon curing.

It is within the scope of this invention that two components (e.g., 3002, 3008) are both provided with alignment pins and secured to the board (3020) without bending any of the pins. In such a case, an adhesive between each of the components and the board is preferred, and this arrangement would "look like" the top half of FIG. 30, mirrored (same both sides).

Assemblies Including Electronic Devices

FIGS. 25-30 describe how an electronic component (e.g., 2502a) can be secured to one side (e.g., 2520a) of a printed circuit board type substrate (e.g., 2520), and how another electronic component (e.g., 2508) can be secured to an other (e.g., 2520b) side of a printed circuit board type substrate (2520).

Figure 31:
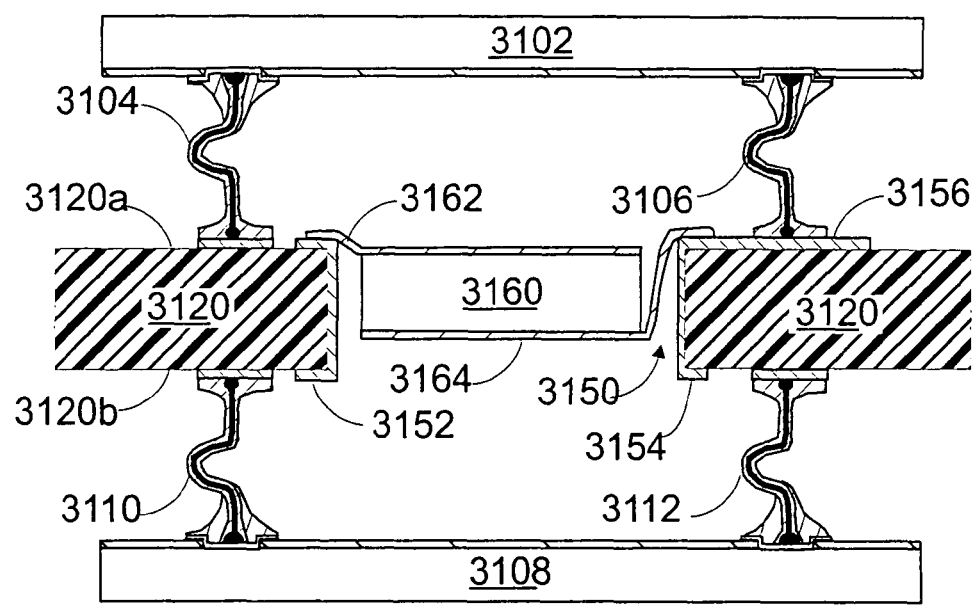
FIG. 31 is a side view of an embodiment of an assembly of a printed circuit board having electronic components mounted thereto with resilient contact structures, and incorporating another electronic device, according to the present invention.
Figure 32:
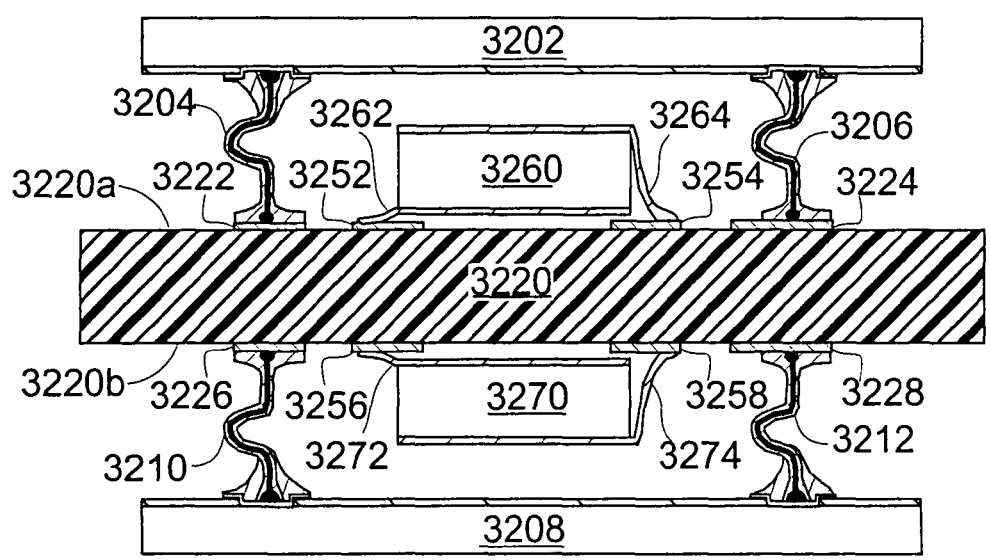
FIG. 32 is a side view of an embodiment of an assembly of a printed circuit board having electronic components mounted thereto with resilient contact structures, and incorporating another electronic device, according to the present invention.

FIGS. 31 and 32, described hereinbelow, similar to FIGS. 31 and 32 of CASE-2, illustrate how electronic devices such as decoupling capacitors (or resistors, or any other type of electronic component) can be incorporated into the assembly of electronic components to circuit boards.

The use of decoupling capacitors in assemblies of electronic components is generally well known, as being advantageous to the performance of semiconductor devices in the assemblies. As a general proposition, the closer a decoupling capacitor is to the semiconductor device, the greater its effect will be. Traditional packaging techniques, generally, are inherently not amenable to achieving this goal.

FIG. 31 illustrates an embodiment 3100 of two electronic components 3102 and 3108 mounted to the two sides 3120a and 3120b, respectively, of a printed circuit board 3120.

A large opening (aperture) 3150 is provided through the PCB 3120 at a location which is preferably underneath the electronic components (3102, 3108). The aperture 3150 has a depth dimension, commensurate with the thickness (vertical dimension, as viewed in the figure) of the PCB 3120, and has an area (into the page, as viewed) which may be circular or rectangular (or any other shape). For purposes of this discussion, it is assumed that the opening 3150 is circular, and has a diameter.

The opening 3150 is provided with plating material in a manner somewhat akin to that of making plated through holes. In this exemplary illustration, a first plating 3152 is disposed on the left (as viewed) side of the opening 3150, and extends only partially (less than 180° around the circumference of the hole 3150. A second plating 3154 (which may, of course, be fabricated in the same process step as the first plating 3152) is disposed on the right (as viewed) side of the hole 3150, and extends only partially (less than)180° around the circumference of the hole 3150. The plating 3154 is illustrated as being connected to a trace 3156 on the top side 3120a of the PCB.

Resilient contact structures 3104 and 3106 are mounted to the face (lower surface, as viewed) of the electronic component 3102, and resilient contact structures 3110 and 3112 are mounted to the face (upper surface, as viewed) of the electronic component 3108, in the manner set forth hereinabove.

An advantage of the electronic assembly of this embodiment is the extremely short path that can be implemented between an electronic device (3160) and the electronic components (3102, 3108). For example, the resilient contact structure 3106 would, evidently, be associated with one of the power (i.e., power or ground; or $V_{SS}$ or $V_{DD}$) "pin outs" of the electronic component 3102.

An electronic device 3160, which in this case is a capacitor, is disposed in the hole 3150, and has two leads (which may be tabs or plates) 3162 and 3164 extending therefrom. As illustrated a one lead 3162 is connected to the plating 3152, and another of the leads 3154 is connected to the plating 3154. (The platings 3152 and 3154 are not "shorted" to one another.) Although not expressly shown in this figure, the plating 3152 would be associated with (connected to) a trace which terminates in a pad, to which one of the resilient contact structures (not shown) of the electronic component 3102 is pressed against.

It has generally known to place components such as capacitors (such as 3160) underneath of other components such as packaged semiconductor devices (such as 3102, except that 3102 is not packaged)—for example, by putting the components (3160) into pockets (recesses) in a circuit board (e.g., 3120). The embodiment 3100 described is principally directed to the advantages of resilient contact structures, and the combination of same with the ability to place components (3160) close to other components (3012), without "wasting" valuable real estate on the printed circuit board (3120).

FIG. 32 illustrates another embodiment 3200 of two electronic components 3202 and 3208 mounted to the two sides 3220a and 3220b, respectively, of a printed circuit board 3220.

Resilient contact structures 3204 and 3206 are mounted to the face (lower surface, as viewed) of the electronic component 3202, and resilient contact structures 3210 and 3212 are mounted to the face (upper surface, as viewed) of the electronic component 3208.

In this example, the upper 3220a and lower 3220b surfaces of the PCB 3220 are provided with conductive pads 3252, 3254, 3256 and 3258 which are connected (not shown), to selected ones of the plurality of conductive pads 3222, 3224, 3226 and 3228, in any known manner, such as by wiring traces.

A first electronic device 3260, such as a capacitor, having two leads 3262 and 3264 is mounted to the top surface 3220a of the PCB 3220, and the leads 3262 and 3264 are connected, respectively, to conductive pads 3252 and 3254.

A second electronic device 3270, such as a capacitor, having two leads 3272 and 3274 is mounted to the bottom surface 3220b of the PCB 3220, and the leads 3272 and 3274 are connected, respectively, to conductive pads 3256 and 3258.

As mentioned hereinabove, with respect to the embodiment 3100 of FIG. 31, the general concept of placing components underneath components is not entirely new. However, as well illustrated by this embodiment 3200, a distinct advantage accrues to the ability to fabricate extremely tall (long) contact structures which, unlike solder bumps or the like, allow components (e.g., 3260) to be placed underneath of other components (e.g., 3202) without providing recesses or the like in the printed circuit board (3220).

It is within the scope of this invention that in any of the assemblies wherein resilient contact structures are mounted to the electronic components, alternate embodiments are readily visualized, wherein the resilient contact structures would be mounted to the PCB and contact selected contact areas (e.g., bond pads) on the electronic components although, with respect to electronic components that are semiconductor devices, it is generally preferred that the resilient contact structures would be mounted directly to the semiconductor devices. Moreover, PCBs (interconnect substrates) with resilient contact structures mounted thereto are generally classified (herein) as interposers.

Generally, mounting resilient (or compliant) contact structures to semiconductor devices, is sometimes referred to herein as "springs on silicon".

Carrier Assemblies

Figure 33:
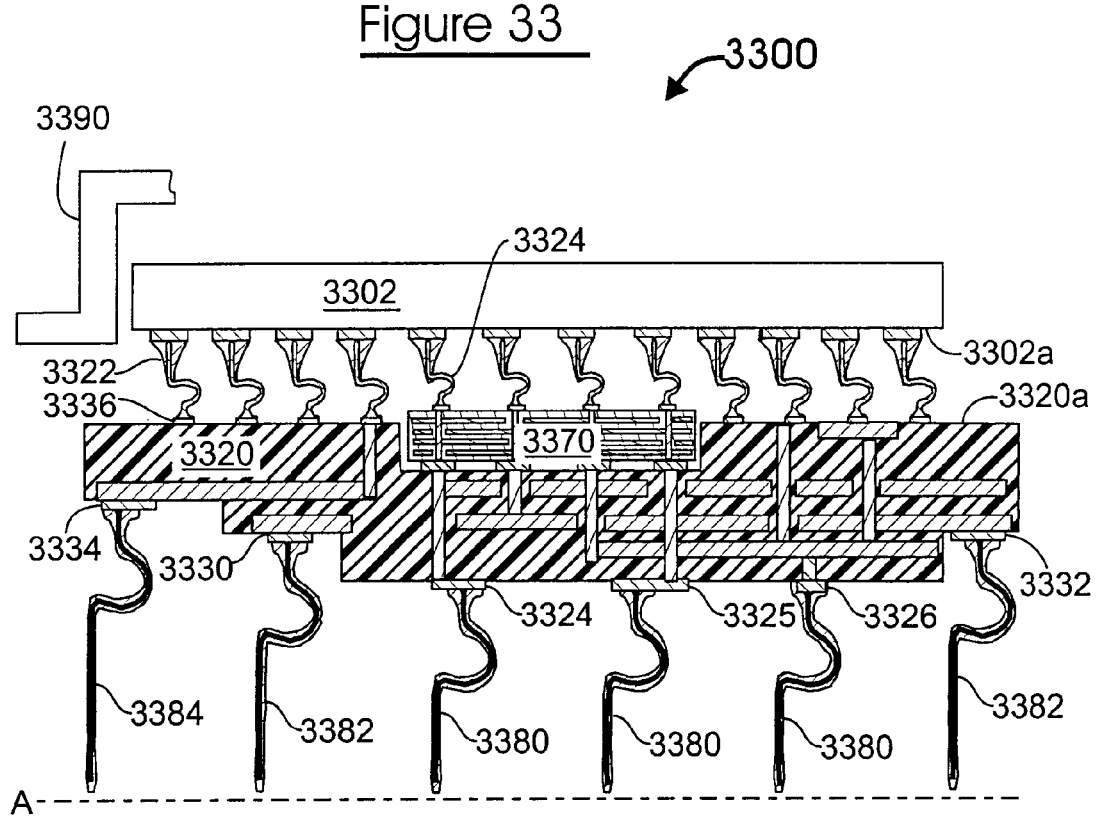
FIG. 33 is a side view of an embodiment of a packaging scheme for electronic components, according to the present invention.
Figure 34:
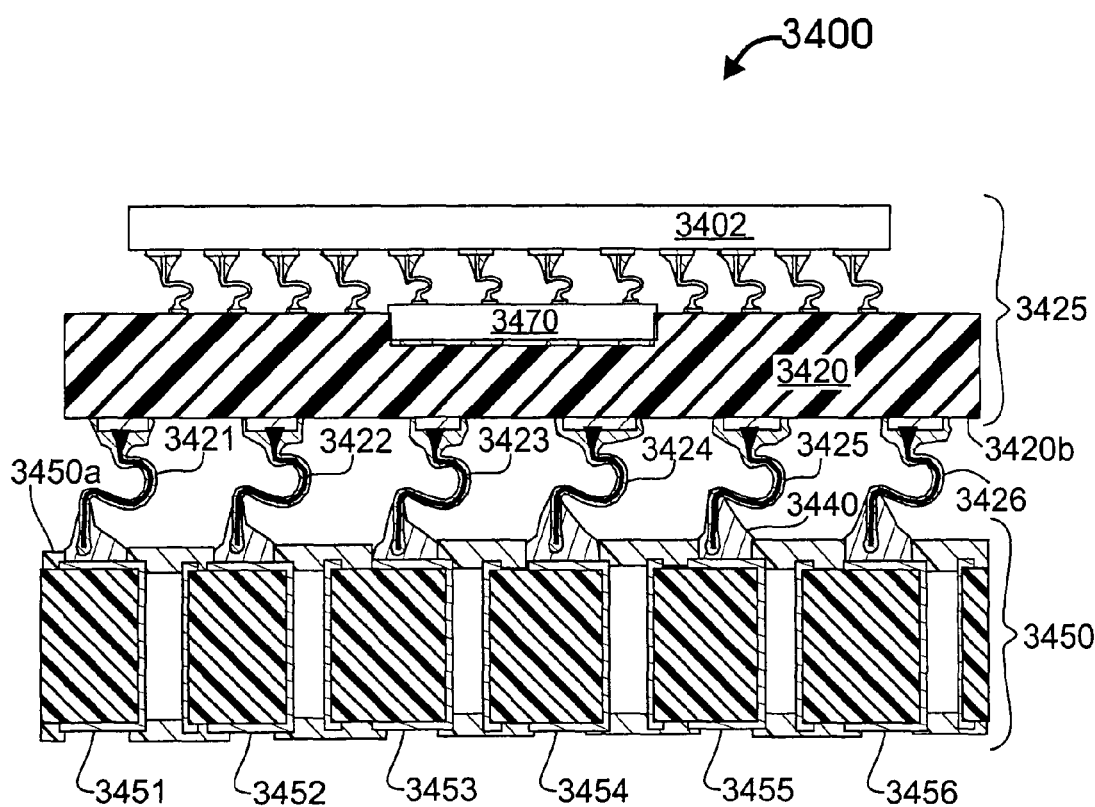
FIG. 34 is a side view of an embodiment of a packaging scheme for electronic components, according to the present invention.
Figure 35:
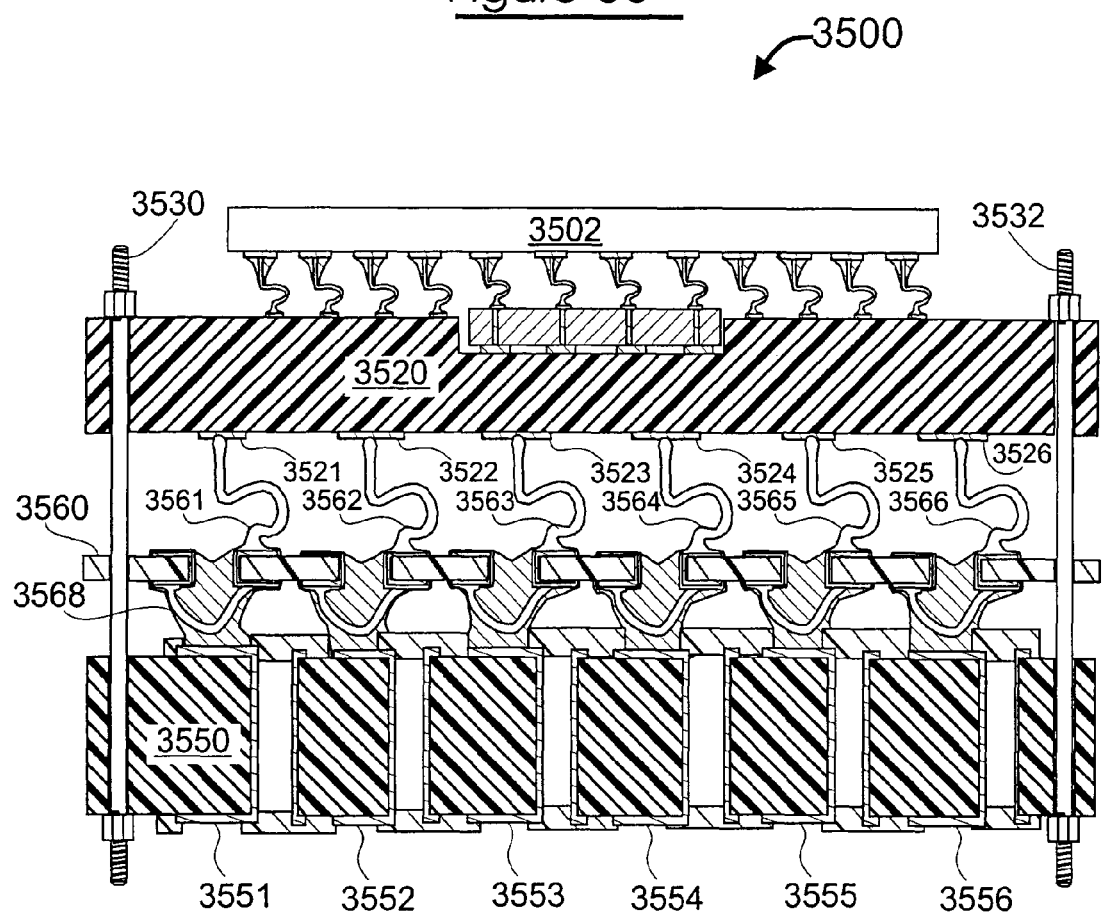
FIG. 35 is a side view of an embodiment of a connection scheme for electronic components, according to the present invention.

FIGS. 33-35, similar to FIGS. 33-35 of CASE-2, illustrate additional embodiments of assemblies of electronic components which, for purposes of this discussion, are termed "carrier assemblies".

FIG. 33 illustrates an embodiment 3300 of a carrier assembly. A multi-layer substrate 3320 has a plurality of resilient contact structures extending from its upper (as viewed) side 3320a for connecting to an electronic component 3302, and a plurality of resilient contact structures extending from its lower (as viewed) side 3320b for connecting to an electronic component such as a mother board (not shown).

A first group (set) 3322 of resilient contact structures are mounted to and extend from a first level on the face 3320a of the PCB 3320 to a given "height" above the PCB. An electronic device 3370, such as a decoupling capacitor, is also mounted to the face 3320a of the PCB 3320. A second group (set) 3324 of resilient contact structures are mounted to and extend from the level of the electronic device 3370 to the same height as the first group of resilient contact structures 3322. In this manner, both groups of resilient contact structures 3322 and 3324 can connect to a planar surface 3302a of the electronic component 3302. This is similar to the situation described hereinabove with respect to FIG. 6A.

The bottom surface 3320b of the PCB is stepped, as shown, and has contact pads (terminals) 3324, 3326 and 3328 disposed at a first level, contact pads 3330 and 3332 disposed at a second level, and contact pads 3334 (one shown) disposed at a third level. The first level is higher (further from the front surface 3320a) than the second level, which is higher than the third level. Conductors (traces) and vias are provided within the multi-layer PCB 3320 are illustrated, in a known manner. For a multi-layer substrate 3320 which is made of ceramic (rather than of printed circuit board material), the use of conductive materials such as molybdenum and tungsten are known. Details of interconnects effected within the body of the substrate 3320 are omitted, for illustrative clarity.

A first group 3380 of resilient contact structures are mounted to the contact pads 3324, 3326 and 3328 at the first level on the bottom surface 3320b of the PCB, and are all the same height (i.e., they extend to a similar distance from the bottom surface of the PCB), indicated by a dashed line "A". These resilient contact structures may be configured to any shape set forth hereinabove (such as the shape shown in FIG. 3B), and may be imbued with any desired set of physical characteristics set forth hereinabove (such as the plasticity and elasticity discussed with respect to FIG. 5F).

A second group 3382 of resilient contact structures are mounted to the contact pads 3330 and 3332 at the second level on the bottom surface 3320b of the PCB, and are all the same height (i.e., they extend to a similar distance from the bottom surface of the PCB). The second group 3382 of resilient contact structures is longer than the first group 3380 of resilient contact structures, and extend to a distance from the PCB 3320 indicated by the dashed line "A". In this manner, the tips (distal ends) of the resilient contact structures 3382 are coplanar with the tips of the resilient contact structures 3380. (Compare the discussion of coplanarity set forth hereinabove, with respect to FIGS. 6A-6C.)

In a similar manner, a third group 3384 (one shown) of resilient contact structures are mounted to the contact pads 3334 at the third level on the bottom surface 3320b of the PCB, and are all the same height (i.e., they extend to a similar distance from the bottom surface of the PCB). The third group 3384 of resilient contact structures is longer than the second group 3382 of resilient contact structures, and extend to a distance from the PCB 3320 indicated by the dashed line "A". In this manner, the tips (distal ends) of the resilient contact structures 3384 are coplanar with the tips of the resilient contact structures 3380 and 3382.

Preferably, all of the resilient contact structures 3380, 3382 and 3384 have the same "bend", at an intermediate portion of their overall length, so as to exhibit the same resiliency as one another. The additional length (e.g., of the contact structures 3382 vis-a-vis the contact structures 3380) is readily accommodated, without altering the resilient characteristics of the contact structures, simply by extending the end ("leg") portions of these resilient contact structures a suitable distance to make up the required length, without altering the configuration of the bend portion.

As mentioned hereinabove, the ability to include a decoupling capacitor (or a plurality of decoupling capacitors) in an assembly is often a very important consideration affecting the performance envelope of certain electronic components, such as microprocessors. Generally (i.e., as a rule of thumb), the shorter the path from a semiconductor device to a decoupling capacitor, the better (e.g., the lower its inductance). The assembly shown herein provides a very short path, and consequent low inductance coupling, between an electronic component (3302) such as a high speed microprocessor and a printed circuit board (3320). Moreover, it is within the scope of this invention that the electronic component 3302 is a bare die (e.g., an unpackaged microprocessor), which would allow for even shorter electrical paths (resilient contact structures 3324).

Optionally, the electronic component 3302 is "packaged" by providing a lid (cover, shown partially) 3390 surrounding the electronic and resting against the top surface 3320a of the board 3320. Alternatively, rather than using a lid, an encapsulant (e.g., epoxy) could be used to package the electronic component (3302).

An advantage of a configuration such as is shown in FIG. 33 is that a ceramic or PCB substrate (3320), having a planar or a stepped (as shown) bottom surface, and optionally including a decoupling capacitor (3370) or the like (if there is no decoupling capacitor, the top surface of the substrate can be planar) can be "prepared" with a plurality of resilient contact structures on each side thereof, ready for flip-chip type interconnection of an semiconductor die (3302).

A general advantage of an assembly, such as is shown in FIG. 33 (vis-a-vis conventional semiconductor packaging techniques), is that there is a reduced number of vias required, more space available for conductors (e.g., to effect complex interconnect schemes and for improving routing of conductive traces on the board), and reduced cost.

It is within the scope of this invention that a plurality of electronic components (3302) could be mounted to a common (single) board (3320). It is also within the scope of this invention that the board could be provided with recesses extending in from its top (as viewed) surface (or lower levels of a multi-layer substrate which are, in selected areas, not covered by higher levels of the substrate), in which case resilient contact structures originating from pads in these recesses would have longer "legs" than the remaining resilient contact structures, in the manner that the resilient contact structures 3324 are made to be shorter than the resilient contact structures 3322.

It is within the scope of this invention that the resilient contact structures 3380, 3382 and 3384 could be formed in the manner of the resilient contact structures 2804 and 2804 of FIG. 28, so that the board 3320 could "plug into" another board (comparable to the board 2820).

By using spring (resilient or compliant) contacts as the external interconnect (3380, 3382, 3384), a component (3302) packaged in this manner is readily tested and/or burned-in, and the same external interconnects can subsequently be used for making connection to a motherboard, or the like, in either a "socketable" or a surface mount manner, or the like. The same is generally true of other embodiments disclosed herein.

FIG. 34 illustrates an embodiment 3400 of a composite assembly of an electronic component 3402 mounted to a printed circuit board 3420, with a decoupling capacitor 3470 disposed therebetween so as to provide short paths exhibiting low inductance coupling, in a manner such as was discussed with respect to FIG. 33. The assembly of electronic component 3402, PCB 3420 and decoupling capacitor 3470 constitutes a first sub-assembly 3425 of the composite assembly 3400.

In this example, the bottom surface 3420b of the PCB 3420 is shown as flat, rather than as stepped (compare FIG. 33), for illustrative clarity. The entire assembly of electronic component 3402, PCB 3420 and decoupling capacitor 3470 is mounted to another printed circuit board 3450 which may be a motherboard, an integration substrate, or the like. In the manner set forth hereinabove, the bottom surface of the PCB 3420 (compare 3320) is provided with a plurality (six of many shown) of resilient contact structures 3421 . . . 3426 extending from the bottom surface 3420b thereof and extending to a common plane (compare "A" in FIG. 33).

The motherboard 3450 is provided with a plurality (six of many shown) of contact surfaces 3451 . . . 3456 which are conveniently extensions (on the top surface 3450a of the motherboard 3450) of plated through holes. The tips of each of the resilient contact structures 3421 . . . 3426 contact respective ones of these contact areas 3451 . . . 3456 and may be soldered thereto as indicated by solder 3440. As mentioned hereinbefore, soldering the tips of the resilient contact structures 3421 . . . 3426 to the contact areas 3451 . . . 3456 would not be necessary if the assembly 3440 were clamped to the motherboard 3450 by clamping means (not shown).

It should be understood that, in any of the embodiments set forth herein wherein solder is employed to effect connection between tips of resilient contact structures and conductive pads or areas, electrically conductive epoxy could be employed in lieu of solder to "complete" the assembly.

It should be understood that, in any of the embodiments set forth herein wherein a single electronic component is assembled to a printed circuit board (or the like), that a plurality of electronic components can be assembled to the printed circuit board in like manner.

It is within the scope of this invention that the embodiment 3300 of FIG. 33 could be mounted atop a component similar to 3450 of FIG. 34, in the manner shown in FIG. 34 (e.g., by substituting the assembly 3300 for the assembly 3425).

FIG. 35 illustrates another embodiment 3500 of a composite assembly, wherein an electronic component 3502 mounted to a printed circuit board 3520, with a decoupling capacitor 3570 disposed therebetween so as to provide short paths exhibiting low inductance coupling, in a manner such as was discussed with respect to FIG. 33. The assembly of electronic component 3502, PCB 3520 and decoupling capacitor 3570 constitutes a first sub-assembly 3525 (compare 3425) of the composite assembly 3500.

In this example, the bottom surface 3520b of the PCB 3520 is shown as flat, rather than as stepped (compare FIG. 33), for illustrative clarity, and is provided with a plurality (six of many shown) of contact pads 3521 . . . 3526, rather than with a plurality of resilient contact structures (compare 3421 . . . 3426 of FIG. 34).

In this example, an interposer substrate 3560, similar to the interposer 1720 of FIG. 17B is disposed between the assembly 3525 and another printed circuit board 3550 which may be a motherboard, an integration substrate, or the like. A plurality (six of many shown) of resilient contact structures 3561 . . . 3566 extend upward (as viewed) from the top surface 3560a of the interposer substrate 3560 and their tips contact respective contact pads 3521 . . . 3526 on the bottom surface of the assembly 3525 (i.e., the bottom surface 3520b of the PCB 3520), in this case, without solder. (The resilient contact structures 3561 . . . 3566 are shown without details of the wire stem being overcoated, for illustrative clarity.)

The motherboard 3550 is provided with a plurality (six of many shown) of contact areas 3551 . . . 3556 which, as was the case with the motherboard 3450 of FIG. 34, may be associated with plated through holes in the motherboard 3550.

A plurality (six of many shown) of bump-like (generally non-resilient) contact structures 3568 (only one of which is labelled in the figure) extend from the lower surface 3560b of the interposer 3560, and are positioned to contact the contact areas 3551 . . . 3556 on the PCB 3550. These contact structures 3568 may (as shown) or may not (not shown) be soldered to the contact areas 3551 . . . 3556.

As is shown, the PCB 3520, the interposer 3560 and the PCB 3550 are each provided with a plurality (two of many shown) of holes, in alignment with one another, through which there extends a plurality (two of many shown) of threaded studs 3530 and 3532. Nuts on the ends of the studs 3530 and 3532 enable the entire assembly 3550 to be compressed so that the resilient contact structures 3561 . . . 3566 on the top surface 3560a of the interposer 3560 can intimately contact the contact pads 3521 . . . 3526 on the bottom surface 3520b of the PCB 3520. In the case where the bottom contact structures 3568 of the interposer 3560 are first (initially) soldered to the contact areas 3551 . . . 3556 on the PCB 3550, it is not necessary that the interposer 3560 be provided with holes. In any event, this represents a viable technique for securing the assembly 3525 to the PCB 3550 with mechanical means (such as the aforementioned studs and nuts, alternatively with nuts and bolts, cams, levers, spring clips and the like). An advantage of this embodiment is that no solder is used to connect to the pads (3521 . . . 3526) on the bottom surface 3520b of the PCB 3520, in contrast to the soldered connections shown on the bottom surface 3420b of the PCB 3420 in the previous embodiment 3400.

It is within the scope of this invention that means other than the threaded studs (3530, 3532) would be employed for holding the assembly (3520, 3560, 3550) together, such as clips, latching springs and the like.

It is within the scope of this invention that the PCB 3550 (and, optionally, the interposer 3560) constitute a test jig, such as for performing test and burn-in on the electronic component 3502, after which, the assembly (3525) may be mounted to another PCB (3550), such as a motherboard in a notebook computer.

It is within the scope of this invention that another "style" of interposer (i.e., other than the style of FIG. 17B could be employed in the assembly 3500. For example, an interposer of the style (type) shown in FIG. 17A could be employed.

As was described with respect to the embodiment 3300 of FIG. 33, in any of the embodiments set forth herein where an electronic component (e.g., 3502) is mounted to a board (e.g., 3520), a lid (see 3390) can be provided, or an adhesive provided, to "package" the electronic component.

FIG. 36A, similar to FIG. 36 of CASE-2, illustrates another technique (embodiment) 3600 of assembling electronic components, wherein a plurality (two of many shown) of electronic components 3602 and 3603 such as "bare" (unpackaged) semiconductor devices are mounted to one side 3620a of an interconnect substrate 3620, and a plurality (two of many shown) of electronic components 3608 and 3609 such as bare (unpackaged) semiconductor devices are mounted to another side 3620b of the interconnect substrate 3620, generally in the manner set forth in FIG. 25. (This is illustrative of "edge-to-edge packing" of silicon chips on cards/boards.) Namely, by way of example, the electronic components 3602, 3603, 3608 and 3609 can optionally be secured to the interconnect substrate 3630 with a suitable, insulating adhesive 3630 (compare 2530). (Alternatively, spring clips, and the like, as described hereinabove, can be used to secure the electronic component against the interconnection substrate.)

The electronic components 3602, 3603, 3608 and 3609 are each provided with a plurality of resilient contact structures 3610 extending from a face thereof, and the interconnect substrate 3620 is provided with a corresponding plurality of contact pads for receiving the distal ends of the resilient contact structures. As illustrated, each contact pad is suitably provided with a dollop of conductive epoxy 3612 for receiving the distal end of a corresponding resilient contact structure 3610.

In this manner, a great many electronic components can be mounted to an interconnect substrate (e.g., PCB), utilizing the space available on the interconnect substrate much more efficiently than would otherwise be possible with packaged (e.g., plastic packaged, leaded) semiconductor devices.

FIGS. 36B and 36C illustrate exemplary applications of the technique illustrated in FIGS. 25 and 36A, respectively.

FIG. 36B illustrates that a plurality of bare semiconductor devices 3650a . . . 3650r can be mounted in two rows to a surface of an interconnect substrate 3652, the semiconductor devices being efficiently laid out, nearly touching one another, in edge-to-edge proximity with one another. A plurality of edge connector pads 3654 are illustrated at an edge of the interconnect substrate 3652, which would be connected by conductive traces (not shown) to pads receiving the distal ends of the resilient contact structures mounted to the semiconductor devices 3650a . . . 3650r.

FIG. 36C illustrates that a plurality of bare semiconductor devices 3660a . . . 3660i can be mounted in one row to a surface of an interconnect substrate 3662, the semiconductor devices being efficiently laid out, nearly touching one another, in edge-to-edge proximity with one another. A plurality of edge connector pads 3664 are illustrated at an edge of the interconnect substrate 3662, which would be connected by conductive traces (not shown) to pads receiving the distal ends of the resilient contact structures mounted to the semiconductor devices 3660a . . . 3660i.

As illustrated in FIG. 36A, the interconnect substrate 3620 is "cocked" or "skewed" with respect to the electronic components (although it would generally be preferred that it not be cocked). In other words, it is not parallel to the electronic components 3602, 3603, 3608 and 3609. This illustrates one of the many advantages of employing resilient contact structures (e.g., on the electronic components)—namely, that the resilient contact structures can inherently "compensate" for small deviations in planarity. As mentioned hereinabove, a certain amount of plastic (versus resilient) deformation is often desirable in the resilient contact structure, to accommodate non-planarities. Generally, a contact structure exhibiting both resilience and a plasticity is termed a "compliant" contact structure.

In this, and in other assemblies described herein, the finished assembly can be fully encapsulated in a suitable insulating material (such as glob top epoxy) to protect the electronic components from environmental damage, including mechanical events (such as handling the assembly) and environmental events (such as dust and humidity). This would make for a "finished", fully packaged assembly. It is within the scope of this invention that appropriate heat sinks (e.g., thermal masses) could be incorporated into such finished assemblies, in any suitable manner (e.g., such as by embedding an end of a heat sink in an overlying glob top epoxy, in close proximity to the electronic components).

FIG. 37, similar to FIG. 37 of CASE-2, illustrates another embodiment 3700 of an electronic assembly wherein two assemblies (double-sided "precursors") 3710 and 3712, each comparable to the assembly 3600 described in FIG. 36 can be "stacked".

As shown, the interconnection substrate 3720 (compare 3620) of the assembly 3710 is provided with a plurality (one of many shown) of contact pads 3722 on a lower (as viewed) surface 3720b thereof. The interconnection substrate 3740 (compare 3620) of the assembly 3712 is provided with a plurality (one of many shown) of resilient contact structures 3742 extending from an upper (as viewed) surface 3730a thereof.

In the process of internally encapsulating the assemblies 3710 and 3712 with a suitable insulating material 3730 (compare 2530), the material 3730 is caused to fill a gap 3732 between the two assemblies 3710 and 3712. In conjunction with such internal encapsulation, the assemblies are urged together, in the manner described hereinabove, so that tips of the resilient contact structures 3742 contact the contact pads 3722.

It is within the scope of this invention that spring clips, and the like, such as were described with respect to FIGS. 26, 27, 29, 30, or other "mechanical means" such as were described with respect to FIG. 35 would be employed in lieu of the adhesive 3730 to hold the assemblies 3710 and 3712 together.

In this figure, the interconnect substrates are shown as not being "cocked", for illustrative clarity. (Compare the interconnect substrate 3620 of FIG. 36.)

For the most part, hereinabove, there have been described a number of electronic assemblies wherein electronic components (e.g., xx02) are assembled in a "flip-chip" manner to an interconnect substrate (xx20). In other words, the electronic components are intended to be parallel to the interconnect substrate. (It should be understood that, when the numbering "xx02" and the like is used, throughout the descriptions set forth herein, it is intended that any suitable numbers, such as "25" can be substituted for the letters (place-holders) "xx". In other words, "xx02" can be read as "2502", "2602", "2702", etc . . . )

According to an aspect of the invention, electronic components can be mounted (and connected) edge-wise to an interconnection substrate.

As mentioned hereinabove (e.g., with respect to FIG. 25), a number of cards (3710, 3712) can be pre-fabricated, optionally pre-tested, and inventoried, later to be assembled into more complex assemblies, such as are shown in FIG. 37. These "sub-assemblies" (i.e., cards 3710 and 3712) are readily stacked, as shown, simply by providing contacts on the cards, and card-to-card interconnect structures (e.g., 3742) between the cards. As a generally proposition, such a technique is superior to "3D" stacking of individual pieces of silicon (electronic components), and is applicable to multi-chip modules of memory components, or any other electronic component.

Figure 38:
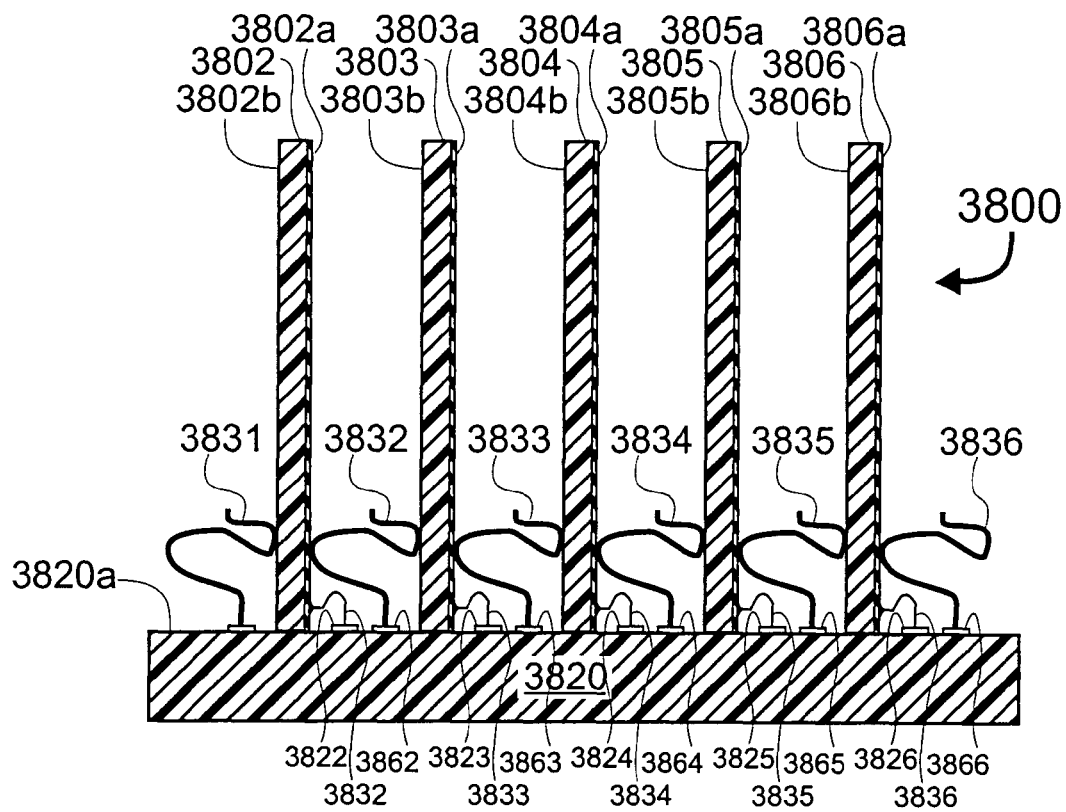
FIG. 38 is a side view of an embodiment of an assembly of a printed circuit board having electronic components mounted thereto with resilient contact structures, according to the present invention.

FIG. 38, similar to FIG. 38 of CASE-2, illustrates an embodiment 3800 of an electronic assembly wherein a plurality of electronic components 3802, 3803, 3804, 3805 and 3806 are mounted edgewise to an interconnect substrate 3820.

Figure 38A:
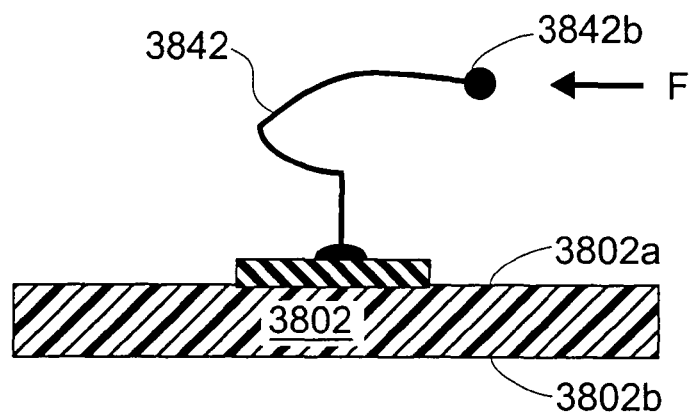
FIG. 38A is a detailed side view of the embodiment of FIG. 38, according to the present invention.

Each of the electronic components 3802 . . . 3806 are provided with a plurality (one of many shown) of resilient contact structures 3842 . . . 3846, a representative (3822) one of which is shown in greater detail in FIG. 38A. The top (as viewed) surface 3820a of the interconnect substrate 3820 is provided with a like plurality (five of many shown) of contact pads 3822 . . . 3826. In use, the tips (e.g., 3842b) of the resilient contact structures 3842 . . . 3846 contact respective ones of the contact pads 3822 . . . 3826, in the manner shown in FIG. 38.

A plurality (six shown) of pads 3861 . . . 3866, generally one more than the number of electronic components 3802 . . . 3806, are provided on the top surface 3820a of the interconnect substrate 3820 at positions between and "outboard" of the electronic components 3802 . . . 3806. A plurality (six of many shown) of spring clips 3831 . . . 3836 are mounted to the pads 3861 . . . 3866, respectively, and are shaped as follows.

A representative one of the spring clips 3832 extends upward from the top surface 3820a of the interconnect substrate 3829 and is configured to have a leftward (as viewed) extending bend and a rightward (as viewed) extending bend. All of the spring clips are preferably shaped in the same manner, with opposing bends. The leftward extending bend of the spring clip 3832 cooperates with the rightward extending bend of the adjacent (to the left, as viewed) spring contact 3831 to define a gap which is somewhat less than the thickness of the electronic component 3802. In this manner, the electronic component 3802 can be inserted snugly between the spring clips 3831 and 3832 on either side thereof, so as to be retained in place edgewise against the surface 3820a of the interconnect substrate 3820. The electronic component 3803 is similarly held in place edgewise against the interconnect substrate 3820 by the spring clips 3832 and 3833. The electronic component 3804 is similarly held in place edgewise against the interconnect substrate 3820 by the spring clips 3833 and 3834. The electronic component 3805 is similarly held in place edgewise against the interconnect substrate 3820 by the spring clips 3834 and 3835. The electronic component 3806 is similarly held in place edgewise against the interconnect substrate 3820 by the spring clips 3835 and 3836.

As was the case with the spring clips (e.g., 2630 and 2632) described hereinabove, the spring clips (3831 . . . 3836) can be fabricated in the same manner as a resilient contact structure, and it is optional, not essential, that the spring clips form an electrically-conductive path between the interconnect substrate and the respective electronic component retained in place by the spring clips.

As mentioned hereinabove with respect, for example, to FIG. 26, the pads 3822 . . . 3826 can be pre-treated with solder so that once the electronic components are urged (between the respective spring clips) into place, the entire assembly can be passed through a furnace to reflow the solder and effect a solder connection between the pads 3822 . . . 3826 and the respective tips of the resilient contact structures 3842 . . . 3846.

As shown in FIG. 38A, the resilient contact structures (3842) of this embodiment are configured to a shape which is intended to react a compressive force (F) which is in-plane (rather than normal to) the electronic component (3802) to which the resilient contact structure (3842) is mounted.

It is within the scope of this invention that resilient contact structures can have their shapes configured to react compressive forces directed at virtually any angle with respect to the electronic component to which they are mounted. For example, in the "probe" embodiments exemplified by FIGS. 9A and 9B, the compressive force is applied from underneath the substrate to which the resilient contact structures are mounted. Although certain exemplary shapes have been set forth herein, it is specifically intended not to limit the scope of this invention to any of the illustrated shapes.

It is also within the scope of this invention that the electronic components (3802, 3803, etc.) are not at right angles to the board 3620.

Dut Test Interface Arrangement

The use of resilient contact structures in probe cards to burn-in and perform functional testing on electronic components has been discussed hereinabove, for example, with respect to FIG. 10A-10G.

In certain applications, it is important to pinpoint and analyze failures in complex integrated circuit devices. For example, a partially-packaged device under test (DUT) can be plugged into a socket which is on a PCB which has conductive areas contacted by "pogo" pins (straight pins with coil springs associated therewith) which extend through a spacer from a test interface board. The assembly of test interface board, spacer, PCB, socket and DUT is inserted into an opening in a vacuum chamber of, for example, an E-beam prober, so that the DUT can be probed by E-beams in a vacuum environment. This is merely exemplary of an application for the DUT test interface arrangement of the present invention.

Figure 39:
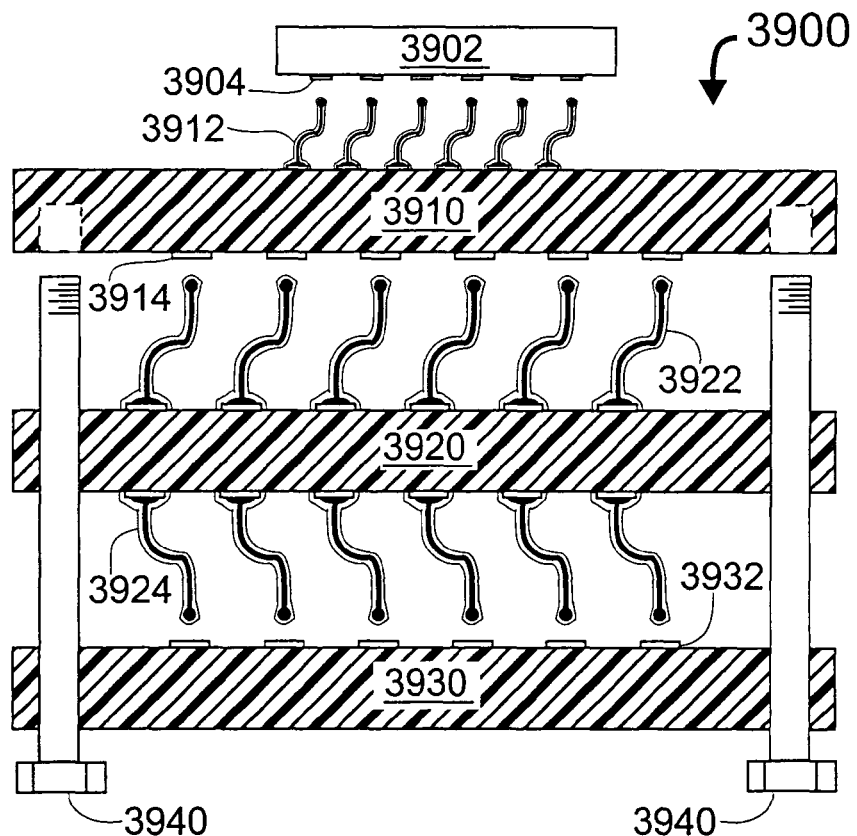
FIG. 39 is a side view, partially exploded, of a test interface arrangement, according to the present invention.

FIG. 39 illustrates a test interface arrangement 3900, according to the present invention. A semiconductor die 3902 has a plurality of solder bumps 3904 disposed on its lower (as viewed) surface, such as in an array. A "space transformer" substrate 3910 has a corresponding plurality of resilient contact structures 3912 disposed on its upper (as viewed) surface. The distal ends of these resilient contact structures 3912 are arranged at the same pitch (spacing) as the solder bumps 3904. The space transformer 3910 is a substrate formed of alternating layers of insulating material and patterned conductive material (e.g., foil), in the manner of a multi-layer PCB. The lower (as viewed) surface of the space transformer 3910 is provided with a plurality of contact pads 3914 which are disposed at a larger spacing (further apart from one another) than the resilient contact structures 3912. The space transformer 3910 can be assembled to the semiconductor die 3902 by urging the die against the distal ends of the resilient contact structures 3912, and soldering (or brazing) the distal ends of the resilient contact structures 3912 to the semiconductor die 3902, in the manner discussed hereinabove (see, e.g., FIG. 12B with respect to gang-transfer of contact structures).

An interposer substrate 3920 is provided with a plurality of resilient contact structures 3922 on its upper (as viewed) surface, and with a plurality of resilient contact structures 3924 on its lower (as viewed) surface, in the manner of any of the interposer substrates described hereinabove.

A probe card substrate 3930 is provided with a plurality of contact pads 3932 on its upper (as viewed) surface. Means are provided for securing the probe card 3930 to the space transformer 3910, with the interposer clamped therebetween, such as bolts 3940 extending through holes in the probe card 3930, optionally through the interposer 3920, and into threaded holes in the space transformer 3910. In this manner, a number of semiconductor assemblies (3902, 3910) can be tested, by test circuitry (not shown) associated with the probe card 3930.

The technique of the present invention is simpler and more cost-effective that prior art techniques of performing "known good die" tests. Typical probe cards of the prior art include contacts mounted thereto, which generally means that a unique (e.g., costly) probe card is required for each unique device being tested. The probe card 3930 of the present invention is much more "fungible", and is readily adapted to unique devices via a readily and inexpensively produced space-transformer substrate 3910.

Various Additional Embodiments

There are now presented certain alternatives to the techniques set forth hereinabove, which are within the scope of the present invention.

Non-Conductive Stem

As mentioned hereinabove, the wire (e.g., 102) serves principally as a medium (falsework, mandrel) upon which the overcoat (superstructure) can be fabricated (e.g., plated). Hence, it is, in many instances, generally immaterial whether the mandrel is electrically conductive, so long as it can be mounted to a substrate, shaped, and overcoated (the outermost layer of the plating being required, as a general proposition, to be electrically conductive).

With this in mind, it is within the scope of the present invention that the wire stem (elongate flexible member) is formed of an insulating material, such as plastic (e.g., nylon), polymer, and the like. It is well within the ambit of one having ordinary skill in the art to which the present invention most nearly pertains to plate a conductive, metallic material (such as nickel) onto such a mandrel. For example, the surface of the insulating mandrel would first be activated to be ion-receptive, then would be electroless plated with a first layer of conductive material, then would be electroplated with a second layer of conductive material.

A wide variety of plastic (e.g., polymer) materials are known, for example, which will liquify at high pressure, and which will form a skin at atmospheric pressure.

Figure 40A:
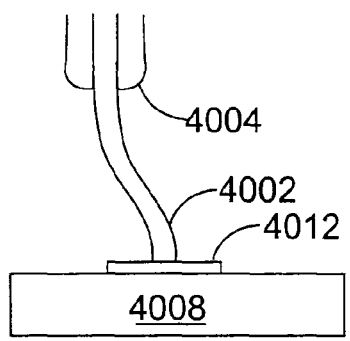
FIG. 40A is a side view of an embodiment of the invention utilizing an insulating (e.g., dielectric) material for forming the wire stem, according to the present invention.

FIG. 40A illustrates a technique wherein a supply of polymer material under high pressure is supplied through a nozzle 4002. The nozzle is brought into close proximity with a terminal (e.g.) 4012 (compare 112) on an electronic component 4008 (compare 108) and the liquified polymer is permitted to flow out of the nozzle and contact the terminal. The nozzle is then moved in the z, and any of the x and y directions, to fashion a stem 4002 (compare 102). When the desired stem is fabricated in this manner, the pressure can be turned off, and the nozzle moved away, which will leave the stem with a distal end. In this manner, the function of the nozzle 4004 in fashioning a wire stem closely resembles that of the wirebonder capillary (104, 204), discussed hereinabove above. When the stem has hardened, it is readily overcoated with a conductive material, in the manner described hereinabove.

As mentioned hereinabove, certain advantages would accrue to using multiple capillaries to simultaneously form multiple wire stems on an electronic component. In much the same manner, a multiplicity of nozzles (4004) could be used to fashion a like multiplicity of non-conductive stems on an electronic component.

Figure 40B:
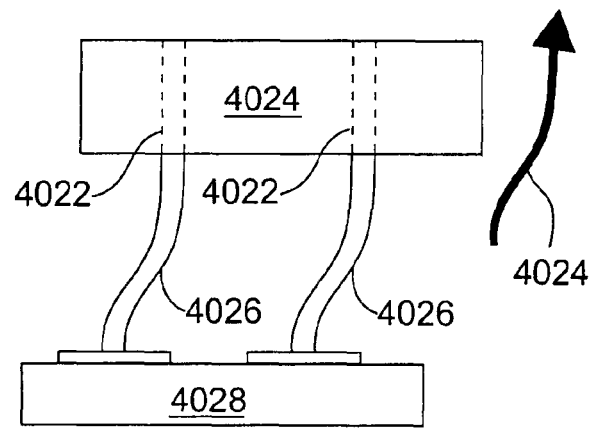
FIG. 40B is a side view of an embodiment of the invention utilizing an insulating (e.g., dielectric) material for forming the wire stem, according to the present invention.

FIG. 40B illustrates a nozzle head 4020 having a multiplicity (two of many shown) of orifices 4022 through which a non-conductive material may be delivered to the surface of a substrate 4028 to fashion a like multiplicity of stems 4026. (Terminals and the like are omitted from this view, for illustrative clarity.) Evidently, all of the stems formed in this manner will have the same shape, as determined by the path of the nozzle head, which is indicated by the dashed line 4024 terminating in an arrow. In essence, the nozzle head 4020 is a perforated plate which may have a great number of orifices (4022) arranged in a suitable manner, such as in a rectangular array.

It is not proposed, at present, that the techniques described with respect to FIGS. 40A and 40B are "preferred". They are primarily presented to illustrate the point that the shaped, to-be-overcoated stem (4002) need not be a conductive wire. It is, however, within the scope of the present invention that any suitable dielectric materials could be employed for the stem.

Stem Affixed without Bonding

As discussed at length, hereinabove, a wirebonder may be employed to mount (bond) the free end of a supply wire to a contact area on a substrate, the free end of the supply wire becoming (when bonded to the substrate) the proximal end of the resulting wire stem.

Bearing in mind that the overcoat (superstructure) plays the principal role in anchoring the resulting contact structure to the substrate, it is within the scope of this invention that the wire is not bonded, per se, to the substrate—rather, that it is mounted thereto in a non-bonding manner. Generally, any technique of affixing the free end of the supply wire to the substrate will be sufficient.

Figure 41A:
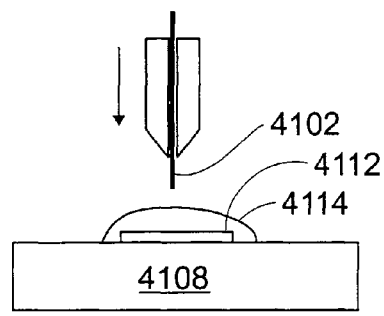
FIG. 41A-41C are side views of an alternate technique for mounting a wire stem to a contact area (e.g., terminal) on an electronic component, according to the present invention.
Figure 41B:
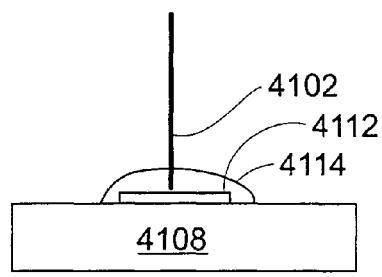

FIG. 41A illustrates a capillary-type head 4104 (compare 104) through which there is supplied a wire 4102. In this example, a terminal 4112 (compare 112) is disposed atop a substrate 4108 (compare 108), and is overcoated with a material 4114 which can be pierced by the tip of the wire. Bonding, such as ultrasonic bonding, is not required to affix the proximal end of the resulting wire stem to the electronic component. Rather, the wire 4102 is sufficiently stiff, and the material 4114 is sufficiently pierce-able (e.g., plastically deformable), that the resulting wire stem (see FIG. 41B) will remain in place during process of overcoating the wire stem. In this example, the wire stem is shown as a straight wire stem, for illustrative clarity—it being understood that the wire stem can be formed into any of the springable shapes described hereinabove (see, e.g., FIGS. 2A-2E). The material 4114 may be solder, conductive epoxy, or any other suitable "pierce-able" material.

It is within the scope of this invention that the aforementioned technique of inserting the wire into (i.e., rather than bonding the wire to) a terminal (or pad, or the like) on an electronic component can be employed for mounting pin-like structures to electronic components such as semiconductor packages. Wire materials would include: beryllium-copper, Kovar(™), spring steel, and the like (relatively stiff materials). Optionally, the resulting pin-like structure can be overcoated (e.g., by plating with gold) to securely anchor the pin to the terminal.

Figure 41C:
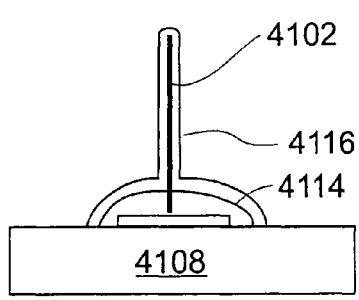

It is also within the scope of this invention that the wire stem 4012 is overcoated with a conductive material 4116, as shown in FIG. 41C, in the manner described hereinabove.

It is also within the scope of this invention that the wire 4102 is of any material suitable for being inserted into the mass 4114 (such as solder, or conductive epoxy), such as high-elasticity carbon fibers.

Manually Shaping the Wire Stem

As discussed hereinabove, a wire stem may be fashioned to have a springable shape by controlling the relative motion of the capillary (e.g., 204) vis-a-vis the substrate (e.g., 208).

It is within the scope of this invention that the shaping of the wire stem is augmented, or fully implemented by external means other than movement of the capillary.

Figure 42:
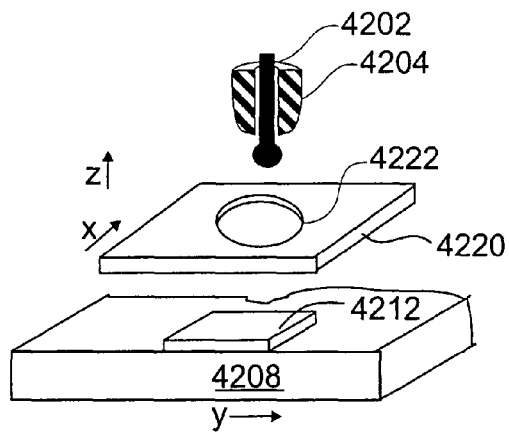
FIG. 42 is a side view of an alternate technique for configuring a wire stem, with an external tool, according to the present invention.

FIG. 42 illustrates a free end of a supply wire 4202 (compare 202) extending from the end of a capillary 4204 (compare 204). As indicated by the dashed line, the capillary 4204 traverses through an opening 4222 in a "tool" member 4220, such as a plate provided with at least one hole therethrough, in order to bond the tip of the wire to a terminal 4212 (compare 112) on a substrate 4208 (compare 108).

Once the free end of the supply wire is bonded to the terminal, the motion of the capillary and of the tool member are controlled to establish the desired spring shape for the resulting wire stem. These motions include both the capillary and the block moving in the same x and y directions, as well as in contrary x and y directions. (The tool member may also move in the z direction, as does the capillary.) If the tool member is simply held in position, the wire stem can be "manually" held at any position along its length during the shaping operation. After severing the wire stem to have a distal end (tip), the block can simply be raised up, off of the wire stem.

It is within the scope of this invention that two or more tool members, each having corresponding holes, through which the capillary must traverse to bond the wire to the terminal, may be employed in like manner to augment the shaping process. Moreover, with tool blocks, the capillary could simply play out a sufficient length of wire (after bonding the free end of the supply wire to the terminal), and the entire stem shaping process can be carried out by controlling the motions of the two blocks.

As will become evident, the use of a tool (e.g., 4220) external to the wirebonder to configure the wire permits the wire to be configured into shapes having tight bends (kinks), as well as avoiding (to a large extent) the amount of capillary overtravel normally associated with any shaping of a bond wire.

Figure 42A:
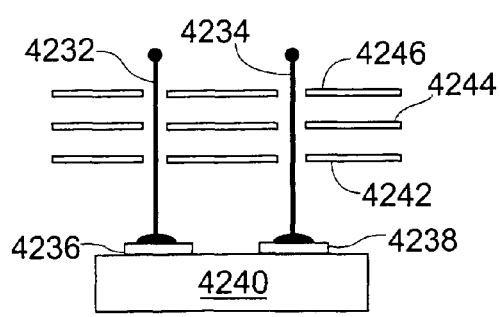
FIGS. 42A and 42B are side views illustrating a technique for shaping to or more wire stems with an external tool, according to the present invention.
Figure 42B:
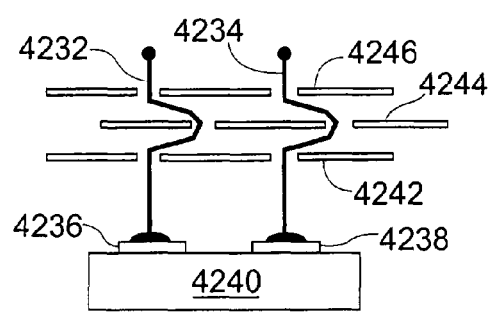

FIG. 42A takes the concept of FIG. 42 a step further, and is especially advantageous in situations where there is an array of wire stems, and it is difficult for the capillary to navigate without bumping into adjacent wire stems. As shown in FIG. 42A, a plurality (two of many shown) of wire stems 4232 and 4234 are bonded to terminals 4236 and 4238, respectively, on a surface of an electronic component 4240. The wire stems are formed protruding straight up from the surface of the electronic component, and severed (compare, e.g., FIG. 4B). Three external tools 4242, 4244 and 4246, each generally formed as a rigid planar member having a plurality of holes, are introduced over the protruding wire stems. The tools are introduced over the wire stems, as shown, spaced apart from one another. As shown in FIG. 42B, by holding the tools 4242 and 4246 stationary, and by moving the tool 4244 (towards the right, as shown), the wire stems can be "gang-shaped". After shaping the wire stems, the tools are removed. It is appreciated that certain wire stem shapes will interfere with removal of the tools. To avoid this problem, the tools are preferably formed as comb-like structures, as shown in FIG. 42C.

Figure 42C:
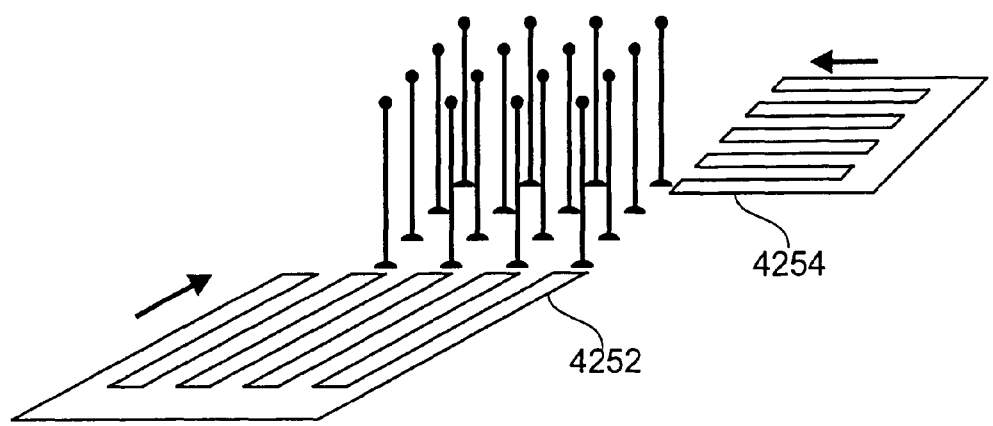
FIG. 42C is a perspective view of an alternate technique for shaping a plurality of wire stems with external comb-like tools, according to the present invention.

FIG. 42C shows an alternate embodiment of gang-shaping a plurality (four-by-four array shown) of protruding wire stems, using external tools (one of several shown) formed as comb-like structures. In this example, the function of two comb-plates 4252 and 4254 are moved into the array (see arrows in figure), so that the spaces between the individual tines of the comb-plates "capture" respective wire stems (in a manner akin to that of the holes in the tools 4242, 4244, 4246). Although two comb-plates (4252, 4254) per vertical position (along the wire stems) are shown, one may suffice—for example, using only the comb 4252 to stabilize the wire stems from moving towards the right (as viewed), or to kink the wire stems to the right. It is also within the scope of this invention that a topmost comb-pair could also be used to shear the wire stems—all to a common height—after configuring their shapes. The comb-plates discussed herein are suitably formed by electro-discharge machining (EDM) processes, and may be made from silicon, iridium, ceramic, metal, tungsten carbide, or the like. Small spacings between the tines of the comb-plates, on the order of 10 mils (or less) are readily achieved.

Overcoming Striction and Pre-Cleaning the Wire

As described hereinabove, applying ultrasonic energy to the capillary during shaping the wire stem is useful in overcoming striction as the wire plays out of the capillary.

It is within the scope of this invention that instrumentalities other than ultrasonic energy can be employed to reduce striction of the wire as it plays out of the capillary, and that these instrumentalities can be used to augment, or in lieu of, the aforementioned ultrasonic energy.

Figure 43A:
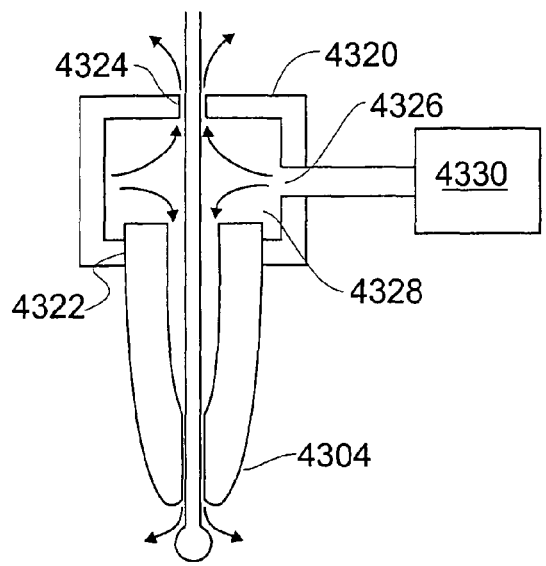
FIG. 43A is a side view of a capillary of a wirebonder, according to the present invention.

FIG. 43A illustrates a capillary 4304 (compare 204) having a supply wire 4302 (compare 202) extending therethrough. The capillary, as is known, has a bore extending axially through its body. The tail end (top, as viewed in the figure) of the capillary is capped off by a housing (cover) 4320 which has an opening 4322 into which the tail end of the capillary fits snugly, an opening 4324 through which the supply wire extends, and an orifice 4326 communicating with an internal cavity 4328 enclosed by the housing. An inert gas, or a "forming" gas is supplied at pressure (i.e., above atmospheric pressure) to the cavity 4328, via the orifice 4326 by a supply reservoir 4330. The gas is, for example, argon, hydrogen, carbon dioxide, or carbon monoxide.

During wirebonding, the gas flows into the cavity 4328, from whence it travels in two directions, as indicated by the arrows. The gas flows downward (as viewed in the figure) through the capillary to reduce stiction of the wire as it plays out of the capillary. The gas flows upward (as viewed in the figure) to pre-clean the supply wire of any foreign particulate matter (such as dust) prior to the wire entering the capillary.

Figure 43B:
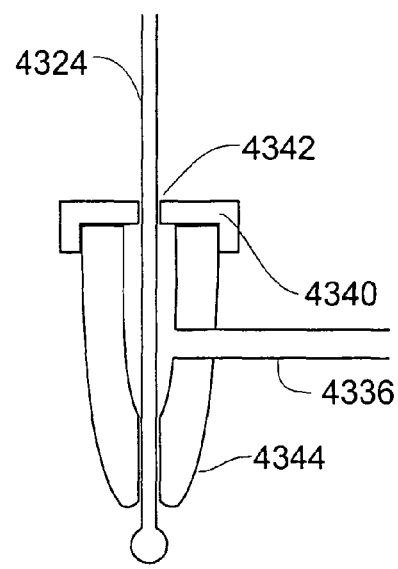
FIG. 43B is a side view of an alternate embodiment of a capillary of a wirebonder, according to the present invention.

It is within the scope of this invention that the gas-feed orifice 4336 (compare 4326) is incorporated into the capillary itself (e.g., approximately at a midpoint of the capillary), thereby eliminating the need for a separate and distinct housing (4320). However, inasmuch as the opening in the tail end of the capillary is typically oversize (e.g., to facilitate threading a supply wire into the tail end of the capillary), it would be preferred that a cover 4340 (compare 4320) having a small opening (slightly larger than the diameter of the wire 4302) be disposed over the tail end of the capillary 4344 (compare 4304) to control (i.e., reduce) the outflow of gas at the tail end of the capillary. This is illustrated in FIG. 43B.

Orientation of the Contact Structures

As mentioned hereinabove, a plurality of contact structures can be mounted, such as in a rectangular array, to an electronic component.

As has been discussed hereinabove, as an electronic component such as a semiconductor device operates, it is typical that it generates heat which will cause the semiconductor device to expand, typically about a centroid of the semiconductor device. In many cases, the package (or the PCB, or the like) to which the semiconductor device is interconnected will experience less heat (since it is not generating heat), and will expand to a much lesser degree than the semiconductor device. Such differences in thermal expansion will evidently impose stresses on the interconnections, as a result of one end of the interconnection being displaced further than the other end of the interconnection. The same phenomenon would be operative when connecting a semiconductor package generating heat to a printed circuit board (PCB).

According to the invention, the orientations of a plurality of shaped contact structures mounted to an electronic component are arranged to accommodate differences in coefficients of thermal expansion between the electronic component and another electronic component to which the electronic component is interconnected.

Figure 44:
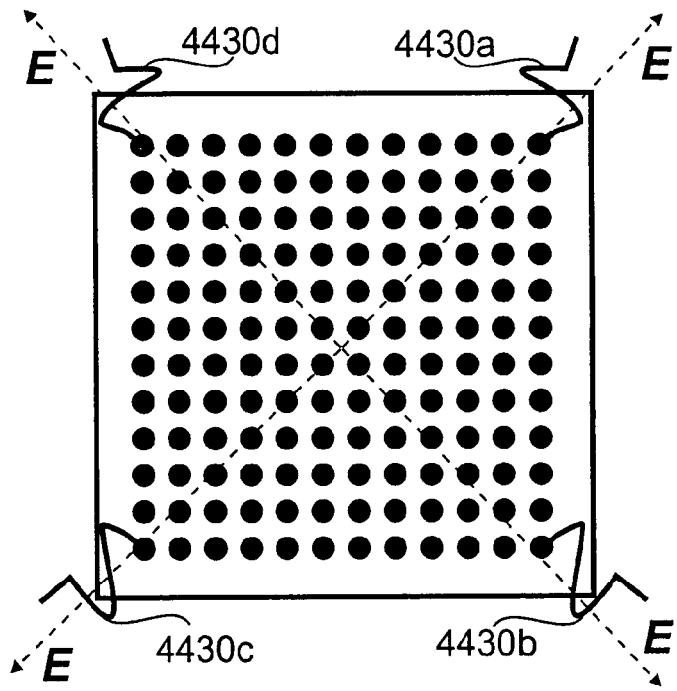
FIG. 44 is a plan view of an electronic component to which a plurality of resilient contact structures are mounted, with their orientations arranged to accommodate thermal expansion of the electronic component, according to the present invention.

FIG. 44 illustrates an exemplary electronic component 4402 having an array of resilient contact structures mounted to its surface. Each contact structure is depicted by a dot (filled circle) in this illustration. The cornermost contact structures 4430*a*, 4430*b*, 4430*c* and 4430*d* are illustrated in perspective. Expansion of the electronic component 4402 is represented by the arrows labelled "E", which all point away from the center of the electronic component 4402.

In this example, each of the resilient contact structures has an orientation, which can arbitrarily be defined as the plane in which the wire stem of the contact structure is bent. As is evident from this figure, the orientations of the four cornermost contact structures 4430*a*, 4430*b*, 4430*c* and 4430*d* are arranged so that the thermal expansion (dashed lines) intersect the plane of the contact structure at substantially a normal (e.g., 90°) angle.

A straightforward approach would be to align all of the contact structures in the top-right (as viewed) quadrant of the electronic component parallel to the contact structure 4430*a*, to align all of the contact structures in the bottom-right (as viewed) quadrant of the electronic component parallel to the contact structure 4430*b*, to align all of the contact structures in the bottom-left (as viewed) quadrant of the electronic component parallel to the contact structure 4430*c*, and to all of the contact structures in the top-left (as viewed) quadrant of the electronic component parallel to the contact structure 4430*d*. However, given that the expansion occurs generally radially, from the centroid of the electronic component, it is within the scope of this invention that each contact structure (only four of which are illustrated) is arranged so that the expansion vector passes through the plane of the contact structure at an individualized, appropriate angle. In FIG. 44, the contact structures are shown aligned "to the 45's" for illustrative clarity.

It is also within the scope of this invention that the tip "leg" of the contact structure is offset in the direction of thermal expansion from the base "leg" of the contact structure, to assist in accommodating thermal expansion.

Flexure Mechanisms

As discussed hereinabove, such as with respect to FIG. 5F, the resilient contact structures of the present invention typically react compressive forces in compression. Ranges of spring constants (k) have been described.

It is within the scope of this invention that other (i.e., than compression) flexure mechanisms can be leveraged to enhance the resilient characteristics of the contact structure.

Figure 45:
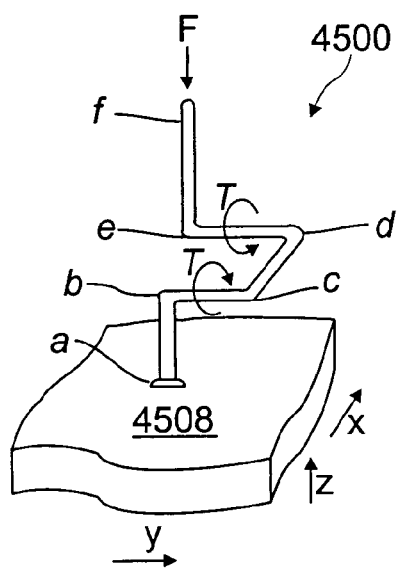
FIG. 45 is a perspective view of a resilient contact structure mounted to a substrate and accommodating a compressive force (F) in torsion (T), according to the present invention.

FIG. 45 illustrates a resilient contact structure 4500 similar to the contact structure shown in FIG. 2C. The proximal end of the contact structure is mounted at a point "a" to a substrate 4508 (compare 2508), and the contact structure has a distal tip (at the point labelled "f"). The top "leg" of the contact structure (i.e., the vertical portion of the contact structure between the points "f" and "e") is offset (e.g., in the x-direction) from the bottom "leg" of the contact structure (i.e., the vertical portion of the contact structure between the points "a" and "b"). When a compressive force (arrow labelled "F") is imposed on the contact structure, the compressive force will, at least partially, be reacted in torsion, as indicated by the arrows labelled "T". Torsion, as a flexure mechanism, can advantageously be employed to tailor the resilient and/or compliant properties of the contact structure. Preferably, the contact structure is shaped so that torsion occurs symmetrically with respect to the "arms" (the horizontal portion of the contact structure between the points "b" and "c", and the horizontal portion of the contact structure between the points "d" and "e") of the contact structure.

It is within the scope of this invention that the contact structure can be designed (e.g., shaped) to react compressive forces via any number of flexure mechanisms, including compression, torsion, tension, bending, and the like. Moreover, additional (i.e., in addition to compressive) forces can be accommodated with different flexure mechanisms. For example, the contact structures 4430*a* . . . 4430*d* of the previous embodiment (FIG. 44) can be aligned to accommodate thermal expansion principally in torsion, while reacting compressive forces principally in compression.

Reducing Inductance

As mentioned hereinabove, such as with respect to FIG. 5E, it is, in many instances, relevant to reduce the inductance imposed by the relatively long overall length of the contact structure to minimize inductance effects. In the previously described embodiment of FIG. 5E, an elastomer mass was employed to provide a conductive path between the distal tip and the proximal end of the wire stem (or, more accurately, the closest point on the terminal to the distal tip of the wire stem) which is shorter than the overall length of the wire stem.

The shortest path between two points is, in Euclidian geometry, a straight line. According to the present invention, a separate and distinct wire is provided, in conjunction with the shaped wire stem, to provide an electrical path, the length of which is minimized, between the distal end of a contact structure and the terminal (e.g.,) to which the contact structure is mounted.

FIG. 46A-46F illustrate a technique of minimizing the electrical path, hence the inductance, between two points being interconnected, in a manner similar to that discussed with respect to the elastomeric mass 564 of FIG. 5E.

Figure 46G:
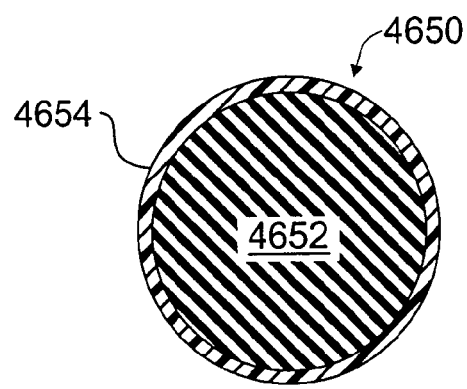
FIG. 46G is a cross-section of an insulated wire of the prior art which may be employed in certain embodiments of the present invention.
Figure 46A:
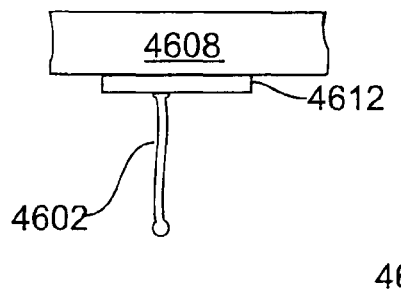
FIGS. 46A-46F are side views, illustrating a technique for reducing overall inductance of a resilient contact structure, according to the present invention.

FIG. 46A shows a "jumper" wire 4602 bonded at one end to a terminal 4612 (compare 212) on a substrate 4808 (compare 208).

The jumper wire 4602 is bonded in the manner of the previously-described wire stems although, as will become evident, it is not intended to function in a resilient manner. The wire 4602 is caused to extend nearly straight up (down, as viewed in the figure) from the surface of the substrate 4608, but is preferably slightly kinked. The wire 4602 is preferably a very flexible wire, such as 0.0008 inch gold wire.

Figure 46B:
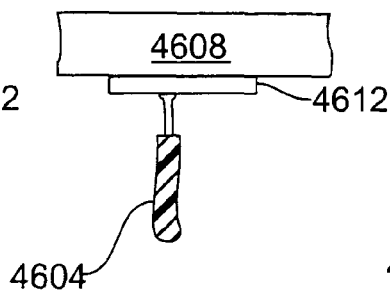

FIG. 46B illustrates a masking layer 4604, such as photoresist, applied to a distal portion of the wire 4602. This can simply be accomplished by "dipping" the substrate into a container (not shown) of liquid masking material.

Figure 46C:
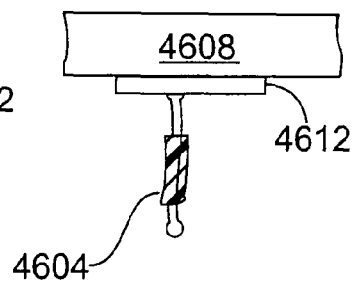

FIG. 46C illustrates a next step in the process, wherein a small portion of the masking material 4604 is removed from the tip-most portion of the wire 4602. This exposes the material of the wire 4602 for subsequent overcoating (e.g., plating), as discussed hereinbelow.

Figure 46D:
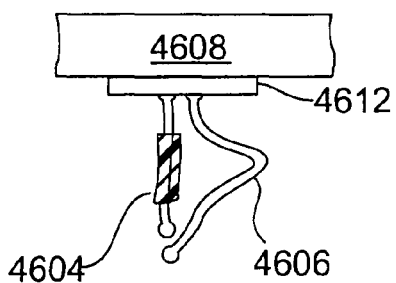

FIG. 46D illustrates a next step in the process, wherein another wire 4604 is bonded to the terminal 4612. This wire 4606 is shaped (e.g., bent) in the manner described hereinabove (see, e.g., FIG. 2A et seq.) to be a falsework (i.e., in a springable shape) for supporting an overcoat (superstructure) to form a resilient contact structure. The distal end (tip) of the resulting shaped wire stem is advertently caused to be very close to, preferably directly over (under, as viewed in the figure) the distal end of the wire 4602.

Figure 46E:
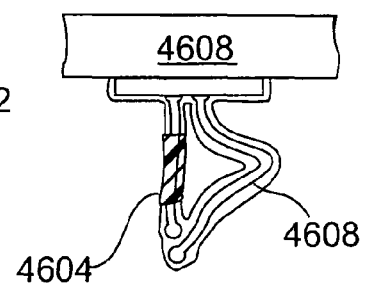
Figure 46F:
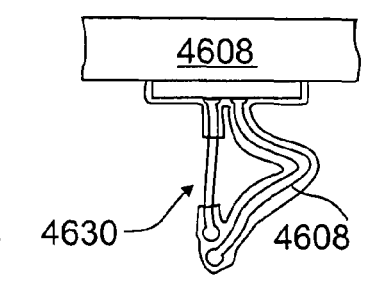

FIG. 46E illustrates a next step in the process, wherein the wires 4602 and 4606 are overcoated, in the manner described hereinabove (see, e.g., FIG. 5, et seq.), such as by plating nickel onto the wires. The overcoat 4608 will completely cover (envelop) the wire stem 4606, and will cover the terminal 4612 to firmly anchor the wire stem 4606 thereto. The overcoat 4608 will also connect the distal ends of the wire 4602 and the wire stem 4606 to one another. In this manner, a nearly straight line path is created between the terminal 4612 and the distal end of the wire stem 4606. The resulting resilient contact structure 4630 will exhibit low inductance as a result of this nearly straight line path, irrespective of the overall length of the resilient portion of the contact structure (i.e., the overcoated wire stem 4606).

An alternative approach to the technique set forth above, involving masking the jumper wire (4602) to prevent it from becoming plated (hence, retaining its flexibility), is to use an insulated wire as the jumper wire. For example, a gold wire having an insulating coating can be used as the jumper wire. (See FIG. 46G which shows an insulated wire 4650 having a conductive core 4652 and an insulating coating 4654.) Such insulated wires are well known, an example of which is described in the aforementioned U.S. Pat. No. 4,860,433. Such insulated wires are readily available, and are used, for example, in bonding semiconductor dies to leadframes to prevent the wires from shorting to one another in the process of plastic molding. For example, a gold wire having a diameter of 0.0008 inches, covered by a polymer (or by a plastic material, such as urethane) can be employed as the jumper wire. Generally, the insulating coating on such a wire will not contribute significantly to the mechanical properties of the wire.

In use, the insulation at both ends of the insulated jumper wire would be ablated (e.g., vaporized) during the process of severing the supply wire (i.e., prior to bonding the proximal end of the jumper wire to the terminal and after playing out the desired length of jumper wire), leaving the underlying wire exposed (for bonding and for plating).

Inasmuch as the jumper wire 4602 provides the principal electrical path from the component 4608 to another component (not shown), it is within the scope of this invention that the wire stem 4606 need not be electrically conductive.

Tapered Wire Stem

As mentioned hereinabove with respect to FIGS. 5G and 5H, it is possible to "tailor" the thickness of the overcoat to modify the characteristics of the resulting contact structure.

According to the invention, it is also possible to "tailor" the thickness of the wire stem to modify the characteristics of the resulting contact structure.

Figure 47:
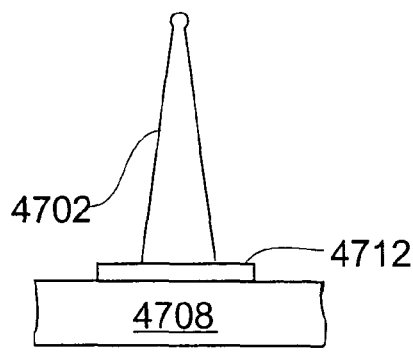
FIG. 47 is a side view of a wire stem having its thickness (e.g., diameter, for a round wire) modified, according to the present invention.

FIG. 47 illustrates a wire stem 4702 mounted by its proximal end to a terminal 4712 on a substrate (e.g., electronic component) 4708. Depending on the material of the wire stem (aluminum, for example), the cross-section of the wire stem can selectively be decreased with an appropriate solvent (potassium hydroxide, for example. In this figure, the wire stem is shown as having a smooth transition from a region of smallest diameter at its distal end, to a region of greatest diameter at its proximal end. It is within the scope of this invention that the diameter can be "stepped", by immersing only a proximal portion (e.g., the top two-thirds, as viewed) of the wire stem in a solvent. The wire stem in this example is shown as straight, for illustrative clarity. The technique of thinning portions of the wire stem are equally applicable to wire stems having a springable shape.

Removing the Wire Stem

As mentioned hereinabove, having established the shape of the overlying superstructure (e.g., plated overcoat), the underlying falsework (wire stem), once overcoated, the underlying wire stem contributes little to the overall mechanical (e.g., structural) characteristics of the resulting contact structure.

According to the invention, the wire stem can be removed after it is overcoated.

Figure 48A:
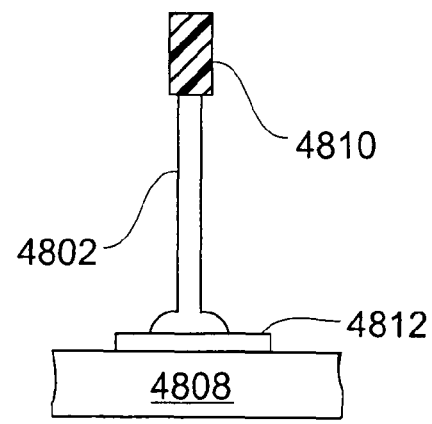
Figure 48B:
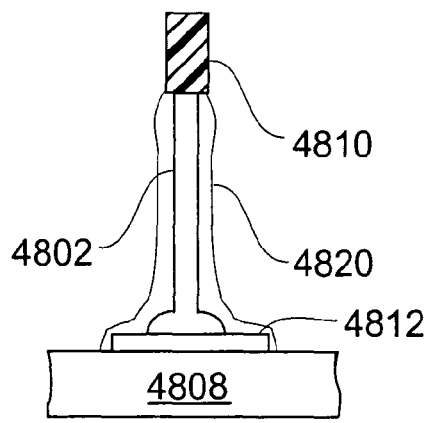
Figure 48C:
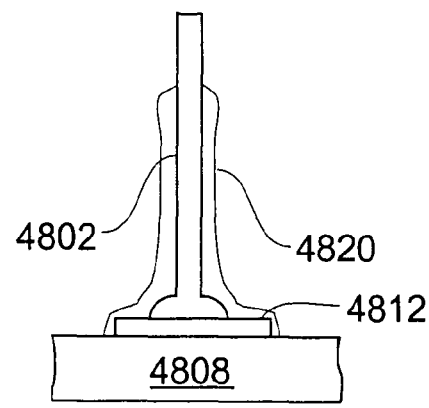
Figure 48D:
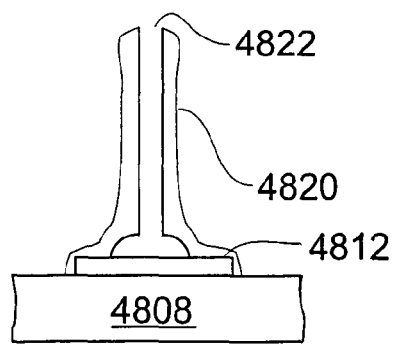

FIG. 48A illustrates a wire stem 4802 mounted by its proximal end to a terminal 4812 on a substrate (e.g., an electronic component). A masking material 4810 such as photoresist is applied over a small portion of the distal end (tip) of the wire stem. Next, as shown in FIG. 48B, the wire stem is overcoated with at least one layer 4820 of a material, according to the techniques set forth hereinabove. Next, as shown in FIG. 48C, the masking material 4810 is removed (such as by dissolving, washing off, and the like). This results in an overcoated contact structure with the distal end of the wire stem exposed through the overcoat material. Next, as shown in FIG. 48D, the wire stem is at least partially removed, such as by immersing the contact structure in a solvent (e.g., potassium cyanide for a gold wire stem, potassium hydroxide for an aluminum wire stem). This results in a hollow superstructure (overcoat) 4820. The process can be terminated at this point and the resulting contact structure will be is suitable for interconnecting to another electronic component (not shown). In the case of soldering the distal end of the contact structure to another electronic component, solder may be drawn into the void left by the removed wire stem, by capillary action, to enhance the electrical connectivity and structural integrity of the interconnection.

Figure 48E:
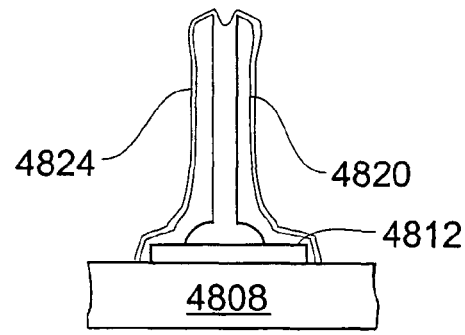

Optionally, an additional overcoat layer 4824 is applied, such as by plating, such as a thin layer of hard gold, and this layer 4824 will tend to fill the hollow opening in the overcoat 4820, as illustrated in FIG. 48E. Again, the wire stem in this example is shown as straight, for illustrative clarity.

Eutectic Contact Tip

Generally, throughout the embodiments set forth hereinabove, it is the overcoat material that establishes contact with other electronic components, the wire stem being "buried" within the overcoat material. In cases where the wire stem has better contact properties (e.g., conductivity, resistance to corrosion, etc.) than the overcoat material, it would seem somewhat counter-intuitive to "bury" the wire stem inside of an overcoat.

According to the invention, the wire stem is permitted to be exposed at the distal end (tip) of the contact structure.

Figure 49A:
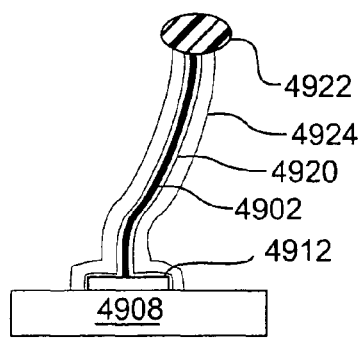

FIG. 49A illustrates a contact structure 4900 fabricated in the following manner. A wire stem 4902 is mounted by its proximal end to a terminal 4912 on a substrate 4902 and is formed of a material such as gold wire. A thin layer 4920 of a material such as tin is applied over the gold wire stem. A dollop of masking material 4922, such as photoresist, is applied to the distal end of the tin-overcoated wire stem. (Optionally, the masking material is applied over the wire stem 4902 prior to applying the tin overcoat 4920.) A layer 4924 of a spring material such as nickel is applied over the tin-overcoated wire stem. Next, the masking material 4922 is removed. This results in a contact structure analogous to the contact structure shown in FIG. 48C.

Next, the entire contact structure is subjected to heating, sufficient to cause the gold (4902) and the tin (4920) to form a gold-tin eutectic. It is within the scope of this invention that materials other than gold and tin, capable of forming a eutectic, can be employed—for example, lead and tin.

Figure 49B:
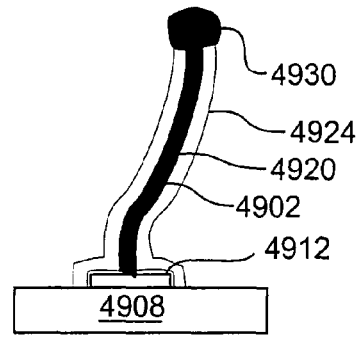

Next, the contact structure is allowed to cool. A property of eutectic material is that it expands upon melting. For example, a gold-tin eutectic may expand up to 4% (by volume). The spring material (e.g., nickel) 4924 is unaffected by the heating and cooling cycles. Thus, upon cooling, the tin-overcoated wire stem will expand and be forced partially out of the distal end of the contact structure, resulting in a configuration such as shown in FIG. 49B, wherein the endmost portion of the contact structure 4900 is a gold-tin eutectic mass 4930 which is "braze-ready" for mounting to a contact pad on another electronic component. The braze-ready tip is, in essence, a portion of the original wire stem 4902 (and additional layer 4920) that has "oozed" out of the open-ended overcoat. When the eutectic wire stem cools off, there will be voids remaining behind, as indicated by the two voids 4940 illustrated in FIG. 49C.

It is within the scope of this invention that an additional, outer layer of gold is applied to the contact structure (e.g., over the nickel layer) either prior to or after heating/cooling the contact structure.

Inasmuch as the wire stem is bonded at its proximal end to the contact area, and its distal end is exposed (for connecting to another electronic component), it is within the scope of this invention that the overcoat is formed of an insulating (dielectric) material. (see, e.g., FIGS. 49B and 49C)

Topographical Contact Tips

As described hereinabove, for example with respect to FIGS. 10A-10I and 11A-11F, the contact structure of the present invention can be fabricated with contact tips which are particularly useful in the context of using the, resilient contact structures of the present invention as probes.

Figure 50A:
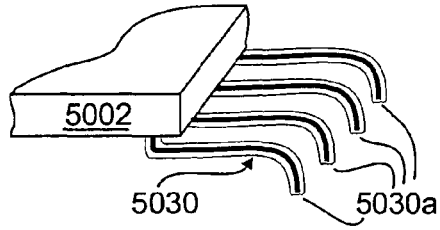

FIG. 50A illustrates an exemplary semiconductor package 5002 having a plurality of resilient contact structures 5030 mounted by their proximal ends to an external surface thereof. The contact structures are formed according to any of the techniques set forth hereinabove. For example, the contact structures have a gold wire stem and a nickel overcoat. As discussed hereinabove, the distal ends 5030a of the contact structures are readily made to be coplanar. Generally, however, they will be smooth (e.g., if a simple nickel overcoat is applied to the wire stem). As illustrated in this figure, the distal ends 5030a of the wire stems 5030 are either surface ground, or subjected to an EDM burn, or the like, to ensure that the distal ends of the contact structures are flat and, optionally, have a topographic (rough, crenulated) surface finish.

Figure 50B:
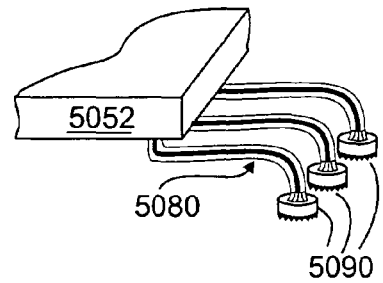

FIG. 50B illustrates an alternative embodiment wherein a semiconductor package 5052 has a plurality of resilient contact structures 5080 mounted by their proximal ends to an external surface thereof. In this example, pre-fabricated contact tips 5090 are applied to the distal ends of the contact structures. The contact tips 5090 may have any desired topography, and are attached to the ends of the contact structures by soldering, brazing or the like.

Generally, there are various ways to make topographical contact tips, including:

(a) make the tips inherently topographical, such as by controlling the plating process, as described hereinabove (see, e.g., FIGS. 5C and 5D);

(b) "build" the contact structure on a previously-fabricated tip structure (see, e.g., the contact tip 1026 of FIG. 10D); or (c) build the contact tips separately, and braze (or the like) them to the contact structures.

Demi-Coating

Generally, throughout the embodiments described hereinabove, the overcoat (superstructure) has had a cylindrical profile (circular cross-section, surrounding the underlying wire stem). This is the case even in instances where the wire stem is removed, as described with respect to FIGS. 48A-48E.

According to the invention, a superstructure can be created which has an approximately semi-circular profile (cross-section) and, optionally, the underlying falsework can be removed.

Figure 51A:
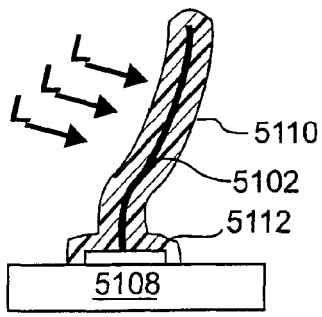

FIG. 51A illustrates a wire stem 5102 mounted by its proximal end to a terminal 5112 on a substrate 5108. A layer of masking material 5110, such as photoresist, is applied over the entire length of the wire stem 5102. The photoresist-covered wire stem is then illuminated from the side (e.g., rather than from above) by light (e.g., actinic light), as indicated by the arrows labelled "L", that will "develop" a portion of the photoresist that is exposed to the light. A remaining portion of the photoresist will be in the "shadow" of the wire stem, and will not be developed.

Figure 51B:
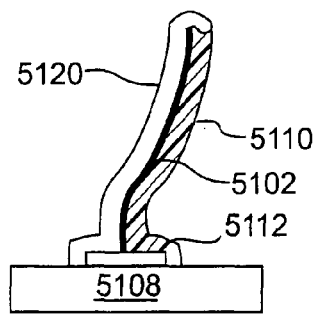

In a next step, illustrated in FIG. 51B, the partially-overcoated wire stem is overplated with a layer of spring material 5120, such as nickel. This results in an overcoating that extends only partially around the wire stem (the remainder being prevented from being overcoated by the residual photoresist). The photoresist may then (optionally) be removed, and the process terminated.

Figure 51C:
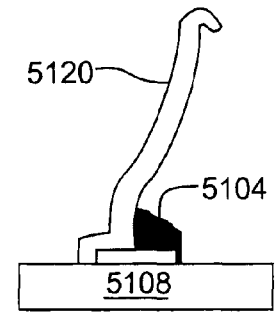

Alternatively, as shown in FIG. 51C, the residual photoresist is removed and the wire stem is melted down (by application of heat to the contact structure) so that it forms a mass upon the terminal 5112.

It is within the scope of this invention that a gold wire stem (5102) is first coated with a thin layer of tin, as described hereinabove with respect to FIG. 49A, so that the resulting mass 5014 will be eutectic.

Contacting a Central Portion of the Wire Stem

As discussed with respect (for example) to the embodiment of FIG. 8C, described hereinabove, in certain instances the contact structure of the present invention contacts another electronic component by a central portion of the contact structure, rather than by a free end of the contact structure.

Examples of electrical contact being made to another electronic component by the overcoat material (see, e.g, FIG. 18B), or by the wire stem material (see, e.g., FIG. 49B) have been described.

According to an aspect of the invention, electrical contact between a contact structure mounted to a first electronic component can be made by a central portion of the wire stem which has been overcoated, rather than with the overcoat material.

Figure 52A:
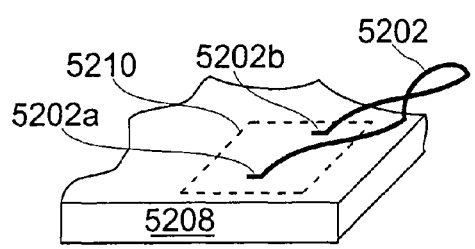

FIG. 52A illustrates a wire stem 5202 having a one end 5202a bonded to a substrate 5208 (compare 208) and another end 5202b bonded to the substrate 5208. The ends 5202a and 5202b are both bonded to the same contact area 5210 (compare 110) on the substrate (electronic component) 5208.

Both ends of the wire stem having been bonded (in contrast to only one end being bonded, and the other end free), the wire stem is seen to be similar to the loop embodiment of FIG. 2F, or to the three-dimensional loop embodiment of FIG. 2G.

Figure 52B:
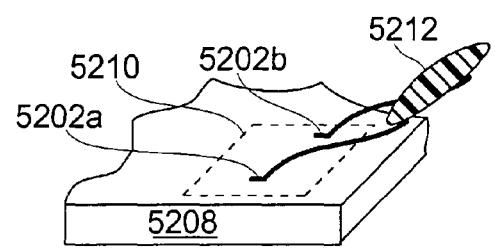

FIG. 52B illustrates a next step, wherein a middle section of the wire stem is masked, such as with photoresist 5212, in a manner similar to that with which the tip of the wire stem 4802 was masked in the embodiment of FIG. 48C—i.e., to prevent subsequent overcoating (e.g., plating) of the masked portion of the wire stem.

Figure 52C:
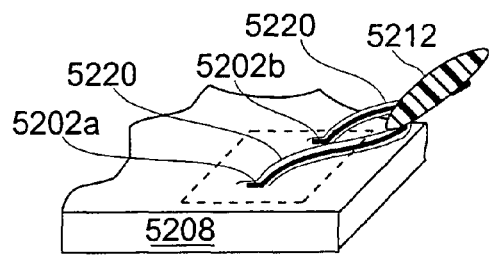

FIG. 52C illustrates a next step, wherein the masked wire stem is overcoated with a material 5220 (compare 4820), such as nickel.

Figure 52D:
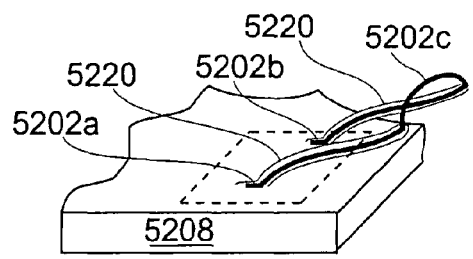

FIG. 52D illustrates a next step, wherein the mask 5212 is removed. This leaves the central portion 5202c of the wire stem exposed, for making contact to another electronic component. In this context, gold is a good choice for the wire stem (5202), due to its superior electrical contact properties, and it is not important that the overcoat material 5220 be electrically conductive (only that it establish the spring qualities of the resulting contact structure).

Multiple Free-Standing Wire Stems, Single Severing Step

In many of the embodiments presented hereinabove, it has been described that a wire (e.g., gold wire) can be bonded to a contact area on an electronic component, shaped (including straight), and severed to be free-standing. In this manner, one end of the resulting wire stem is attached to the electronic component, and the other (free) end of the wire stem is available for making contact to another electronic component. Generally, this requires individually forming each free-standing wire stem by repeating the steps of bonding and severing, for each wire stem.

According to an aspect of the invention, a plurality of (multiple) free-standing wire stems may be formed with a plurality of bonding steps and a single severing step.

This embodiment can be understood by referencing the previously-described FIGS. 52A-52D. In this case, however, the ends 5202a and 5202b of the wire stem 5202 may be bonded to the same contact area (5210), or to two distinct contact areas (110, 110, not shown) on the substrate 5208.

In this embodiment, it is generally preferred that a gold wire stem (5202) is first overcoated with a thin layer of tin, which will ultimately form a gold-tin eutectic in the manner described hereinabove with respect to FIGS. 49A and 49B).

Figure 52E:
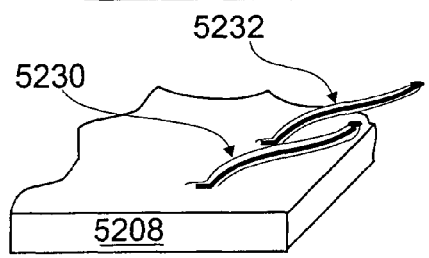

In this embodiment, after removing the mask (5212), the contact structure is heated to a sufficient temperature which will reflow the eutectic wire stem, and cause the exposed "bridge" (bight) 5202c between the two "legs" of the contact structure to "collapse", resulting in two free-standing contact structures 5230 and 5232, as shown in FIG. 52E, each having eutectic tips (compare FIG. 49B)—the tips (distal ends) being suitable for making contact to another electronic component.

It is within the scope of this invention that this principle could be applied to a sequence of loops, such as are shown in FIG. 24C, to form multiple free-standing contact structures, without requiring severing (e.g., EFO, as described hereinabove) the free ends of each of the wire stems.

It is within the scope of this invention that this technique of "collapsing" the bridge(s) of one or more loops to form two or more (e.g., twice the number of loops) free-standing contact structures (or wire stems, prior to overcoat) can be applied to loop structures such as are illustrated in FIGS. 2F, 15C, 16C and 24C.

Figure 52F:
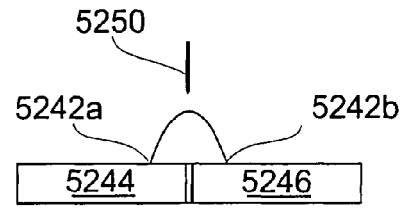

According to an embodiment of the invention, a plurality of single bond wires can be looped between two electronic components, then severed, to form a double-plurality of free-standing wire stems (or overcoated wire stems). For example, as shown in FIG. 52F, a single wire stem 5242 has first end 5242a mounted to a first electronic component 5244 and a second end 5242b mounted to a second electronic component. Attention is directed to FIG. 15 to illustrate the point that the two electronic components 5244 and 5246 may be adjacent unsingulated semiconductor dies on a semiconductor wafer.

As mentioned hereinabove, it is generally preferred that contact structures mounted to unsingulated semiconductor dies, according to the present invention, do not extend over the edges of the dies—an area between two adjacent dies being a kerf area whereat a saw (or the like) will perform the operation of singulating (dicing) the dies.

As shown in FIG. 52F, the "bridge" portion of the wire stem 5242 may simply be sawed in the same operation as singulating the dies, with a kerfing saw 5250. Compare FIG. 14F.

The concept of making multiple free-standing contact structures without severing can also be done with simple wirebond loops extending from a one terminal to another terminal, or from a terminal on a one die to a terminal on another die (compare FIG. 15). Additionally, a sequence of loops, such as are shown in FIG. 24C can be dealt with in this manner, leaving behind a large number of free-standing wire stems, each mounted to a distinct terminal on the electronic component.

Also, for example, the wire stems shown in FIG. 16B can have their topmost portions removed in any suitable manner, which will separate the frame from the die(s). Rather than (e.g., dissolving the frame.

Generally, it is within the scope of this invention that loops may be formed (typically from terminal to terminal), and their bight portions removed in any suitable manner to result in two free-standing wire stems per loop. For example, the loops can be encapsulated in a material such as wax, and polished to separate the legs from one another. This can be done before overcoating, or after overcoating. If done after overcoating, the wire stem will be exposed, and the techniques and benefits discussed hereinabove with respect to FIGS. 49A-49C would be relevant.

Figure 53A:
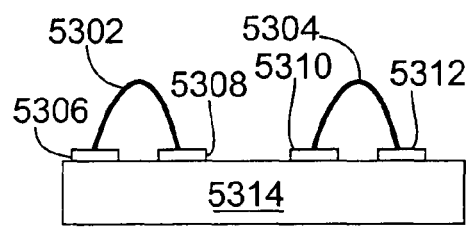
Figure 53B:
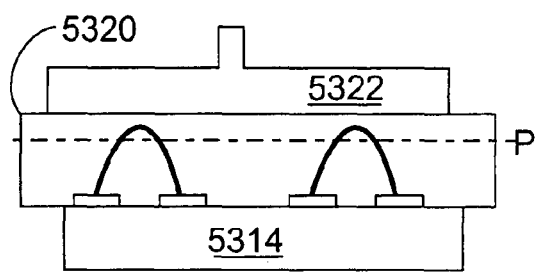

For example, FIG. 53A illustrates a plurality (two of many shown) of loops 5302 and 5204 (similar to the loop 202 of FIG. 2F) formed between terminals 5306, 5308, 5310 and 5312 on a surface of an electronic component 5314. FIG. 53B shows the loops 5302 and 5304 encapsulated (e.g., potted) in a sacrificial material 5320, such as hard wax. After being potted in this manner, a grinding (polishing) tool 5322 is brought to bear down upon the potted loops, grinding through the potting material 5320 and through the bight portions of the loops 5302 and 5304, until the loops are severed. (This is indicated by the dashed line labelled "P in the figure). Then, the potting material is removed (such as by melting). This results in each loop being two, free-standing wire stems (not illustrated). It is within the scope of this invention that the wire stems (loops) are overcoated either before potting, or after grinding (and removing the potting material).

If the wire stems are overcoated prior to potting, the wire stems would be exposed to form braze-able tips, in the manner discussed hereinabove with respect to FIG. 49C.

It is within the scope of this invention that the loop wire stems (e.g., 5302) extend from a terminal on a one electronic component to a terminal on another electronic component (rather than the two terminals being on the same electronic component, as illustrated).

By fabricating multiple wire stems from loops, or the like, electronic components (such as semiconductor devices) to which the loops (and, ultimately the free-standing contact structures) are mounted are spared from the high, potentially damaging, voltages (e.g., thousands of volts in a discharge) associated with electronic flame off techniques (described hereinabove).

Figure 53C:
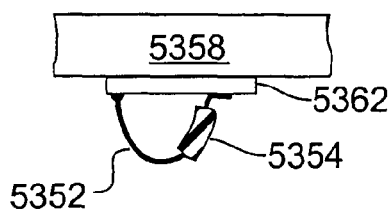
Figure 53D:

FIGS. 53C and 53D illustrate another technique for making free-standing wire stems, without electronic flame off, from loops, according to the present invention. As illustrated, a wire stem 5352 extending from a terminal 5362 on an electronic component 5358 is formed into a loop and bonded back onto the terminal (or onto another terminal on the electronic component, or onto another terminal on another electronic component). A substantial portion of one "branch" (leg) of the loop is covered with a masking material 5354, such as photoresist. The loop is then overcoated with a material 5358, and the photoresist is removed, at which point the previously-masked branch of the loop can also be removed, resulting in a free-standing overcoated wire stem, as illustrated in FIG. 53D.

Flat Tab Tips, and Methods of Making Interconnections

As described hereinabove, the distal end (tip) of the contact structure can be provided with a topological contact pad, or the like. It is, for example, within the scope of this invention that the tips of the contact structures can be provided with flat tabs (pressure plates). In this manner, interconnections to external components are readily made (without soldering or the like), especially to fragile external components, through the intermediary of what is termed "z-axis conducting adhesive", which is a known material having conductive (e.g., gold) particles disposed therein and which becomes conductive under compression.

Figure 54:
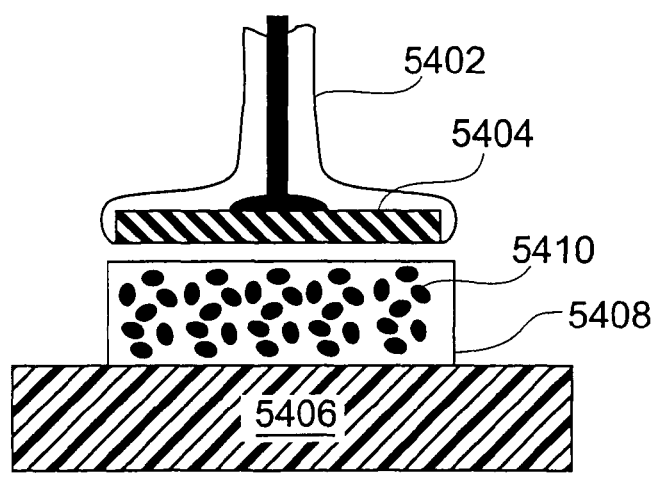

FIG. 54 illustrates an overcoated wire stem 5402, the distal end (tip) of which is provided with a flat tab (pad) 5404, in a manner similar to the technique described hereinabove with respect to FIG. 10D (see element 1026). An electrical interconnection is effected from the contact structure 5402 to an external electronic component 5406 by means of a z-axis conducting adhesive 5408 having conductive particles 5410 suspended throughout. When the electronic component (omitted in this view) to which the contact structure 5402 is urged (see arrow "C") against the external component 5406, the adhesive 5408 is compressed and becomes conductive.

Advantages

As mentioned above, the prior art is replete with a variety of interconnection schemes and, typically, each scheme is applicable to only one milieu.

For example, "conventional" wirebonding is effective for making electrical connections between a plurality of points (e.g., bond pads) on a first electronic component (e.g., a semiconductor die) and a corresponding plurality of points (e.g., terminals) of a second electronic component (a semiconductor package element), and generally is implemented by bonding a wire at a first point, extending the wire with some "slack" to a second point, and bonding the wire at the second point. However, such a scheme is not of particular value for bonding a semiconductor package to a printed circuit board.

For example, it is known to provide an external surface of a semiconductor package with an array of pins, leads, solder bumps, and the like, for making electrical connections between the package and a printed circuit board to which the package is mounted. However, packaging electronic components such as semiconductor dies in this manner often requires outsourcing the packaging, which involves the transportation of often-costly semiconductor devices. Moreover, it is relatively difficult to salvage a package once a semiconductor device is mounted therein—resulting in an entire packaged semiconductor device being thrown out if the packaged semiconductor device fails in testing.

For example, sockets provide a means to make temporary (removable) connections between semiconductor packages and printed circuit boards. However, sockets are generally utterly inapplicable to making connections to bare (unpackaged) semiconductor components.

For example, contacts having a limited degree of resiliency are known, for making connections between electronic components. Typically, these contacts are disposed in (supported) by a carrier, as exemplified in the aforementioned U.S. Pat. No. 4,705,205. Moreover, even though such contacts may have a shape (e.g., an S-shape) which is conducive to functioning as a "spring", the materials from which these contacts are made are not conducive to their functioning as a resilient contact structure. Additionally, any such contact which is supported in (rather than extending from) a carrier is, by definition, not freestanding.

A somewhat non-intuitive advantage accrues to using shaped resilient contact structures, such as mounted to semiconductor dies, in a non-resilient manner, such as by soldering (or epoxying) the tips (distal ends) of the contact structures extending from the dies (with resilient contact structures mounted thereto) to a printed circuit board (see, e.g., FIG. 36A, hereinabove). In such a flip-chip type application of the present invention, a degree of resiliency can be maintained (if desired). Additionally, due to the "protuberant" nature of the contact structures which have high aspect (height:width) ratios, cleaning (e.g., of solder flux) and inspectability are increased, as compared with traditional solder-bump type flip-chip surface mount processes.

Another non-intuitive feature of the present invention is the use of processes such as plating, to fabricate contact structures for microelectronic applications. A survey of the prior art will readily indicate that plating is typically employed to provide a protective, rather than a structural, coating over an essential electrical conductor (such as a lead frame lead). Moreover, it is generally counter-intuitive to plate anything (e.g., nickel) over gold (e.g., a gold wire stem), since gold is so widely accepted as a material of choice for making electrical interconnections in many applications.

A wide variety of resilient contact structures, methods for fabricating same, and applications for same have been discussed hereinabove.

An electroplating process is generally preferred for overcoating the wire stem, and certain parameters such as hardness, ductility and tensile strength are desired to be optimized. The process of optimizing these parameters tends to be empirical, following certain general guidelines, such as are set forth in the treatise: *Properties of Electrodeposited Metals and Alloys*, by William Safrenek.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected.

For example, resilient contact structures can be formed as individual units to be applied to electronic components. This would be similar to the gang transfer embodiment described hereinabove with respect to FIG. 12A, wherein a plurality of resilient contact structures are formed on a sacrificial substrate for subsequent transfer to an electronic component. However, it is within the scope of this invention that resilient contact structures are fabricated, then removed from a sacrificial substrate, and stored for later application (such as by automated equipment) on an individual basis to an electronic component. Such individual resilient contact structures could also be formed by using two sacrificial members, removing both sacrificial members after the resilient contact structures are fabricated.

Based on the description set forth hereinabove, one having ordinary skill in the art to which the present invention most nearly pertains will understand how to practice the invention. Nevertheless, a useful "companion" reference, providing a basic understanding of electric contact technology, can be found in *NEY Contact Manual*, Kenneth E. Pitney, 1973, relevant portions of which are incorporated by reference herein. For example, as discussed therein, an "ideal" contact material would possess:

(1) High electrical conductivity (low resistivity) in order that constriction resistance and bulk resistance will be low.

(2) High thermal conductivity so that joule heat ($I^2R$) will rapidly be conducted away from the contact interface.

(3) Softness, so that a-spots will be large, thereby providing low constriction resistance.

(4) High hardness for low mechanical wear.

(5) High strength to provide the ability to serve as a contact and cantilever beam to give low mechanical wear.

(6) High noble metal content for extended shelf life, low electrical noise and excellent reliability.

(7) Ability to form extremely thin lubricating films, but not an excess of frictional polymer.

(8) Low cost.

The present invention meets a number of these criteria, it being apparent that the simultaneous attainment of all these characteristics is impossible.

As further noted in the *NEY Contact Manual*, there are many cases in which a cantilever beam plays an important role in a contact structure. (A simple cantilever is a beam of uniform cross section (throughout its length) which overhangs its support, and which is loaded on its overhanging region.)

According to the present invention, a straight (linear) wire stem, overcoated as set forth above, and disposed at an angle (non-normal) to the surface of the substrate to which it is mounted will function, essentially, as a cantilever beam.

The present invention includes in its scope any case wherein a bond wire is bonded to an electronic component and overcoated (e.g., plated) with a material chosen primarily for its structural characteristics.

Based on the descriptions set forth hereinabove, it should clearly be understood that it is intended that certain features of selected embodiments described hereinabove can be "transplanted" into other embodiments described hereinabove, such as would be evident to one having ordinary skill in the art to which this invention most nearly pertains.

For example, in any of the embodiments set forth hereinabove, the contact structures can be substantially purely elastic (e.g., resilient), or can exhibit a combination of plasticity and elasticity (e.g., compliant). In any instance where "resilient" is used, "compliant" may be substituted therefor as being a "special case" of resiliency. Moreover, as used herein, any contact structure that is compliant is resilient.

For example, rather than masking the tips (distal ends) of the wire stems to permit the wire stem to be exposed after it is overcoated (see, e.g., FIGS. 48A-E or FIGS. 49A-C), the wire stem can be overcoated (without masking), and the tip of the wire stem consequently ground (with a grinding or polishing tool) to expose the wire stem.

Figure 49C:
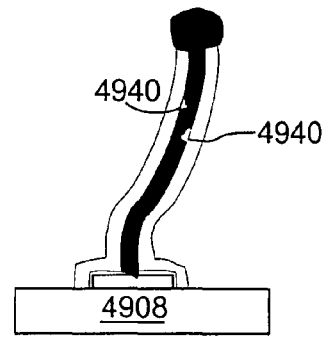

For example, when reflowing the wire stem to cause it to expand, such as is shown in FIGS. 49A-49C, an external tool such as a mold can be brought to bear upon the distal end (4930) of the contact structure, to impart a desired shape to the expanded tip. This would include a mold tool causing the tip to have a chisel (wedge) shape.

For example, in any case where the distal end of the contact structure is "permanently" attached to another electronic component, this can be done with any suitable conductive mass, such as with solder or with conductive epoxy. Alternatively, the distal portion of the contact structure can be shaped to bias itself within a plated hole of the other electronic component, as shown (for example) in FIG. 28.

For example, in most cases where contact structures are mounted to semiconductor devices, it is generally preferred that at least the proximal portion and surrounding area on the surface of the substrate (semiconductor device) be encapsulated, such as with a rigidizing material, such as a polymer. In many cases, the entire semiconductor device can be encapsulated in this manner.

Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is

1. A method of forming a contact assembly comprising:
    fabricating a plurality of contact structures each comprising an elongate body that is flexible and resilient;
    providing a first substrate comprising an array of electrical connections on a surface of said first substrate; and
    after said fabricating step and said providing step, attaching ones of said plurality of contact structures to ones of said electrical connections such that said elongate bodies of said ones of said contact structures extend away from said surface of said first substrate and stand on said first substrate free of material between said elongate bodies that mechanically couples any one of said elongate bodies to any other of said elongate bodies,
    wherein said fabricating comprises:
        forming said contact structures on a second substrate, and
        removing said contact structures from said second substrate.

2. The method of claim 1, wherein said electrical connections comprise metallic pads.

3. The method of claim 1, wherein said forming step comprises sequentially applying a plurality of materials to said second substrate.

4. The method of claim 3, wherein at least one of said materials comprises a patterned layer of material.

5. The method of claim 4, wherein said at least one of said materials comprises photoresist.

6. The method of claim 3, wherein at least one of said materials composes said contact structures.

7. The method of claim 6, wherein a plurality of said materials composes said contact structures.

8. The method of claim 3, wherein at least one of said materials composes tips of said contact structures.

9. The method of claim 8, wherein at least another of said materials composes wires bonded to said tips, said elongate bodies comprising said wires.

10. The method of claim 9, wherein at least another of said materials composes an overcoat at least partially enveloping said wires.

11. The method of claim 8, wherein said tips are patterned.

12. The method of claim 1, wherein said first substrate composes a probe card assembly.

13. The method of claim 1, wherein said attaching step comprises:
    bringing ends of said ones of said contact structures into contact with said ones of said electrical connections on said first substrate; and
    securing said ends of said ones of said contacts structures to said ones of said electrical connections.

14. The method of claim 1, wherein said attaching step comprises permanently attaching said ones of said plurality of contact structures to said ones of said electrical connections.

15. The method of claim 1, wherein said attaching step comprises metallurgically bonding said ones of said contact structures to said ones of said electrical connections.

16. The method of claim 1, wherein said fabricating step comprises fabricating said plurality of contact structures separate and apart from said first substrate and said electrical connections.

17. The method of claim 16, wherein following said fabricating step and prior to said attaching step said plurality of contact structures are not attached to said electrical connections.

18. A method of forming a contact assembly comprising:
    providing a first substrate comprising an array of electrical connections on a surface of said first substrate;
    fabricating a plurality of elongate contact structures on a second substrate, each said contact structure comprising an elongate body;
    after said providing step and said fabricating step, attaching ones of said plurality of contact structures to ones of said electrical connections such that said elongate bodies of said ones of said contact structures extend away from said surface of said first substrate and stand on said first substrate free of material between said elongate bodies that mechanically couples any one of said elongate bodies to any other of said elongate bodies; and
    removing said contact structures from said second substrate.

19. The method of claim 18, wherein said fabricating step comprises sequentially applying a plurality of materials to said second substrate.

20. The method of claim 19, wherein at least one of said materials comprises a patterned layer of material.

21. The method of claim 20, wherein said at least one of said materials comprises photoresist.

22. The method of claim 20, wherein at least one of said materials composes said contact structures.

23. The method of claim 22, wherein a plurality of said materials composes said contact structures.

24. The method of claim 23, wherein at least one of said materials composes tips of said contact structures.

25. The method of claim 24, wherein at least another of said materials composes wires bonded to said tips, said elongate bodies comprising said wires.

26. The method of claim 25, wherein at least another of said materials composes an overcoat at least partially enveloping said wires.

27. The method of claim 24, wherein said tips are patterned.

28. The method of claim 18, wherein said fabricating step comprises applying a patterned layer of material to said second substrate, said patterned layer comprising openings corresponding to said contact structures.

29. The method of claim 28, wherein said fabricating step further comprises creating a topographical pattern in said second substrate at said openings.

30. The method of claim 29, wherein said fabricating step further comprises forming contact tips of said contact structures in said openings.

31. The method of claim 30, wherein said step of forming contact tips comprises depositing a material in said openings.

32. The method of claim 31, wherein said step of forming contact tips further comprises depositing a plurality of materials in said openings.

33. The method of claim 30, wherein said fabricating step further comprises wire bonding wires at one end to said tips, second ends of said wires being deposed away from said tips, said elongate bodies comprising said wires.

34. The method of claim 33, wherein said fabricating step further comprises over coating said wires.

35. The method of claim 18, wherein said first substrate composes a probe card assembly.

36. The method of claim 18, wherein said attaching step comprises:

bringing ends of said ones of said contact structures into contact with said ones of said electrical connections on said first substrate; and securing said ends of said ones of said contacts structures to said ones of said electrical connections.

37. The method of claim 18, wherein said attaching step comprises:

inserting ends of said ones of said contact structures into recesses in said first substrate, said recesses corresponding to said electrical connections on said substrate; and securing said ends of said ones of said contacts structures in said ones of said recesses.

38. The method of claim 18, wherein said fabricating step comprises fabricating said plurality of contact structures separate and apart from said first substrate and said electrical connections.

39. The method of claim 38, wherein following said fabricating step and prior to said attaching step said plurality of contact structures are not attached to said electrical connections.

40. The method of claim 18, wherein said attaching comprises attaching said contact structures to said electrical connections such that said elongate body of each of said contact structure is disposed entirely to one side of said first substrate.

41. The method of claim 18, wherein:

said elongate body of each said contact structure comprises a contact end, and said elongate body of said ones of said contact structures deforms in response to a force on its contact end independently of a force on said contact end of any other of said ones of said contact structures.

42. The method of claim 1, wherein:

said elongate body of each said contact structure comprises a contact end, and said elongate body of each of said ones of said contact structures deforms in response to a force on its contact end independently of a force on said contact end of any other of said ones of said contact structures.

* * * * *